(12) United States Patent
Miyagi et al.

(10) Patent No.: US 10,133,173 B2
(45) Date of Patent: Nov. 20, 2018

(54) PROCESSING FLUID SUPPLY DEVICE, SUBSTRATE PROCESSING DEVICE, PROCESSING FLUID SUPPLY METHOD, SUBSTRATE PROCESSING METHOD, PROCESSING FLUID PROCESSING DEVICE, AND PROCESSING FLUID PROCESSING METHOD

(71) Applicant: SCREEN Holdings Co., Ltd., Kyoto (JP)

(72) Inventors: Masahiro Miyagi, Kyoto (JP); Hiroyuki Araki, Kyoto (JP); Masanori Suzuki, Tokyo (JP); Tomokatsu Sato, Tokyo (JP); Nobuo Kawase, Yokohama (JP)

(73) Assignee: SCREEN Holdings Co., Ltd. (JP)

( * ) Notice: Subject to any disclaimer, the term of this patent is extended or adjusted under 35 U.S.C. 154(b) by 609 days.

(21) Appl. No.: 14/431,992

(22) PCT Filed: Sep. 26, 2013

(86) PCT No.: PCT/JP2013/076006
§ 371 (c)(1),
(2) Date: Mar. 27, 2015

(87) PCT Pub. No.: WO2014/050941
PCT Pub. Date: Apr. 3, 2014

(65) Prior Publication Data
US 2015/0264790 A1 Sep. 17, 2015

(30) Foreign Application Priority Data

Sep. 27, 2012 (JP) .................................. 2012-215293
Sep. 27, 2012 (JP) .................................. 2012-215294

(Continued)

(51) Int. Cl.
*G21K 5/08* (2006.01)
*G21K 5/00* (2006.01)
(Continued)

(52) U.S. Cl.
CPC ................. *G03F 1/82* (2013.01); *G21K 5/10* (2013.01); *H01L 51/0004* (2013.01)

(58) Field of Classification Search
CPC ... G03F 1/82; G21K 5/10; G21K 1/04; G21K 1/046; G21K 2201/064; H01L 51/0004;
(Continued)

(56) References Cited

U.S. PATENT DOCUMENTS 2,968,734 A * 1/1961 Yeomans ................ G21F 5/015
250/435
4,621,195 A * 11/1986 Larsson .................... A61L 2/10
250/436
(Continued)

FOREIGN PATENT DOCUMENTS

JP 60-047400 3/1985
JP 06-313800 11/1994
(Continued)

OTHER PUBLICATIONS

Notification Concerning Transmittal of International Preliminary Report on Patentability (Chapter I) dated Apr. 9, 2015 and a Notification from the International Bureau (Form PCT/IB/326) in corresponding PCT International Application No. PCT/JP2013/076006.
(Continued)

*Primary Examiner* — Irakli Kiknadze
(74) *Attorney, Agent, or Firm* — Ostrolenk Faber LLP

(57) ABSTRACT

A processing liquid supplying apparatus is arranged to discharge a processing liquid from a discharge port to supply the processing liquid to a processing object, and the pro-
(Continued)

cessing liquid supplying apparatus includes a first piping, through the interior of which the processing liquid can flow, the interior of the first piping being in communication with the discharge port, and an X-ray irradiating means irradiating X-rays onto the processing liquid present inside the first piping. The first piping has an opening in its pipe wall and the opening is closed by a window member formed using a material that can transmit the X-rays, and the X-ray irradiating means irradiates the X-rays onto the processing liquid present inside the first piping via the window member.

42 Claims, 44 Drawing Sheets

(30) Foreign Application Priority Data

Sep. 19, 2013 (JP) .................................. 2013-194293
Sep. 19, 2013 (JP) .................................. 2013-194294

(51) Int. Cl.
*G03F 1/82* (2012.01)
*G21K 5/10* (2006.01)
*H01L 51/00* (2006.01)

(58) Field of Classification Search
CPC ......... A61B 6/032; A61B 6/06; A61B 6/4035; A61B 6/544; H05G 1/36; H05G 1/44; H05G 1/60; H05G 2/001; B01J 19/125; B01J 2219/0879; G01N 21/51; G01N 2223/076; G01N 23/12; A01N 59/00; A01N 37/16; G02B 1/043; H01J 2235/087; H01J 35/14; H01J 2235/068; H01J 2235/086; H01J 35/065; H01J 35/08; H01J 35/16; H01J 35/18; H01J 2235/00; H01J 2235/062; H01J 2235/081; H01J 2235/1216; H01J 2235/122; H05F 3/06; H05F 1/00; A61L 2/087; H01T 23/00
USPC ............................................ 378/64, 66, 161
See application file for complete search history.

(56) References Cited

U.S. PATENT DOCUMENTS

| | | | |
|---|---|---|---|
| 5,134,295 A * | 7/1992 | Walischmiller | A61M 1/3681 250/436 |
| 2005/0028928 A1 * | 2/2005 | Asa | H01L 21/6719 156/345.5 |
| 2005/0115671 A1 | 6/2005 | Araki | 156/345.12 |
| 2007/0062559 A1 | 3/2007 | Wada | 134/2 |

FOREIGN PATENT DOCUMENTS

| | | |
|---|---|---|
| JP | 10-254146 | 9/1998 |
| JP | 11-090302 | 4/1999 |
| JP | 11-214341 | 8/1999 |
| JP | 2000-277476 | 10/2000 |
| JP | 2001-332398 | 11/2001 |
| JP | 2001-334219 | 12/2001 |
| JP | 2002-184660 | 6/2002 |
| JP | 2002-203783 | 7/2002 |
| JP | 2004-179276 | 6/2004 |
| JP | 2005-191511 | 7/2005 |
| JP | 2006-162535 | 6/2006 |
| JP | 2007-018769 | 1/2007 |
| JP | 2007-88262 | 4/2007 |
| JP | 2009-117597 | 5/2009 |
| JP | 2010-118413 | 5/2010 |
| JP | 2011-181795 | 9/2011 |
| JP | 2012-084437 | 4/2012 |
| JP | 2012-094659 | 5/2012 |

OTHER PUBLICATIONS

English translation of the International Preliminary Report on Patentability (Chapter I) with a Notification from the International Bureau (Form PCT/IB/338) in corresponding PCT International Application No. PCT/JP2013/076006 dated Apr. 9, 2015.
English translation of PCT Notification of the Recoding of a Change regarding the applicant's dated Mar. 27, 2015.
International Search Report dated Dec. 17, 2013 in corresponding PCT International Application No. PCT/JP2013/076006.
Written Opinion dated Dec. 17, 2013 in corresponding PCT International Application No. PCT/JP2013/076006.

* cited by examiner

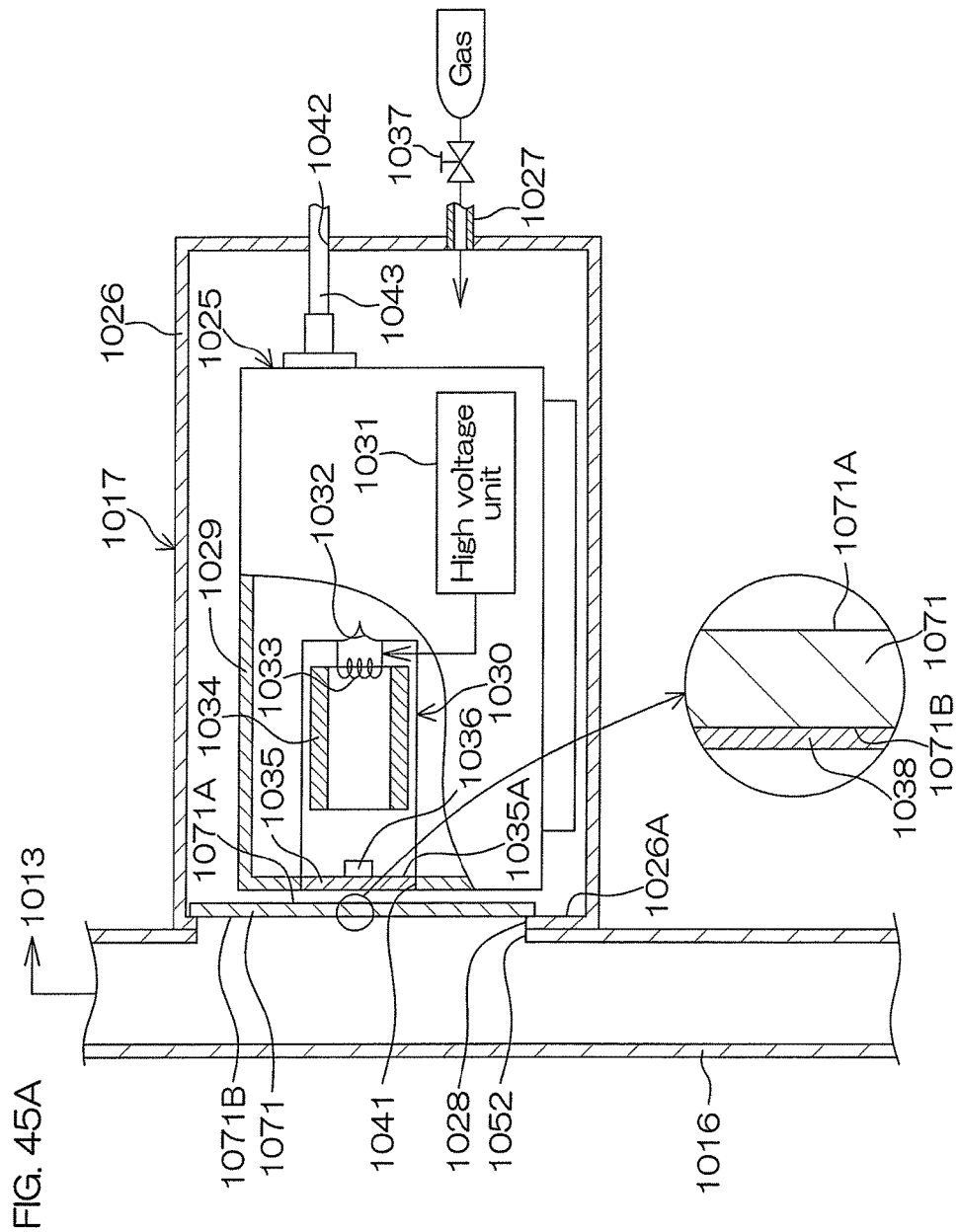

PROCESSING FLUID SUPPLY DEVICE, SUBSTRATE PROCESSING DEVICE, PROCESSING FLUID SUPPLY METHOD, SUBSTRATE PROCESSING METHOD, PROCESSING FLUID PROCESSING DEVICE, AND PROCESSING FLUID PROCESSING METHOD

CROSS-REFERENCE TO RELATED APPLICATIONS

The present application is a 35 U.S.C. §§ 371 national phase conversion of PCT/JP2013/076006, filed Sep. 26, 2013, which claims priority to Japanese Patent Application Nos. 2012-215293, filed Sep. 27, 2012, 2012-215294, filed Sep. 27, 2012, 2013-194293, filed Sep. 19, 2013, and 2013-194294, filed Sep. 19, 2013, the contents of all of which are incorporated herein by reference. The PCT International Application was published in the Japanese language.

TECHNICAL FIELD

The present invention relates to a processing liquid supplying apparatus, a substrate processing apparatus, a processing liquid supplying method, a substrate processing method, a processing liquid processing apparatus, and a processing liquid processing method. Examples of processing objects subject to processing using a processing liquid include substrates, containers, optical parts, etc. Examples of substrates used as processing objects include semiconductor wafers, glass substrates for liquid crystal displays, substrates for plasma displays, substrates for FEDs (Field Emission Displays), substrates for OLEDs (organic electroluminescence displays), substrates for optical disks, substrates for magnetic disks, substrates for magneto-optical disks, substrates for photomasks, ceramic substrates, substrates for solar cells, etc.

BACKGROUND ART

In a manufacturing process for a semiconductor device or a liquid crystal display device, a processing of supplying a processing liquid to a surface of a substrate, such as a semiconductor wafer or a glass substrate for a liquid crystal display panel, to clean the substrate surface with the processing liquid, etc., are performed.

For example, a substrate processing apparatus that performs a single substrate processing type cleaning processing of cleaning a substrate one by one includes a spin chuck that rotates the substrate while holding the substrate substantially horizontally by a plurality of chuck pins and a processing liquid nozzle arranged to supply a processing liquid to a front surface of the substrate rotated by the spin chuck.

In processing the substrate, the substrate is rotated by the spin chuck. A chemical solution is then supplied from the nozzle to the front surface of rotating substrate. The chemical solution supplied onto the front surface of the substrate receives a centrifugal force due to the rotation of the substrate and flows along the front surface of the substrate toward the peripheral edge. The chemical solution is thereby supplied to the entire front surface of the substrate and processing of the front surface of the substrate by the chemical solution is achieved. After the processing by the chemical solution, a rinsing processing for rinsing off the chemical solution attached to the substrate by pure water is performed. That is, pure water is supplied from the processing liquid nozzle onto the front surface of the substrate that is being rotated by the spin chuck and by the pure water spreading upon receiving the centrifugal force due to the rotation of the substrate, the chemical solution attached to the front surface of the substrate is rinsed off. After the rinsing processing, the speed of rotation of the substrate by the spin chuck is increased to perform a spin drying processing of spinning off the pure water attached to the substrate to dry (see Patent Literature 1 indicated below).

CITATION LIST

Patent Literature

Patent Literature 1: Japanese Patent Application Publication No. 2005-191511

SUMMARY OF INVENTION

Technical Problem

However, with the conventional substrate processing apparatus, during the rinsing processing, contact segregation may occur between the front surface of the substrate in the rotating state and the pure water to cause flow electrification of the substrate. If the substrate is a glass substrate or a silicon wafer, the substrate becomes positively charged. If the substrate is charged, breakdown of a device formed on the front surface of the substrate may occur when the charge is discharged.

A batch type substrate processing apparatus, which processes a plurality of substrates in a batch, is also used in a manufacturing process for a semiconductor device or a liquid crystal display device, etc. The batch type substrate processing apparatus includes a plurality of processing tanks including, for example, a chemical solution processing tank storing a chemical solution and a rinsing processing tank storing water. When the plurality of substrates are processed in a batch, the substrates are immersed successively in the chemical solution processing tank and the rinsing processing tank.

In the rinsing processing in the rinsing processing tank, the substrate may become charged. If the substrate is a silicon wafer or a glass substrate, the substrate becomes positively charged. If the substrate is charged after a series of processes, breakdown of a device formed on the front surface of the substrate may occur when the charge is discharged. A similar problem may also occur when a processing object is charged even before it is carried into a processing tank. It is therefore required that the rinsing processing (processing using a processing liquid) be performed while achieving charging prevention and static elimination of the substrate.

Charging prevention and static elimination in a processing using a processing liquid are issues that are not restricted to cases where the processing object is a substrate but are also issues in common to cases where the processing object is a container or other optical part, etc.

An object of the present invention is thus to provide a processing liquid supplying apparatus and a processing liquid supplying method by which a processing liquid can be supplied to a processing object while achieving charging prevention and static elimination of the processing object.

Another object of the present invention is to provide a substrate processing apparatus and a substrate processing method by which processing using a processing liquid can be applied to a substrate while achieving charging prevention and static elimination of the substrate.

Yet another object of the present invention is to provide a processing liquid processing apparatus and a processing liquid processing method by which processing using a processing liquid can be applied to a processing object while achieving charging prevention and static elimination of the processing object.

Solution to Problem

A first aspect of the present invention provides a processing liquid supplying apparatus arranged to discharge a processing liquid from a discharge port to supply the processing liquid to a processing object and the processing liquid supplying apparatus includes a first piping, through the interior of which the processing liquid can flow, the interior of the first piping being in communication with the discharge port, and an X-ray irradiating means irradiating X-rays onto the processing liquid present inside the first piping.

With this arrangement, X-rays are irradiated onto the processing liquid present inside the first piping. Also, the processing liquid discharged from the discharge port in communication with the interior of the first piping is supplied to the processing object. In a portion of the processing liquid irradiated by the X-rays (hereinafter referred to as the "irradiated portion of the processing liquid"), electrons are emitted from water molecules due to excitation of the water molecules and consequently, a plasma state is formed in which positive ions of water molecules and the electrons coexist.

The processing liquid discharged from the discharge port is supplied to the processing object and comes in liquid contact with the processing object. Hereinafter, a case where the processing liquid discharged from the discharge port is connected in liquid form between the discharge port and the processing object shall be considered. In this case, the processing object and the irradiated portion of the processing liquid are connected via the processing liquid.

If at this point, the processing object is positively charged, the potential difference between the irradiated portion of the processing liquid and the positively charged processing object causes the electrons from the irradiated portion of the processing liquid to move toward the processing liquid in liquid contact with the processing object along the processing liquid connected in liquid form. The processing liquid in liquid contact with the processing object is thereby made to have a large amount of electrons and static elimination of the positively charged processing object is thus achieved.

On the other hand, if the processing object is negatively charged, electrons from the processing object move toward the positive ions at the irradiated portion of the processing liquid along the processing liquid connected in liquid form. Static elimination of the processing object that is negatively charged is thereby achieved.

Charging of the processing object during supplying of the processing liquid can thus be prevented.

Also, even if the processing object is positively or negatively charged from before the supplying of the processing liquid, static elimination of the processing object based on the principles described above can be performed via the processing liquid connected in liquid form.

By the above, the processing liquid can be supplied to the processing object while achieving charging prevention and static elimination of the processing object.

In the present specification and the claims, "X-rays" refer to electromagnetic waves having a wavelength of approximately 0.001 nm to 10 nm and is intended to include "soft X-rays" of comparatively long wavelength (approximately 0.1 nm to 10 nm) and "hard X-rays" of comparatively short wavelength (approximately 0.001 nm to 0.1 nm).

Also in the present specification and the claims, "processing object" includes a substrate, a container, and an optical part, etc.

In the preferred embodiment of the present invention, the first piping has an opening in its pipe wall and the opening is closed by a window member formed using a material that can transmit the X-rays, and the X-ray irradiating means irradiates the X-rays onto the processing liquid present inside the first piping via the window member.

With this arrangement, the window member is formed using the material that can transmit the X-rays. The X-rays irradiated by the X-ray irradiating means are irradiated via the window member onto the processing liquid present inside the first piping. The plasma state in which the positive ions of water molecules and the electrons coexist can thereby be formed satisfactorily in the irradiated portion of the processing liquid.

In this case, the window member may be formed using beryllium or a polyimide resin.

A substance of low atomic weight, such as beryllium, can transmit even X-rays of weak penetrability. The X-rays can thus be transmitted through the window member if the window member is formed using beryllium.

The X-rays can also be transmitted through the window member if the window member is formed using a polyimide resin. Also, a polyimide resin is excellent in chemical stability and enables use of the window member over a long period.

Also, the wall surface of the window member at the side at which the processing liquid is present is preferably hydrophilic. In this case, mixing in of air bubbles between the wall surface and the processing liquid can be suppressed or prevented. The X-rays can thereby be irradiated satisfactorily onto the processing liquid present in the first piping.

Also, the wall surface of the window member at the side at which the processing liquid is present may be coated with a coating film. The irradiating window can thereby be protected. In particular, if the window member is formed of beryllium, which is poor in acid resistance, the window member can be protected satisfactorily from an acidic processing liquid.

The coating film is preferably formed using a hydrophilic material. In this case, mixing in of air bubbles between the coating film and the processing liquid can be suppressed or prevented. The X-rays can thereby be irradiated satisfactorily onto the processing liquid present in the first piping.

In this case, the coating film may be a coating film that includes one or more materials among a polyimide resin, diamond-like carbon, fluororesin, and hydrocarbon resin.

The X-ray irradiating means may include an X-ray generator that has an irradiating window disposed to face the window member, generates X-rays, and irradiates the generated X-rays from the irradiating window.

With this arrangement, the X-rays generated by the X-ray generator are irradiated from the irradiating window of the X-ray generator onto the processing liquid flowing inside the first piping.

The X-ray irradiating means may further include a cover surrounding a periphery of the X-ray generator across an interval from the X-ray generator and a gas supplying means supplying a gas to the interior of the cover.

With this arrangement, the X-ray generator may become heated due to the driving of the X-ray generator. By supplying the gas to the interior of the cover, the X-ray generator can be cooled to suppress temperature rise of the ambient atmosphere of the X-ray generator.

In the preferred embodiment of the present invention, the first piping may include a processing liquid piping, through the interior of which the processing liquid flows toward the discharge port, and the X-ray irradiating means may irradiate the X-rays onto the processing liquid flowing through the interior of the first piping.

Also, another preferred embodiment of the present invention may further include a processing liquid piping, through the interior of which the processing liquid flows toward the discharge port, and the first piping may include a branch piping branching from the processing liquid piping. In this case, the processing liquid present in the branch piping is irradiated by the X-rays.

Preferably, a fibrous substance, disposed at the discharge port and along which the processing liquid, discharged from the discharge port, can flow, is further included.

With this arrangement, the processing liquid that is discharged from the discharge port flows along the fibrous substance and therefore the form of the processing liquid discharged from the discharge port can be that of a continuous flow form connected to both the discharge port and the processing object even if the discharge flow rate of the processing liquid from the discharge port is a low flow rate. The processing object and the irradiated portion of the processing liquid can thus be connected via the processing liquid by a simple arrangement.

If a liquid film of the processing liquid is formed on the processing object by the discharge of the processing liquid from the discharge port, the tip of the fibrous substance may contact the liquid film of the processing liquid or the processing object. In this case, the form of the processing liquid discharged from the discharge port can be maintained readily in a continuous flow form such as described above.

An electrode disposed further downstream in the processing liquid flowing direction than the X-ray irradiation position in the first piping and a power supply applying a voltage to the electrode may further be included.

With this arrangement, the power supply applies a voltage to the electrode in conjunction with the irradiation of the X-rays onto the processing liquid present in first piping. By the application of voltage to the electrode, the electrode can be made to generate positive charges or negative charges.

By making the electrode generate positive charges, the electrons present in the irradiated portion (plasma state) of the processing liquid are drawn by the positive charges at the electrode and move toward the electrode. The movement of electrons toward the substrate side can thereby be promoted.

The electrode may be disposed at a tip portion of the first piping. With this arrangement, the electrode is disposed at the tip portion of the first piping. The electrons present in the irradiated portion (plasma state) of the processing liquid are thus drawn by the positive charges at the electrode and move to the tip portion of the first piping. That is, a large amount of electrons can be drawn to the tip portion of the first piping. The movement of electrons toward the substrate side can thereby be promoted further.

The processing liquid supplying device may further include a processing liquid detecting means arranged to detect the presence or non-presence of the processing liquid at the irradiation position of the X-rays in the first piping and an X-ray irradiation control means that executes the irradiation of the X-rays by the X-ray irradiating means when the processing liquid is present at the irradiation position and does not perform the irradiation of X-rays by the X-ray irradiating means when the processing liquid is not present at the irradiation position.

If the X-rays are irradiated in a state where the processing liquid is not present at the irradiation position of the X-rays in the first piping, the X-rays may leak outside the first piping.

With the present arrangement, the irradiation of X-rays onto the irradiation position of the X-rays is prohibited when the processing liquid is not present at the irradiation position of the X-rays in the first piping. Leakage of the X-rays outside the first piping can thereby be suppressed or prevented.

The first aspect of the present invention provides a substrate processing apparatus that includes a substrate holding means holding a substrate and the processing liquid supplying apparatus and supplies a processing liquid, discharged from the discharge port, to a major surface of the substrate.

With this arrangement, the X-rays are irradiated onto the processing liquid present in the first piping of the processing liquid supplying apparatus. Also, the processing liquid discharged from the discharge port in communication with the interior of the first piping is supplied to the major surface of the substrate. In the irradiated portion of the processing liquid, electrons are emitted from water molecules due to excitation of the water molecules and consequently, a plasma state is formed in which the positive ions of water molecules and the electrons coexist.

The processing liquid discharged from the discharge port is supplied to the major surface of the substrate and comes in liquid contact with the major surface of the substrate. Hereinafter, a case where the processing liquid discharged from the discharge port is connected in liquid form between the discharge port and the major surface of the substrate shall be considered. In this case, the major surface of the substrate and the irradiated portion of the processing liquid are connected via the processing liquid.

If at this point, the substrate is positively charged, the potential difference between the irradiated portion of the processing liquid and the positively charged substrate causes the electrons from the irradiated portion of the processing liquid to move toward the processing liquid in liquid contact with the substrate along the processing liquid connected in liquid form. The processing liquid in liquid contact with the substrate is thereby made to have a large amount of electrons and static elimination of the positively charged substrate is thus achieved.

Charging of the substrate due to contact segregation with respect to processing liquid is thereby avoided. Charging of the substrate during the supplying of the processing liquid can thus be prevented.

Also, even if the substrate is positively charged from before the supplying of the processing liquid, static elimination of the processing object based on the principles described above can be performed via the processing liquid connected in liquid form. Consequently, device breakdown due to charging of the substrate can be prevented.

By the above, processing using the processing liquid can be applied to the substrate while achieving charging prevention and static elimination of the substrate.

In the preferred embodiment of the present invention, the substrate holding means includes a substrate holding and rotating means that rotates the substrate around a predetermined vertical rotation axis while holding it in a horizontal attitude, the substrate processing apparatus further includes a cylindrical liquid receiver member surrounding a periphery of the substrate holding and rotating means, the processing liquid supplying apparatus further includes a processing liquid piping, through the interior of which the processing liquid flows toward the discharge port, the first piping of the processing liquid supplying apparatus includes a branch piping branching from the processing liquid piping, and the branch piping has a liquid receiver discharge port for discharging the processing liquid toward the liquid receiver member.

With this arrangement, the X-rays from the X-ray irradiating means are irradiated onto the processing liquid flowing through the interior of the branch piping while the processing liquid is discharged from the liquid receiver discharge port toward the liquid receiver member. In the irradiated portion of the processing liquid in the branch piping, a plasma state is formed in which positive ions of water molecules and electrons coexist.

The processing liquid discharged from the liquid receiver discharge port is supplied to the liquid receiver member and comes in liquid contact with the liquid receiver member. If the processing liquid discharged from the liquid receiver discharge port is connected in liquid form between the liquid receiver discharge port and the liquid receiver member, the liquid receiver member and the irradiated portion of the processing liquid are connected via the processing liquid.

If at this point, the liquid receiver member is positively charged, the potential difference between the irradiated portion of the processing liquid and the positively charged liquid receiver member causes the electrons from the irradiated portion of the processing liquid to move toward the processing liquid in liquid contact with the liquid receiver member along the processing liquid connected in liquid form. The processing liquid in liquid contact with the liquid receiver member is thereby made to have a large amount of electrons and static elimination of the positively charged liquid receiver member is thus achieved.

On the other hand, if the liquid receiver member is negatively charged, electrons from the liquid receiver member move toward the positive ions at the irradiated portion of the processing liquid along the processing liquid connected in liquid form. Static elimination of the liquid receiver member that is negatively charged is thereby achieved.

Not only charging prevention and static elimination of the substrate but prevention of charging of the liquid receiver member can thus be prevented.

In another preferred embodiment of the present invention, the substrate holding means includes a substrate holding and rotating means that rotates the substrate around a predetermined vertical rotation axis while holding it in a horizontal attitude, the substrate holding and rotating means has a supporting member contacting at least a portion of a lower surface of the substrate to support the substrate in the horizontal attitude, the supporting member is formed using a porous material, and the processing liquid discharged from the discharge port is supplied to the supporting member.

With this arrangement, the processing liquid supplied to the supporting member impregnates the interior of the supporting member. The processing liquid impregnating the interior of the supporting member oozes out from the supporting member to form a liquid film of the processing liquid on the supporting member. The lower surface of the substrate is processed by the liquid film of the processing liquid coming in liquid contact with the lower surface of the substrate.

If at this point, the processing liquid discharged from the discharge port takes on a continuous flow form connected to both the discharge port and the supporting member, the discharge port and the lower surface of the substrate are connected in liquid form via the processing liquid impregnated in the interior of the supporting member and therefore the lower surface of the substrate and the irradiated portion of the processing liquid are connected via the processing liquid.

Processing using the processing liquid can thereby be applied to the lower surface of the substrate while achieving charging prevention and static elimination of the substrate.

The substrate holding means may also include a substrate holding and conveying means that conveys the substrate toward a predetermined conveying direction while holding the substrate. With this arrangement, the processing liquid discharged from the discharge port is supplied to the major surface (upper surface) of the substrate conveyed by the substrate holding and conveying means and comes in liquid contact with the major surface (upper surface) of the substrate.

A case where the processing liquid discharged from the discharge port is connected in liquid form between the discharge port and the major surface of the substrate shall now be considered. In this case, the major surface of the substrate and the irradiated portion of the processing liquid are connected via the processing liquid.

If at this point, the substrate is positively charged, the potential difference between the irradiated portion of the processing liquid and the positively charged substrate causes the electrons from the irradiated portion of the processing liquid to move toward the processing liquid in liquid contact with the substrate along the processing liquid connected in liquid form. The processing liquid in liquid contact with the substrate is thereby made to have a large amount of electrons and static elimination of the positively charged substrate is thus achieved.

Preferably in this case, the substrate holding and conveying means conveys the substrate while holding it in an attitude along the conveying direction and inclined with respect to a horizontal plane.

With this arrangement, the substrate is held in an inclined attitude and therefore the processing liquid discharged from the discharge port flows along an inclined surface on the substrate. The processing liquid thus does not stay on the substrate and therefore concentration of load at a certain single location of the substrate due to the weight of the processing liquid can be prevented or suppressed. Also, the processing liquid flows smoothly on the substrate and therefore a liquid film of the processing liquid that spreads across a wide range can be formed on the upper surface of the substrate. Charging prevention and static elimination can thereby be achieved across a wide range of the substrate.

The first aspect of the present invention provides a processing liquid supplying method for making a processing liquid be discharged from a discharge port of a processing liquid supplying apparatus to supply the processing liquid to a processing object and the processing liquid supplying method includes a facing positioning step of positioning the discharge port to face the processing object, an X-ray irradiating step of irradiating X-rays onto the processing liquid present in the interior of a first piping in communication with the discharge port, and a processing liquid discharging step of making the processing liquid be discharged from the discharge port in parallel to the X-ray irradiating step, and in the processing liquid discharging step, the processing liquid is connected in liquid form between the discharge port and the processing object.

With this method, the X-rays are irradiated onto the processing liquid present inside the first piping. Also, the processing liquid discharged from the discharge port in communication with the interior of the first piping is supplied to the processing object. In a portion of the processing liquid irradiated by the X-rays, electrons are emitted from water molecules due to excitation of the water molecules and consequently, a plasma state is formed in which positive ions of water molecules and the electrons coexist.

The processing liquid discharged from the discharge port is connected in liquid form between the discharge port and the processing object. In this case, the processing object and the irradiated portion of the processing liquid are connected via the processing liquid.

If at this point, the processing object is positively charged, the potential difference between the irradiated portion of the processing liquid and the positively charged processing object causes the electrons from the irradiated portion of the processing liquid to move toward the processing liquid in liquid contact with the processing object along the processing liquid connected in liquid form. The processing liquid in liquid contact with the processing object is thereby made to have a large amount of electrons and static elimination of the positively charged processing object is thus achieved.

On the other hand, if the processing object is negatively charged, electrons from the processing object move toward the positive ions at the irradiated portion of the processing liquid along the processing liquid connected in liquid form. Static elimination of the processing object that is negatively charged is thereby achieved.

Charging of the processing object during supplying of the processing liquid can thus be prevented.

Also, even if the processing object is positively or negatively charged from before the supplying of the processing liquid, static elimination of the processing object based on the principles described above can be performed via the processing liquid connected in liquid form.

By the above, the processing liquid can be supplied to the processing object while achieving charging prevention and static elimination of the processing object.

Preferably in this case, the processing liquid discharged from the discharge port takes on a continuous flow form connected to both the discharge port and the processing object in the processing liquid discharging step. In this case, the processing object and the irradiated portion of the processing liquid can be connected easily via the processing liquid.

The processing object may be a second piping, through the interior of which a liquid flows, or may be a container arranged to contain an article.

The first aspect of the present invention provides a substrate processing method for processing a substrate using a processing liquid discharged from a discharge port of a processing liquid supplying apparatus and the substrate processing method includes a facing positioning step of positioning the discharge port to face a major surface of the substrate that is held by a substrate holding means, an X-ray irradiating step of irradiating X-rays onto the processing liquid present in the interior of a first piping in communication with the discharge port, and a processing liquid discharging step of making the processing liquid be discharged from the discharge port in parallel to the X-ray irradiating step, and in the processing liquid discharging step, the processing liquid is connected in liquid form between the discharge port and the major surface of the substrate.

With this method, X-rays are irradiated onto the processing liquid present inside the first piping. Also, the processing liquid discharged from the discharge port in communication with the interior of the first piping is supplied to the major surface of the substrate. In a portion of the processing liquid irradiated by the X-rays, electrons are emitted from water molecules due to excitation of the water molecules and consequently, a plasma state is formed in which positive ions of water molecules and the electrons coexist.

The processing liquid discharged from the discharge port is supplied to an upper surface of the substrate and comes in liquid contact with the upper surface of the substrate. The processing liquid discharged from the discharge port is connected in liquid form between the discharge port and the major surface of the substrate. In this case, the major surface of the substrate and the irradiated portion of the processing liquid are connected via the processing liquid.

If at this point, the substrate is positively charged, the potential difference between the irradiated portion of the processing liquid and the positively charged substrate causes the electrons from the irradiated portion of the processing liquid to move toward the processing liquid in liquid contact with the substrate along the processing liquid connected in liquid form. The processing liquid in liquid contact with the substrate is thereby made to have a large amount of electrons and static elimination of the positively charged substrate is thus achieved.

Charging of the substrate due to contact segregation with respect to processing liquid is thereby avoided. Charging of the substrate during the supplying of the processing liquid can thus be prevented.

Also, even if the substrate is positively charged from before the supplying of the processing liquid, static elimination of the processing object based on the principles described above can be performed via the processing liquid connected in liquid form. Consequently, device breakdown due to charging of the substrate can be prevented.

By the above, processing using the processing liquid can be applied to the substrate while achieving charging prevention and static elimination of the substrate.

Preferably in this case, the processing liquid discharged from the discharge port takes on a continuous flow form connected to both the discharge port and the major surface of the substrate in the processing liquid discharging step. The major surface of the substrate and the irradiated portion of the processing liquid can thus be connected easily via the processing liquid.

In the preferred embodiment of the present invention, the substrate is held in a horizontal attitude by the substrate holding means and the facing positioning step includes a step of positioning the discharge port to face an upper surface of the substrate held by the substrate holding means.

With this method, the processing liquid discharged from the liquid discharge port is supplied to the upper surface of the substrate and comes in liquid contact with the upper surface of the substrate. The processing liquid discharged from the discharge port is connected in liquid form between the discharge port and the substrate upper surface and the processing object and the irradiated portion of the processing liquid are thus connected via the processing liquid. Therefore if the upper surface of the substrate is positively charged, the potential difference between the irradiated portion of the processing liquid and the positively charged upper surface of the substrate causes the electrons from the irradiated portion of the processing liquid to move toward the processing liquid in liquid contact with the upper surface of the substrate along the processing liquid connected in liquid form. The processing liquid in liquid contact with the upper surface of the substrate is thereby made to have a large amount of electrons and static elimination of the positively charged upper surface of the substrate is thus achieved.

In another preferred embodiment of the present invention, the substrate is held in a horizontal attitude by the substrate holding means, the facing positioning step includes a step of positioning the discharge port to face a lower surface of the substrate held by the substrate holding means, and the substrate processing method further includes a substrate rotating step, which is executed in parallel to the processing liquid discharging step and by which the substrate is rotated around a predetermined vertical rotation axis, and an upper surface processing liquid supplying step of supplying the processing liquid to the upper surface of the substrate in parallel to the processing liquid discharging step and the substrate rotating step.

With this method, the processing liquid discharged from the discharge port is supplied to the lower surface of the substrate and comes in liquid contact with the lower surface of the substrate. The processing liquid in liquid contact with the lower surface of the substrate spreads to a peripheral edge portion along the lower surface of the substrate such that a liquid film of the processing liquid is formed across the entirety of the lower surface of the substrate. The processing liquid that reaches the peripheral edge portion of the lower surface of the substrate flows around a peripheral end surface of the substrate to reach a peripheral edge portion of the upper surface of the substrate.

The processing liquid is also supplied to the upper surface of the substrate. The processing liquid supplied to the substrate receives a centrifugal force due to the rotation of the substrate to spread along the upper surface of the substrate to the peripheral edge portion such that a liquid film of the processing liquid is formed across the entirety of the upper surface of the substrate. The processing liquid that flows around from the substrate lower surface side joins the liquid film of the processing liquid at the substrate upper surface side and consequently, the liquid film of the processing liquid at the substrate upper surface side and the liquid film of the processing liquid at the substrate lower surface side become connected.

Both the upper surface of the substrate and the lower surface of the substrate are thereby connected with the irradiated portion of the processing liquid via the processing liquid. Charging prevention and static elimination of both the upper and lower surfaces of the substrate can thus be achieved.

A second X-ray irradiating step, which is executed in parallel to a liquid removing processing or a drying processing executed after the end of the processing liquid discharging step and by which X-rays are irradiated onto the major surface of the substrate, may further be included.

With this method, the processing liquid is removed from the major surface of the substrate by the liquid removing processing or the drying processing. The X-rays are irradiated onto the major surface of the substrate immediately after the removal of the processing liquid. Charging prevention and static elimination of the substrate can thereby be achieved even more reliably.

A second aspect of the present invention provides a substrate processing apparatus including a substrate holding means holding a substrate, an X-ray irradiating means irradiating X-rays onto a front surface of the substrate held by the substrate holding means, a processing liquid supplying means supplying a processing liquid onto the front surface of the substrate held by the substrate holding means, and a control means controlling the X-ray irradiating means and the processing liquid supplying means so that the supplying of the processing liquid and the irradiation of X-rays onto the front surface of the substrate are performed in parallel.

With this arrangement, a liquid film of the processing liquid that is in liquid contact with the front surface of the substrate is formed on the front surface. The X-rays are irradiated onto the liquid film of the processing liquid. At a portion of the liquid film of the processing liquid that is irradiated by the X-rays, electrons are emitted from water molecules due to excitation of the water molecules and consequently, a plasma state is formed in which a large amount of electrons and a large amount of positive ions of the water molecules coexist. Therefore even if positive charges are generated at the substrate due to contact segregation with respect to the processing liquid, the electrons generated in the processing liquid by the irradiation of X-rays move via the liquid film of the processing liquid by being drawn by the positive charges generated in the substrate and act to cancel out the charges. Charging of the substrate can thereby be suppressed. Also, even if the substrate is charged from before a rinsing processing, static elimination of the charged substrate can be performed by means of the liquid film of the processing liquid that is in liquid contact with the front surface of the substrate. Consequently, device breakdown due to charging of the substrate can be prevented.

Also, the liquid properties of the processing liquid are not changed by the irradiation of the X-rays and unlike a case of processing the substrate using an acidic processing liquid, such as carbonated water, there is no possibility of causing adverse effects to the device.

In the preferred embodiment of the present invention, the X-ray irradiating means includes an X-ray generator that has an irradiating window, generates X-rays, and irradiates the generated X-rays from the irradiating window.

With this arrangement, the X-rays generated by the X-ray generator are irradiated from the irradiating window of the X-ray generator onto the front surface of the substrate.

The substrate processing apparatus further includes a cover surrounding a periphery of the X-ray generator across an interval and an opening is formed in a portion of the cover facing the irradiating window.

With this arrangement, if the atmosphere at the periphery of the X-ray generator contains a large amount of moisture, leakage of high voltage may occur when the X-rays are generated. The periphery of the X-ray generator is thus covered by the cover to prevent moisture from entering the periphery of the X-ray generator. In this case, the opening is provided in the portion of the cover facing the irradiating window and the X-rays from the irradiating window are guided to the front surface of the substrate via the opening. Moisture can thereby be suppressed from entering the atmosphere at the periphery of the X-ray generator without obstructing the irradiation of X-rays from the X-ray generator.

Preferably in this case, the substrate processing apparatus further includes a gas supplying means supplying a gas into the interior of the cover. When the opening is formed in the cover, the atmosphere outside the cover that contains a large amount of moisture may enter inside the cover via the opening.

With the present arrangement, a gas flow leading to the opening is formed in a space between the X-ray generator and the cover by the gas being supplied inside the cover. The atmosphere outside the cover can thus be suppressed or prevented from entering inside the cover via the opening. Examples of the gas supplied into the interior of the cover from the gas supplying means include CDA (clean dry air) and nitrogen gas.

The gas supplying means may supply a gas of higher temperature than ordinary temperature.

With this arrangement, the high temperature gas supplied inside the cover passes through the space between the X-ray generator and the cover and reaches an outer surface of the irradiating window. By the high temperature gas, water droplets attached to the outer surface of the irradiating window can be eliminated by evaporation and fogging of the irradiating window can thereby be suppressed or prevented.

The outer surface of the irradiating window may be coated with a coating film. The irradiating window can thereby be protected. In particular, if the irradiating window is formed of beryllium, which is poor in acid resistance, the irradiating window can be protected satisfactorily from an acidic processing liquid.

The coating film is preferably formed using a water repellant material. In this case, the precipitation of moisture in the form of a film across the entire surface of the irradiating window is prevented and the moisture is formed into minute water droplets. The water droplets attached to the outer surface of the irradiating window are in a state of being easily movable along the outer surface. The water droplets can thus be removed readily from the outer surface of the irradiating window. Fogging of the irradiating window can thereby be suppressed or prevented.

It is especially preferable for the substrate processing apparatus to include both the coating by the outer surface of the irradiating window by the coating film and the gas supplying means. The water droplets attached to the outer surface of the irradiating window are in a state of being easily movable along the outer surface and therefore the water droplets attached to the outer surface of the irradiating window move upon receiving the gas flow formed inside the space. The water droplets can thereby be removed satisfactorily from the outer surface of the irradiating window and fogging of the irradiating window can be prevented reliably.

The coating film may be a coating film of a polyimide resin.

Also, the coating film may be a coating film of diamond-like carbon.

Further, the coating film may be a coating film of an amorphous fluororesin.

Preferably, a heating member is disposed at least at one of either a periphery of the opening in the cover or the irradiating window.

With this arrangement, the periphery of the irradiating window of the X-ray generator is heated by the heating member. Water droplets attached to the outer surface of the irradiating window can thus be eliminated by evaporation and the fogging of the irradiating window can thereby be suppressed or prevented.

The substrate processing apparatus may further include a shielding member disposed to face the front surface of the substrate held by the substrate holding means and arranged to shield a space above the front surface of the substrate from a periphery thereof. The shielding member is arranged to keep the X-rays, irradiated from the irradiating window, within the space above the substrate.

With this arrangement, the X-rays, irradiated from the irradiating window, are kept within the space above the front surface of the substrate. Scattering of the X-rays, irradiated from the irradiating window, to the periphery of the substrate can thus be suppressed or prevented. Safety of the substrate processing apparatus can thereby be improved.

The shielding member may be provided to be integrally movable with the cover.

The substrate processing apparatus further includes a moving means moving the X-ray irradiating means along the front surface of the substrate held by the substrate holding means.

With this arrangement, the X-rays are irradiated from the X-ray irradiating means and the X-ray irradiating means is moved along the front surface of the substrate while the X-ray irradiating means is made to face the front surface of the substrate. The ionized processing liquid can thereby be supplied to the entirety of the front surface of the substrate. Static elimination of the substrate can thereby be performed across the entirety of the substrate.

Also, the processing liquid may be water.

The second aspect of the present invention provides a substrate processing method including a processing liquid supplying step of supplying a processing liquid onto a front surface of a substrate held by a substrate holding means, and an X-ray irradiating step of irradiating X-rays onto the front surface of the substrate, held by the substrate holding means, in parallel to the processing liquid supplying step.

With the method according to the present invention, a liquid film of the processing liquid that is in liquid contact with the front surface of the substrate is formed on the front surface. The X-rays are irradiated onto the liquid film of the processing liquid. At a portion of the liquid film of the processing liquid that is irradiated by the X-rays, electrons are emitted from water molecules due to excitation of the water molecules and consequently, a plasma state is formed in which a large amount of electrons and a large amount of positive ions of the water molecules coexist. Therefore even if positive charges are generated at the substrate due to contact segregation with respect to the processing liquid, the electrons generated in the processing liquid by the irradiation of X-rays move via the liquid film of the processing liquid by being drawn by the positive charges generated in the substrate and act to cancel out the charges. Charging of the substrate can thereby be suppressed. Also, even if the substrate is charged from before a rinsing processing, static elimination of the charged substrate can be performed by means of the liquid film of the processing liquid that is in liquid contact with the front surface of the substrate. Consequently, device breakdown due to charging of the substrate can be prevented.

A third aspect of the present invention is a processing liquid processing apparatus with which processing is performed by immersing a processing object in a processing liquid and the processing liquid processing apparatus includes a processing tank storing the processing liquid and arranged to perform immersion of the processing object in the processing liquid, and an X-ray irradiating means irradiating X-rays onto the processing liquid stored in the processing tank or onto the processing liquid present inside a piping, through the interior of which the processing liquid can flow, the interior of the piping being in communication with the interior of the processing tank.

With this arrangement, the X-rays are irradiated onto the processing liquid stored in the processing tank or the processing liquid present inside the piping, the interior of which is in communication with the interior of the processing tank. In a portion of the processing liquid irradiated by the X-rays (irradiated portion of the processing liquid), electrons are emitted from water molecules due to excitation of the water molecules and consequently, a plasma state is formed in which positive ions of water molecules and the electrons coexist.

In the case where the X-rays are irradiated onto the processing liquid stored in the processing tank, the processing object immersed in the processing liquid stored in the processing tank and the irradiated portion of the processing liquid are connected via the processing liquid stored in the processing tank. If at this point, the processing object is positively charged, the potential difference between the irradiated portion of the processing liquid and the positively charged processing object causes the electrons from the irradiated portion of the processing liquid to move toward the processing object via the processing liquid stored in the processing tank. The processing object is thereby supplied with a large amount of electrons and static elimination of the positively charged processing object is consequently achieved. On the other hand, if the processing object is negatively charged, electrons from the processing object move toward the positive ions at the irradiated portion of the processing liquid via the processing liquid stored in the processing tank. Electrons are thereby eliminated from the processing object and static elimination of the negatively charged processing object is consequently achieved.

Also, in the case where the X-rays are irradiated onto the processing liquid present inside the piping, the processing object immersed in the processing liquid stored in the processing tank and the irradiated portion of the processing liquid are connected via the processing liquid stored in the processing tank and the processing liquid inside the piping. If at this point, the processing object is positively charged, the potential difference between the irradiated portion of the processing liquid and the positively charged processing object causes the electrons from the irradiated portion of the processing liquid to move toward the processing object via the processing liquid stored in the processing tank and the processing liquid inside the piping. The processing object is thereby supplied with a large amount of electrons and static elimination of the positively charged processing object is consequently achieved. On the other hand, if the processing object is negatively charged, electrons from the processing object move toward the positive ions at the irradiated portion of the processing liquid via the processing liquid stored in the processing tank and the processing liquid inside the piping. Electrons are thereby eliminated from the processing object and static elimination of the negatively charged processing object is consequently achieved.

Also, even if the processing object is positively or negatively charged from before the immersion in the processing liquid, static elimination of the processing object based on the principles described above can be performed via the processing liquid inside the processing tank and the processing liquid inside the piping.

With the preferred embodiment of the present invention, a pipe wall of the piping or a wall of the processing tank has an opening, the opening is closed by a window member formed using a material that can transmit the X-rays, and the X-ray irradiating means irradiates the X-rays via the window member.

With this arrangement, the window member is formed using the material that can transmit the X-rays. The X-rays irradiated by the X-ray irradiating means are irradiated via the window member onto the processing liquid present inside the piping. The plasma state in which the positive ions of water molecules and the electrons coexist can thereby be formed satisfactorily in the irradiated portion of the processing liquid.

In this case, the window member may be formed using beryllium or a polyimide resin.

A substance of low atomic weight, such as beryllium, can transmit even X-rays of weak penetrability. The X-rays can thus be transmitted through the window member if the window member is formed using beryllium.

The X-rays can also be transmitted through the window member if the window member is formed using a polyimide resin. Also, a polyimide resin is excellent in chemical stability and enables use of the window member over a long period.

Also, the wall surface of the window member at the side at which the processing liquid is present is preferably hydrophilic. In this case, mixing in of air bubbles between the wall surface and the processing liquid can be suppressed or prevented. The X-rays can thereby be irradiated satisfactorily onto the processing liquid present in the piping.

Also, the wall surface of the window member at the side at which the processing liquid is present may be coated with a coating film. The irradiating window can thereby be protected. In particular, if the window member is formed of beryllium, which is poor in acid resistance, the window member can be protected satisfactorily from an acidic processing liquid.

The coating film is preferably formed using a hydrophilic material. In this case, mixing in of air bubbles between the coating film and the processing liquid can be suppressed or prevented. The X-rays can thereby be irradiated satisfactorily onto the processing liquid present in the piping.

In this case, the coating film may be a coating film that includes one or more materials among a polyimide resin, diamond-like carbon, fluororesin, and hydrocarbon resin.

The X-ray irradiating means may include an X-ray generator that has an irradiating window disposed to face the window member, generates X-rays, and irradiates the generated X-rays from the irradiating window.

With this arrangement, the X-rays generated by the X-ray generator are irradiated from the irradiating window of the X-ray generator onto the processing liquid flowing inside the piping.

The X-ray irradiating means may further include a cover surrounding a periphery of the X-ray generator across an interval from the X-ray generator and a gas supplying means supplying a gas to the interior of the cover.

With this arrangement, the X-ray generator may become heated due to the driving of the X-ray generator. By supplying the gas to the interior of the cover, the X-ray generator can be cooled to suppress temperature rise of the ambient atmosphere of the X-ray generator.

In the preferred embodiment of the present invention, the piping may include a processing liquid supplying piping, being in communication with the interior of the processing tank and arranged to supply the processing liquid into the processing tank, and the X-ray irradiating means may irradiate the X-rays onto the processing liquid flowing through the interior of the processing liquid supplying piping.

Also, with another preferred embodiment of the present invention, the processing tank may include an inner tank, storing the processing liquid and in which the processing object is immersed in the processing liquid, and an outer tank recovering the processing liquid overflowing from the inner tank, the piping may include an overflow piping, through which the processing liquid recovered in the outer tank flows, and the X-ray irradiating means may irradiate the X-rays onto the processing liquid flowing through the interior of the overflow piping.

With yet another preferred embodiment of the present invention, the processing tank may include an inner tank, storing the processing liquid and in which the processing object is immersed in the processing liquid, and an outer tank recovering the processing liquid overflowing from the inner tank, and the X-ray irradiating means may irradiate the X-rays onto the processing liquid stored in the inner tank.

With yet another preferred embodiment of the present invention, the processing tank may include an inner tank, storing the processing liquid and in which the processing object is immersed in the processing liquid, and an outer tank recovering the processing liquid overflowing from the inner tank, and the piping may include a piping, the interior of which is in communication with the interior of the inner tank.

The third aspect of the present invention is a processing liquid processing method including a processing object immersing step of immersing a processing object in a processing liquid stored in a processing tank and an X-ray irradiating step of performing, in parallel to the processing object immersing step, irradiation of X-rays onto the processing liquid stored in the processing tank or onto the processing liquid present inside a piping, through the interior of which the processing liquid can flow, the interior of the piping being in communication with the interior of the processing tank.

With this method, the X-rays are irradiated onto the processing liquid stored in the processing tank or the processing liquid present inside the piping, the interior of which is in communication with the interior of the processing tank. In a portion of the processing liquid irradiated by the X-rays (irradiated portion of the processing liquid), electrons are emitted from water molecules due to excitation of the water molecules and consequently, a plasma state is formed in which positive ions of water molecules and the electrons coexist.

In the case where the X-rays are irradiated onto the processing liquid stored in the processing tank, the processing object immersed in the processing liquid stored in the processing tank and the irradiated portion of the processing liquid are connected via the processing liquid stored in the processing tank. If at this point, the processing object is positively charged, the potential difference between the irradiated portion of the processing liquid and the positively charged processing object causes the electrons from the irradiated portion of the processing liquid to move toward the processing object via the processing liquid stored in the processing tank. The processing object is thereby supplied with a large amount of electrons and static elimination of the positively charged processing object is consequently achieved. On the other hand, if the processing object is negatively charged, electrons from the processing object move toward the positive ions at the irradiated portion of the processing liquid via the processing liquid stored in the processing tank. Electrons are thereby eliminated from the processing object and static elimination of the negatively charged processing object is consequently achieved.

Also, in the case where the X-rays are irradiated onto the processing liquid present inside the piping, the processing object immersed in the processing liquid stored in the processing tank and the irradiated portion of the processing liquid are connected via the processing liquid stored in the processing tank and the processing liquid inside the piping. If at this point, the processing object is positively charged, the potential difference between the irradiated portion of the processing liquid and the positively charged processing object causes the electrons from the irradiated portion of the processing liquid to move toward the processing object via the processing liquid stored in the processing tank and the processing liquid inside the piping. The processing object is thereby supplied with a large amount of electrons and static elimination of the positively charged processing object is consequently achieved. On the other hand, if the processing object is negatively charged, electrons from the processing object move toward the positive ions at the irradiated portion of the processing liquid via the processing liquid stored in the processing tank and the processing liquid inside the piping. Electrons are thereby eliminated from the processing object and static elimination of the negatively charged processing object is consequently achieved.

Also, even if the processing object is positively or negatively charged from before the immersion in the processing liquid, static elimination of the processing object based on the principles described above can be performed via the processing liquid inside the processing tank and the processing liquid inside the piping.

A fourth aspect of the present invention is a processing liquid processing method for processing a processing object by immersing it in a processing liquid stored in a processing tank and the processing liquid processing method includes a processing object immersing step of immersing the processing object in the processing liquid stored in the processing tank, a processing liquid discharging step of making the processing liquid be discharged from a discharge port toward the processing tank in parallel to the processing object immersing step, and an X-ray irradiating step of irradiating X-rays onto the processing liquid present in the interior of a piping in communication with the discharge port in parallel to the processing liquid discharging step, and in the processing liquid discharging step, the processing liquid is connected in liquid form between the discharge port and the liquid surface of the processing liquid stored in the processing tank.

With this method, the X-rays are irradiated onto the processing liquid present inside the piping. Also, the processing liquid discharged from the discharge port in communication with the interior of the piping is supplied to the processing object. In a portion of the processing liquid irradiated by the X-rays, electrons are emitted from water molecules due to excitation of the water molecules and consequently, a plasma state is formed in which positive ions of water molecules and the electrons coexist.

The processing liquid discharged from the discharge port is connected in liquid form with the liquid surface of the processing liquid. In this case, the processing object and the irradiated portion of the processing liquid are connected via the processing liquid.

If at this point, the processing object is positively charged, the potential difference between the irradiated portion of the processing liquid and the positively charged processing object causes the electrons from the irradiated portion of the processing liquid to move toward the processing object via the processing liquid connected in liquid form and the processing liquid stored in the processing tank. The processing object is thereby supplied with a large amount of electrons and static elimination of the positively charged processing object is consequently achieved. On the other hand, if the processing object is negatively charged, electrons from the processing object move toward the positive ions at the irradiated portion of the processing liquid via the processing liquid connected in liquid form and the processing liquid stored in the processing tank. Electrons are thereby eliminated from the processing object and static elimination of the negatively charged processing object is consequently achieved.

By the above, processing using a processing liquid can be applied to a processing object while achieving charging prevention and static elimination of the processing object.

The aforementioned and other objects, features, and effects of the present invention shall be clarified by the following description of preferred embodiments with reference to the accompanying drawings.

BRIEF DESCRIPTION OF DRAWINGS

FIG. 45A is an illustrative sectional view of the respective arrangements of a branch piping and a soft X-ray irradiating unit shown in FIG. 44.

DESCRIPTION OF EMBODIMENTS

Figure 1:
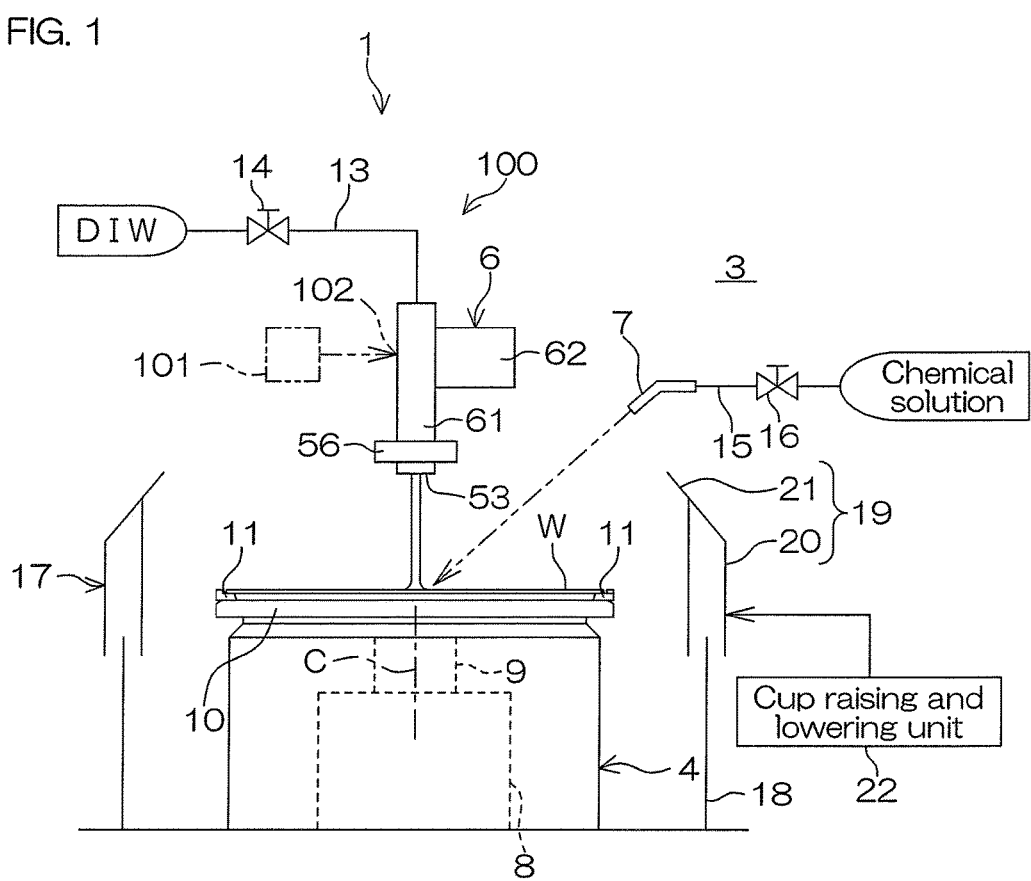
FIG. 1 is a diagram of the arrangement of a substrate processing apparatus according to a first preferred embodiment of the present invention.

FIG. 1 is a diagram of the arrangement of a substrate processing apparatus 1 according to a first preferred embodiment of the present invention.

The substrate processing apparatus 1 is a single substrate processing type apparatus that is used to perform processing using processing liquids (a chemical solution and water) on a front surface (processing surface) of a circular semiconductor wafer (silicon wafer) as an example of a substrate (processing object) W. With the present preferred embodiment, water is used for the rinsing of the substrate W that is performed after a chemical solution processing.

The substrate processing apparatus 1 includes, inside a processing chamber 3 partitioned by a partition wall (not shown), a spin chuck (substrate holding and rotating means) 4 that holds and rotates the substrate W in a horizontal attitude, a water supplying unit (processing liquid supplying apparatus) 100 arranged to supply DIW (deionized water) as an example of water to an upper surface (major surface at the upper side; front surface) of the substrate W and to irradiate soft X-rays onto the DIW before it is supplied to the substrate W, and a chemical solution nozzle 7 arranged to supply the chemical solution to the upper surface of the substrate W held by the spin chuck 4.

As the spin chuck 4, for example, that of a clamping type is adopted. Specifically, the spin chuck 4 includes a spin motor 8, a spin shaft 9 made integral to a driveshaft of the spin motor 8, a disk-shaped spin base 10 mounted substantially horizontally on an upper end of the spin shaft 9, and a plurality of clamping members 11 disposed at a plurality of locations at substantially equal intervals of a peripheral edge portion of the spin base 10. The spin chuck 4 is thereby enabled to rotate the spin base 10 by the rotational driving force of the spin motor 8 in a state where the substrate W is clamped by the plurality of clamping members 11 to rotate the substrate W, maintained in the substantially horizontal attitude, around a vertical rotation axis C together with the spin base 10.

The spin chuck 4 is not restricted to a clamping type and, for example, a vacuum suction type (vacuum chuck) arrangement that vacuum-suctions a rear surface of the substrate W to hold the substrate W in a horizontal attitude and further performs rotation around a vertical rotation axis in this state to rotate the held substrate W may be adopted instead.

The spin chuck 4 is housed inside a cup (liquid receiver member) 17. The cup 17 has a cup lower portion 18 and a cup upper portion 19 disposed above the cup lower portion 18 so as to be capable of being raised and lowered.

The cup lower portion 18 has the shape of a bottomed circular cylinder, the central axis of which matches the rotation axis C. An exhaust port (not shown) is formed in a bottom surface of the cup lower portion 18 and during operation of the substrate processing apparatus 1, the atmosphere inside the cup 17 is constantly exhausted from the exhaust port.

The cup upper portion 19 integrally includes a circular cylindrical portion 20 of circular cylindrical shape having the central axis in common with the cup lower portion 18 and an inclined portion 21 that is inclined so as become higher as the central axis of the circular cylindrical portion 20 is approached from an upper end of the circular cylindrical portion 20. A cup raising and lowering unit 22, arranged to raise and lower (move up and down) the cup upper portion 19, is coupled to the cup upper portion 19. By the cup raising and lowering unit 22, the cup upper portion 19 is moved to a position at which the circular cylindrical portion 20 is disposed at a side of the spin base 10 and a position at which the upper end of the inclined portion 21 is disposed below the spin base 10.

The cup upper portion 19 and the cup lower portion 18 are respectively formed using a resin material (for example, PTFE (polytetrafluoroethylene)).

The chemical solution nozzle 7 is, for example, a straight nozzle that discharges the chemical solution in a continuous flow state and is disposed fixedly above the spin chuck 4 in a state where a discharge port thereof is directed toward a vicinity of a rotation center of the substrate W. The chemical solution nozzle 7 is connected to a chemical solution supplying pipe 15 to which the chemical solution is supplied from a chemical solution supply source. A chemical solution valve 16 arranged to switch between supplying and stopping the supplying of the chemical solution from the chemical solution nozzle 7 is interposed in an intermediate portion of the chemical solution supplying pipe 15.

Also, the chemical solution nozzle 7 is not required to be disposed fixedly with respect to the spin chuck 4 and, for example, a so-called scan nozzle arrangement may be adopted where the nozzle is mounted on an arm capable of swinging within a horizontal plane above the cup 17 and a liquid landing position of the chemical solution on the front surface of the substrate W is scanned by the swinging of the arm.

As the chemical solution, that which is in accordance with the contents of the processing performed on the front surface of the substrate W is used. For example, when a cleaning processing for eliminating particles from the front surface of the substrate W is to be performed, APM (ammonia-hydrogen peroxide mixture), etc., is used. Also, when a cleaning processing for etching an oxide film, etc., from the front surface of the substrate W is to be performed, hydrofluoric acid, BHF (buffered HF), or TMAH (tetramethylammonium hydroxide aqueous solution), etc., is used, or when a resist peeling processing of peeling off a resist film formed on the front surface of the substrate W or a polymer eliminating processing for eliminating a resist residue remaining as a polymer on the front surface of the substrate W after resist peeling is to be performed, a resist peeling solution or a polymer eliminating solution, such as SPM (sulfuric acid/hydrogen peroxide mixture) or APM (ammonia-hydrogen peroxide mixture), is used. In a cleaning processing of eliminating a metal contaminant, hydrofluoric acid, HPM (hydrochloric acid/hydrogen peroxide mixture), or SPM (sulfuric acid/hydrogen peroxide mixture), etc., is used.

The water supplying unit 100 has an integral head 6 disposed above and so as to face the spin chuck 4. The integral head 6 integrally includes a water nozzle (processing liquid nozzle) 61 for discharging DIW as an example of water and a soft X-ray irradiating unit (X-ray irradiating means) 62 arranged to irradiate soft X-rays onto the water flowing through the interior of the water nozzle 61. The soft X-ray irradiating unit 62 is mounted onto the water nozzle 61. The water nozzle 61 is, for example, a straight nozzle that discharges a chemical solution in a continuous flow state and is disposed in a state where its discharge port 53 is directed downward. The water nozzle 61 is connected to a water supplying piping 13 to which DIW is supplied from a DIW supply source. A water valve 14 arranged to switch between supplying and stopping the supplying of the DIW from the water nozzle 61 is interposed in an intermediate portion of the water supplying piping 13. The soft X-ray irradiating unit 62 shall be described later.

Figure 2:
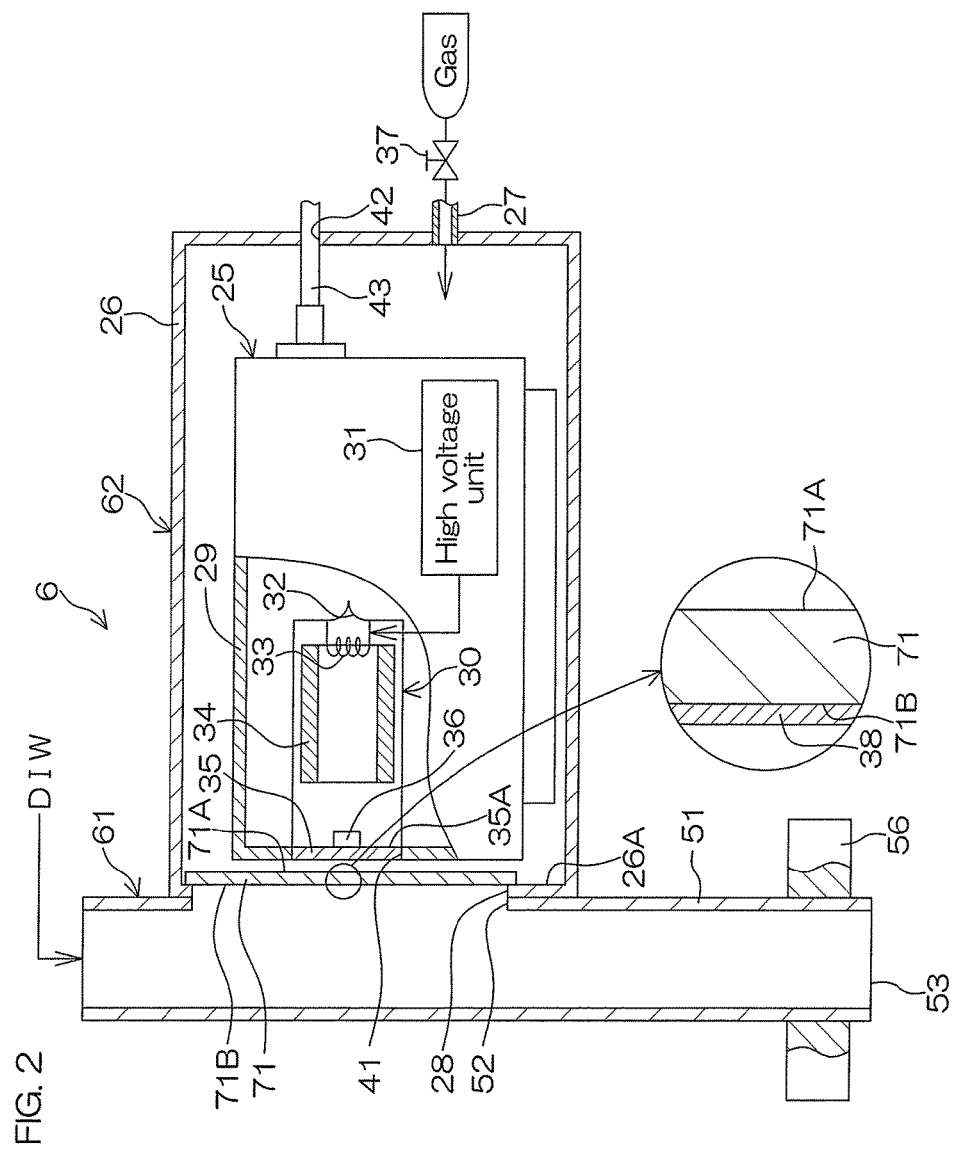
FIG. 2 is an illustrative vertical sectional view of an integral head shown in FIG. 1.

FIG. 2 is an illustrative vertical sectional view of the integral head 6.

The water nozzle 61 of the integral head 6 has a first nozzle piping 51 of round pipe shape (circular cylindrical shape) that extends in a vertical direction. The first nozzle piping 51 is formed using a resin material, such as PVC (polyvinyl chloride), PTFE (polytetrafluoroethylene), and PFA (perfluoroalkylvinyl ether tetrafluoroethylene copolymer). The round discharge port 53 is opened at a tip portion (lower end portion) of the first nozzle piping 51. A first opening 52, for example, of circular shape is formed in a pipe wall at an intermediate portion of the first nozzle piping 51. The soft X-ray irradiating unit 62 is mounted onto the first nozzle piping 51 so as to close the first opening 52. The integral head 6 is disposed fixedly above the axis C of rotation of the substrate W by the spin chuck 4 with its discharge port 53 directed downward (toward a vicinity of the rotation center of the substrate W).

A circular annular electrode 56 is externally fitted and fixed to the tip portion of the first nozzle piping 51. A voltage with respect to an apparatus ground is applied to the electrode 56 by a power supply 57 (see FIG. 3) and an electric field is thereby applied to the processing liquid passing through a vicinity of the electrode 56.

The soft X-ray irradiating unit 62 includes a soft X-ray generator (X-ray generator) 25, a cover 26 made, for example, of PVC (polyvinyl chloride) and surroundingly covering a periphery of the soft X-ray generator 25, and a gas nozzle (gas supplying means) 27, arranged to supply a gas into the interior of the cover 26, and irradiates soft X-rays laterally. The cover 26 has an oblong rectangular box shape that surrounds the periphery of the soft X-ray generator 25 across an interval from the soft X-ray generator 25 and has a second opening 28, having, for example, a circular shape and the same diameter as the first opening 52, formed in a portion of a vertical plate-shaped side wall 26A facing an irradiating window 35 to be described after the soft X-ray generator 25. The soft X-ray irradiating unit 62 is mounted onto the nozzle piping 51 so that the second opening 28 of the cover 26 is matched with the first opening 52 of the first nozzle piping 51 and the side wall 26A is closely adhered to an outer periphery of the first nozzle piping 51.

The second opening 28 is closed by a disk-shaped window member 71. The window member 71 closes the second opening 28 from the inner side of the cover 26. Not only the second opening 28 but the first opening 52 is also closed by the window member 71. As the material of the window member 71, a substance of low atomic weight is used so that the soft X-rays of weak penetrability can be transmitted readily and, for example, beryllium (Be), is adopted. The thickness of the window member 71 is set, for example, to approximately 0.3 mm.

The soft X-ray generator 25 emits (radiates) soft X-rays used to ionize the processing liquid flowing through the first nozzle piping 51. The soft X-ray generator 25 includes a case body 29, a soft X-ray tube 30 that is long in the right/left direction and arranged to generate the soft X-rays, and a high voltage unit 31 supplying a high voltage to the soft X-ray tube 30. The case body 29 has an oblong rectangular cylindrical shape, houses the soft X-ray tube 30 and the high voltage unit 31 in its interior, and is formed using a material having electrical conductivity and thermal conductivity (for example, a metal material, such as aluminum.).

The high voltage unit 31 inputs a driving voltage of high electrical potential, for example, of −9.5 kV into the soft X-ray tube 30. The high voltage unit 31 is supplied with a voltage from a power supply (not shown) via a feeder 43 led outside the cover 26 through a penetrating hole 42 formed in the cover 26.

The soft X-ray tube 30 is constituted of a vacuum tube of circular cylindrical shape made of glass or metal and is disposed so that the tube direction is horizontal. A circular opening 41 is defined by one end portion (opening end portion; left end portion shown in FIG. 2) of the soft X-ray tube 30. The other end portion (right end portion shown in FIG. 2) of the soft X-ray tube 30 is closed and constitutes a stem 32. Inside the soft X-ray tube 30, a filament 33, which is a cathode, and a target 36, which is an anode, are disposed so as to face each other. The soft X-ray tube 30 houses the filament 33 and a focusing electrode 34. Specifically, the filament 33 is disposed as the cathode at the stem 32. The filament 33 is electrically connected to the high voltage unit 31. The filament 33 is surrounded by the focusing electrode 34 of circular cylindrical shape.

The opening end portion of the soft X-ray tube 30 is closed by the plate-shaped irradiating window 35 of vertical attitude. The irradiating window 35 has, for example, a disk shape and is fixed to the wall surface at the opening end portion of the soft X-ray tube 30 by silver alloy brazing. As the material of the irradiating window 35, a substance of low atomic weight is used so that the soft X-rays of weak penetrability can be transmitted readily and, for example, beryllium (Be), is adopted. The thickness of the irradiating window 35 is set, for example, to approximately 0.3 mm. The irradiating window 35 is disposed to face an inner surface 71A of the window member 71 across a minute interval with respect to the window member 71.

The target 36 made of metal is formed by vapor deposition on an inner surface 35A of the irradiating window 35. A metal of high atomic weight and high melting point, such as tungsten (W) or tantalum (Ta), is used in the target 36.

Figure 5:
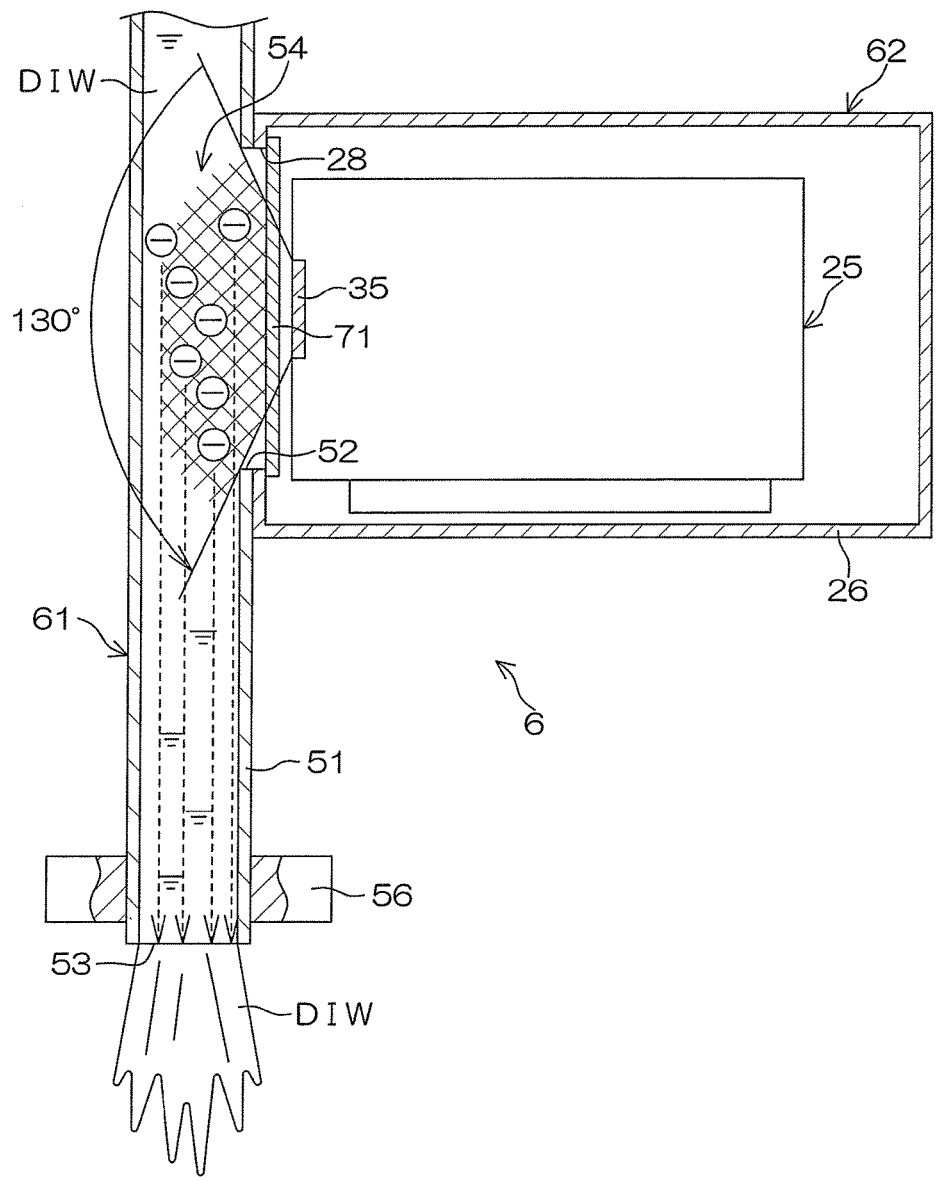
FIG. 5 is an illustrative sectional view of a state of irradiation of soft X-rays onto the interior of a water nozzle.

By application of the driving voltage from the high voltage unit 31 to the filament 33 that is the cathode, electrons are emitted from the filament 33. The electrons emitted from the filament 33 are converged and made into an electron beam by the focusing electrode 34 and generate soft X-rays upon colliding against the target 36. The generated soft X-rays are emitted (radiated) toward a lateral direction (left direction shown in FIG. 2) from the irradiating window 35 and irradiate the interior of the first nozzle piping 51 through the window member 71 and the first opening 52. The irradiation angle (irradiation range) of the soft X-rays from the irradiating window 35 is a wide angle (for example, 130°) as shown in FIG. 5. The soft X-rays irradiated from the irradiating window 35 onto the interior of the first nozzle piping 51 are, for example, 0.13 to 0.4 nm in wavelength.

The entirety of an outer surface (wall surface of the closed window at the side at which the processing liquid flows) 71B of the window member 71 is covered by a hydrophilic coating film (coating film) 38. The hydrophilic coating film 38 is, for example, a polyimide resin coating film. The outer surface 71B of the window member 71 is covered with the hydrophilic coating film 38 to protect the window member 71, which is made of beryllium that is poor in acid resistance, from an acid contained in water or other processing liquid. The film thickness of the hydrophilic coating film 38 is not more than 50 μm and is especially preferably approximately 10 μm. The hydrophilic coating film 38 has hydrophilicity and is thus capable of suppressing or preventing the mixing in of air bubbles between the coating film 38 and DIW. The soft X-rays from the irradiating window 35 can thereby be irradiated satisfactorily onto the DIW flowing through the first nozzle piping 51.

A discharge port of the gas nozzle 27 is opened in a side wall of the cover 26. A gas from a gas supply source (not shown) is supplied to the gas nozzle 27 via a gas valve (gas supplying means) 37. As examples of the gas discharged by the gas nozzle 27, an inert gas such as CDA (clean dry air), nitrogen gas, can be cited. The gas discharged from the gas nozzle 27 is supplied to the interior of the cover 26. Although heat may be generated by the soft X-ray generator 25 due to driving of the soft X-ray generator 25, the soft X-ray generator 25 can be cooled and temperature rise of the ambient atmosphere of the soft X-ray generator 25 can be suppressed by supplying the gas into the interior of the cover 26.

Figure 3:
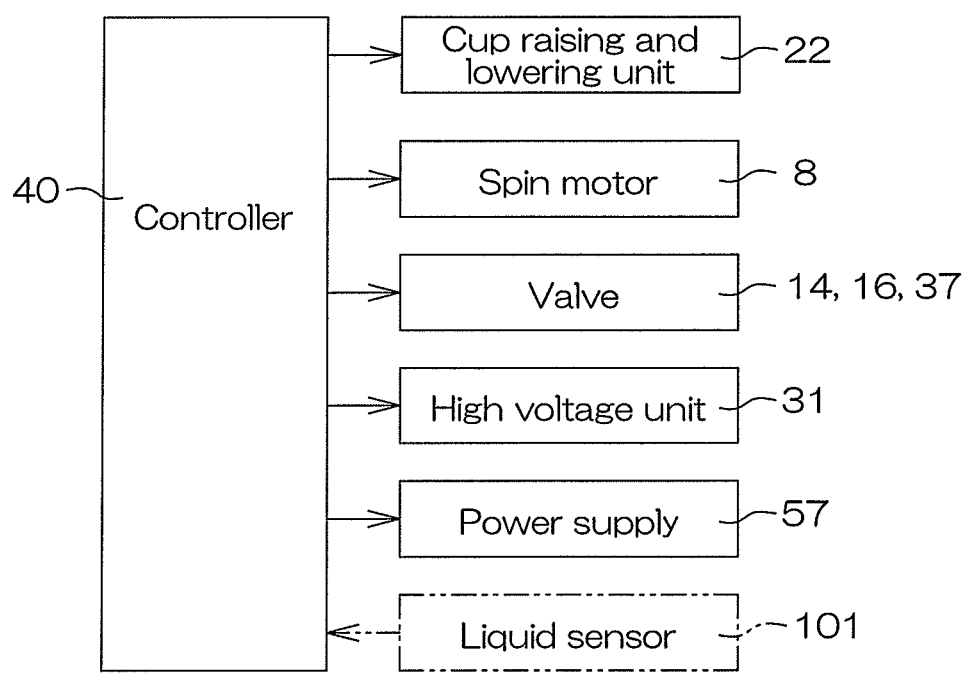
FIG. 3 is a block diagram of the electrical arrangement of the substrate processing apparatus shown in FIG. 1.

FIG. 3 is a block diagram of the electrical arrangement of the substrate processing apparatus 1. The substrate processing apparatus 1 further includes a controller (X-ray irradiation control means) 40 with an arrangement that includes a microcomputer. The cup raising and lowering unit 22, the spin motor 8, the high voltage unit 31, the chemical solution valve 16, the water valve 14, the power supply 57, the gas valve 37, etc., are connected as control objects to the controller 40.

To release the heat inside the cover 26, the gas valve 37 is constantly opened while the power of the substrate processing apparatus 1 is turned on.

Figure 4:
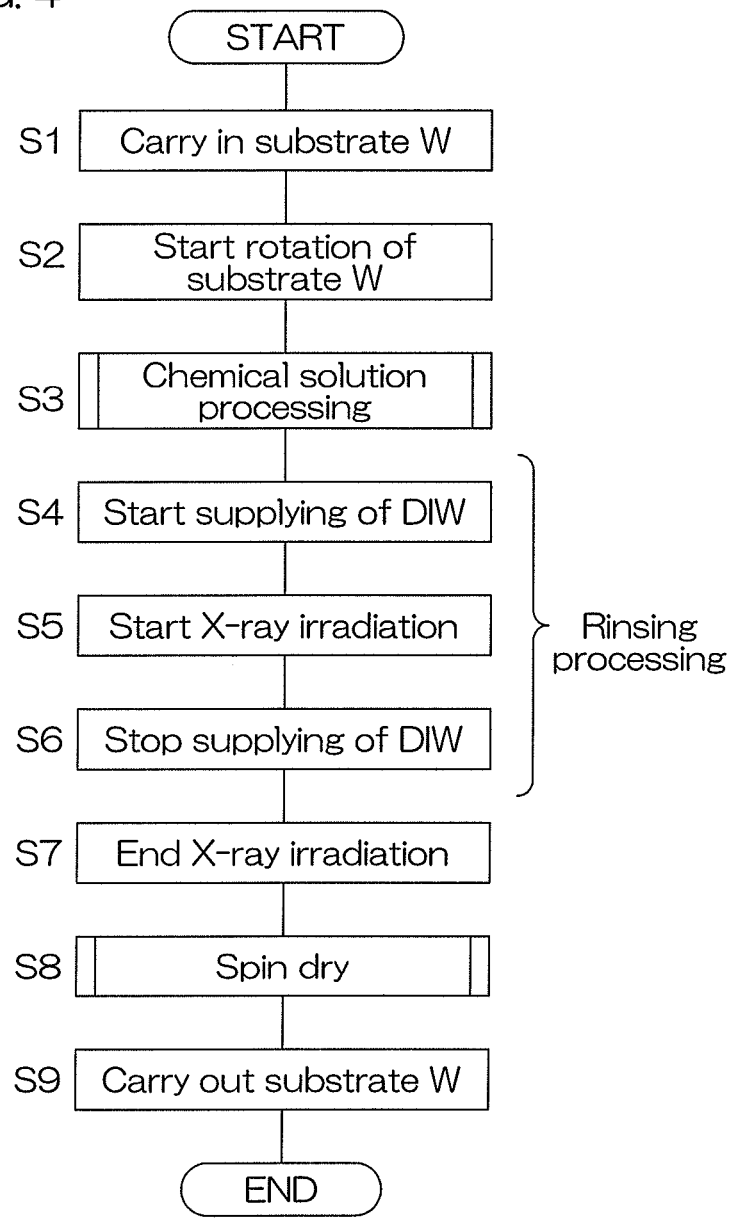
FIG. 4 is a process diagram of a processing example executed in the substrate processing apparatus shown in FIG. 1.

FIG. 4 is a process diagram of a processing example executed on the substrate W in the substrate processing apparatus 1. In this processing example, a rinsing processing is executed after execution of a chemical solution processing. The processing of the substrate W in the substrate processing apparatus 1 shall now be described with reference to FIG. 1, FIG. 3, and FIG. 4.

In the processing of the substrate W, the unprocessed substrate W is carried inside the processing chamber 3 by a transfer robot (not shown) (step S1) and is transferred with its front surface facing upward onto the spin chuck 4.

After the substrate W is held by the spin chuck 4, the controller 40 controls the spin motor 8 to start rotation of the substrate W by the spin chuck 4 (step S2). The rotation speed of the substrate W is increased to a predetermined liquid processing speed (for example, 500 rpm) and is thereafter maintained at the liquid processing speed.

When the rotation speed of the substrate W reaches the liquid processing speed, the controller 40 opens the chemical solution valve 16 to make the chemical solution be discharged from the chemical solution nozzle 7 toward the rotation center of the upper surface of the substrate W. The chemical solution supplied to the upper surface of the substrate upper surface W flows toward a peripheral edge of the substrate W upon receiving the centrifugal force due to the rotation of the substrate W (spreads across the entirety of the substrate W). Processing by the chemical solution is thereby applied to the entire front surface of the substrate W (S3: chemical solution processing).

When a predetermined chemical solution processing time elapses from the start of supplying of the chemical solution, the controller 40 closes the chemical solution valve 16 to stop the supplying of the chemical solution from the chemical solution nozzle 7.

Also, the controller 40 opens the water valve 14 to make DIW be discharged from the water nozzle 61 of the integral head 6 toward the rotation center of the upper surface of the substrate W in the rotating state (step S4).

A soft X-ray irradiation timing arrives when a predetermined time (for example, 2 seconds) elapses from the opening of the water valve 14. The predetermined time is set so that the irradiation of the soft X-rays is started when the interior of the first nozzle piping 51 is sufficiently filled with DIW. When the soft X-ray irradiation timing arrives, the controller 40 controls the high voltage unit 31 to make the soft X-ray generator 25 of the soft X-ray irradiating unit 62 generate the soft X-rays so that the soft X-rays are irradiated from the irradiating window 35 toward the interior of the first nozzle piping 51 via the window member 71 (step S5). The soft X-rays are thereby irradiated onto the DIW flowing through the interior of the first nozzle piping 51.

FIG. 5 is an illustrative sectional view of a state of irradiation of the soft X-rays onto the interior of the water nozzle 61.

During the rinsing processing, the DIW flowing through the interior of the first nozzle piping 51 of the water nozzle 61 is irradiated with the soft X-rays. Also, the processing liquid discharged from the discharge port 53 is supplied to the upper surface of the substrate W. At a portion of DIW inside the first nozzle piping 51 irradiated with the soft X-rays (the portion inside the first nozzle piping 51 facing the first opening 52; the hatched portion shown in FIG. 5; hereinafter referred to as the "irradiated portion 54 of DIW"), electrons are emitted from water molecules due to excitation of the water molecules. Consequently, a plasma state, in which a large amount of the electrons and a large amount of positive ions of water molecules coexist, is formed in the irradiated portion 54 of DIW.

Figure 6:
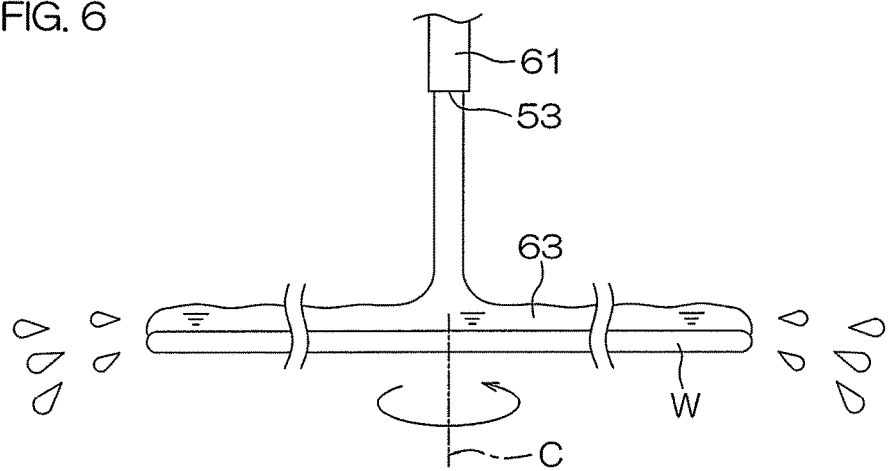
FIG. 6 is a diagram of a state where a rinsing processing is performed on a substrate.

FIG. 6 is a diagram of a state where the rinsing process is performed on the substrate W.

The DIW supplied to the upper surface of the substrate W receives a centrifugal force due to the rotation of the substrate W and flows toward a peripheral edge portion of the substrate W (spreads across the entirety of the substrate W). A liquid film 63 of DIW in liquid contact with the upper surface is thereby formed across the entire upper surface of the substrate W. The chemical solution attached to the upper surface of the substrate W is rinsed off by the liquid film 63 of DIW.

The supply flow rate of DIW with respect to the water nozzle 61 during the rinsing processing is set to a comparatively high flow rate (for example, 0.5 to 2.0 L/min). The form of DIW discharged from the discharge port 53 of the water nozzle 61 is thus the form of a continuous flow connected to both the discharge port 53 and the liquid film 63 of DIW on the upper surface of the substrate W and also, the DIW is in a liquid-tight state inside the first nozzle piping 51. At this point, the liquid film 63 of DIW and the irradiated portion 54 of DIW are connected via the DIW.

As shown in FIG. 5 and FIG. 6, if the substrate W is positively charged, the potential difference between the irradiated portion 54 of DIW and the positively charged substrate W causes the electrons from the irradiated portion 54 of DIW to move along the DIW of continuous flow form toward the liquid film 63 of DIW on the upper surface of the substrate W. The liquid film 63 of DIW on the upper surface of the substrate W is thereby made to have a large amount of electrons and static elimination of the positively charged substrate W is thus achieved.

By the above, even if DIW is supplied to the substrate W in the rotating state, charging of the substrate due to contact segregation with respect to the processing liquid does not occur. Charging of the substrate W during the rinsing processing can thus be prevented. Also, even if the substrate W is charged from before the rinsing processing, the charges carried by the substrate W can be eliminated (that is, static elimination can be achieved). Consequently, device breakdown due to charging of the substrate W can be prevented.

By the above, the rinsing processing can be applied to the substrate W while achieving charging prevention or static elimination of the substrate W.

Also, the liquid properties of the DIW are not changed by the irradiation of the soft X-rays and unlike a case of processing the substrate W using an acidic processing liquid, such as carbonated water, there is no possibility of causing adverse effects to the device on the substrate W.

Also, in parallel to the irradiation of soft X-rays by the soft X-ray irradiating unit 62, application to the electrode 56 of the power supply 57 is performed. In this case, the electrode 56 is preferably charged with positive charges. In this case, the electrons generated in the irradiated portion 54 of DIW by the irradiation of the soft X-rays are drawn toward the electrode 56 by the positive charges at the electrode 56 and move to the tip portion of the first nozzle piping 51 (water nozzle 61) at which the electrode 56 is disposed. That is, a large amount of electrons can be drawn toward the discharge port 53 of the water nozzle 61. Movement of electrons toward the substrate W can thereby be promoted.

As shown in FIG. 1, FIG. 3, and FIG. 4, when a predetermined rinsing time elapses from the start of supplying of DIW, the controller 40 closes the water valve 14 to stop the supplying of DIW (step S6) and controls the high voltage unit 31 to stop the irradiation of soft X-rays from the irradiating window 35 of the soft X-ray irradiating unit 62 (step S7). Also in accompaniment with the stoppage of irradiation of soft X-rays from the soft X-ray irradiating unit 62, the controller 40 stops the application of electric field to the electrode 56.

Thereafter, the controller 40 controls the spin motor 8 to raise the rotation speed of the substrate W to a spin drying rotation speed (for example of 2500 rpm). The DIW attached to the upper surface of the substrate W after the rinsing processing is thereby spun off by a centrifugal force and drying is achieved (S8: spin drying (drying processing)).

After the spin drying has been performed for a predetermined drying time, the rotation of the spin chuck 4 is stopped. Thereafter, the processed substrate W is carried out of the processing chamber 3 by the transfer robot (not shown) (step S9).

By the above arrangement, with the first preferred embodiment, the DIW flowing through the interior of the first nozzle piping 51 of the water nozzle 61 is irradiated with the soft X-rays. The plasma state, in which a large amount of the electrons and a large amount of the positive ions of water molecules coexist, is thereby formed in the irradiated portion 54 of DIW. These electrons move along the DIW of continuous flow form to the liquid film 63 of DIW and consequently, the liquid film 63 of DIW is made to have a large amount of electrons. Therefore, even if DIW is supplied to the substrate W in the rotating state, charging of the substrate W due to contact segregation with respect to the DIW does not occur. Charging of the substrate W during the rinsing processing can thus be prevented. Also, even if the substrate W is charged from before the rinsing processing, the charges carried by the substrate W can be eliminated (that is, static elimination can be achieved). Consequently, device breakdown due to charging of the substrate W can be prevented.

Also, the liquid properties of the DIW are not changed by the irradiation of the soft X-rays and unlike a case of processing the substrate W using an acidic processing liquid, such as carbonated water, there is no possibility of causing adverse effects to the device on the substrate W.

Figure 7:
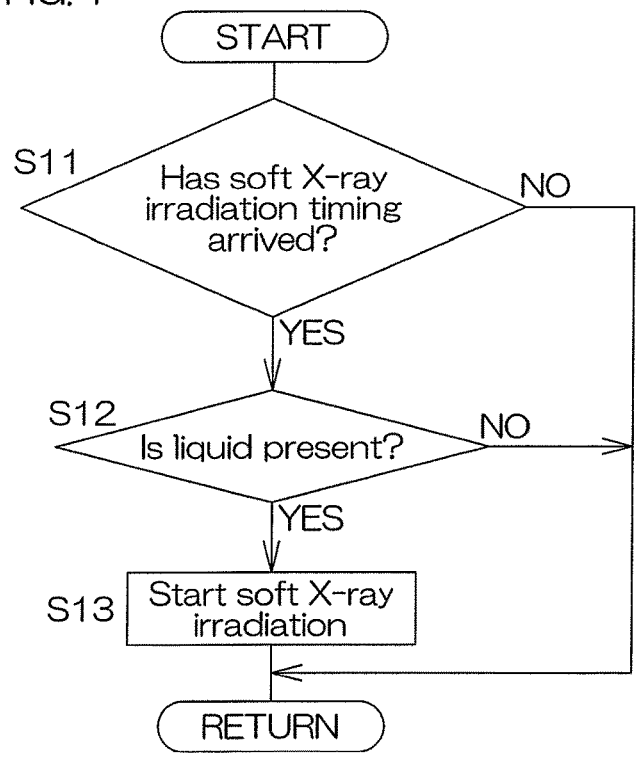
FIG. 7 is a flowchart for describing a modification example of the processing example shown in FIG. 4.

FIG. 7 is a flowchart for describing a modification example of the processing example shown in FIG. 4.

With the modification example shown in FIG. 7, when the soft X-ray irradiation timing arrives, the irradiation of soft X-rays by the soft X-ray irradiating unit 62 is executed if DIW is present near the first opening 52 of the first nozzle piping 51 and the irradiation of soft X-rays by the soft X-ray irradiating unit 62 is not executed if DIW is not present near the first opening 52 of the first nozzle piping 51. This shall now be described specifically.

As indicated by alternate long and two short dashed lines in FIG. 1, with the water supplying unit 100, a liquid detection sensor (processing liquid detecting means) 101, arranged to detect the presence or non-presence of DIW inside the first nozzle piping 51 at a predetermined water detection position 102, is disposed in the first nozzle piping 51 of the water nozzle 61. In regard to the direction of flow through the first nozzle piping 51, the water detection position 102 is set at the same position as the first opening (opening; soft X-ray irradiation position) 52 (see FIG. 2) or a position close to the first opening 52.

The liquid detection sensor 101 is arranged, for example, from a capacitive sensor and disposed by being directly attached to or disposed proximally to an outer peripheral wall (not shown) of the first nozzle piping 51. The liquid detection sensor 101 detects the presence or non-presence of DIW inside the first nozzle piping 51 at a periphery of the water detection position 102 and outputs a signal corresponding to the detection result. If DIW is present near the first opening 52 of the first nozzle piping 51, DIW is detected, and on the other hand, if DIW is not present near the first opening 52 of the first nozzle piping 51, DIW is not detected.

Also, as the liquid detection sensor 101, an optical type (for example, an arrangement combining a light emitting diode and a light receiving element and making use of a refractive index difference between gas and liquid) sensor or a conductivity sensor may be adopted.

When the soft X-ray irradiation timing arrives (YES at step S11), the controller 40 references the detection output of the liquid detection sensor 101 to check whether or not DIW is present or not present (whether there is liquid or there is no liquid) near the first opening 52 (step S12). If DIW is present near the first opening 52 (YES in step S12), the controller 40 starts the X-ray irradiation by the soft X-ray irradiating unit 62 (step S13). On the other hand, if DIW is not present near the first opening 52 (NO in step S12) or the soft X-ray irradiation timing has not arrived (NO in step S11), a return is thereafter performed in the processing of FIG. 7 without the X-ray irradiation by the soft X-ray irradiating unit 62 being started.

In this case, the irradiation of soft X-rays onto the first opening 52 is prohibited if DIW is not present near the first opening 52. Leakage of soft X-rays to the exterior of the first nozzle piping 51 can thereby be suppressed or prevented.

The liquid detection sensor 101 may also be adopted in water supplying units 230, 250, and 600 (see FIGS. 15A and 15B, FIG. 16, and FIG. 28) in which arrangements equivalent to the water supplying unit 100 are adopted. In this case, the processing shown in FIG. 7 can be executed.

Figure 8:
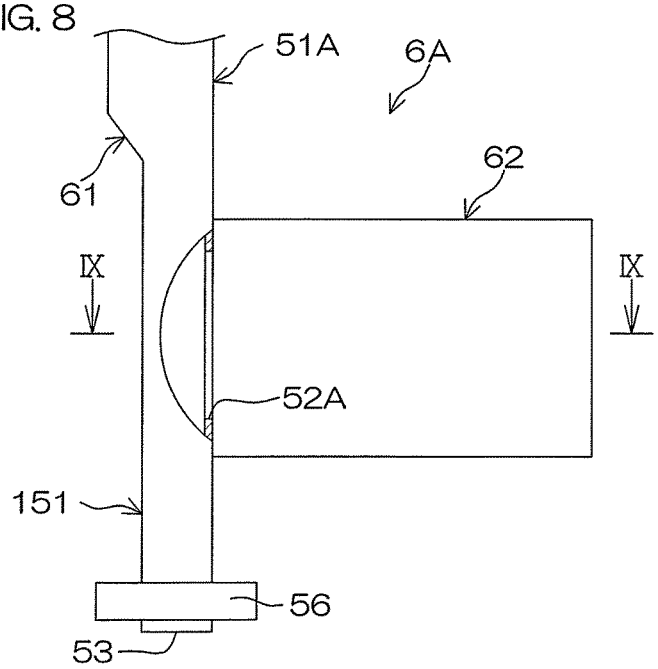
FIG. 8 is a schematic diagram of the arrangement of an integral head according to a second preferred embodiment of the present invention.
Figure 9:
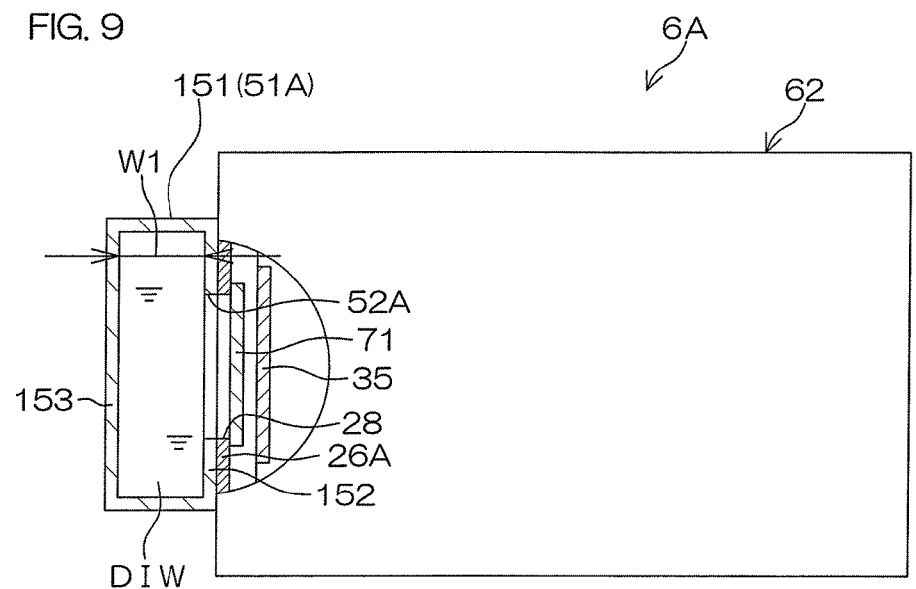
FIG. 9 is a sectional view taken along section line IX-IX in FIG. 8.

FIG. 8 is a schematic diagram of the arrangement of an integral head 6A according to a second preferred embodiment of the present invention. FIG. 9 is a sectional view taken along section line IX-IX in FIG. 8.

Portions of the integral head 6A that are in common to the integral head 6 according to the first preferred embodiment are provided with the same reference symbols as in FIG. 1 to FIG. 6 and description thereof shall be omitted. A main point of difference of the integral head 6A with respect to the integral head 6 is that a first nozzle piping 51A with a tip portion of flat shape is used in the water nozzle 61. A region of the first nozzle piping 51A besides the tip portion has the same round tube shape (circular cylindrical shape) as the first nozzle piping 51. As with the first nozzle piping 51, the first nozzle piping 51A extends in a vertical direction and is formed using a resin material, such as PVC (polyvinyl chloride), PTFE (polytetrafluoroethylene), and PFA (perfluoroalkylvinyl ether tetrafluoroethylene copolymer).

A flat portion 151 with a cross section of substantially oblong shape is formed at the tip portion of the first nozzle piping 51A. The flat portion 151 is formed by deforming a round pipe by thermoforming. A width W1 between a pair of flat wall portions 152 and 153 is set, for example, to approximately 5 to 10 mm. In the flat wall portion 152 at one side, a third opening (opening; X-ray irradiation position) 52A, for example, of circular shape is formed at an intermediate portion of the first nozzle piping 51A. The soft X-ray irradiating unit 62 is mounted onto the first nozzle piping 51A so as to close the third opening 52A. Specifically, the soft X-ray irradiating unit 62 is mounted onto the first nozzle piping 51A so that the second opening 28 of a cover 26A is matched with the third opening 52A of the first nozzle piping 51A and a side wall 26A is closely adhered to an outer periphery of the first nozzle piping 51A.

The width W1 of the flat portion 151 is set to a width such that in a state where the flat portion 151 is filled with DIW, the soft X-rays irradiated from the irradiating window 35 of the soft X-ray irradiating unit 62 reach the other flat wall portion 153. The soft X-rays from the soft X-ray irradiating unit 62 are thus irradiated onto all of the DIW flowing through the flat portion 151 of the first nozzle piping 51A. The irradiation portion 54 of DIW can thereby be maintained to be of a wide range so that the amount of electrons contained in the liquid film 63 of DIW on the upper surface of the substrate W can be increased further. The charging of the substrate W due to contact segregation with respect to DIW can thereby be suppressed more reliably, and static elimination of the substrate W can be achieved more reliably even if the substrate W is charged from before the rinsing processing.

Figure 10A:
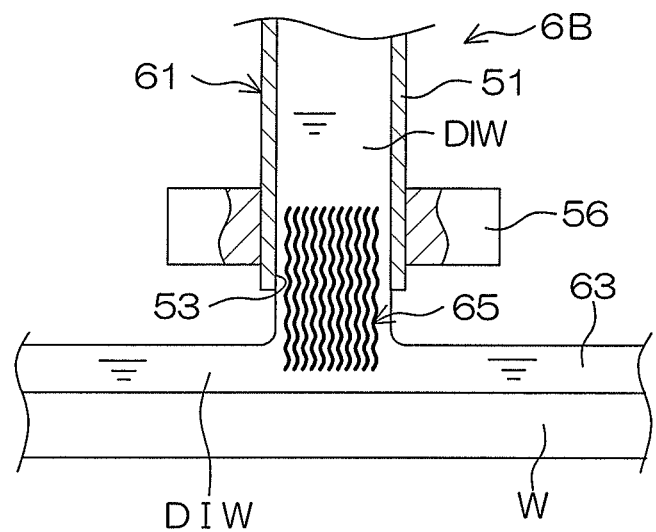
FIGS. 10A and 10B are diagrams showing the arrangement of an integral head according to a third preferred embodiment of the present invention.
Figure 10B:
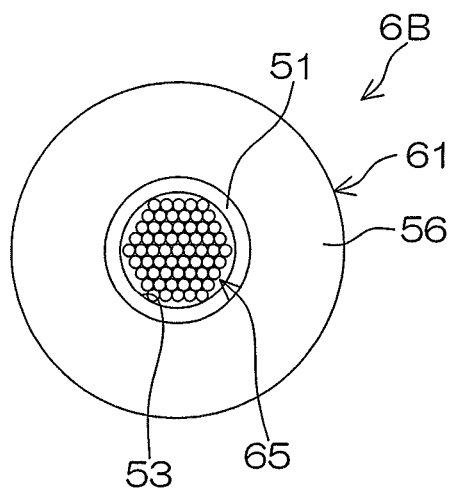

FIGS. 10A and 10B are diagrams showing the arrangement of an integral head 6B according to a third preferred embodiment of the present invention. FIG. 10A is a sectional view of principal portions of the integral head 6B during the rinsing processing and FIG. 10B is a view as viewed from a lower side of FIG. 10A.

With the integral head 6B, a fiber bundle (fibrous substance) 65, arranged by bundling together numerous string-form fibers, is mounted onto the discharge port 53 of the first nozzle piping 51 of the water nozzle 61. The fiber bundle 65 has a round columnar shape with a central axis extending along a longitudinal direction of the first nozzle piping 51. A length of projection of the fiber bundle 65 from the discharge port 53 of the first nozzle piping 51 is set to be approximately equal to an interval between the substrate W held by the spin chuck 4 and the discharge port 53.

During the rinsing processing, the DIW discharged from the discharge port 53 of the first nozzle piping 51 flows downward along the numerous fibers included in the fiber bundle 65. A tip of the fiber bundle 65 contacts the liquid film 63 of DIW formed on the upper surface of the substrate W and is adrift in the liquid film 63. The fiber bundle 65 guides the DIW satisfactorily from the discharge port 53 to the liquid film 63 of DIW and therefore the form of the DIW discharged from the discharge port 53 can be maintained readily in a continuous flow form connected to both the discharge port 53 and the liquid film 63 of DIW.

Even if the discharge flow rate of DIW from the discharge port 53 is a low flow rate, the form of the DIW discharged from the discharge port 53 can be maintained in the continuous flow form. Charging prevention of the substrate W and static elimination of the substrate W can thereby be achieved while reducing the consumption amount of DIW. During the rinsing processing, the tip of the fiber bundle 65 may be in contact not only with the liquid film 63 but also with the upper surface of the substrate W.

The fiber bundle 65 may also be provided at a tip portion of the first nozzle piping 51A (see FIG. 8). The fiber bundle 65 may also be provided at a tip portion of the first nozzle piping 51 in each of the water supplying units 230, 250, and 600 (see FIGS. 15A and 15B, FIG. 16, and FIG. 28) in which arrangements equivalent to the water supplying unit 100 are adopted.

Also, although with the third preferred embodiment, the fiber bundle 65, arranged by bundling together numerous string-form fibers, was described as an example of the fibrous substance mounted onto the discharge port 53 of the first nozzle piping 51 of the water nozzle 61, the fibrous substance is not restricted to that which is arranged by bundling together numerous string-form fibers and may be arranged from a single, thick string-form fiber or may be arranged from fibers of fabric form instead of string form.

Figure 11:
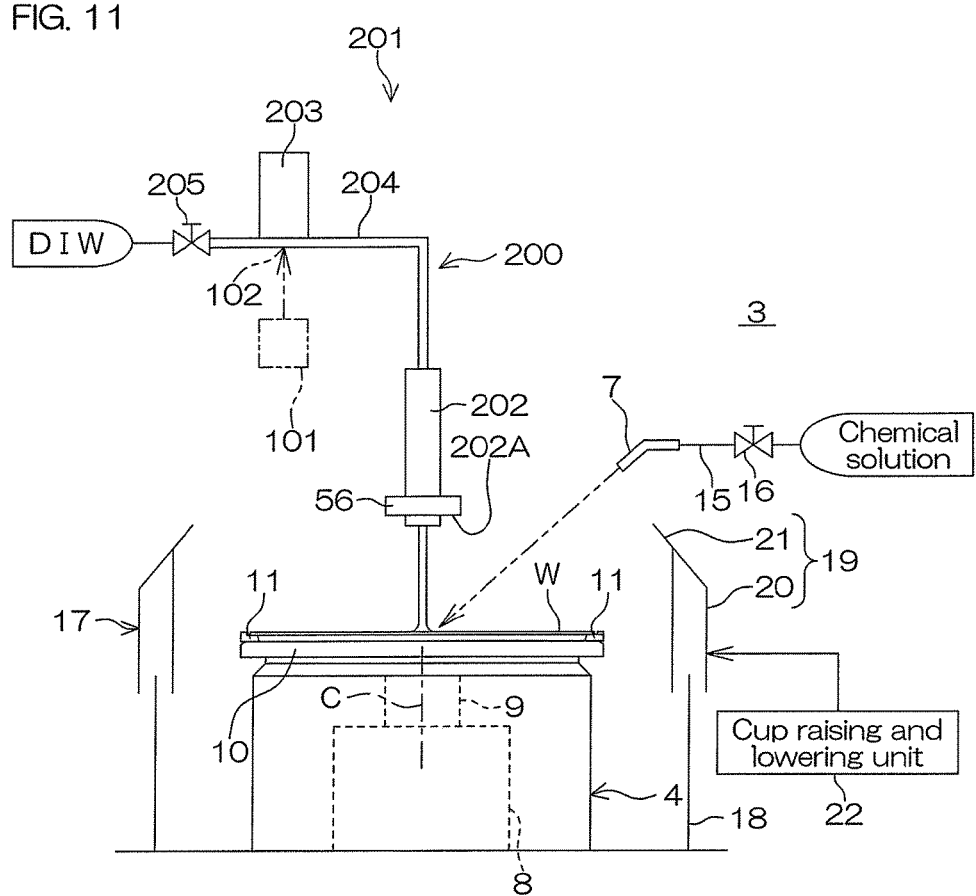
FIG. 11 is a diagram of the arrangement of a substrate processing apparatus according to a fourth preferred embodiment of the present invention.

FIG. 11 is a diagram of the arrangement of substrate processing apparatus 201 according to a fourth preferred embodiment of the present invention.

With the fourth preferred embodiment, portions that are in common to the first preferred embodiment are provided with the same reference symbols as in FIG. 1 to FIG. 6 and description thereof shall be omitted. With the substrate processing apparatus 201, a water supplying unit (processing liquid supplying apparatus) 200, with which a nozzle and a soft X-ray irradiating unit are provided separately, is provided in place of the water supplying unit 100 (see FIG. 1) according to the first preferred embodiment.

The water supplying unit 200 includes a water nozzle 202, a water supplying piping (processing liquid supplying piping) 204 supplying DIW (example of water) from a DIW supply source to the water nozzle 202, and a soft X-ray irradiating unit (X-ray irradiating means) 203 arranged to irradiate soft X-rays onto the DIW present inside the water supplying piping 204. The soft X-ray irradiating unit 203 is mounted onto the water supplying piping 204.

The water nozzle 202 has a nozzle piping of round pipe shape (circular cylindrical shape) and is mounted onto a tip of the water supplying piping 204. The water nozzle 202 is constituted of a straight nozzle that discharges liquid in a continuous flow state and is disposed fixedly inside the processing chamber 3 in a state where a discharge port 202A thereof is directed toward an upper surface central portion of the substrate W. With the exception that the first opening 52 (see FIG. 2) is not formed, an arrangement equivalent to that of the water nozzle 61 (see FIG. 2) according to the first preferred embodiment is adopted in the water nozzle 202. That is, the circular annular electrode 56 is externally fitted and fixed to the tip portion of the nozzle piping of the water nozzle 202, and a voltage with respect to an apparatus ground is arranged to be applied to the electrode 56 by the power supply 57 (see FIG. 3).

The water supplying piping 204 has a round pipe shape (circular cylindrical shape). The water supplying piping 204 is formed using a resin material, such as PVC (polyvinyl chloride), PTFE (polytetrafluoroethylene), and PFA (perfluoroalkylvinyl ether tetrafluoroethylene copolymer). An opening (not shown) is formed in a pipe wall at an intermediate portion of the water supplying piping 204.

The soft X-ray irradiating unit 203 adopts an arrangement equivalent to the soft X-ray irradiating unit 62 (see FIG. 2) according to the first preferred embodiment. The soft X-ray irradiating unit 203 is mounted onto the water supplying piping 204 so as to close the opening in the water supplying piping 204. Specifically, an opening in the cover of the soft X-ray irradiating unit 203 (an opening corresponding to the second opening 28 (see FIG. 2) in the cover 26 of the soft X-ray irradiating unit 62) is matched with the opening in the water supplying piping 204 and a wall surface of the cover of the soft X-ray irradiating unit 203 (corresponding to the side wall 26A (see FIG. 2) of the cover 26 of the soft X-ray irradiating unit 62) is closely adhered to the outer periphery of the water supplying piping 204. A high voltage unit of the soft X-ray irradiating unit 203 (corresponding to the high voltage unit 31 (see FIG. 2) of the soft X-ray irradiating unit 62 according to the first preferred embodiment) is connected to the controller 40 (see FIG. 3).

A water valve 205 arranged to open and close the water supplying piping 204 is interposed in the water supplying piping 204. When the water valve 205 is opened, DIW is supplied from the water supplying piping 204 to the water nozzle 202, and when the water valve 205 is closed, the supply of DIW from the water supplying piping 204 to the water nozzle 202 is stopped. The water valve 205 is connected to the controller 40 (see FIG. 3).

With the substrate processing apparatus 201, the same processing as that of the processing example shown in FIG. 4 is performed, and in the rinsing processing (steps S4 to S6 of FIG. 4), the controller 40 (see FIG. 3) opens the water valve 205. The DIW flowing through the water supplying piping 204 is thereby supplied to the water nozzle 202. DIW is discharged from the discharge port 202A of the water nozzle 202 toward the rotation center of the upper surface of the substrate W that is in the rotating state.

When the predetermined time from the opening of the water valve 205 elapses and the soft X-ray irradiation timing arrives, the controller 40 controls the high voltage unit of the soft X-ray irradiating unit 203 to make the soft X-ray generator of the soft X-ray irradiating unit 203 (corresponding to the soft X-ray generator 25 (see FIG. 2) of the soft X-ray irradiating unit 62 according to the first preferred embodiment) generate the soft X-rays so that the soft X-rays are irradiated toward the interior of the water supplying piping 204. The soft X-rays are thereby irradiated onto the DIW flowing through the interior of the water supplying piping 204.

The DIW supplied to the upper surface of the substrate W receives the centrifugal force due to the rotation of the substrate W and flows toward the peripheral edge of the substrate W (spreads across the entirety of the substrate W). A liquid film of DIW is thereby formed across the entire upper surface of the substrate W. The chemical solution attached to the upper surface of the substrate W is rinsed off by the liquid film of DIW.

The supply flow rate of DIW with respect to the water nozzle 202 during the rinsing processing is set to a comparatively high flow rate (for example, 0.5 to 2.0 L/min). The form of DIW discharged from the discharge port 202A of the water nozzle 202 is thus the form of a continuous flow connected to both the discharge port 202A and the liquid film of DIW on the upper surface of the substrate W. Also, the DIW is in a liquid-tight state inside the nozzle piping of the water nozzle 202 and inside the water supplying piping 204.

When during the rinsing processing, the DIW flowing through the interior of the water supplying piping 204 is irradiated with the soft X-rays, electrons are emitted from water molecules due to excitation of the water molecules in the irradiated portion of DIW inside the water supplying piping 204 (the portion equivalent to the irradiated portion 54 of DIW according to the first preferred embodiment shown in FIG. 5). Consequently, a plasma state, in which a large amount of the electrons and a large amount of positive ions of water molecules coexist, is formed in the irradiated portion of DIW inside the water supplying piping 204. The irradiated portion of DIW is connected via DIW to the liquid film of DIW formed on the upper surface of the substrate W.

If the substrate W is positively charged, the potential difference between the irradiated portion of DIW inside the water supplying piping 204 and the positively charged substrate W causes the electrons from the irradiated portion of DIW inside the water supplying piping 204 to move along the DIW of continuous flow form toward the liquid film of DIW on the upper surface of the substrate W. The liquid film of DIW on the upper surface of the substrate W is thereby made to have a large amount of electrons.

By the above, actions and effects equivalent to those described for the first preferred embodiment are also exhibited by the fourth preferred embodiment.

Figure 12:
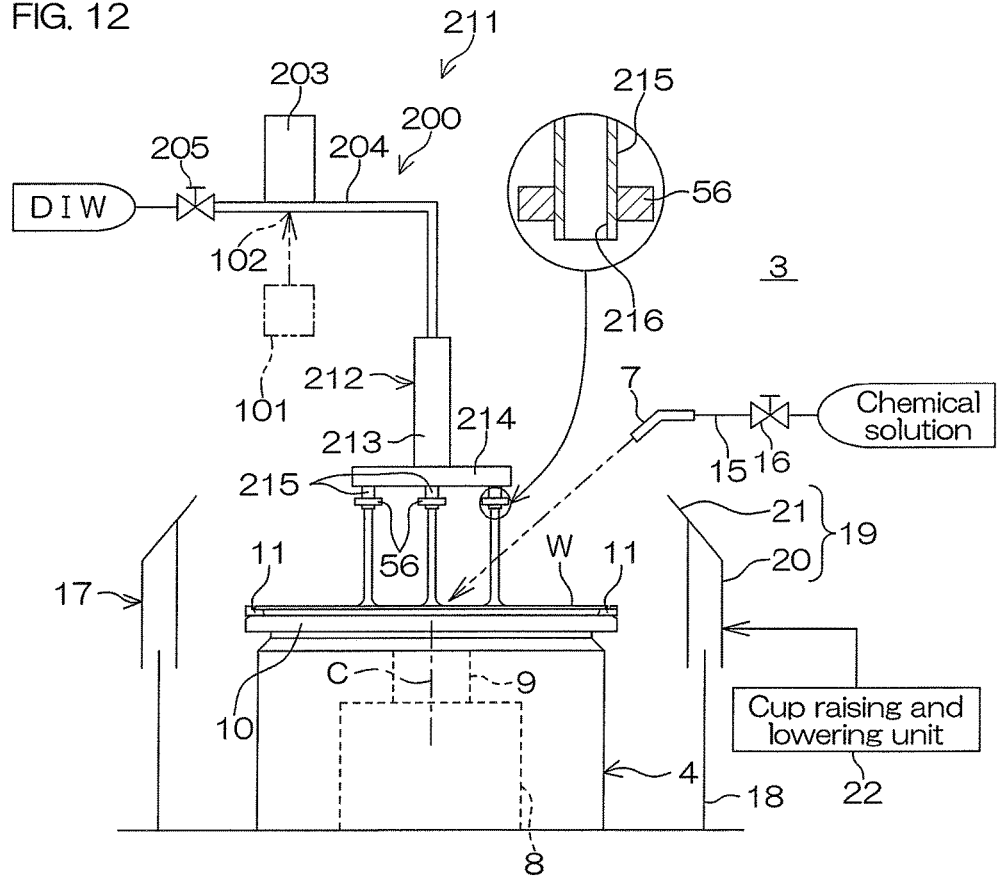
FIG. 12 is a diagram of the arrangement of a substrate processing apparatus according to a fifth preferred embodiment of the present invention.

FIG. 12 is a diagram of the arrangement of a substrate processing apparatus 211 according to a fifth preferred embodiment of the present invention.

Portions of the substrate processing apparatus 211 that are in common to the substrate processing apparatus 201 according to the fourth preferred embodiment are provided with the same reference symbols as in FIG. 11 and description thereof shall be omitted. A point of difference of the substrate processing apparatus 211 with respect to the substrate processing apparatus 201 is that a water nozzle 212 having a plurality of discharge ports 216 is provided in place of the water nozzle 202 (see FIG. 11).

The water nozzle 212 includes a main body portion 213 constituted of a nozzle piping of round pipe shape (circular cylindrical shape), a plurality (for example, three in FIG. 12) of discharge port portions 215 aligned in a horizontal direction at a tip portion of the main body portion 213, and a communicating portion 214 putting an internal space of the main body portion 213 and an internal space of each individual discharge port portions 215 in communication. Each individual discharge port portion 215 has a discharge port 216. Each individual discharge port portion 215 is constituted of a straight nozzle that discharges liquid in a continuous flow state. An electrode 56 is externally fitted and fixed to each discharge port portion 215. The water nozzle 212 is disposed fixedly inside the processing chamber 3 in a state where the plurality of discharge ports 216 are directed toward an upper surface central portion of the substrate W. The water supplying piping 204 is connected to the main body portion 213 of the water nozzle 212.

During the rinsing processing, DIW (example of water) is supplied to the water nozzle 212 and DIW is discharged from the respective discharge ports 216 of the water nozzle 212. During the rinsing process, a liquid film of DIW is formed across the entire upper surface of the substrate W. During the rinsing process, as shown in FIG. 12, the form of DIW discharged from each individual discharge port 216 is the form of a continuous flow connected to both the discharge port 216 and the liquid film of DIW on the upper surface of the substrate W. Also, the DIW is in a liquid-tight state inside the nozzle piping of the water nozzle 212 and inside the water supplying piping 204.

With the substrate processing apparatus 211, it suffices that the form of DIW discharged from at least one discharge port 216 is the form of a continuous flow connected to both the discharge port 216 and the liquid film of DIW on the upper surface of the substrate W. In other words, it suffices that the interior of the nozzle piping of the water nozzle 212 and the liquid film of DIW on the upper surface of the substrate W are connected by at least one continuous flow 64A (see FIG. 13).

Figure 13:
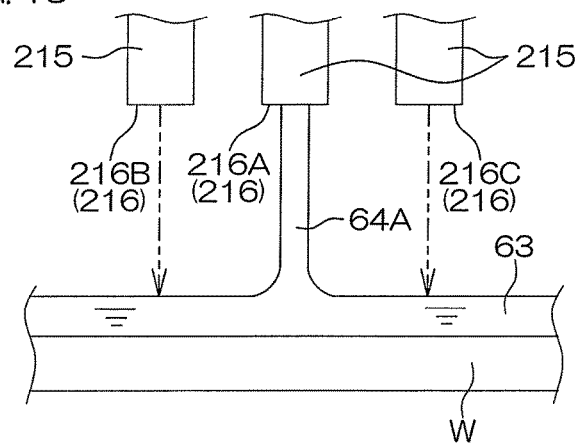
FIG. 13 is a diagram for describing the discharging of a processing liquid in the fifth preferred embodiment of the present invention.

Specifically, a case where a continuous flow connected to both the discharge port 216 and the liquid film of DIW on the upper surface of the substrate W is formed at one discharge port 216A among the plurality of discharge ports 216 but a continuous flow is not formed at the other discharge ports 216B and 216C as shown in FIG. 13 shall now be considered. In this case, DIW is discharged in the form of droplets or DIW is not discharged from the discharge port 216B and the discharge port 216C.

Even in the case illustrated in FIG. 13, the interior of the nozzle piping of the water nozzle 212 and the liquid film of DIW on the upper surface of the substrate W are connected by the at least one continuous flow 64A. Therefore, if the substrate W is positively charged, the electrons from the irradiated portion of DIW inside the water supplying piping 204 move along the single continuous flow 64A toward the liquid film 63 of DIW on the upper surface of the substrate W. Charging prevention of the substrate W and static elimination of the substrate W can thereby be achieved.

Figure 14:
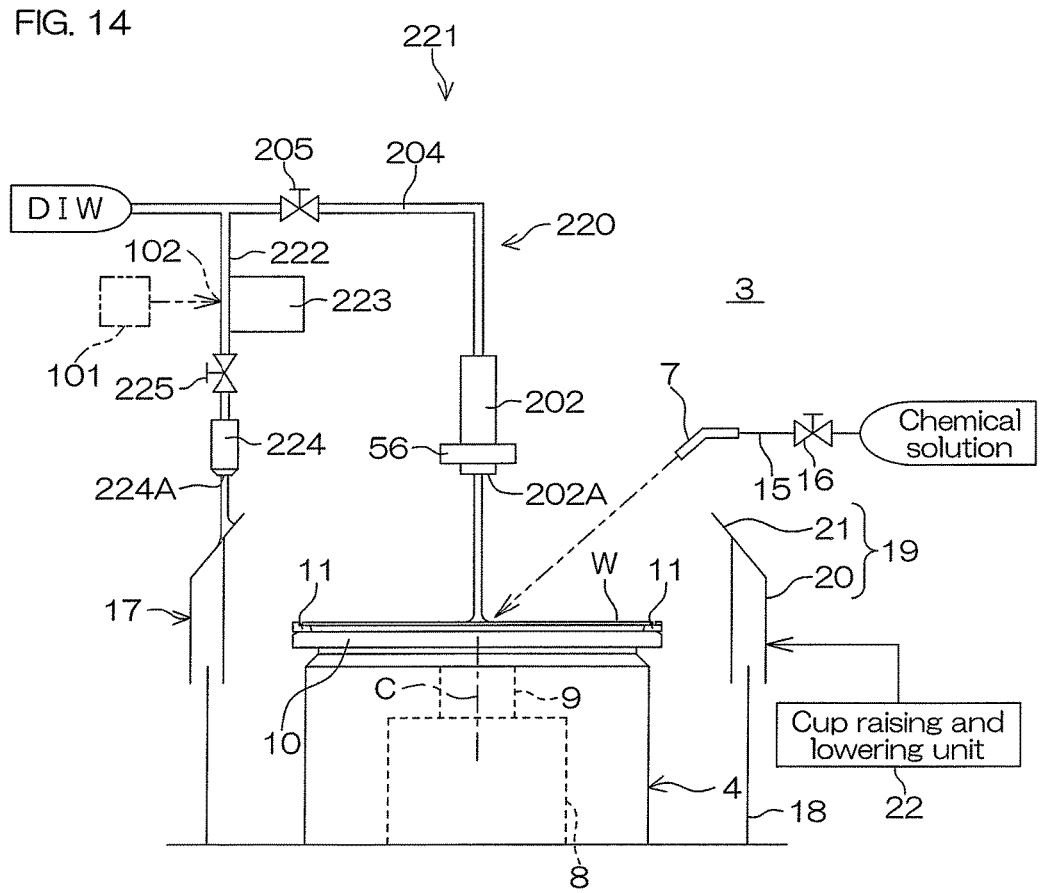
FIG. 14 is a diagram of the arrangement of a substrate processing apparatus according to a sixth preferred embodiment of the present invention.

FIG. 14 is a diagram of the arrangement of a substrate processing apparatus 221 according to a sixth preferred embodiment of the present invention.

Portions of the substrate processing apparatus 221 that are in common to the substrate processing apparatus 201 according to the fourth preferred embodiment are provided with the same reference symbols as in FIG. 11 and description thereof shall be omitted. With the substrate processing apparatus 221, a water supplying unit (processing liquid supplying apparatus) 220 is provided in place of the water supplying unit 200.

The water supplying unit 220 includes the water nozzle 202, the water supplying piping 204, a first branch piping (branch piping) 222 branching from an intermediate portion of the water supplying piping 204, and a soft X-ray irradiating unit (X-ray irradiating means) 223 arranged to irradiate soft X-rays onto DIW (example of water) present inside the first branch piping 222. The soft X-ray irradiating unit 223 is mounted onto the first branching piping 222. That is, with the water supplying unit 220, soft X-ray irradiating unit 223 is mounted not onto the water supplying piping 204 but onto the first branch piping 222.

The first branch piping 222 branches from a portion of the water supplying piping 204 that is further upstream than the water valve 205. The first branch piping 222 has a round pipe shape (circular cylindrical shape) and is formed using a resin material, such as PVC (polyvinyl chloride), PTFE (polytetrafluoroethylene), and PFA (perfluoroalkylvinyl ether tetrafluoroethylene copolymer). A branch valve 225 arranged to open and close the first branch piping 222 is interposed in an intermediate portion of the first branch piping 222. The branch valve 225 is connected to the controller 40 (see FIG. 3). In the first branch piping 222, an opening (not shown) is formed in a pipe wall at a predetermined portion further upstream than the branch valve 225.

A first cup nozzle 224 is mounted onto a downstream end of the first branch piping 222. The first cup nozzle 224 is constituted of a straight nozzle that discharges liquid in a continuous flow state and is disposed fixedly above the cup upper portion 19 inside the substrate chamber 3 in a state where its discharge port (liquid receiver discharge port) 224A is directed toward an outer wall (for example, an upper surface of the inclined portion 21) of the cup upper portion 19.

The soft X-ray irradiating unit 223 adopts an arrangement equivalent to the soft X-ray irradiating unit 62 (see FIG. 2) according to the first preferred embodiment. The soft X-ray irradiating unit 223 is mounted onto the first branch piping 222 so as to close the opening in the first branch piping 222. Specifically, an opening in the cover of the soft X-ray irradiating unit 223 (corresponding to the second opening 28 (see FIG. 2) in the cover 26 of the soft X-ray irradiating unit 62) is matched with the opening in the first branch piping 222 and a wall surface of the cover of the soft X-ray irradiating unit 223 (corresponding to the side wall 26A (see FIG. 2) of the cover 26 of the soft X-ray irradiating unit 62) is closely adhered to the outer periphery of the first branch piping 222. A high voltage unit of the soft X-ray irradiating unit 223 (corresponding to the high voltage unit 31 (see FIG.

2) of the soft X-ray irradiating unit 62 according to the first preferred embodiment) is connected to the controller 40 (see FIG. 3).

When the water valve 205 is opened in a state where the branch valve 225 is closed, DIW is supplied from the water supplying piping 204 to the water nozzle 202 and the DIW is discharged from the discharge port 202A of the water nozzle 202. When the branch valve 225 is opened in a state where the water valve 205 is closed, DIW is supplied from the first branch piping 222 to the first cup nozzle 224 and the DIW is discharged from the discharge port 224A of the first cup nozzle 224.

It may be considered that the cup 17 (especially the cup upper portion 19) is charged due to the cup upper portion 19 being raised and lowered by the cup raising and lowering unit 22. Static elimination of the cup upper portion 19 must thus be performed prior to the execution of the processing on the substrate W.

With the substrate processing apparatus 221, although the same processing as that of the processing example shown in FIG. 4 is performed, static elimination of the cup 17 is performed prior to the carrying-in of the substrate W in step S1 of FIG. 4. Specifically, the controller 40 controls the high voltage unit of the soft X-ray irradiating unit 223 to make the soft X-ray generator of the soft X-ray irradiating unit 223 (corresponding to the soft X-ray generator 25 (see FIG. 2) of the soft X-ray irradiating unit 62 according to the first preferred embodiment) generate the soft X-rays so that the soft X-rays are irradiated toward the interior of the first branch piping 222. The soft X-rays are thereby irradiated onto the DIW present in the interior of the first branch piping 222.

Also, the controller 40 opens the branch valve 225 while closing the water valve 205. The DIW flowing through the first branch piping 222 is thereby supplied to the first cup nozzle 224. The DIW is discharged from the discharge port 224A of the first cup nozzle 224 toward the upper surface of the inclined portion 21 of the cup upper portion 19. The supplied DIW flows downward along the upper surface of the inclined portion 21. A liquid film of DIW is thus formed on the upper surface of the inclined portion 21. At this point, the supply flow rate of DIW with respect to the first cup nozzle 224 is set to a comparatively high flow rate (for example, 0.5 to 2.0 L/min). The form of DIW discharged from the discharge port 224A of the first cup nozzle 224 is thus the form of a continuous flow connected to both the discharge port 224A and the liquid film of DIW on the upper surface of the inclined portion 21. Also, the DIW is in a liquid-tight state inside the nozzle piping of the first cup nozzle 224 and inside the first branch piping 222.

When the cup upper portion 19 is positively charged, the potential difference between the irradiated portion of DIW inside the first branch piping 222 and the positively charged cup upper portion 19 causes the electrons from the irradiated portion of DIW inside the first branch piping 222 to move along the DIW of continuous flow form toward the liquid film of DIW on the upper surface of the inclined portion 21. The liquid film of DIW on the upper surface of the inclined portion 21 is thereby made to have a large amount of electrons and static elimination of the portion of the positively charged cup upper portion 19 in contact with the liquid film of DIW is thus achieved.

On the other hand, when the cup upper portion 19 is negatively charged, electrons from the cup upper portion 19 move along the DIW of continuous flow form toward the positive ions at the irradiated portion of DIW inside the first branch piping 222. Static elimination of the portion of the negatively charged cup upper portion 19 in contact with the liquid film of DIW is thus achieved.

After the static elimination has been performed on the cup upper portion 19, the unprocessed substrate W is carried into the processing chamber 3 and conveyed to the spin chuck 4.

After the substrate W is held by the spin chuck 4, the controller 40 controls the spin motor 8 to start rotation of the substrate W by the spin chuck 4 (step S2 of FIG. 4). The rotation speed of the substrate W is increased to a predetermined liquid processing speed (for example, 500 rpm) and is thereafter maintained at the liquid processing speed.

In the rinsing processing (steps S4 to S6 of FIG. 4), the controller 40 (see FIG. 3) opens the water valve 205 while closing the branch valve 225.

When the predetermined time from the opening of the water valve 205 elapses and the soft X-ray irradiation timing arrives, the controller 40 controls the high voltage unit of the soft X-ray irradiating unit 223 to make the soft X-ray generator of the soft X-ray irradiating unit 223 generate the soft X-rays so that the soft X-rays are irradiated toward the interior of the first branch piping 222. The soft X-rays are thereby irradiated onto the DIW flowing through the interior of the first branch piping 222.

DIW is discharged from the discharge port 202A of the water nozzle 202 toward the rotation center of the upper surface of the substrate W that is in the rotating state. During the rinsing processing, a liquid film of DIW is formed across the entire upper surface of the substrate W. The form of DIW discharged from the discharge port 202A of the water nozzle 202 is the form of a continuous flow connected to both the discharge port 202A and the liquid film of DIW on the upper surface of the substrate W. Also, the DIW is in a liquid-tight state inside the nozzle piping of the water nozzle 202, inside the water supplying piping 204, and inside the first branch piping 222.

When during the rinsing processing, the DIW present inside the first branch piping 222 is irradiated with the soft X-rays, electrons are emitted from water molecules due to excitation of the water molecules in the irradiated portion of DIW inside the first branch piping 222 (equivalent to the irradiated portion 54 of DIW according to the first preferred embodiment shown in FIG. 5). Consequently, a plasma state, in which a large amount of the electrons and a large amount of positive ions of water molecules coexist, is formed in the irradiated portion of DIW inside the first branch piping 222. The irradiated portion of DIW is connected via DIW to the liquid film of DIW formed on the upper surface of the substrate W.

If the substrate W is positively charged, the potential difference between the irradiated portion of DIW inside the first branch piping 222 and the positively charged substrate W causes the electrons from the irradiated portion of DIW inside the first branch piping 222 to move along the DIW of both the water supplying piping 204 and the continuous flow form toward the liquid film of DIW on the upper surface of the substrate W. The liquid film of DIW on the upper surface of the substrate W is thereby made to have a large amount of electrons.

By the above, in addition to actions and effects equivalent to those described for the first preferred embodiment, the sixth preferred embodiment exhibits the action and effect of enabling static elimination of the cup upper portion 19 to be performed satisfactorily.

Also, when a hydrophilic coating film (corresponding to the hydrophilic coating film 38 (see FIG. 2)) peels off from an outer surface of a window member (corresponding to the outer surface 71B of the window member (see FIG. 2)) of the X-ray irradiating unit 223, the beryllium contained in the window member may become dissolved in the DIW or other processing liquid. Even in such a case, the DIW containing such beryllium is supplied not to the water nozzle 202 but to the first cup nozzle 224 because the X-ray irradiating unit 223 is provided on the first branch piping 222. The supplying of DIW containing beryllium to the substrate W can thereby be prevented reliably.

Although with each of the first to sixth preferred embodiments, the case where the DIW (example of water) discharged from the water nozzle 61 or 202 is used to achieve charging prevention and static elimination of the substrate W during the rinsing processing was described, cases of using the DIW (example of water) discharged from the water nozzle 61 or 202 to achieve static elimination of a second nozzle piping (second piping) 232 or 262, through the interior of which the processing liquid flows, shall now be described with substrate processing apparatuses 231, 251, and 261 according to seventh to ninth preferred embodiments.

Figure 15A:
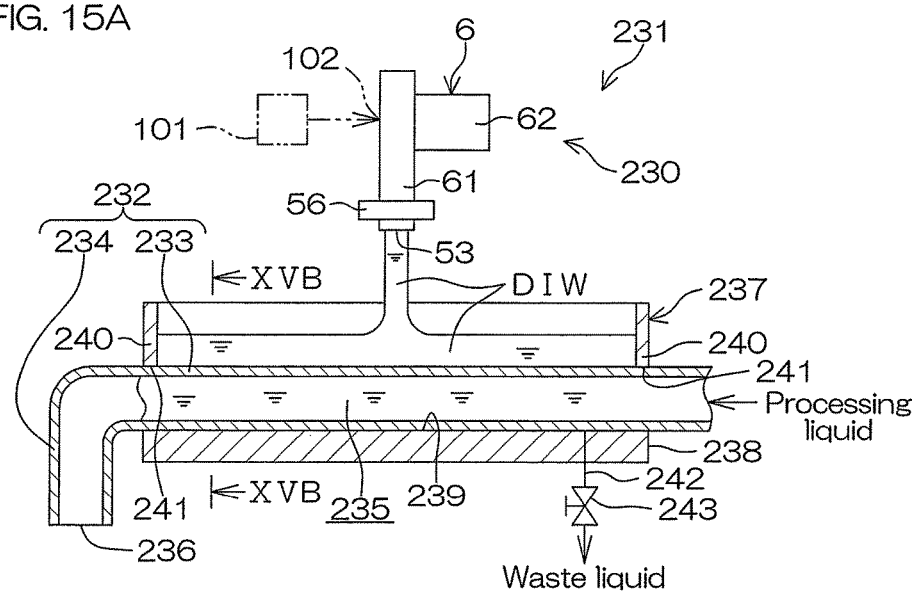
FIGS. 15A and 15B are diagrams showing the arrangement of a substrate processing apparatus according to a seventh preferred embodiment of the present invention.
Figure 15B:
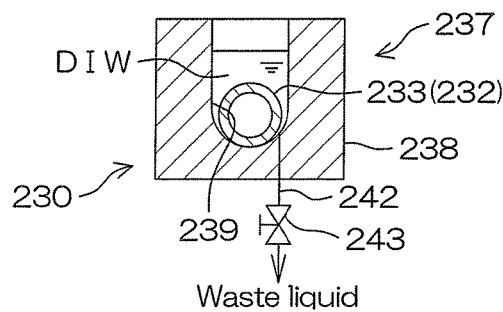

FIGS. 15A and 15B are diagrams showing the arrangement of the substrate processing apparatus 231 according to the seventh preferred embodiment of the present invention. Points of difference of the substrate processing apparatus 231 with respect to the substrate processing apparatus 1 according to the first preferred embodiment are that the second nozzle piping 232, arranged to supply the processing liquid to the substrate W held by the spin chuck 4, is included and that DIW as an example of water is supplied to the second nozzle piping 232 by a water supplying unit 230. The water supplying unit 230 adopts an arrangement equivalent to the water supplying unit 100 (see FIG. 1) and therefore the same reference symbols as those in the case of the water supplying unit 100 are provided and description thereof shall be omitted. Only the arrangement related to the water supplying unit 230 is illustrated in FIGS. 15A and 15B, and illustration of other portions is omitted. FIG. 15A is a sectional view of a state where the second nozzle piping 232 is housed in a standby pod 237 to be described below, and FIG. 15B is a sectional view taken along section line XVB-XVB in FIG. 15A.

The second nozzle piping 232 integrally includes a horizontal portion 233 of circular cylindrical shape that extends in a horizontal direction and a downwardly extending portion 234 of circular cylindrical shape that extends downward from a tip of the horizontal portion 233. The second nozzle piping 232 is formed of a resin material, such as PVC (polyvinyl chloride), PTFE (polytetrafluoroethylene), and PFA (perfluoroalkylvinyl ether tetrafluoroethylene copolymer).

A processing liquid flow passage 235 is defined in the interior of the second nozzle piping 232. The processing liquid flow passage 235 opens in a circular shape as a discharge port 236 at a lower end of the downwardly extending portion 234. A processing liquid (chemical solution or water) from a processing liquid supply source is supplied via a processing liquid valve (not shown) to the second nozzle piping 232. When the processing liquid valve is opened, the processing liquid is supplied to an upstream end of the horizontal portion 233 of the second nozzle piping 232. The processing liquid introduced into the second nozzle piping 232 flows through the processing liquid flow passage 235 and is thereafter discharged from the discharge port 236.

The second nozzle piping 232 is supported by a supporting shaft (not shown) that extends substantially vertically at a side of the cup 17 (see FIG. 1) and the second nozzle piping 232 can be swung above the spin chuck 4 (see FIG. 1) by inputting a rotating force to the supporting shaft to rotate the supporting shaft. That is, the second nozzle piping 232 takes on the form of a scan nozzle. When supplying of the processing liquid to the substrate W (see FIG. 1) is not performed, the second nozzle piping 232 is retreated at a home position set at a side of the cup 17 (see FIG. 1). During supplying of the processing liquid to the substrate W (see FIG. 1), the second nozzle piping 232 is moved to a position above the substrate W.

As shown in FIGS. 15A and 15B, the substrate processing apparatus 231 includes the trough-shaped standby pod 237 for housing the second nozzle piping 232 at the home position. The standby pod 237 has a pod main body 238 with a substantially rectangular cross section along a longitudinal direction of the second nozzle piping 232. A liquid storing groove 239, extending along the longitudinal direction of the second nozzle piping 232, is formed in an upper surface of the pod main body 238. The liquid storing groove 239 is formed across the entirety of the longitudinal direction besides the respective ends in the longitudinal direction. The liquid storing groove 239 has a substantially U-shaped cross section. The width and depth of the liquid storing groove 239 are set to sizes enabling the housing of the second nozzle piping 232.

End walls 240 are provided at the respective ends in the longitudinal direction of the pod main body 238. An insertion hole 241, constituted of a round hole substantially matching the second nozzle piping 232, is formed in each end wall 240. A waste liquid piping 242 is connected to a bottom portion of the liquid storing groove 239. A waste liquid valve 243, arranged to open and close the waste liquid piping 242, is interposed in an intermediate portion of the waste liquid piping 242. When the second nozzle piping 232 is at the home position, the second nozzle piping 232 is disposed so as to be housed in the liquid storing groove 239. At this point, the second nozzle piping 232 is inserted through the insertion holes 241 of both end walls 240.

The water nozzle 61 of the water supplying unit 230 is disposed fixedly above the standby pod 237 in a state where its discharge port 53 is directed toward the liquid storing groove 239.

In a state where the waste liquid valve 243 is closed in the state where the second nozzle piping 232 is disposed at the home position, DIW is discharged from the water nozzle 61 of the water supplying unit 230. DIW is thereby stored in the liquid storing groove 239 of the standby pod 237. The entirety of (the horizontal portion 233) of the second nozzle piping 232 in the circumferential direction is thus immersed in the DIW stored in the liquid storing groove 239.

During a period in which the second nozzle piping 232 is at the home position (during standby), the discharge of DIW discharged from the water nozzle 61 is continued. During this period, the supply flow rate of DIW with respect to the water nozzle 61 is set to a comparatively high flow rate (for example, 0.5 to 2.0 L/min). The form of DIW discharged from the discharge port 53 of the water nozzle 61 is thus the form of a continuous flow connected to both the discharge port 53 and the DIW stored in the liquid storing groove 239. That is, the DIW discharged from the discharge port 53 is connected in liquid form between the discharge port 53 and an outer peripheral wall of the second nozzle piping 232. The DIW is in a liquid-tight state inside the first nozzle piping 51.

Also during the period in which the second nozzle piping 232 is at the home position (during standby), the soft X-rays from the soft X-ray irradiating unit 62 are irradiated onto the interior of the water nozzle 61 (first nozzle piping 51). As a result of the soft X-rays being irradiated onto the DIW present inside the first nozzle piping 51, a plasma state, in which a large amount of electrons and a large amount of positive ions of water molecules coexist, is formed in the irradiated portion 54 of DIW (see FIG. 5). At this point, the irradiated portion 54 of DIW is connected via DIW to the DIW in liquid contact with the outer peripheral wall of the second nozzle piping 232.

During stoppage of the supplying of the processing liquid to the second nozzle piping 232, the processing liquid remains in the interior (especially the horizontal portion 233) of the second nozzle piping 232. If at this point, the outer peripheral wall of the second nozzle piping 232 is positively or negatively charged, even the remaining processing liquid inside the second nozzle piping 232 may become positively or negatively charged due to induction charging. If the processing liquid in such a charged state is supplied to substrate W, even the substrate W may become charged and breakdown of a device formed on the upper surface of the substrate W may occur when the charge is discharged.

When the second nozzle piping 232 is positively charged, the potential difference between the irradiated portion 54 of DIW (see FIG. 5) and the positively charged outer peripheral wall of the second nozzle piping 232 causes the electrons from the irradiated portion 54 of DIW (see FIG. 5) to move along the DIW of continuous flow form and the DIW stored in the liquid storing groove 239 toward the outer peripheral wall of the second nozzle piping 232. Static elimination of the positively charged outer peripheral wall of the second nozzle piping 232 is thereby achieved.

On the other hand, when the second nozzle piping 232 is negatively charged, electrons from the outer peripheral wall of the second nozzle piping 232 move along the DIW of continuous flow form toward the positive ions at the irradiated portion 54 of DIW (see FIG. 5). Static elimination of the negatively charged second nozzle piping 232 is thereby achieved.

Figure 16:
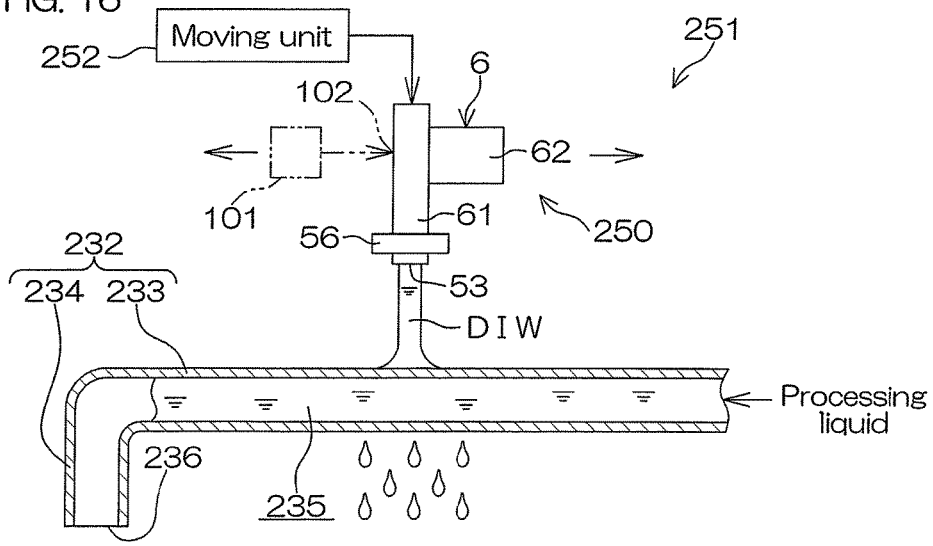
FIG. 16 is a diagram of the arrangement of a substrate processing apparatus according to an eighth preferred embodiment of the present invention.

FIG. 16 is a diagram of the arrangement of the substrate processing apparatus 251 according to the eighth preferred embodiment of the present invention.

A point of difference of the substrate processing apparatus 251 with respect to the substrate processing apparatus 231 according to the seventh preferred embodiment (see FIGS. 15A and 15B) is that the second nozzle piping 232 is not immersed in the DIW stored in the liquid storing groove 239 but the DIW from the discharge port 53 of the water nozzle 61 of the water supplying unit (processing liquid supplying apparatus) 250 is arranged to be supplied directly to the outer peripheral wall of the second nozzle piping 232 to achieve static elimination of the second nozzle piping 232. The water supplying unit 250 adopts an arrangement equivalent to the water supplying unit 100 (see FIG. 1) besides the arrangement of the moving unit 252 described below. Therefore the same reference symbols as those in the case of the water supplying unit 100 are provided and description thereof shall be omitted. With the water supplying unit 250, the integral head 6 is coupled to a moving unit 252 arranged to move the integral head 6 in a horizontal direction. The moving unit 252 is arranged using a ball nut and a motor and is connected to the controller 40 (see FIG. 3) as a control object.

During the period in which the second nozzle piping 232 is at the home position (during standby), the controller 40 makes DIW (example of water) be supplied to the water nozzle 61 (first nozzle piping 51) and makes the soft X-rays from the soft X-ray irradiating unit 62 be irradiated onto the interior of the water nozzle 61 (first nozzle piping 51). The DIW discharged from the water nozzle 61 of the integral head 6 is supplied to the outer peripheral wall of the second nozzle piping 232 and flows downward along the outer peripheral wall of the second nozzle piping 232.

During this period, the supply flow rate of DIW with respect to the water nozzle 61 is set to a comparatively high flow rate (for example, 0.5 to 2.0 L/min). The form of DIW discharged from the discharge port 53 of the water nozzle 61 is thus the form of a continuous flow connected to both the discharge port 53 and the outer peripheral wall of the second nozzle piping 232. The DIW is in a liquid-tight state inside the first nozzle piping 51.

Also during the period in which the second nozzle piping 232 is at the home position (during standby), the soft X-rays from the soft X-ray irradiating unit 62 are irradiated onto the interior of the water nozzle 61 (first nozzle piping 51). As a result of the soft X-rays being irradiated onto the DIW present inside the first nozzle piping 51, a plasma state, in which a large amount of electrons and a large amount of positive ions of water molecules coexist, is formed in the irradiated portion 54 of DIW (see FIG. 5). At this point, the irradiated portion 54 of DIW is connected via DIW to the DIW in liquid contact with the outer peripheral wall of the second nozzle piping 232.

When the second nozzle piping 232 is positively charged, the potential difference between the irradiated portion 54 of DIW (see FIG. 5) and the positively charged second nozzle piping 232 causes the electrons from the irradiated portion 54 of DIW (see FIG. 5) to move along the DIW of continuous flow form toward the position of the second nozzle piping 232 in liquid contact with DIW. Static elimination of the DIW landing portion of the second nozzle piping 232 is thereby achieved.

On the other hand, when the second nozzle piping 232 is negatively charged, electrons from the second nozzle piping 232 move along the DIW of continuous flow form toward the positive ions at the irradiated portion 54 of DIW (see FIG. 5). Static elimination of the DIW landing portion of the second nozzle piping 232 is thereby achieved.

The controller 40 then controls the moving unit 252 to move the DIW landing portion of the outer peripheral wall of the second nozzle piping 232 (horizontal portion 233) in one direction or reciprocally along the longitudinal direction of the second nozzle piping 232. The position of the second nozzle piping 232 subject to static elimination can thereby be moved along the longitudinal direction of the second nozzle piping 232 (horizontal portion 233). Satisfactory static elimination of substantially the entirety of the outer peripheral wall of the second nozzle piping 232 (horizontal portion 233) can thus be achieved.

Figure 17A:
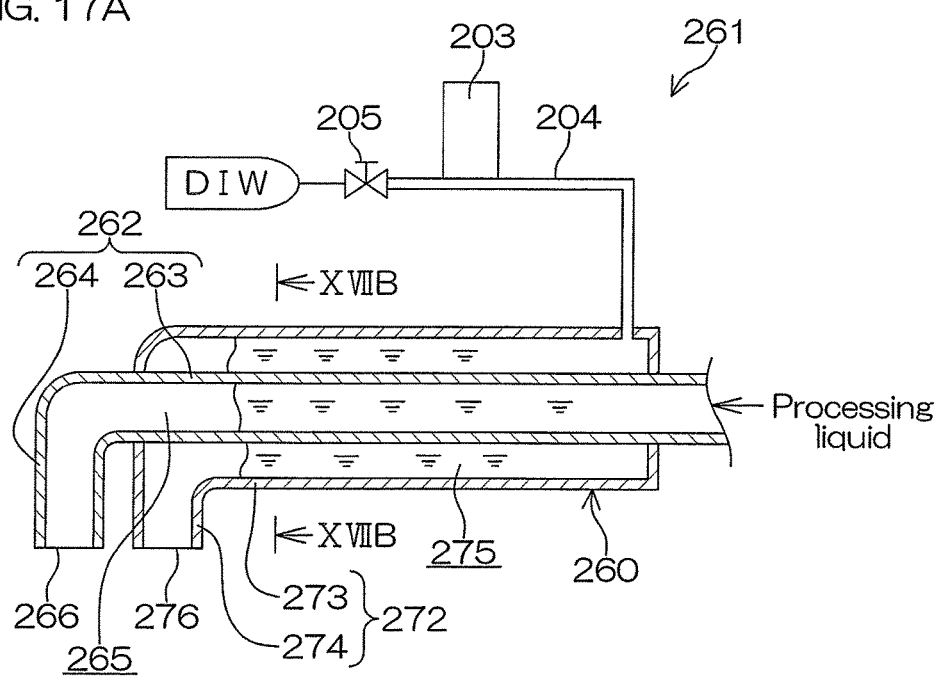
FIGS. 17A and 17B are diagrams showing the arrangement of a substrate processing apparatus according to a ninth preferred embodiment of the present invention.
Figure 17B:
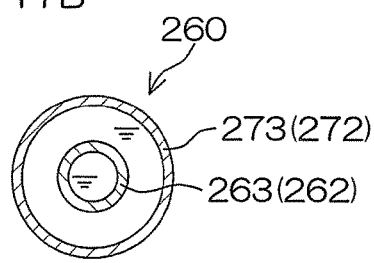

FIGS. 17A and 17B are diagrams showing the arrangement of the substrate processing apparatus 261 according to the ninth preferred embodiment of the present invention.

The substrate processing apparatus 261 differs from the substrate processing apparatus 1 (see FIG. 1) according to the first preferred embodiment in including a water supplying unit (processing liquid supplying apparatus) 260 in place of the water supplying unit 100 (see FIG. 1) according to the first preferred embodiment and besides this, has an arrangement in common with the substrate processing apparatus 1. Only the arrangement related to the water supplying unit 260 is illustrated in FIGS. 17A and 17B and illustration of other portions is omitted. FIG. 17A is a vertical sectional view of the second nozzle piping 262 and a third nozzle piping 272 to be described below, and FIG. 17B is a sectional view taken along section line XVIIB-XVIIB in FIG. 17A.

The water supplying unit 260 includes the second nozzle piping 262 and the third nozzle piping 272. The second nozzle piping 262 and the third nozzle piping 272 form a double piping structure by the second nozzle piping 262 being inserted inside the third nozzle piping 272.

The second nozzle piping 262 integrally includes a horizontal portion 263 of circular cylindrical shape that extends in a horizontal direction and a downwardly extending portion 264 of circular cylindrical shape that extends downward from a tip of the horizontal portion 263. The second nozzle piping 262 is formed of a resin material, such as PVC (polyvinyl chloride), PTFE (polytetrafluoroethylene), and PFA (perfluoroalkylvinyl ether tetrafluoroethylene copolymer).

A processing liquid flow passage 265 is defined in the interior of the second nozzle piping 262. The processing liquid flow passage 265 opens in a circular shape as a discharge port 266 at a lower end of the downwardly extending portion 264. A processing liquid (chemical solution or water) from a processing liquid supply source is supplied via a processing liquid valve (not shown) to the second nozzle piping 262.

The water supplying unit 260 includes a portion of the arrangement of the water supplying unit 200 (see FIG. 11) according to the fourth preferred embodiment. That is, the water supplying unit 260 includes the water supplying piping 204, the soft X-ray irradiating unit 203, and the water valve 205. Besides the point that the water supplying piping 204 supplies DIW (example of water) from a DIW supply source to the third nozzle piping 272, the soft X-ray irradiating unit 203 and the water supplying piping 204 have the arrangement described with the fourth preferred embodiment and detailed description thereof shall thus be omitted.

The third nozzle piping 272 integrally includes a horizontal portion 273 of circular cylindrical shape that extends in a horizontal direction and a downwardly extending portion 274 of circular cylindrical shape that extends downward from a tip of the horizontal portion 273. The third nozzle piping 272 is formed of a resin material, such as PVC (polyvinyl chloride), PTFE (polytetrafluoroethylene), and PFA (perfluoroalkylvinyl ether tetrafluoroethylene copolymer). The horizontal portion 263 of the second nozzle piping 262 is inserted in the horizontal portion 273 of the third nozzle piping 272 and its downstream end is connected to the downwardly extending portion 264 of the second nozzle piping 262 upon penetrating through a pipe wall of the downwardly extending portion 274 of the third nozzle piping 272. A water flow passage 275 is defined by a space between an inner wall of the third nozzle piping 272 and an outer wall of the second nozzle piping 262. The water flow passage 275 opens in a circular annular shape as a discharge port 276 at a lower end of the downwardly extending portion 274.

When a processing liquid processing using the processing liquid is to be applied to the substrate W, the processing liquid valve is opened. When the processing liquid valve is opened, the processing liquid is supplied to an upstream end of the horizontal portion 263 of the second nozzle piping 262. The processing liquid introduced into the second nozzle piping 262 flows through the processing liquid flow passage 265 and is thereafter discharged from the discharge port 266. Although when a processing liquid supply stopping timing arrives, the processing liquid valve is closed, the processing liquid remains in the interior of the second nozzle piping 262 (especially the horizontal portion 263) thereafter.

When DIW is to be supplied to the substrate W, the water valve 205 is opened. DIW is supplied to an upstream end of the water flow passage 275 of the third nozzle piping 272. The DIW introduced into the third nozzle piping 272 flows through the water flow passage 275 and is thereafter discharged from the discharge port 276. Although when a DIW supply stopping timing arrives, the water valve 205 is closed, DIW remains in the space between the inner wall of the third nozzle piping 272 and the outer wall of the second nozzle piping 262 thereafter.

If the outer peripheral wall of the second nozzle piping 262 is positively or negatively charged, even the remaining processing liquid inside the second nozzle piping 262 may become positively or negatively charged due to induction charging. If the processing liquid in such a charged state is supplied to the substrate W, even the substrate W may become charged and breakdown of a device formed on the upper surface of the substrate W may occur when the charge is discharged.

As a mechanism of such charging of the outer peripheral wall of the second nozzle piping 262, it may be considered that the outer peripheral wall of the third nozzle piping 272 becomes charged first and the outer peripheral wall of the second nozzle piping 262 then becomes charged via the DIW remaining between the outer wall of the second nozzle piping 262 and the inner wall of the third nozzle piping 272.

With the substrate processing apparatus 261, the irradiation of the soft X-rays onto the interior of the water supplying piping 204 by the soft X-ray irradiating unit 203 is continued even when DIW is not supplied to the substrate W from the third nozzle piping 272 (that is, at times besides during the rinsing processing).

During this time, the DIW remaining between the outer wall of the second nozzle piping 262 and the inner wall of the third nozzle piping 272 and the DIW present inside the water supplying piping 204 is connected in a liquid-tight state (in the form of a continuous flow).

When the third nozzle piping 272 is positively charged, the potential difference between the irradiated portion of DIW inside the water supplying piping 204 and the positively charged third nozzle piping 272 causes the electrons from the irradiated portion of DIW inside the water supplying piping 204 to move along the DIW inside the water supplying piping 204 and the DIW remaining between the outer wall of the second nozzle piping 262 and the inner wall of the third nozzle piping 272 toward the third nozzle piping 272. Static elimination of the positively charged third nozzle piping 272 is thereby achieved.

On the other hand, when the third nozzle piping 272 is negatively charged, electrons from the third nozzle piping 272 move along the DIW inside the water supplying piping 204 and the DIW remaining between the outer wall of the second nozzle piping 262 and the inner wall of the third nozzle piping 272 toward the positive ions at the irradiated portion of DIW in the water supplying piping 204. Static elimination of the third nozzle piping 272 is thereby achieved.

That is, the second nozzle piping 262 does not become charged because static elimination of the third nozzle piping 272 is achieved.

Also, even if the second nozzle piping 262 is positively charged, the electrons from the irradiated portion of DIW inside the water supplying piping 204 move along the DIW inside the water supplying piping 204 and the DIW remaining between the outer wall of the second nozzle piping 262 and the inner wall of the third nozzle piping 272 toward the second nozzle piping 262. Even if the second nozzle piping 262 is negatively charged, electrons from the second nozzle piping 262 move along the DIW inside the water supplying piping 204 and the DIW remaining between the outer wall of the second nozzle piping 262 and the inner wall of the third nozzle piping 272 toward the positive ions at the irradiated portion of DIW in the water supplying piping 204. That is, even if the second nozzle piping 262 is charged, static elimination of the second nozzle piping 262 can be achieved as described above.

Figure 18:
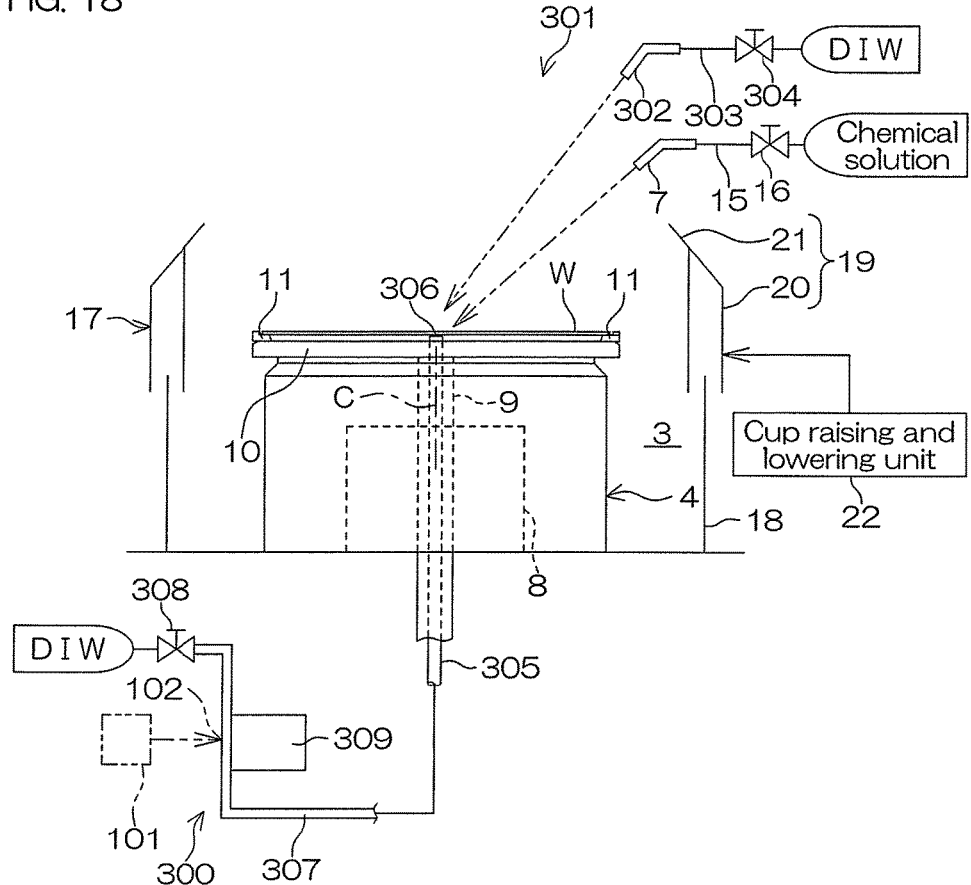
FIG. 18 is a diagram of the arrangement of a substrate processing apparatus according to a tenth preferred embodiment of the present invention.

FIG. 18 is a diagram of the arrangement of a substrate processing apparatus 301 according to a tenth preferred embodiment of the present invention.

With the tenth preferred embodiment, portions that are in common to the first preferred embodiment are provided with the same reference symbols as in FIG. 1 to FIG. 6 and description thereof shall be omitted. The substrate processing apparatus 301 mainly differs from the substrate processing apparatus 1 (see FIG. 1) according to the first preferred embodiment in the two points that a water supplying unit (processing liquid supplying apparatus) 300 arranged to supply DIW (example of water) to a lower surface of the substrate W is provided and that DIW (example of water) is supplied to the upper surface of the substrate W by a water nozzle 302 instead of the water supplying unit 100 (see FIG. 1).

The water nozzle 302 is constituted of a straight nozzle that discharges liquid in a continuous flow state and is disposed fixedly inside the processing chamber 3 in a state where its discharge port is directed toward an upper surface central portion of the substrate W. A water supplying piping 303, to which DIW is supplied from a DIW supply source, is connected to the water nozzle 302. A water valve 304 arranged to open and close the water supplying piping 303 is interposed in the water supplying piping 303.

With the substrate processing apparatus 301, the spin shaft 9 is arranged as a hollow shaft. A lower processing liquid supplying pipe 305 is inserted in a non-contacting state in the interior of the spin shaft 9.

The water supplying unit 300 includes the lower processing liquid supplying pipe 305, a lower surface nozzle 306 mounted onto an upper end of the lower processing liquid supplying pipe 305, a water supplying piping (processing liquid piping) 307 supplying DIW from the DIW supply source to the lower processing liquid supplying pipe 305, and a soft X-ray irradiating unit (X-ray irradiating means) 309 arranged to irradiate soft X-rays onto the DIW present inside the water supplying piping 307. The soft X-ray irradiating unit 309 is mounted onto the water supplying piping 307. The lower surface nozzle 307 is disposed so that its discharge port 306A (see FIG. 19) is close to a lower surface central portion of the substrate W, which is supported by a clamping member 11.

The water supplying piping 307 is connected to the lower processing liquid supplying piping 305. DIW can thereby be supplied to the lower surface nozzle 306 of the lower processing liquid supplying piping 305 and the DIW can be discharged toward the lower surface central portion of the discharge port 306A (see FIG. 19) of the lower surface nozzle 306.

The water supplying piping 307 has a round pipe shape (circular cylindrical shape). The water supplying piping 307 is formed using a resin material, such as PVC (polyvinyl chloride), PTFE (polytetrafluoroethylene), and PFA (perfluoroalkylvinyl ether tetrafluoroethylene copolymer). An opening (not shown) is formed in a pipe wall at an intermediate portion of the water supplying piping 307.

The soft X-ray irradiating unit 309 adopts an arrangement equivalent to the soft X-ray irradiating unit 62 (see FIG. 2) according to the first preferred embodiment. The soft X-ray irradiating unit 309 is mounted onto the water supplying piping 307 so as to close the opening in the water supplying piping 307. Specifically, an opening in the cover of the soft X-ray irradiating unit 309 (corresponding to the second opening 28 (see FIG. 2) in the cover 26 of the soft X-ray irradiating unit 62) is matched with the opening in the water supplying piping 307 and a wall surface of the cover of the soft X-ray irradiating unit 309 (corresponding to the side wall 26A (see FIG. 2) of the cover 26 of the soft X-ray irradiating unit 62) is closely adhered to the outer periphery of the water supplying piping 307. A high voltage unit of the soft X-ray irradiating unit 309 (corresponding to the high voltage unit 31 (see FIG. 2) of the soft X-ray irradiating unit 62 according to the first preferred embodiment) is connected to the controller 40 (see FIG. 3).

A water valve 308 arranged to open and close the water supplying piping 307 is interposed in the water supplying piping 307. The water valve 308 is connected to the controller 40 (see FIG. 3).

With the substrate processing apparatus 301, the same processing as that of the processing example shown in FIG. 4 is performed.

In the rinsing processing (steps S4 to S6 of FIG. 4), the controller 40 (see FIG. 3) opens the water valve 304. DIW is thereby discharged from the water nozzle 302 toward the upper surface central portion of the substrate W. Also, the controller 40 (see FIG. 3) opens the water valve 308. The DIW flowing through the water supplying piping 307 is thereby supplied to the lower surface nozzle 306. The DIW is discharged upward from the discharge port 306A of the lower surface nozzle 306 toward the lower surface central portion of the substrate W.

When the predetermined time from the opening of the water valve 308 elapses and the soft X-ray irradiation timing arrives, the controller 40 controls the high voltage unit of the soft X-ray irradiating unit 309 to make the soft X-ray generator of the soft X-ray irradiating unit 309 (corresponding to the soft X-ray generator 25 (see FIG. 2) of the soft X-ray irradiating unit 62 according to the first preferred embodiment) generate the soft X-rays so that the soft X-rays are irradiated toward the interior of the water supplying piping 307. The soft X-rays are thereby irradiated onto the DIW flowing through the interior of the water supplying piping 307.

Figure 19:
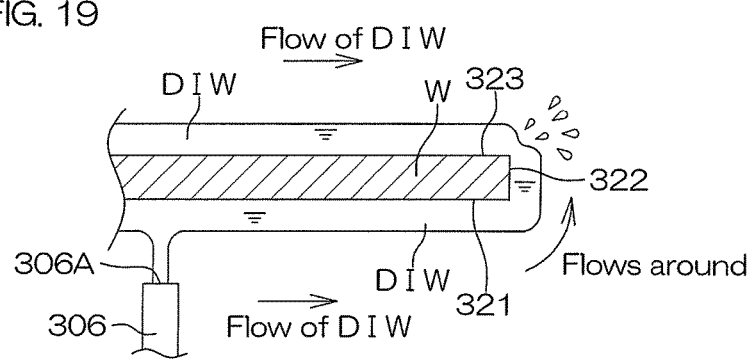
FIG. 19 is a diagram of the flow of DIW during a rinsing processing in the substrate processing apparatus shown in FIG. 18.

FIG. 19 is a diagram of the flow of DIW during the rinsing processing in the substrate processing apparatus 301.

The DIW supplied to the upper surface central portion of the substrate W receives the centrifugal force due to the rotation of the substrate W and flows from the central portion toward the peripheral edge portion along the upper surface of the substrate W. A liquid film of DIW is thereby formed across the entire upper surface of the substrate W. The chemical solution attached to the upper surface of the substrate W is rinsed off by the liquid film of DIW.

On the other hand, the DIW supplied to the lower surface central portion of the substrate W receives the centrifugal force due to the rotation of the substrate W to flow outward in the rotational radius direction along the lower surface of the substrate W and reach a lower surface peripheral edge portion 321 of the substrate W. A liquid film of DIW is thus formed across the entire lower surface of the substrate W. In this process, the DIW that reaches the lower surface peripheral edge portion 321 flows around a circumferential end surface 322 of the substrate W to reach an upper surface peripheral edge portion 323 of the substrate W. The DIW flowing along the upper surface of the substrate W and the DIW flowing around from the circumferential end surface 322 of the substrate W become joined at the upper surface peripheral edge portion 323 of the substrate W as shown in FIG. 19. A state is thus entered in which the liquid film of DIW formed on the upper surface of the substrate W and the liquid film of DIW formed on the lower surface of the substrate W are connected to each other.

The supply flow rate of DIW with respect to the lower surface nozzle 306 during the rinsing processing is set to a comparatively high flow rate (for example, 0.5 to 2.0 L/min). The form of DIW discharged from the discharge port 306A of the lower surface nozzle 306 is thus the form of a continuous flow connected to both the discharge port 306A and the liquid film of DIW formed on the lower surface of the substrate W. As mentioned above, the liquid film of DIW formed on the upper surface of the substrate W and the liquid film of DIW formed on the lower surface of the substrate W are connected to each other and therefore the DIW discharged from the discharge port 306A is connected in liquid form not only to the liquid film of DIW formed on the lower surface of the substrate W but also to the liquid film of DIW formed on the upper surface of the substrate W. Also, the DIW is in a liquid-tight state inside the nozzle piping of the lower surface nozzle 306, inside the lower processing liquid supplying pipe 305, and inside the water supplying piping 307.

When during the rinsing processing, the DIW present inside the water supplying piping 307 is irradiated with the soft X-rays, electrons are emitted from water molecules due to excitation of the water molecules in the irradiated portion of DIW inside the water supplying piping 307 (equivalent to the irradiated portion 54 of DIW according to the first preferred embodiment shown in FIG. 5). Consequently, a plasma state, in which a large amount of the electrons and a large amount of positive ions of water molecules coexist, is formed in the irradiated portion of DIW inside the water supplying piping 307. The irradiated portion of DIW is connected via DIW to the liquid film of DIW formed on the lower surface of the substrate W and the liquid film of DIW formed on the upper surface of the substrate W.

If the lower surface of the substrate W is positively charged, the potential difference between the irradiated portion of DIW inside the water supplying piping 307 and the positively charged substrate W causes the electrons from the irradiated portion of DIW inside the water supplying piping 307 to move along the DIW in the lower processing liquid supplying pipe 305, in the water supplying piping 307, and of the continuous flow form toward the liquid films of DIW on the upper surface and the lower surface of the substrate W. The liquid films of DIW on the lower surface and the upper surface of the substrate W are thereby respectively made to have large amounts of electrons.

By the above, even if DIW is supplied to the upper and lower surfaces of the substrate W in the rotating state in applying the rinsing processing simultaneously to both the upper and lower surfaces of the substrate W, charging of the substrate W due to contact segregation with respect to the DIW does not occur and therefore charging of the substrate W during the rinsing processing can be prevented. Also, even if the substrate W is charged from before the rinsing processing, the charges carried by the substrate W can be eliminated (that is, static elimination can be achieved). Consequently, device breakdown due to charging of the substrate W can be prevented.

Figure 20:
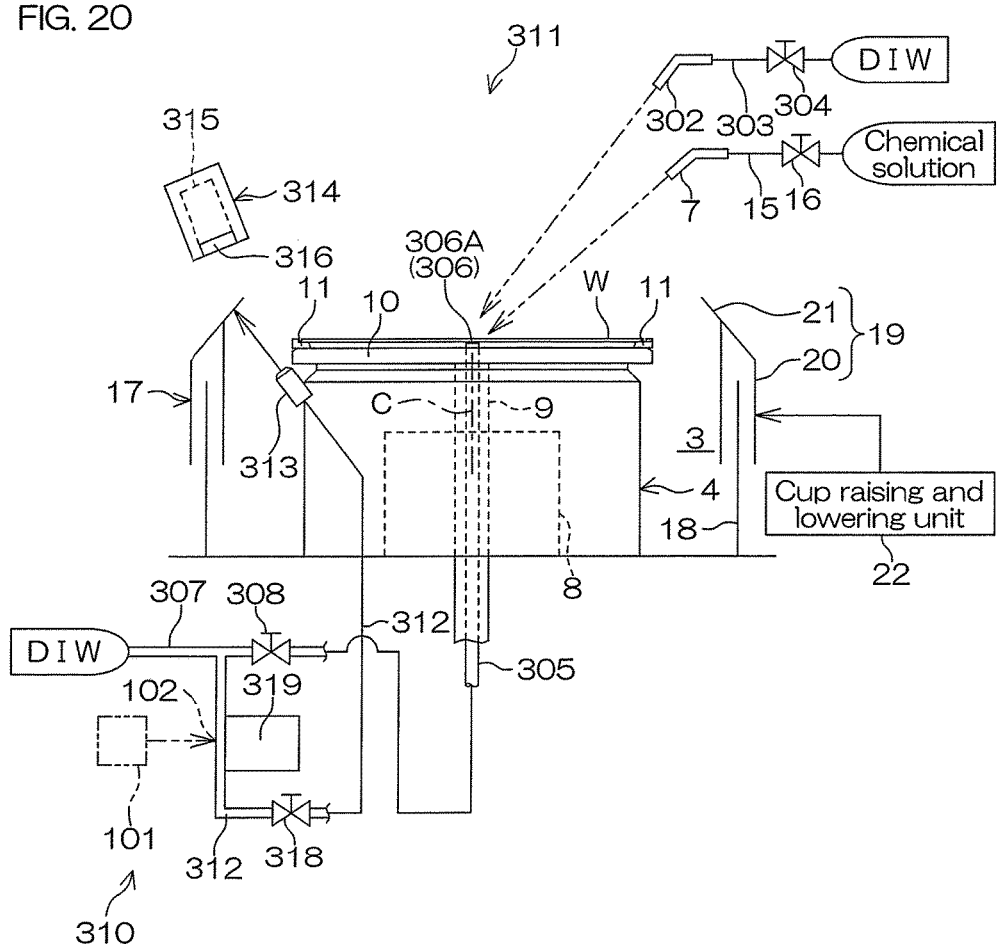
FIG. 20 is a diagram of the arrangement of a substrate processing apparatus according to an eleventh preferred embodiment of the present invention.

FIG. 20 is a diagram of the arrangement of a substrate processing apparatus 311 according to an eleventh preferred embodiment of the present invention.

Portions of the substrate processing apparatus 311 that are in common to the substrate processing apparatus 301 according to the tenth preferred embodiment are provided with the same reference symbols as in FIG. 18 and description thereof shall be omitted. With the substrate processing apparatus 311, a water supplying unit (processing liquid supplying apparatus) 310 is provided in place of the water supplying unit 300 (see FIG. 18). Also, a soft X-ray irradiating apparatus 314 is disposed inside the processing chamber 3. The eleventh preferred embodiment differs from the tenth preferred embodiment in these points.

The water supplying unit 310 includes the lower processing liquid supplying pipe 305, the lower surface nozzle 306, the water supplying piping 307, a second branch piping (branch piping) 312 branching from an intermediate portion of the water supplying piping 307, and a soft X-ray irradiating unit (X-ray irradiating means) 319 arranged to irradiate soft X-rays onto DIW (example of water) present inside the second branch piping 312. The soft X-ray irradiating unit 319 is mounted onto the second branching piping 312.

The second branch piping 312 branches from a portion of the water supplying piping 307 that is further upstream than the water valve 308. The second branch piping 312 has a round pipe shape (circular cylindrical shape) and is formed using a resin material, such as PVC (polyvinyl chloride), PTFE (polytetrafluoroethylene), and PFA (perfluoroalkylvinyl ether tetrafluoroethylene copolymer). A branch valve 318 arranged to open and close the second branch piping 312 is interposed in an intermediate portion of the second branch piping 312. The branch valve 318 is connected to the controller 40 (see FIG. 3). In the second branch piping 312, an opening (not shown) is formed in a pipe wall at a predetermined portion further upstream than the branch valve 318.

A second cup nozzle 313 is mounted onto a downstream end of the second branch piping 312. The second cup nozzle 313 is constituted of a straight nozzle that discharges liquid in a continuous flow state and is disposed fixedly, for example, on an outer wall of the spin chuck 4 in a state where its discharge port 313A (see FIG. 21; liquid receiver discharge port) is directed toward an inner wall (for example, a lower surface of the inclined portion 21) of the cup upper portion 19.

The soft X-ray irradiating unit 319 adopts an arrangement equivalent to the soft X-ray irradiating unit 62 (see FIG. 2) according to the first preferred embodiment. The soft X-ray irradiating unit 319 is mounted onto the second branch piping 312 so as to close the opening in the second branch piping 312. Specifically, an opening in the cover of the soft X-ray irradiating unit 319 (corresponding to the second opening 28 (see FIG. 2) in the cover 26 of the soft X-ray irradiating unit 62) is matched with the opening in the second branch piping 312 and a wall surface of the cover of the soft X-ray irradiating unit 319 (corresponding to the side wall 26A (see FIG. 2) of the cover 26 of the soft X-ray irradiating unit 62) is closely adhered to the outer periphery of the second branch piping 312. A high voltage unit of the soft X-ray irradiating unit 319 (corresponding to the high voltage unit 31 (see FIG. 2) of the soft X-ray irradiating unit 62 according to the first preferred embodiment) is connected to the controller 40 (see FIG. 3).

When the water valve 308 is opened in a state where the branch valve 318 is closed, DIW is supplied from the water supplying piping 307 to a lower surface nozzle 306 via the lower processing liquid supplying pipe 305 and the DIW is discharged from a discharge port 306A of the lower surface nozzle 306. When the branch valve 318 is opened in a state where the water valve 308 is closed, DIW is supplied from the second branch piping 312 to the second cup nozzle 313 and the DIW is discharged from the discharge port 313A of the second cup nozzle 313.

The soft X-ray irradiating apparatus 314 incorporates a soft X-ray generator 315 having an irradiating window 316. The soft X-rays generated at the irradiating window 316 are arranged to be emitted (radiated) to the exterior of the soft X-ray irradiating apparatus 314. The irradiation angle (irradiation range) of the soft X-rays from the irradiating window 316 is, for example, 130°, and the soft X-rays irradiated from the irradiating window 316 are, for example, 0.13 to 0.41 nm in wavelength. The soft X-ray generator 315 adopts an arrangement equivalent to the soft X-ray generator 25 (see FIG. 2) included in the soft X-ray irradiating unit 309 and the irradiating window 316 corresponds to the irradiating window 35 (see FIG. 2). The soft X-ray irradiating apparatus 314 is disposed above the cup upper portion 19 so that the irradiating window 316 faces the upper surface of the inclined portion 21 of the cup upper portion 19.

With the substrate processing apparatus 311, although the same processing as that of the processing example shown in FIG. 4 is performed, static elimination of the cup 17 is performed prior to the carrying-in of the substrate W in step S1 of FIG. 4.

Although the eleventh preferred embodiment has the point in common with the sixth preferred embodiment that static elimination of the cup 17 is performed, it differs from the sixth preferred embodiment in that not only the supplying of DIW to the cup upper portion 19 but the irradiation of soft X-rays from the soft X-ray irradiating apparatus 314 is also performed in parallel to this supplying of DIW to perform static elimination of the cup 17.

Specifically, the controller 40 controls the high voltage unit of the soft X-ray irradiating unit 319 to make the soft X-ray generator of the soft X-ray irradiating unit 319 (corresponding to the soft X-ray generator 25 (see FIG. 2) of the soft X-ray irradiating unit 62 according to the first preferred embodiment) generate the soft X-rays so that the soft X-rays are irradiated toward the interior of the second branch piping 312. Also, the controller 40 opens the branch valve 318 while closing the water valve 308. The DIW flowing through the second branch piping 312 is thereby discharged from the discharge port 313A (see FIG. 21) of the second cup nozzle 313.

Figure 21:
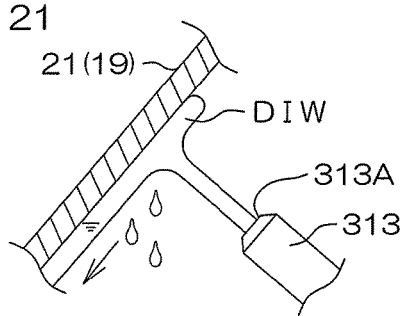
FIG. 21 is a diagram of a state where a water supplying unit, shown in FIG. 20, is supplying DIW to an inclined portion of an upper portion of a cup.

FIG. 21 is a diagram of a state where the water supplying unit 310, shown in FIG. 20, is supplying DIW to the inclined portion 21 of the cup upper portion 19.

As shown in FIG. 21, the DIW discharged from the discharge port 313A is supplied to the lower surface of the inclined portion 21 of the cup upper portion 19 and flows downward along the lower surface of the inclined portion 21. A liquid film of DIW is thus formed on the lower surface of the inclined portion 21.

At this point, the supply flow rate of DIW with respect to the second cup nozzle 313 is set to a comparatively high flow rate (for example, 0.5 to 2.0 L/min). The form of DIW discharged from the discharge port 313A of the second cup nozzle 313 is thus the form of a continuous flow connected to both the discharge port 313A and the liquid film of DIW on the lower surface of the inclined portion 21. Also, the DIW is in a liquid-tight state inside the nozzle piping of the second cup nozzle 313 and inside the second branch piping 312.

When the cup upper portion 19 is positively charged, the potential difference between the irradiated portion of DIW inside the second branch piping 312 and the positively charged cup upper portion 19 causes the electrons from the irradiated portion of DIW inside the second branch piping 312 to move along the DIW of continuous flow form toward the liquid film of DIW on the lower surface of the inclined portion 21. The liquid film of DIW on the lower surface of the inclined portion 21 is thereby made to have a large amount of electrons and static elimination of the portion of the positively charged cup upper portion 19 in contact with the liquid film of DIW is thus achieved.

On the other hand, when the cup upper portion 19 is negatively charged, electrons from the cup upper portion 19 move along the processing liquid of continuous flow form toward the positive ions at the irradiated portion of DIW inside the second branch piping 312. Static elimination of the portion of the negatively charged cup upper portion 19 in contact with the liquid film of DIW is thus achieved.

The controller 40 also controls the high voltage unit of the soft X-ray irradiating apparatus 314 to make the soft X-ray generator 315 of the soft X-ray irradiating apparatus 314 generate soft X-rays so that the soft X-rays are irradiated onto the upper surface of the inclined portion 21 of the cup upper portion 19. Although the inclined portion 21 of the cup upper portion 19 is a member that is disposed at a periphery of the substrate W during the processing, charging prevention and static elimination of the inclined portion 21 can be achieved by the irradiation of soft X-rays from the soft X-ray irradiating apparatus 314.

After the static elimination has been performed on the cup upper portion 19, the unprocessed substrate W is carried into the processing chamber 3 and conveyed to the spin chuck 4.

After the substrate W is held by the spin chuck 4, the controller 40 controls the spin motor 8 to start rotation of the substrate W by the spin chuck 4 (step S2 of FIG. 4). The rotation speed of the substrate W is increased to a predetermined liquid processing speed (for example, 500 rpm) and is thereafter maintained at the liquid processing speed.

In the rinsing processing (steps S4 to S6 of FIG. 4), the controller 40 (see FIG. 3) opens the water valve 308 while closing the branch valve 318. Also, when the predetermined time from the opening of the water valve 308 elapses and the soft X-ray irradiation timing arrives, the controller 40 controls the high voltage unit of the soft X-ray irradiating unit 319 to make the soft X-ray generator of the soft X-ray irradiating unit 319 generate the soft X-rays so that the soft X-rays are irradiated toward the interior of the second branch piping 312. DIW is thereby discharged from the lower surface nozzle 306 toward the lower surface central portion of the substrate W.

As in the tenth preferred embodiment, the DIW supplied to the lower surface central portion of the substrate W spreads outward in the rotational radius direction along the lower surface of the substrate W and flows around the circumferential end surface 322 (see FIG. 19) of the substrate W to reach the upper surface peripheral edge portion of the substrate W. The DIW flowing along the upper surface of the substrate W and the DIW flowing around from the circumferential end surface 322 of the substrate W become joined at the upper surface peripheral edge portion of the substrate W and consequently, a state is entered in which the liquid film of DIW formed across the entire upper surface of the substrate W and the liquid film of DIW formed across the entire lower surface of the substrate W are connected to each other.

Also, the form of DIW discharged from the discharge port 306A of the lower surface nozzle 306 is the form of a continuous flow connected to both the discharge port 306A and the liquid film of DIW formed on the lower surface of the substrate W. The liquid film of DIW formed on the upper surface of the substrate W and the liquid film of DIW formed on the lower surface of the substrate W are connected to each other and therefore the DIW discharged from the discharge port 306A is connected in liquid form not only to the liquid film of DIW formed on the lower surface of the substrate W but also to the liquid film of DIW formed on the upper surface of the substrate W. Also, the DIW is in a liquid-tight state inside the nozzle piping of the lower surface nozzle 306, inside the lower processing liquid supplying pipe 305, inside the water supplying piping 307, and inside the second branch piping 312.

When during the rinsing processing, the DIW present inside the second branch piping 312 is irradiated with the soft X-rays, electrons are emitted from water molecules due to excitation of the water molecules in the irradiated portion of DIW inside the second branch piping 312 (equivalent to the irradiated portion 54 of DIW according to the first preferred embodiment shown in FIG. 5). Consequently, a plasma state, in which a large amount of the electrons and a large amount of positive ions of water molecules coexist, is formed in the irradiated portion of DIW inside the second branch piping 312. The irradiated portion of DIW is connected via DIW to the liquid film of DIW formed on the lower surface of the substrate W and the liquid film of DIW formed on the upper surface of the substrate W.

If the substrate W is positively charged, the potential difference between the irradiated portion of DIW inside the second branch piping 312 and the positively charged substrate W causes the electrons from the irradiated portion of DIW inside the second branch piping 312 to move along the DIW of the lower processing liquid supplying pipe 305, the water supplying piping 307, the second branch piping 312, and the continuous flow form toward the liquid films of DIW on the upper surface and the lower surface of the substrate W. The liquid films of DIW on the upper surface and the lower surface of the substrate W are thereby made to have large amounts of electrons.

By the above, in addition to the actions and effects equivalent to those described for the tenth preferred embodiment, the eleventh preferred embodiment also exhibits the action and effect of enabling static elimination of the cup upper portion 19 to be performed satisfactorily.

When a hydrophilic coating film (corresponding to the hydrophilic coating film 38 (see FIG. 2)) peels off from an outer surface of a window member (corresponding to the outer surface 71B of the window member 71 (see FIG. 2)) of the X-ray irradiating unit 319, the beryllium contained in the window member may become dissolved in the processing liquid (for example, water, such as DIW). Even in such a case, the DIW containing such beryllium is supplied not to the lower surface nozzle 306 but to the second cup nozzle 313 because the X-ray irradiating unit 319 is provided on the second branch piping 312. The supplying of DIW containing beryllium to the substrate W can thereby be prevented reliably.

Although in the description above, it was described that the irradiation of soft X-rays by the soft X-ray irradiating apparatus 314 is executed prior to the carrying-in of the substrate W, the irradiation of soft X-rays by the soft X-ray irradiating apparatus 314 may be executed not just before the carrying-in of the substrate W but also during the spin drying (step S8 in FIG. 4). In this case, the soft X-rays are preferably irradiated onto the front surface (upper surface) of the substrate W. The soft X-rays are thereby irradiated on the front surface of the substrate W immediately after the processing liquid has been spun off and therefore charging prevention and static elimination of the substrate W can be achieved even more reliably.

Although as the arrangement of the eleventh embodiment, the two components of the water supplying unit 310 with the arrangement including the second cup nozzle 313 and the soft X-ray irradiating apparatus 314 are provided in comparison to the arrangement of the tenth preferred embodiment, an arrangement is also possible where just one of either the water supplying unit 310 or the soft X-ray irradiating apparatus 314 is added to the arrangement of the tenth preferred embodiment.

Figure 22:
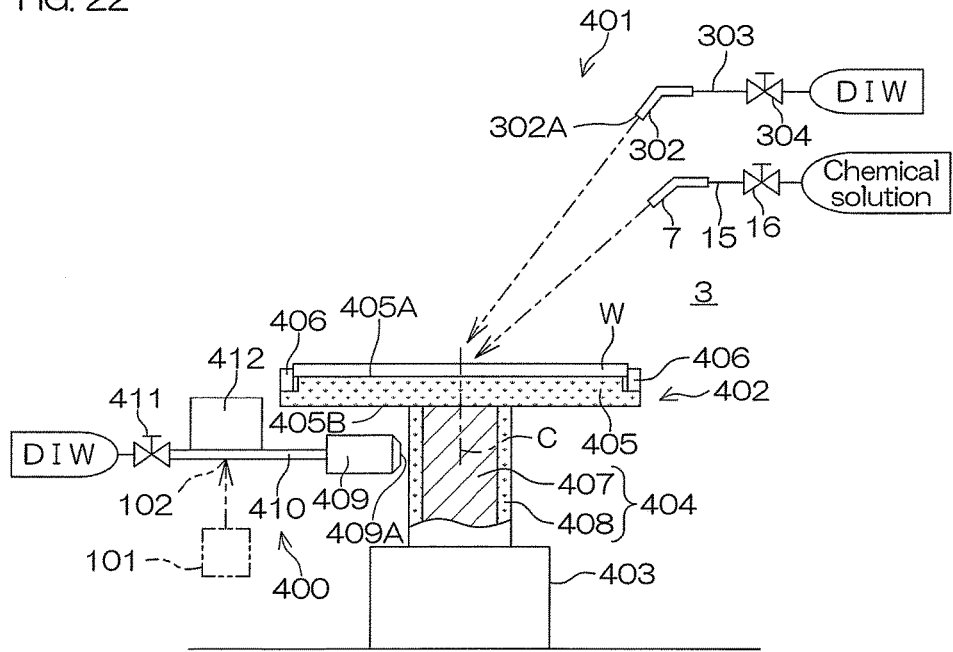
FIG. 22 is a diagram of the arrangement of a substrate processing apparatus according to a twelfth preferred embodiment of the present invention.

FIG. 22 is a diagram of the arrangement of a substrate processing apparatus 401 according to a twelfth preferred embodiment of the present invention.

Portions of the twelfth preferred embodiment that are in common to the tenth preferred embodiment are provided with the same reference symbols as in FIG. 18 and FIG. 19 and description thereof shall be omitted. The substrate processing apparatus 401 mainly differs from the substrate processing apparatus 301 (see FIG. 18) according to the tenth preferred embodiment in the two points that a spin chuck (substrate holding and rotating means) 402 is provided in place of the spin chuck 4 and that DIW (example of water) is supplied to the lower surface of the substrate W via the spin chuck 402. The substrate processing apparatus 401 includes a water supplying unit (processing liquid supplying apparatus) 400.

The spin chuck 402 is that of a clamping type. Specifically, the spin chuck 402 includes a spin motor 403, a spin shaft (supporting member) 404 made integral to a driveshaft of the spin motor 403, a disk-shaped spin base (supporting member) 405 mounted substantially horizontally on an upper end of the spin shaft 404, and a plurality of clamping members 406 disposed at a plurality of locations at substantially equal intervals of a peripheral edge portion of the spin base 405.

The spin shaft 404 includes an inner shaft portion 407, formed using a resin or a steel material, etc., and an outer cylindrical portion 408, formed using a porous material, and is made integral in a state where the inner shaft portion 407 is inserted through the outer cylindrical portion 408. That is, an outer periphery of the inner shaft portion 407 is surrounded by the outer cylindrical portion 408 in a closely adhered state.

The spin base 405 is formed using a porous material. An upper end surface of the outer cylindrical portion 408 is connected in a closely adhered state to a lower surface 405B of the spin base 405.

The clamping members 406 are formed using a steel material, etc. The specifications of the clamping members 406 and the thickness of the spin base 405 in the height direction are respectively set so that the entire lower surface of the substrate W is in contact with an upper surface of the spin base 405 in a state where the substrate W is clamped by the plurality of clamping members 406.

The porous material that is the material of the outer cylindrical portion 408 of the spin shaft 404 and the spin base 405 is, for example, a sponge made of PVA (polyvinyl alcohol) and has numerous pores. The pores of the porous material have a size (for example, a diameter of 0.05 to 100 μm) that allows the passage of DIW (example of water). DIW can thus be passed through the pores of the porous material and therefore DIW can be moved to the interior of the outer cylindrical portion 408 and the interior of the spin base 405.

Besides PVA, urethane resins, fluorine-based resins (PTFE (polytetrafluoroethylene), PEEK (polyether ether ketone), PVC (polyvinyl chloride), and PFA (perfluoroalkylvinyl ether tetrafluoroethylene copolymer)) can be cited as examples of the raw material of the porous material.

The water supplying unit 400 includes a water nozzle 409, a water supplying piping (processing liquid piping) 410 supplying DIW (example of water) from a DIW supply source to the water nozzle 409, and a soft X-ray irradiating unit (X-ray irradiating means) 412 arranged to irradiate soft X-rays onto the DIW present inside the water supplying piping 410. The soft X-ray irradiating unit 412 is mounted onto the water supplying piping 410.

The water nozzle 409 has a nozzle piping of round pipe shape (circular cylindrical shape) and is mounted onto a tip of the water supplying piping 410. The water nozzle 409 is constituted of a straight nozzle that discharges liquid in a continuous flow state and is disposed fixedly inside the processing chamber 3 in a state where a discharge port 409A thereof is directed toward the outer cylindrical portion 408 of the spin shaft 404.

The water supplying piping 410 has a round pipe shape (circular cylindrical shape). The water supplying piping 410 is formed using a resin material, such as PVC (polyvinyl chloride), PTFE (polytetrafluoroethylene), and PFA (perfluoroalkylvinyl ether tetrafluoroethylene copolymer). An opening (not shown) is formed in a pipe wall at an intermediate portion of the water supplying piping 410.

The soft X-ray irradiating unit 412 adopts an arrangement equivalent to the soft X-ray irradiating unit 62 (see FIG. 2) according to the first preferred embodiment. The soft X-ray irradiating unit 412 is mounted onto the water supplying piping 410 so as to close the opening in the water supplying piping 410. Specifically, an opening in the cover f the soft X-ray irradiating unit 412 (an opening corresponding to the second opening 28 (see FIG. 2) in the cover 26 of the soft X-ray irradiating unit 62) is matched with the opening in the water supplying piping 410 and a wall surface of the cover of the soft X-ray irradiating unit 412 (corresponding to the side wall 26A (see FIG. 2) of the cover 26 of the soft X-ray irradiating unit 62) is closely adhered to the outer periphery of the water supplying piping 410. A high voltage unit of the soft X-ray irradiating unit 412 (corresponding to the high voltage unit 31 (see FIG. 2) of the soft X-ray irradiating unit 62 according to the first preferred embodiment) is connected to the controller 40 (see FIG. 3).

A water valve 411 arranged to open and close the water supplying piping 410 is interposed in the water supplying piping 410. The water valve 411 is connected to the controller 40 (see FIG. 3). When the water valve 411 is opened, DIW is supplied from the water supplying piping 410 to the water nozzle 409, and when the water valve 411 is closed, the supply of DIW to the water nozzle 409 is stopped.

Figure 23:
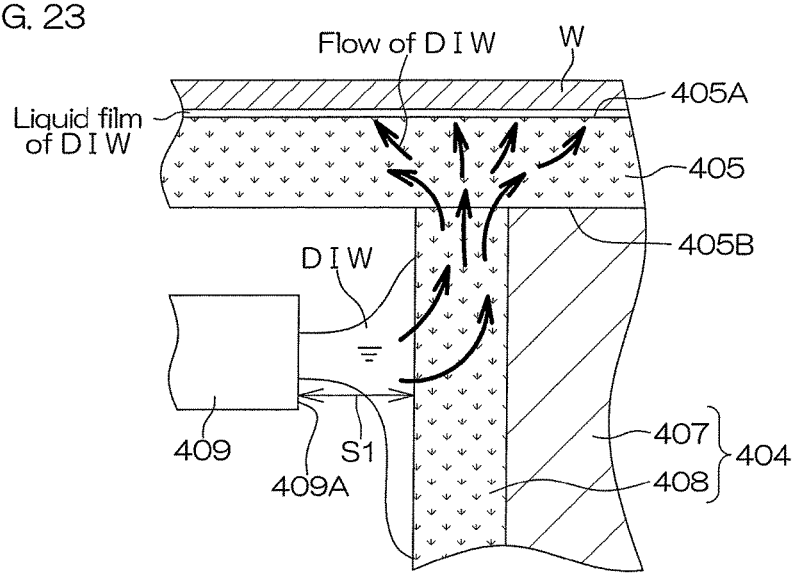
FIG. 23 is a diagram of a state where a water supplying unit, shown in FIG. 22, is supplying DIW to an outer cylindrical portion.

FIG. 23 is a diagram of a state where the water supplying unit 400 is supplying DIW to the outer cylindrical portion 408.

With the substrate processing apparatus 401, the same processing as that of the processing example shown in FIG. 4 is performed.

In the rinsing processing (steps S4 to S6 of FIG. 4), the controller 40 (see FIG. 3) opens the water valve 304. DIW is thereby discharged from the discharge port 302A of the water nozzle 302 toward the upper surface central portion of the substrate W. The DIW supplied to the upper surface central portion of the substrate W receives the centrifugal force due to the rotation of the substrate W and flows from the central portion toward the peripheral edge portion along the upper surface of the substrate W. A liquid film of DIW is thereby formed across the entire upper surface of the substrate W. The chemical solution attached to the upper surface of the substrate W is rinsed off by the liquid film of DIW.

In the rinsing processing (steps S4 to S6 of FIG. 4), the controller 40 (see FIG. 3) opens the water valve 411 in accordance with the opening of the water valve 304. The DIW flowing through the water supplying piping 410 is thereby supplied to the water nozzle 409. DIW is discharged laterally toward the outer cylindrical portion 408 of the spin shaft 404 from the discharge port 409A of the water nozzle 409.

The DIW supplied to the outer peripheral surface of the outer cylindrical portion 408 permeates into the interior of the outer cylindrical portion 408 and passes through the interior of the outer cylindrical portion 408 to be supplied to the lower surface 405B of the spin base 405. The DIW supplied to the lower surface 405B of the spin base 405 permeates into the interior of the spin base 405 and passes through the interior of the outer cylindrical portion 408 to be supplied to the upper surface 405A of the spin base 405. The DIW impregnated in the interior of the spin base 405 seeps out from the upper surface 405A to form a liquid film of DIW on the upper surface 405A as shown in FIG. 23. By this liquid film of DIW coming in liquid contact with the lower surface of the substrate W, the chemical solution attached to the lower surface of the substrate W is rinsed off by the DIW. The rinsing processing can thereby be applied to the entire lower surface of the substrate W.

With the water nozzle 409, the discharge port 409A is disposed so as to be separated from the outer peripheral surface of the outer cylindrical portion 408 across a minute interval S1. Also, the supply flow rate of DIW with respect to the water nozzle 61 during the rinsing processing is set to a comparatively high flow rate (for example, 0.5 to 2.0 L/min). The form of DIW discharged from the discharge port 409A of the water nozzle 409 is thus a continuous flow connected to both the discharge port 409A and the outer peripheral surface of the outer cylindrical portion 408 of the spin shaft 404. The DIW discharged from the discharge port 409A is thus connected in liquid form to the liquid film of DIW formed on the lower surface of the substrate W. Also, the DIW is in a liquid-tight state inside the nozzle piping of the water nozzle 409 and inside the water supplying piping 410.

When the predetermined time from the opening of the water valve 411 elapses and the soft X-ray irradiation timing arrives, the controller 40 controls the high voltage unit of the soft X-ray irradiating unit 412 to make the soft X-ray generator of the soft X-ray irradiating unit 412 (corresponding to the soft X-ray generator 25 (see FIG. 2) of the soft X-ray irradiating unit 62 according to the first preferred embodiment) generate the soft X-rays so that the soft X-rays are irradiated toward the interior of the water supplying piping 410. The soft X-rays are thereby irradiated onto the DIW flowing through the interior of the water supplying piping 410.

When during the rinsing processing, the DIW flowing through the interior of the water supplying piping 410 is irradiated with the soft X-rays, electrons are emitted from water molecules due to excitation of the water molecules in the irradiated portion of DIW inside the water supplying piping 410 (the portion equivalent to the irradiated portion 54 of DIW according to the first preferred embodiment shown in FIG. 5). Consequently, a plasma state, in which a large amount of the electrons and a large amount of positive ions of water molecules coexist, is formed in the irradiated portion of DIW inside the water supplying piping 410. The irradiated portion of DIW is connected via DIW to the liquid film of DIW formed on the lower surface of the substrate W.

If the lower surface of the substrate W is positively charged, the potential difference between the irradiated portion of DIW inside the water supplying piping 410 and the positively charged lower surface of the substrate W causes the electrons from the irradiated portion of DIW inside the water supplying piping 410 to move along the DIW of continuous flow form toward the liquid film of DIW in liquid contact with the lower surface of the substrate W. The liquid film of DIW in liquid contact with the lower surface of the substrate W is thereby made to have a large amount of electrons.

By the above, actions and effects equivalent to those described for the tenth preferred embodiment are also exhibited by the twelfth preferred embodiment.

Although with the first to twelfth preferred embodiments, the present invention has been described by way of examples of application to the single substrate processing type apparatuses 1, 201, 211, 221, 231, 251, 261, 301, 311, and 401 arranged to perform processing of a circular substrate W, with the present invention, the present invention may also be applied to a substrate conveying type substrate processing apparatus arranged to perform processing of a rectangular (sheet-shaped) substrate.

Figure 24:
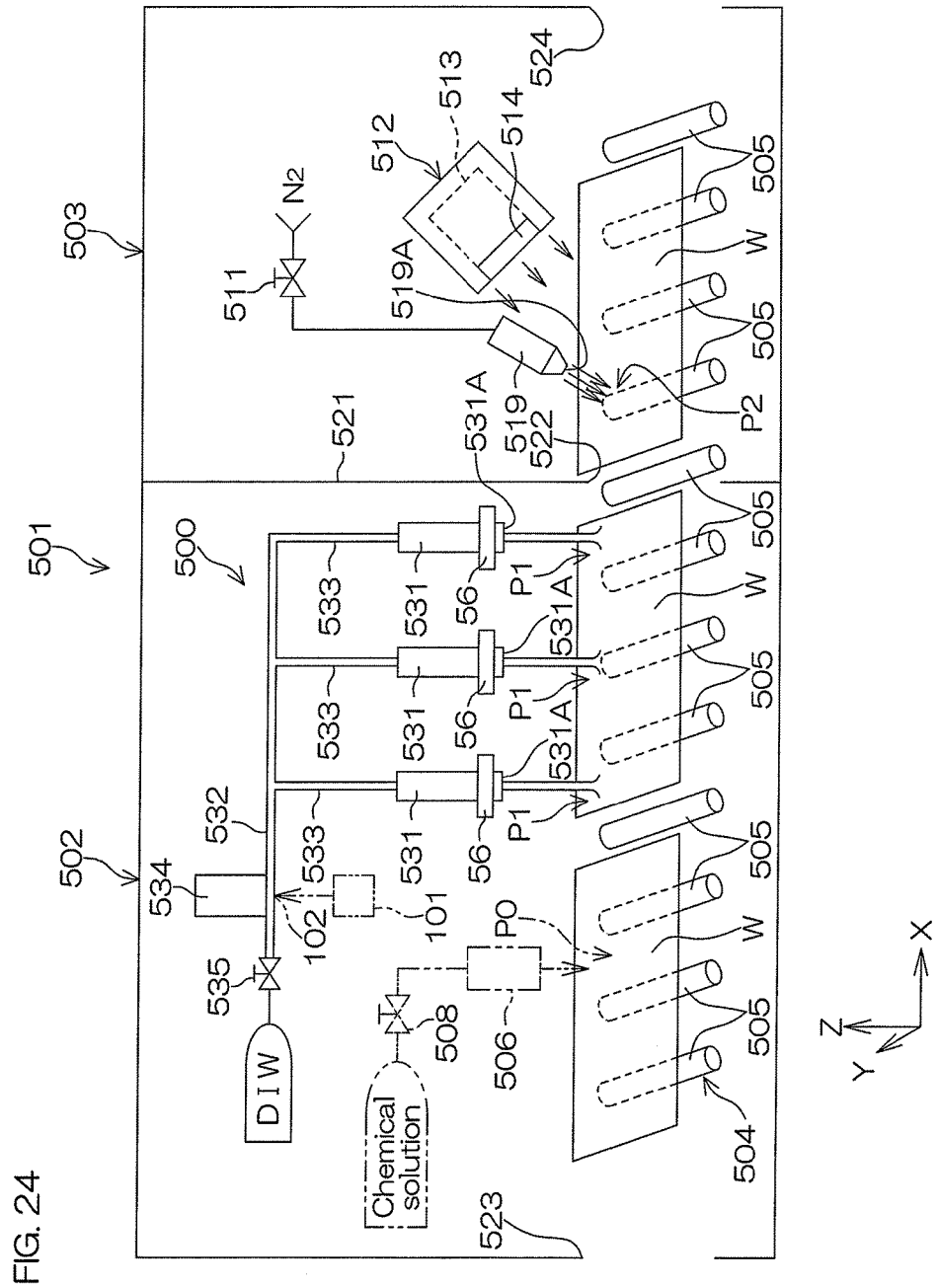
FIG. 24 is an illustrative perspective view of the arrangement of a substrate processing apparatus according to a thirteenth preferred embodiment of the present invention.

FIG. 24 is an illustrative diagram of the arrangement of a substrate processing apparatus 501 according to a thirteenth preferred embodiment of the present invention. The substrate processing apparatus 501 is an apparatus that is used to clean a front surface (processing surface) of a rectangular glass substrate for liquid crystal display device, as an example of a substrate W, by using a processing liquid, such as water. The length of one side of the rectangular substrate W that is the processing object is within a range, for example, of several dozen cm to 2 m and the plate thickness thereof is approximately 0.5 to 1.2 mm.

In the following description, the horizontal direction along the direction of conveying of the substrate W shall be the X direction, the horizontal direction orthogonal to the X direction shall be the Y direction, and the up/down direction shall be the Z direction.

The substrate processing apparatus 501 includes a roller conveying unit 504 (substrate holding and conveying means) arranged to convey the substrate W along the X direction, a water supplying unit (processing liquid supplying apparatus) 500 supplying DIW (example of water) as the processing liquid to the front surface of the substrate W conveyed by the roller conveying unit 504, a gas knife nozzle 519 blowing nitrogen gas as an example of an inert gas onto the front surface of the substrate W conveyed by the roller conveying unit 504, a soft X-ray irradiating apparatus 512 irradiating soft X-rays onto the front surface of the substrate W conveyed by the roller conveying unit 504.

The substrate processing apparatus 501 includes a cleaning processing chamber 502 arranged to supply DIW to the front surface of the substrate W to apply a cleaning processing to the front surface of the substrate W and a liquid removing chamber 503 arranged to apply a liquid removing processing of performing liquid removal of the DIW attached to the front surface of the substrate W. The cleaning processing chamber 502 and the liquid removing chamber 503 are disposed adjacent to each other. Inside the cleaning processing chamber 502, the supplying unit 500 is disposed above the roller conveying unit 504. Inside the liquid removing chamber 503, the gas knife nozzle 519 and the soft X-ray irradiating apparatus 512 are disposed in that order in the conveying direction above the roller conveying unit 504.

The roller conveying unit 504 is disposed in a state of extending in the right/left direction across an internal space of the cleaning processing chamber 502 and an internal space of the liquid removing chamber 503. The substrate W that is carried in from a substrate carry-in port 523 formed in a side wall at an upstream side of the cleaning processing chamber 502 is conveyed by the roller conveying unit 504 to be transferred into the liquid removing chamber 503 via a substrate passing port 522 formed in a partition wall 521 partitioning the cleaning processing chamber 502 and the liquid removing chamber 503. It is then conveyed inside the liquid removing chamber 503 by the roller conveying unit 504 and carried out from a substrate carry-out port 524 formed in a side wall at a downstream side of the liquid removing chamber 503.

The substrate W is placed with its front surface facing upward on the roller conveying unit 504. By the substrate W being conveyed along the X direction, the front surface of the substrate W is successively scanned by a water supplying position P1 and an inert gas jetting position P2. By this arrangement, first, DIW is supplied and then nitrogen gas is jetted after just a predetermined time later onto the front surface of the substrate W.

Figure 25:
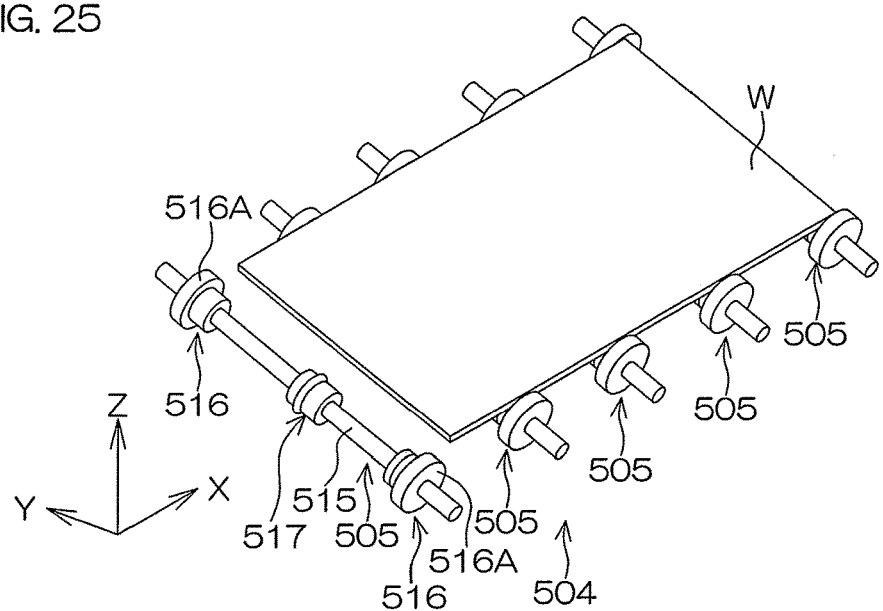
FIG. 25 is a perspective view of the arrangement of a roller conveying unit shown in FIG. 24.

FIG. 25 is a perspective view of the arrangement of the roller conveying unit 504.

With the roller conveying unit 504, conveying rollers 505 are disposed in parallel at substantially equal pitch in the X direction. The respective conveying rollers 505 are arranged to rotate in synchronization in the same direction by being driven by a driving unit (not shown).

Each conveying roller 505 includes a roller shaft 515 that is inclined with respect to the horizontal plane within a plane (Y-Z plane) orthogonal to the X direction. A conveying path realized by the roller conveying unit 504 is therefore inclined overall in the Y direction with respect to the horizontal plane. The substrate W is conveyed while being maintained in an inclined attitude. The inclination angle α (see FIG. 26) of the substrate W with respect to the horizontal surface is set, for example, to approximately 5°.

Each conveying roller 505 is a so-called partially supporting type conveying roller that includes a pair of right and left side portion rollers 516 externally fitted to respective right and left side portions of the roller shaft 515 so as to be capable of rotating in accompaniment with the roller shaft 515 and a central roller 517 provided in the central portion of the roller shaft 515.

Each individual side portion roller 516 has, at an outer side portion, a collar portion 516A that is provided integral to the side portion roller 516. The collar portion 516A prevents lateral shifting of the conveyed substrate W, and by means of the collar portion 516A at the lower side, the substrate W is prevented from slipping off along the inclined surface. Also, an O-ring (not shown), made of rubber, etc., is externally fitted onto each of the rollers 516 and 517 and the slipping off of the substrate W is prevented more reliably by an anti-slipping action of the O-ring.

As shown in FIG. 24, the water supplying unit 500 includes a plurality (for example, three in FIG. 24) of water nozzles 531 disposed inside the cleaning processing chamber 502, water supplying pipings (processing liquid pipings) 533 arranged to supply DIW to the respective individual water nozzles 531, and a collective water piping 532, to which upstream ends of the respective individual water supplying pipings 533 are connected. The plurality of water nozzles 531 are disposed, for example, at equal intervals along the X direction. Each water nozzle 531 is disposed fixedly in a state where its discharge port 531A is directed downward at a position facing an upper portion of the substrate W conveyed by the roller conveying unit 504. The collective water piping 532 is a piping arranged to supply DIW (example of water) from a DIW supply source to DIW to the plurality of water supplying pipings 533. The circular annular electrode 56 is externally fitted and fixed to the tip portion of each water nozzle 531 and a voltage with respect to an apparatus ground is arranged to be applied to each electrode 56 by the power supply 57 (see FIG. 3).

As shown in FIG. 24, each water supplying unit 500 further includes a soft X-ray irradiating unit (X-ray irradiating means) 534 arranged to irradiate soft X-rays onto the DIW present inside the collective water piping 532. The soft X-ray irradiating unit 534 is mounted onto the collective water piping 532.

The collective water piping 532 has a round pipe shape (circular cylindrical shape) and is formed using, for example, PVC (polyvinyl chloride). A collective valve 535 arranged to open and close the collective water piping 532 is interposed in an intermediate portion of the collective water piping 532. An opening (not shown) is formed in a pipe wall of the collective water piping 532 at a predetermined portion further downstream than the collective.

As shown in FIG. 24, the soft X-ray irradiating unit 534 adopts an arrangement equivalent to the soft X-ray irradiating unit 62 (see FIG. 2) according to the first preferred embodiment. The soft X-ray irradiating unit 534 is mounted onto the collective water piping 532 so as to close the opening in the collective water piping 532. Specifically, an opening in the cover of the soft X-ray irradiating unit 534 (an opening corresponding to the second opening 28 (see FIG. 2) in the cover 26 of the soft X-ray irradiating unit 62) is matched with the opening in the collective water piping 532 and a wall surface of the cover of the soft X-ray irradiating unit 534 (corresponding to the side wall 26A (see FIG. 2) of the cover 26 of the soft X-ray irradiating unit 62) is closely adhered to the outer periphery of the collective water piping 532. A high voltage unit of the soft X-ray irradiating unit 534 (corresponding to the high voltage unit 31 (see FIG. 2) of the soft X-ray irradiating unit 62 according to the first preferred embodiment) is connected to the controller 40 (see FIG. 3). When the collective valve 535 is opened, DIW is supplied from the collective water piping 532 to the respective individual water supplying pipings 533 and the DIW is discharged from the discharge ports 531A of the respective water nozzles 531.

As shown in FIG. 24, the gas knife nozzle 519 is a nozzle arranged to jet nitrogen gas as an example of inert gas onto the upper surface of the substrate W conveyed by the roller conveying unit 504 to blow off the DIW attached to the upper surface of the substrate W. CDA (clean dry air) can be cited as another example of inert gas. The gas knife nozzle 519 has, at its tip, a slit jetting port 519A that is long in the Y direction and is capable of supplying nitrogen gas across a range extending over the entire width in the Y direction of the substrate W conveyed by the roller conveying unit 504. The gas knife nozzle 519 is disposed fixedly inside the liquid removing chamber 503 so that the slit jetting port 519A faces the upper surface of the substrate W across a minute interval.

Nitrogen gas from a nitrogen gas source is supplied to the gas knife nozzle 519 via an inert gas valve 511. The gas knife nozzle 519 jets the nitrogen gas in a band shape along the Y direction.

The direction of blowing of the inert gas from the slit jetting port 519A of the gas knife nozzle 519 with respect to the upper surface of the substrate W is inclined in a direction opposite (toward the left side in FIG. 24) to the conveying direction of the substrate W with respect to the vertical direction. The inclination angle θ (see FIG. 27) is, for example, within a range of 20° to 70°.

As shown in FIG. 24, the soft X-ray irradiating apparatus 512 incorporates a soft X-ray generator 513 having an irradiating window 514. The soft X-rays generated at the irradiating window 514 are arranged to be emitted (radiated) to the exterior of the soft X-ray irradiating apparatus 512. The irradiation angle (irradiation range) of the soft X-rays from the irradiating window 512 is, for example, 130°, and the soft X-rays irradiated from the irradiating window 514 are, for example, 0.13 to 0.41 nm in wavelength. The soft X-ray generator 315 adopts an arrangement equivalent to the soft X-ray generator 25 (see FIG. 2) included in the soft X-ray irradiating unit 534 and the irradiating window 514 corresponds to the irradiating window 35 (see FIG. 2). The soft X-ray irradiating apparatus 512 is disposed above the substrate W conveyed by the roller conveying unit 504 and further downstream than the gas knife nozzle 519. Specifically, the soft X-ray irradiating apparatus 512 is disposed at a position at which the irradiating window 514 faces the inert gas jetting position P2.

Figure 26:
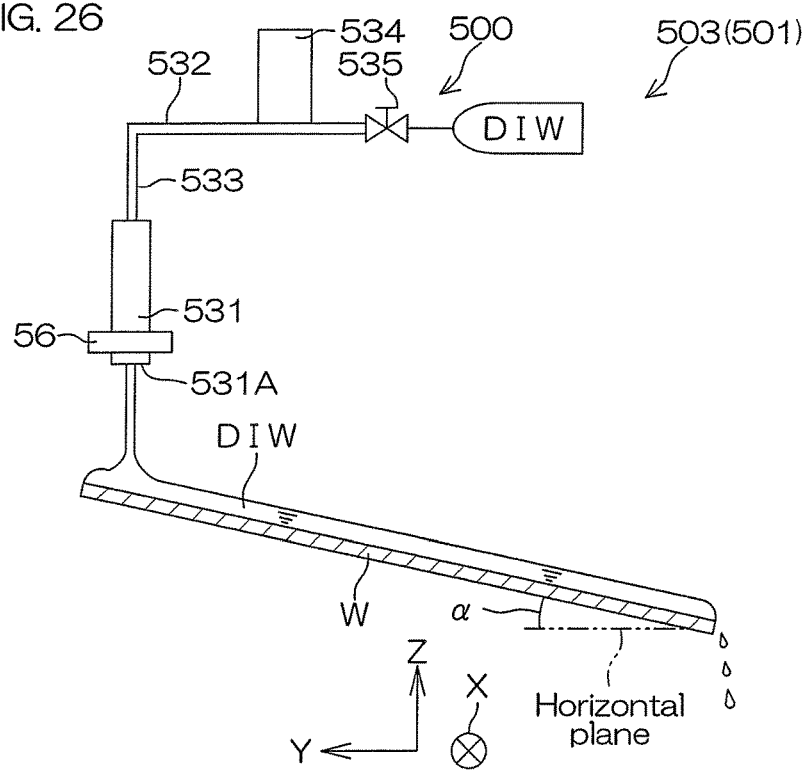
FIG. 26 is a sectional view of a state where a water supplying unit, shown in FIG. 24, is supplying DIW to a substrate.
Figure 27:
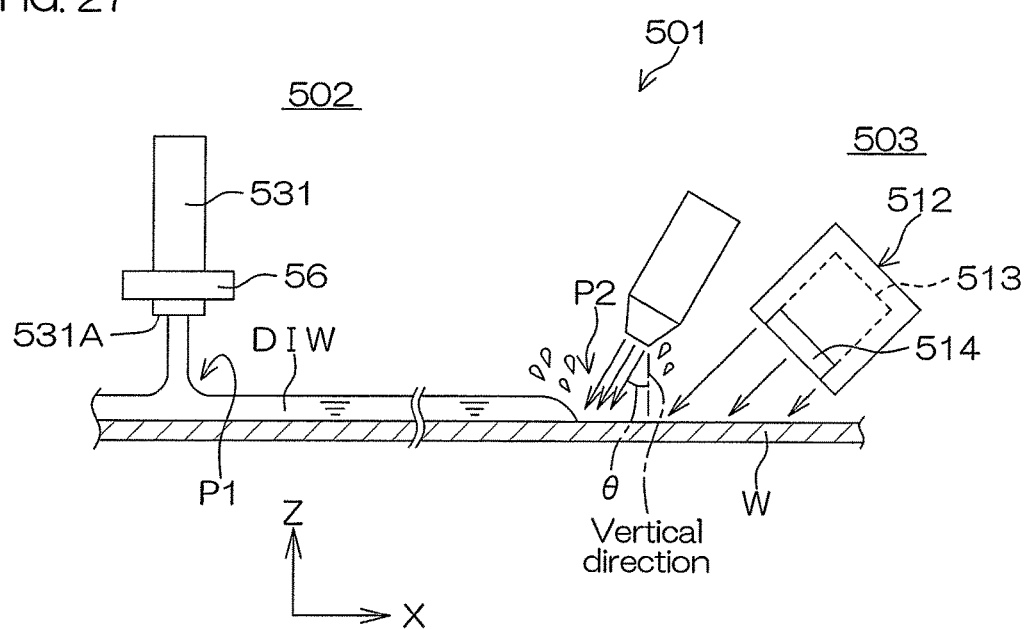
FIG. 27 is a sectional view of a state where a soft X-ray irradiating apparatus, shown in FIG. 24, is irradiating soft X-rays onto an upper surface of the substrate.

FIG. 26 is a sectional view of a state where the water supplying unit 500 is supplying DIW to the substrate W. FIG. 27 is a sectional view of a state where the soft X-ray irradiating apparatus 512 is irradiating the soft X-rays onto the upper surface of the substrate.

As shown in FIG. 26 and FIG. 27, the DIW discharged from each discharge port 531A is supplied to the water supplying position P1 of the upper surface of the substrate W and flows down the upper surface of the substrate W along the inclined surface. A liquid film of DIW is thereby formed on the upper surface of the substrate W. Also, the supply flow rate of DIW with respect to each water nozzle 531 is set to a comparatively high flow rate (for example, 1 to several dozen L/min according to the size of the glass substrate and the degree of cleaning). The DIW discharged from each discharge port 531A thus takes the form of a continuous flow connected to both the discharge port 531A of the water nozzle 531 and the liquid film of DIW on the upper surface of the substrate W. Also, the DIW is in a liquid-tight state inside the nozzle piping of the water nozzle 531, inside the collective water piping 532, and inside the water supplying piping 533.

During the series of processing, soft X-rays from the soft X-ray irradiating unit 534 are irradiated onto the interior of the collective water piping 532. When the soft X-rays are irradiated onto the DIW present inside the collective water piping 532, electrons are emitted from water molecules due to excitation of the water molecules in the irradiated portion of DIW inside the collective water piping 532 (the portion equivalent to the irradiated portion 54 of DIW according to the first preferred embodiment shown in FIG. 5). Consequently, a plasma state, in which a large amount of the electrons and a large amount of positive ions of water molecules coexist, is formed in the irradiated portion of DIW inside the collective water piping 532. The irradiated portion of DIW is connected via DIW to the liquid film of DIW formed on the upper surface of the substrate W.

If the substrate W is positively charged, the potential difference between the irradiated portion of DIW inside the collective water piping 532 and the positively charged substrate W causes the electrons from the irradiated portion of DIW inside the collective water piping 532 to move along the DIW of continuous flow form toward the liquid film of DIW on the upper surface of the substrate W. The liquid film of DIW on the upper surface of the substrate W is thereby made to have a large amount of electrons.

By the above, the charging of the substrate W can be prevented by the processing using DIW. Also, even if the substrate W is charged from before the cleaning processing, the charges carried by the substrate W can be eliminated (that is, static elimination can be achieved). Consequently, device breakdown due to charging of the substrate W can be prevented.

Also, at the inert gas jetting position P2, the nitrogen gas from the slit jetting port 519A of the gas knife nozzle 519 is blown onto the liquid film of DIW formed on the upper surface of the substrate W (the liquid film connected via the continuous flow of DIW to the discharge port 531A). Also at the inert gas jetting position P2, the soft X-rays generated by the soft X-ray generator 513 of the soft X-ray irradiating apparatus 512 are irradiated onto the upper surface of the substrate W.

By the blowing on of the nitrogen gas, the DIW is blown off the upper surface of the substrate W and the DIW attached to the upper surface of the substrate W is eliminated. The soft X-rays are irradiated onto the inert gas jetting position P2. The soft X-rays are irradiated onto the portion of the upper surface of the substrate W from which the DIW was removed (blown off) immediately before so that charge prevention and static elimination of the substrate W can be achieved even more reliably.

Although with the thirteenth preferred embodiment, a case of processing the substrate W using water (for example, DIW) inside the cleaning processing chamber 502 was described as an example, the substrate W may also be processed using a processing that uses a chemical solution and water inside the cleaning processing chamber 502. In this case, a chemical solution nozzle 506 is disposed further upstream than the water supplying unit 500 as indicated by alternate long and two short dashed lines in FIG. 24. A chemical solution from a chemical solution supply source is arranged to be supplied via a chemical solution valve 508 to the chemical solution nozzle 506. That is, a chemical solution supplying position P0 is set further upstream than the water supplying position P1.

Although with the thirteenth preferred embodiment, the roller conveying unit 504 that conveys the substrate W in an inclined attitude was described as an example, the roller conveying unit 504 may instead be arranged to convey the substrate W while keeping it in a horizontal attitude.

Also, although with the substrate processing apparatus 501 according to the thirteenth preferred embodiment, that which cleans the upper surface (major surface at the upper side) of the substrate W was described as an example, the present invention can also be applied to a substrate processing apparatus of a type that applies a cleaning processing to both surfaces of a substrate. In this case, the water supplying unit 500 and the gas knife nozzle 519 are disposed at the lower side of the roller conveying unit 504 in the cleaning processing chamber 502 and the liquid removing chamber 503, respectively, DIW is supplied to the lower surface of the substrate W at the water supplying position P1 by the water supplying unit 500 at the lower side, and nitrogen gas is jetted onto the lower surface of the substrate W at the inert gas jetting position P2 by the gas knife nozzle 519 at the lower side.

Although with the first to thirteenth preferred embodiments, the processing liquid supplying units 100, 200, 220, 230, 250, 260, 300, 310, 400, and 500 installed in the substrate processing apparatuses 1, 201, 211, 221, 231, 251, 261, 301, 311, 401, and 501, with which the substrate W is the processing object, were described as examples, the present invention may be applied to a processing unit, with which an object besides the substrate W is the processing object. A container cleaning apparatus 601, with which the processing object is a substrate container (container) 602 and which is arranged to clean the processing object using a cleaning liquid (processing liquid), shall now be descried as an example.

Figure 28:
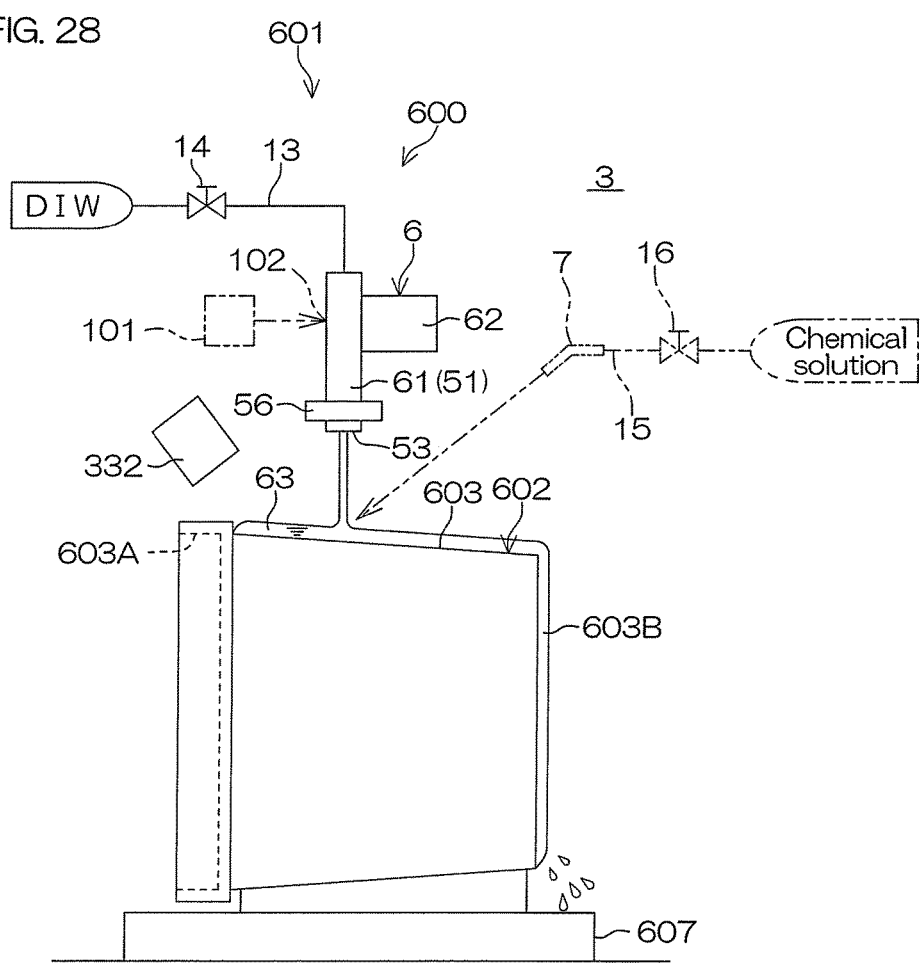
FIG. 28 is a diagram of the arrangement of an article cleaning apparatus according to a fourteenth preferred embodiment of the present invention.
Figure 29:
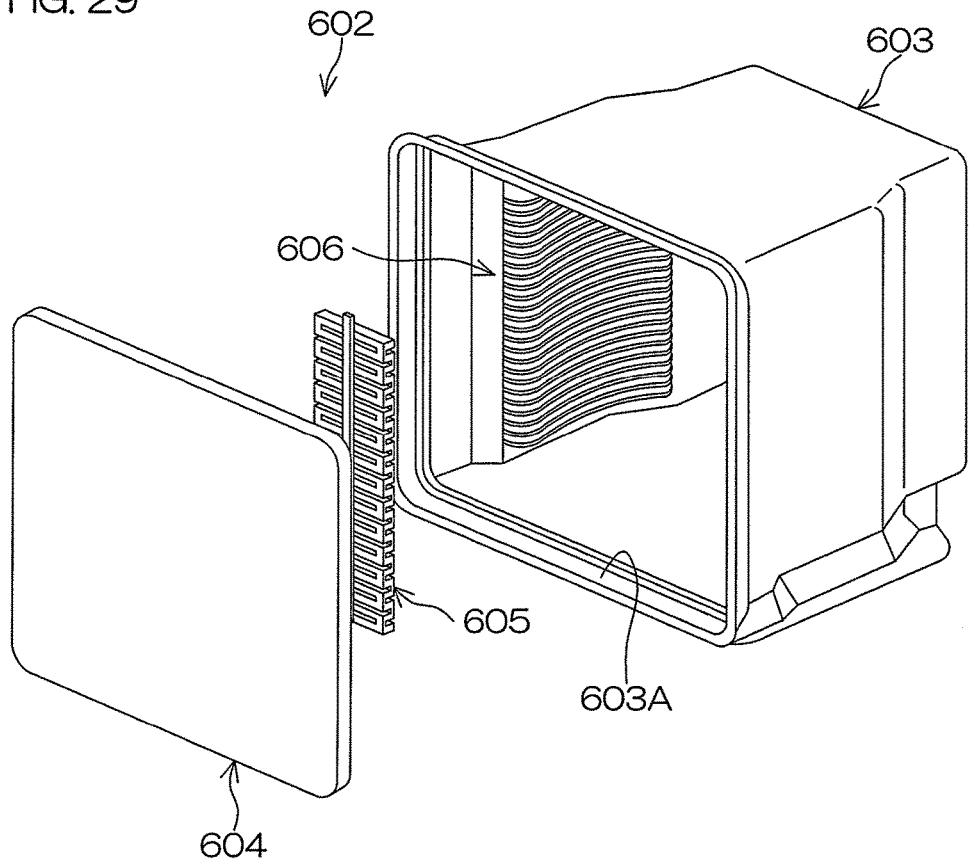
FIG. 29 is a perspective view of the arrangement of a substrate container shown in FIG. 28.

FIG. 28 is a diagram of the arrangement of an article cleaning apparatus 601 according to a fourteenth preferred embodiment of the present invention. FIG. 29 is a perspective view of the arrangement of a substrate container 602.

As shown in FIG. 29, the substrate container 602 is a container that houses substrates W in a sealed state. An FOSB (front opening shipping box) can be cited as an example of the substrate container 602. The FOSB is mainly used for delivery of substrates W from a semiconductor wafer manufacturer to a semiconductor device manufacturer. The FOSB houses a plurality of unprocessed substrates W and prevents damaging of the substrates W while maintaining the degree of cleanness of the substrates W.

As shown in FIG. 28, the article cleaning apparatus 601 includes an installation base 607, on which a container main body 603 of the substrate container 602 is installed, and a water supplying unit (processing liquid supplying apparatus) 600 supplying DIW as an example of a cleaning liquid to the substrate container 602. The water supplying unit 600 adopts an arrangement equivalent to that of the water supplying unit 100 (see FIG. 1) according to the first preferred embodiment. The same reference symbols are thus provided in FIG. 28 and description thereof shall be omitted. The water nozzle 61 of the water supplying unit 600 is disposed above the container main body 603 installed on the installation base 607 and with its discharge port 53 directed downward.

The substrate container 602 includes the container main body 603 with the shape of a bottomed box and having an opening 603A at a side, a lid 604 arranged to open and close the opening 603A of the container main body 603 (a state where the lid 604 is closed is shown in FIG. 28), a multiple-stage container support rack 606 mounted on an inner wall of the container main body 603, and a multiple-stage lid support rack 605 mounted on the lid 604. The substrates W are taken into and out of the interior of the container main body 603 via the opening 603A. The container main body 603 and the lid 604 are respectively formed using, for example, a resin material, such as PVC (polyvinyl chloride). The container main body 603 has substantially cubical outer frame shape and, as shown in FIG. 28, the opening side may have a slightly larger diameter in comparison to a bottom portion side. In this case, an upper surface of the container main body 603 has an inclined surface.

In the cleaning processing, DIW is supplied from the water supplying unit 600 to an outer wall of the container main body 603 of the substrate container 602. Specifically, the water valve 14 is opened and the DIW flowing through the water supplying piping 13 is supplied to the water nozzle 61. The DIW is thereby discharged downward from the discharge port 53 of the water nozzle 61 toward an upper surface of the outer wall of the container main body 603. Also, the controller 40 makes the soft X-ray generator 25 (see FIG. 2) generate the soft X-rays so that the soft X-rays are irradiated toward the interior of the first nozzle piping 51 of the water nozzle 61. The soft X-rays are thereby irradiated onto the DIW flowing through the interior of the first nozzle piping 51.

The DIW supplied to the side surface at the upper side of the outer wall of the container main body 603 flows down along the side surface at the upper side, which is constituted of an inclined surface, and the bottom surface. A liquid film of DIW is thereby formed on the outer wall of the container main body 603. Dirt, debris, etc., attached to the outer wall of the container main body 603 are thus rinsed off by the liquid film.

When during the cleaning processing, the DIW present inside the first nozzle piping 51 is irradiated with the soft X-rays, electrons are emitted from water molecules due to excitation of the water molecules in the irradiated portion 54 of DIW inside the first nozzle piping 51 (see FIG. 5). Consequently, a plasma state, in which a large amount of the electrons and a large amount of positive ions of water molecules coexist, is formed in the irradiated portion 54 of DIW.

The supply flow rate of DIW with respect to the water nozzle 61 during the cleaning processing is set to a comparatively high flow rate (for example, 1 to 10 L/min according to the size of the container 602, etc.). The form of DIW discharged from the discharge port 53 of the water nozzle 61 is thus the form of a continuous flow connected to both the discharge port 53 and the outer wall of the container main body 603. The liquid film of DIW is thus formed on the outer wall of the container main body 603. By this liquid film, the liquid film 63 formed on the outer wall of the container main body 603 and the irradiated portion 54 of DIW are connected via DIW. Also, the DIW is in a liquid-tight state inside the nozzle piping of the water nozzle 61.

If the outer wall of the container main body 603 is positively charged, the potential difference between the irradiated portion 54 of DIW and the positively charged outer wall of the container main body 603 causes the electrons from the irradiated portion 54 of DIW to move along the DIW of continuous flow form toward the liquid film of DIW in liquid contact with the outer wall of the container main body 603. The liquid film of DIW in liquid contact with the outer wall of the container main body 603 is thereby made to have a large amount of electrons. At this point, the liquid film 63 of DIW and the irradiated portion 54 of DIW are connected via DIW.

By the above, the charging of the container main body 603 during the cleaning processing can be prevented by the fourteenth preferred embodiment. Also, even if the container main body 603 is charged from before the cleaning processing, the charges carried by the container main body 603 can be eliminated (that is, static elimination can be achieved).

Although with the fourteenth preferred embodiment, an example of cleaning the container main body 603 was described, the cleaning method may be adopted similarly to clean the lid 604 or the support rack 605 or 606 to apply the cleaning processing to the lid 604 or the support rack 605 or 606 while achieving static elimination of the lid 604 or the support rack 605 or 606.

Also, although the FOSB was described as an example of the substrate container 602, an FOUP (front opening unified pod), which houses substrates W in a sealed state and is mainly used for conveying substrates W within a plant of a semiconductor wafer manufacturer, can also be cited as an example. Besides this, an FOUP (front opening unified pod), an SMIF (standard mechanical interface) pod, OC (open cassette), and other forms of substrate containers can be cited as examples of the substrate container 602.

Also, the container is not restricted to that which houses a substrate W, and the processing object may be a medium container housing a disk-shaped medium, such as a CD, DVD, blue disk, or a parts container housing an optical part, such as a lens, mirror, diffraction grating.

Next, a static elimination test was performed to confirm that static elimination of a processing object, such as a silicon wafer, glass substrate, container, can be achieved by supplying DIW (example of water) from a water supplying unit that incorporates a soft X-ray irradiating unit. The contents and results of this static elimination test shall now be described.

Figure 30:
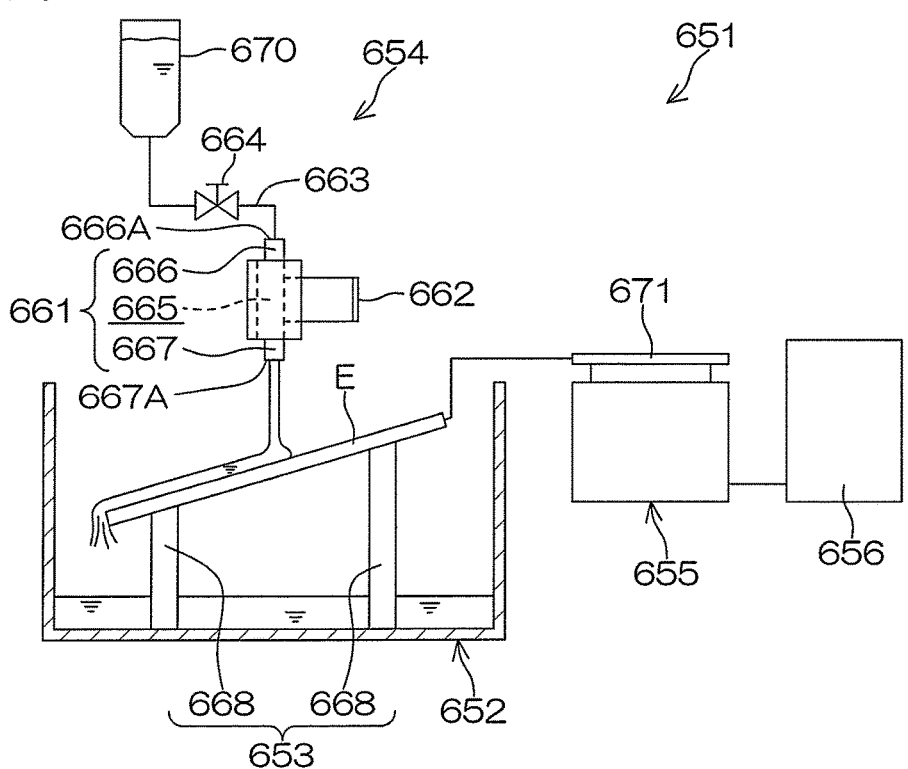
FIG. 30 is a diagram for describing a test apparatus used in a static elimination test.

FIG. 30 is a diagram for describing a test apparatus 651 used in the static elimination test.

The test apparatus 651 includes a bottomed container 652 made of resin, a charged body holding base 653 arranged to hold a charged body E inside the container 652, a water supplying unit 654 arranged to supply a processing liquid to the charged body E held by the charged body holding base 653, a charging plate monitor 655 arranged to measure a charge amount of a charged body E held by the charged body holding base 653 while charging the charged body E, and a recorder 656 arranged to record the charge amount measured by the charged plate monitor 655. The charged plate monitor 655 has a metal plate 671 in electrical conduction with the charged body E. CPM 210, manufactured by Ion Systems Inc., USA, can be cited as an example of the charged plate monitor 655, and Hioki 8841, manufactured by Hioki E. E. Corporation, can be cited as an example of the recorder 656.

The water supplying unit 654 includes a water nozzle 661, a soft X-ray irradiating unit 662 arranged to irradiate soft X-rays onto DIW (example of water) flowing through the interior of the water nozzle 661, and a water supplying piping 663 supplying DIW from a DIW tank 670 to the water nozzle 661. The soft X-ray irradiating unit 662 is mounted onto the water supplying piping 663. A valve 664 arranged to open and close and adjust an opening degree of the water supplying piping 663 is interposed in the water supplying piping 663.

The water nozzle 661 has an ionization chamber 665, an inflow port portion 666 having an inlet 666A allowing DIW to flow into the ionization chamber 665, and an outflow port portion 667 having an outlet 667A for the DIW that flowed through the interior of the ionization chamber 665. The ionization chamber 665 is formed to a flat rectangular shape, and an internal space of the ionization chamber 665 is set to a rectangular shape with a flow direction length of approximately 100 mm×a flow direction width of approximately 5 mm×a flow direction depth of approximately 60 mm.

The soft X-ray irradiating unit 662 adopts an arrangement equivalent to the soft X-ray irradiating unit 62 according to the first preferred embodiment. The soft X-ray irradiating unit 662 has a soft X-ray generator corresponding to the soft X-ray generator 25 (see FIG. 2) according to the first preferred embodiment. A soft X-ray ionizer (L9490 manufactured by Hamamatsu Photonics K. K.) can be cited as an example of the soft X-ray generator. In the soft X-ray irradiating unit 662, the diameter of a round opening corresponding to the second opening 28 (see FIG. 2) is, for example, 17 mm.

In the present static elimination test, a rectangular metal plate (130 mm×93 mm×1 mm thickness) is used as the charged body E subject to measurement. The substrate holding base 653 holds the charged body E in an inclined attitude that is inclined by a predetermined angle with respect to the horizontal plane. In a state where the charged body E is held by the substrate holding base 653, the charged body E is electrically insulated from the container 652 by blocks 668 made of PTFE (polytetrafluoroethylene) that are included in the substrate holding base 653. An interval between an upper end portion of the charged body E and the outlet 667A is, for example, 55 mm.

In the test apparatus 651, an experiment is performed according to the following procedure.

First step: The valve 664 is adjusted to make DIW (with a conductivity of not more than 1 μS/cm in the present case) drip down in a droplet form (discontinuous flow form) from the outlet 667A of the water nozzle 661. The droplet form refers to a state where a droplet and a subsequent droplet are not connected.

Second step: The charged body E was charged via the metal plate 671 of the charged plate monitor 655, the soft X-ray generator of the soft X-ray irradiating unit 662 was turned on/off, and the time required for the electric potential of the charged body E to be attenuated from +/−4.5 kV to +/−3.5 kV (static elimination time) in this state was measured using the charged plate monitor 655 and the recorder 656.

Third step: Thereafter, the valve 664 is adjusted to make DIW flow down at a fixed flow rate (0.77 L/min or 0.08 L/min) in a continuous flow form (state of flowing in a liquid column form) from the outlet 667A of the water nozzle 661. The water nozzle 661 was made variable in height in this state and measurements were made for the respective cases where the distance from the outlet 667A of the water nozzle 661 to the upper end of the charged body E was 55 mm, 1000 mm, and 3000 mm. In the case where the distance was 1000 mm or 3000 mm, a 6φ×4 mm vinyl chloride tube wound in a coil form was mounted to a tip of the water nozzle 661.

Fourth step: The charged body E inside the container 652 was charged via the metal plate 671 of the charged plate monitor 655, the soft X-ray generator was turned on/off, and the time required for the electric potential of the charged body E to be attenuated from +/−1 kV to +/−0.1 kV (static elimination time) in this state was measured using the charged plate monitor 655 and the recorder 656. The experimental results are shown in Table 1 to Table 3.

TABLE 1

| | Static elimination time (seconds) | |
|---|---|---|
| Soft X-rays | +4.5 kV to +3.0 kV | −4.5 kV to −3.0 kV |
| OFF | 31.5 | 31.4 |
| ON | 32.2 | 32.6 |

The experimental results for the cases where DIW was dripped in the droplet form are shown in Table 1. As shown in Table 1, regardless of turning on/off the soft X-ray generator, the time required for the electric potential of the charged body E to be attenuated from +/−4.5 kV to +/−3.5 kV (static elimination time) was substantially fixed. From the experimental results shown in Table 1, it can be understood that static elimination of the charged body E is hardly achieved when DIW is dripped in the droplet form.

TABLE 2

| Flow rate | | Static elimination time (seconds) | |
|---|---|---|---|
| (L/min) | Soft X-rays | −1.0 kV to +0.1 kV | −1.0 kV to −0.1 kV |
| 0.77 | OFF | 26.9 | 27.8 |
| | ON | 1.02 | 1.08 |
| 0.08 | OFF | — | 36.3 |
| | ON | 1.02 | 1.06 |

The experimental results for the cases where DIW was made to flow down in the continuous flow form are shown in Table 2. As shown in Table 2, in both cases of DIW flow rate of 0.774 L/min and 0.08 L/min, the time required for the electric potential of the charged body E to be attenuated from +/−1 kV to +/−0.1 kV (static elimination time) was shortened by the turning on of the soft X-ray generator. The static elimination times in these cases were slightly more than 1 second. From the experimental results shown in Table 2, it can be understood that static elimination performance is improved when DIW is made to flow down in the continuous flow form.

TABLE 3

| | Static elimination time (seconds) | |
|---|---|---|
| Distance (mm) | +1.0 kV to +0.1 kV | −1.0 kV to −0.1 kV |
| 55 | 1.04 | 1.12 |
| 1000 | 1.16 | 1.22 |
| 3000 | 1.30 | 1.74 |

The experimental results for the cases where the distance from the outlet of the water nozzle 661 to the charged body E was changed with the DIW being made to flow down in the continuous form are shown in Table 3. As shown in Table 3, although the time required for the electric potential of the charged body E to be attenuated from +/−1 kV to +/−0.1 kV (static elimination time) increases slightly with increase of the distance from the outlet of the water nozzle 661 to the charged body E, static elimination can be accomplished in 1 to 2 seconds even when the distance is 3000 mm. From this, it can be understood that the distance from the outlet of the water nozzle 661 to the charged body E does not have a large influence on the static elimination performance.

From the above experimental results, the principles of static elimination of performing static elimination of a processing object by supplying DIW from a water supplying unit incorporating a soft X-ray irradiating unit are presumed to be as follows. That is, electrons are emitted from water molecules excited by soft X-ray irradiation and the irradiated portion is in a plasma state in which positive ions of the water molecules excited by the soft X-rays and electrons coexist.

If the processing object is positively charged, the potential difference between the irradiated portion of DIW and the charged processing object causes the electrons of the irradiated portion of DIW to move toward the positively charged processing object, and static elimination of the positively charged processing object is achieved. Also, if the processing object is negatively charged, electrons move from the charged processing object toward the positive ions at the irradiated portion of DIW, and static elimination of the negatively charged processing object is achieved.

Figure 31:
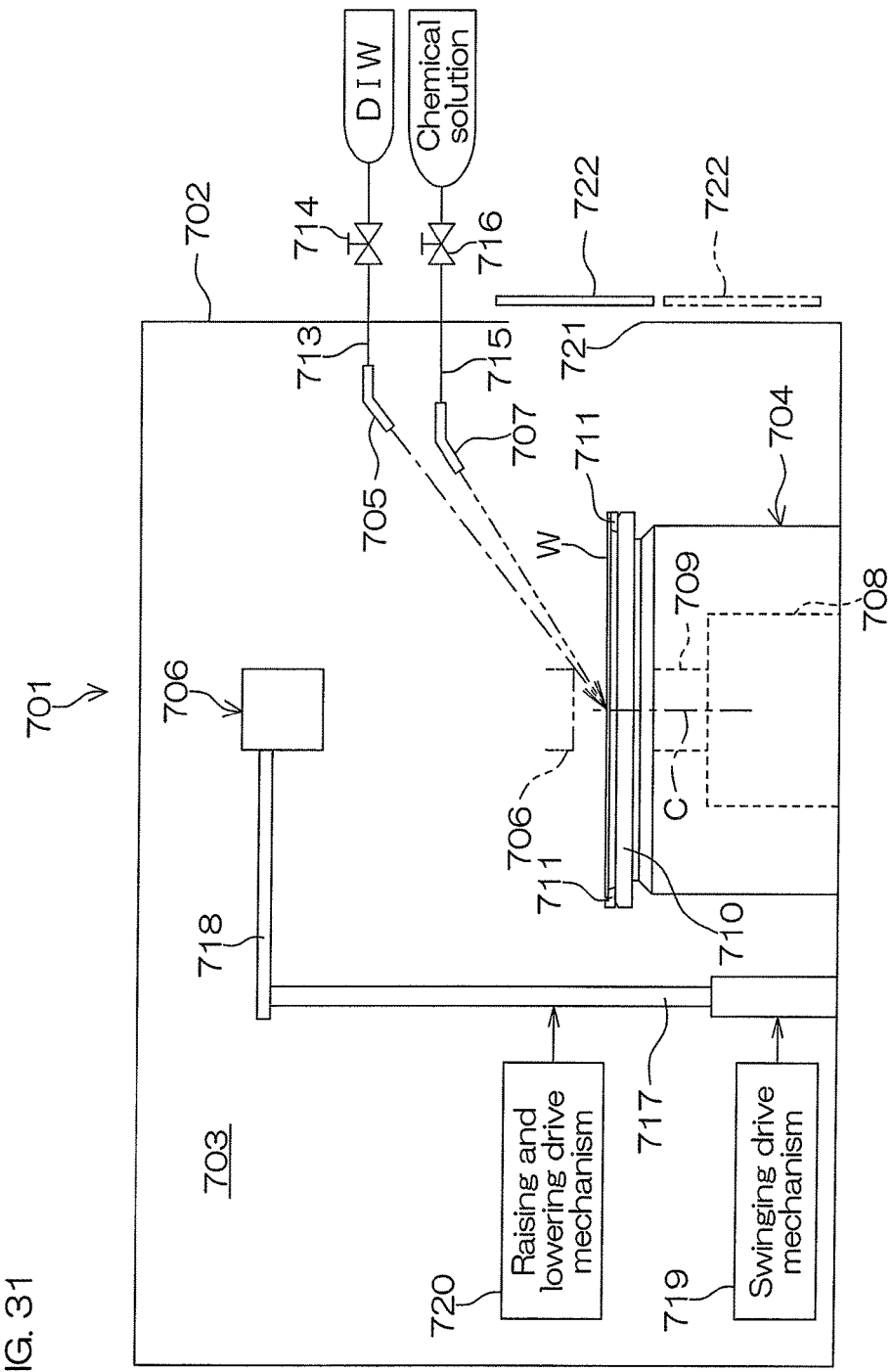
FIG. 31 is a diagram of the arrangement of a substrate processing apparatus according to a fifteenth preferred embodiment of the present invention.

FIG. 31 is a diagram of the arrangement of a substrate processing apparatus 701 according to a fifteenth preferred embodiment of the present invention.

The substrate processing apparatus 701 is a single substrate processing type apparatus that is used to perform processing using processing liquids (a chemical solution and water) on a front surface (processing surface) of a circular semiconductor wafer (silicon wafer) as an example of the substrate W. With the present preferred embodiment, water is used for the rinsing of the substrate W that is performed after a chemical solution processing. For example, an oxide film, etc., is formed on the front surface of the substrate W to be processed.

The substrate processing apparatus 701 includes, inside a processing chamber 703 partitioned by a partition wall 702, a spin chuck (substrate holding means) 704 that holds and rotates the substrate W in a horizontal attitude, a water nozzle (water supplying means) 705 arranged to discharge DIW (deionized water; pure water) as an example of water onto the front surface (upper surface) of the substrate W held by the spin chuck 704, a soft X-ray irradiating head (X-ray irradiating means) 706 arranged to irradiate soft X-rays onto the front surface of the substrate W held by the spin chuck 704, and the chemical solution nozzle 7 arranged to discharge the chemical solution onto the front surface of the substrate W held by the spin chuck 704.

As the spin chuck 704, for example, that of a clamping type is adopted. Specifically, the spin chuck 704 includes a spin motor 708, a spin shaft 709 made integral to a driveshaft of the spin motor 708, a disk-shaped spin base 710 mounted substantially horizontally on an upper end of the spin shaft 709, and a plurality of clamping members 711 disposed at a plurality of locations at substantially equal intervals of a peripheral edge portion of the spin base 710. The spin chuck 704 is thereby enabled to rotate the spin base 710 by the rotational driving force of the spin motor 708 in a state where the substrate W is clamped by the plurality of clamping members 711 to rotate the substrate W, maintained in the substantially horizontal attitude, around a rotation axis C together with the spin base 710.

The spin chuck 704 is not restricted to a clamping type and, for example, a vacuum suction type (vacuum chuck) arrangement that vacuum-suctions a rear surface of the substrate W to hold the substrate W in a horizontal attitude and further performs rotation around the vertical rotation axis C in this state to rotate the held substrate W may be adopted instead.

The water nozzle 705 is, for example, a straight nozzle that discharges DIW in a continuous flow state and is disposed fixedly above the spin chuck 704 with its discharge port directed toward a vicinity of the rotation center of the substrate W. The water nozzle 705 is connected to a water supplying pipe 713 to which DIW is supplied from a DIW supply source. A water valve (water supplying means) 714 arranged to switch between supplying and stopping the supplying of DIW from the water nozzle 705 is interposed in an intermediate portion of the water supplying pipe 713.

The chemical solution nozzle 707 is, for example, a straight nozzle that discharges the chemical solution in a continuous flow state and is disposed fixedly above the spin chuck 704 with its discharge port directed toward a vicinity of the rotation center of the substrate W. The chemical solution nozzle 707 is connected to a chemical solution supplying pipe 715 to which the chemical solution is supplied from a chemical solution supply source. A chemical solution valve 716 arranged to switch between supplying and stopping the supplying of the chemical solution from the chemical solution nozzle 707 is interposed in an intermediate portion of the chemical solution supplying pipe 715.

Also, the chemical solution nozzle 707 is not required to be disposed fixedly with respect to the spin chuck 704 and, for example, a so-called scan nozzle arrangement may be adopted where the nozzle is mounted on an arm capable of swinging within a horizontal plane above the spin chuck 704 and a liquid landing position of the chemical solution on the front surface of the substrate W is scanned by the swinging of the arm.

A supporting shaft 717, extending in a vertical direction, is disposed at a side of the spin chuck 704. An arm 718, extending in a horizontal direction, is coupled to an upper end portion of the supporting shaft 717, and the soft X-ray irradiating head 706 is mounted on a tip of the arm 718. A swinging drive mechanism (moving means) 719, arranged to rotate the supporting shaft 717 around an axis, and a raising and lowering drive mechanism (moving means) 720, arranged to move the supporting shaft 717 up and down along its axial direction, are coupled to the supporting shaft 717.

By inputting a driving force into the supporting shaft 717 from the swinging drive mechanism 719 to rotate the supporting shaft 717 within a predetermined angular range, the arm 718 is swung, with the supporting shaft 717 as a support point, above the substrate W held by the spin chuck 704. By the swinging of the arm 718, the soft X-ray irradiating head 706 can be moved between a position that includes a point above the rotation axis C of the substrate W (position facing the rotation center of the substrate W) and a home position set at a side of the spin chuck 704. Also, by inputting a driving force into the supporting shaft 717 from the raising and lowering drive mechanism 720 to raise/lower the supporting shaft 717, the soft X-ray irradiating head 706 is raised/lowered between a proximity position proximal to the front surface of the substrate W held by the spin chuck 704 (position indicated by an alternate long and two short dashed line in FIG. 31) and a retracted position retracted above the substrate W (position indicated by a solid line in FIG. 31). In the present preferred embodiment, the proximity position is set to a position at which the interval between the front surface of the substrate W held by the spin chuck 704 and a lower surface (lower surface of a lower wall 726A) of the soft X-ray irradiating head 706 is a predetermined interval (for example, approximately 10 mm) in a range of 1 to 30 mm.

An opening 721 for carrying the substrate W into and out of the interior of the processing chamber 703 is formed in a side wall (one of a plurality of side walls) of the partition wall 702. When the substrate W is carried in or out, a hand of a transfer robot (not shown), facing the opening 721 outside the processing chamber 703, accesses the interior of the processing chamber 703 through the opening 721. An unprocessed substrate W can thereby be placed on the spin chuck 704 or a processed substrate W can be removed from the spin chuck 704. The opening 721 is opened and closed by a shutter 722. The shutter 722 is raised and lowered between a closed position (indicated by solid lines in FIG. 31) of covering the opening 721 and an open position (indicated by alternate long and two short dashed lines in FIG. 31) of opening the opening 721 by a shutter raising and lowering mechanism (not shown) coupled to the shutter 722.

Figure 32:
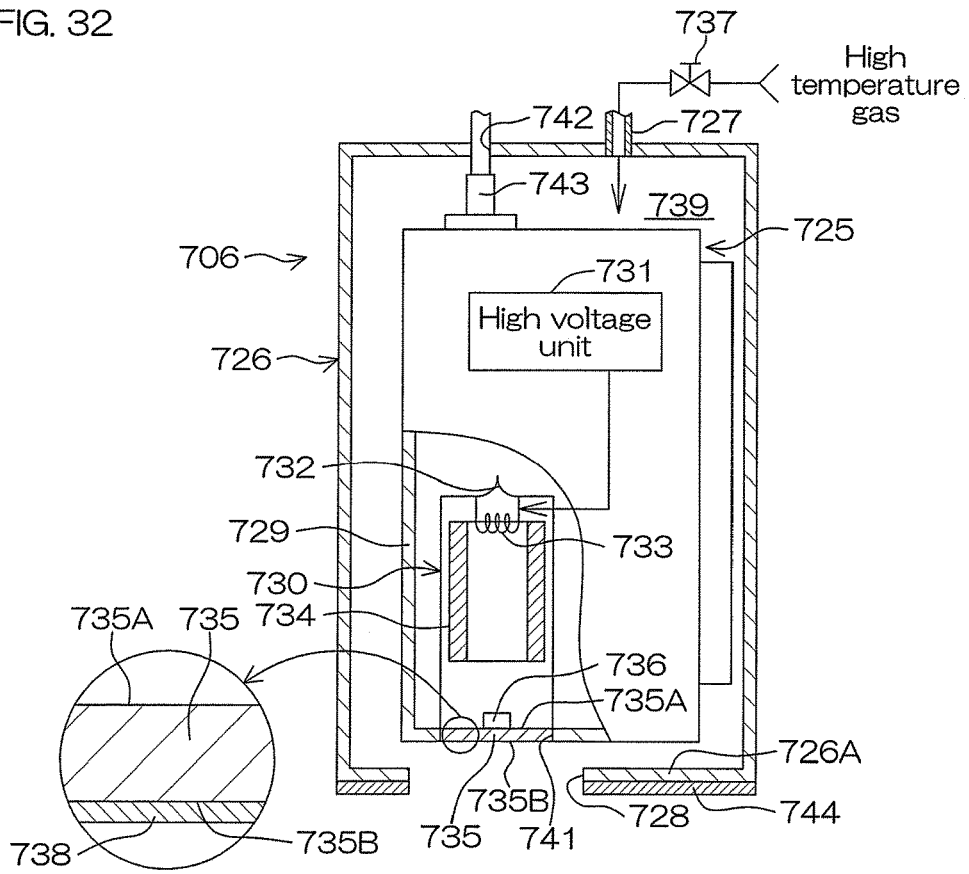
FIG. 32 is an illustrative vertical sectional view of a soft X-ray irradiating head shown in FIG. 31.

FIG. 32 is an illustrative sectional view of the soft X-ray irradiating head 706.

The soft X-ray irradiating head 706 includes an X-ray generator 725, a cover 726 made, for example, of polyvinyl chloride (PVC) and surroundingly covering a periphery of the X-ray generator 725, and a gas nozzle (gas supplying means) 727, arranged to supply a gas into the interior of the cover 726. The cover 726 has an oblong rectangular box shape that surrounds the periphery of the X-ray generator 725 across an interval from the X-ray generator 725 and has an opening 728, having, for example, a circular shape, formed in a portion of a horizontal plate-shaped lower wall 726A facing an irradiating window 735 to be described after the X-ray generator 725.

The X-ray generator 725 emits (radiates) soft X-rays used to ionize the DIW on the substrate W. The X-ray generator 725 includes a case body 729, an X-ray tube 730 that is long in the up/down direction and arranged to generate the soft X-rays, and a high voltage unit 731 supplying a high voltage to the X-ray tube 730. The case body 729 has an oblong rectangular cylindrical shape, houses the X-ray tube 730 and the high voltage unit 731 in its interior, and is formed using a material having electrical conductivity and thermal conductivity (for example, a metal material, such as aluminum).

The high voltage unit 731 inputs a driving voltage of high electrical potential, for example, of −9.5 kV into the X-ray tube 730. The high voltage unit 731 is supplied with a voltage from a power supply (not shown) via a feeder 743 led outside the cover 726 through a penetrating hole 742 formed in the cover 726.

The X-ray tube 730 is constituted of a vacuum tube of circular cylindrical shape made of glass or metal and is disposed so that the tube direction is vertical. A lower end portion (opening end portion) of the X-ray tube 730 is opened to form a circular opening 741. An upper end portion of the X-ray tube 730 is closed and constitutes a stem 732. Inside the X-ray tube 730, a filament 733, which is a cathode, and a target 736, which is an anode, are disposed so as to face each other. The X-ray tube 730 houses the filament 733 and a focusing electrode 734. Specifically, the filament 733 is disposed as the cathode at the stem 732. The filament 733 is electrically connected to the high voltage unit 731. The filament 733 is surrounded by the focusing electrode 734 of circular cylindrical shape.

The opening end portion of the X-ray tube 730 is closed by the plate-shaped irradiating window 735 of vertical attitude. The irradiating window 735 has, for example, a disk shape and is fixed to the wall surface at the opening end portion of the X-ray tube 730 by silver alloy brazing. As the material of the irradiating window 735, a substance of low atomic weight is used so that the soft X-rays of weak penetrability can be transmitted readily and in the present preferred embodiment, beryllium (Be), is adopted. The thickness of the irradiating window 735 is set, for example, to approximately 0.3 mm.

The target 736 made of metal is formed by vapor deposition on an inner surface 735A of the irradiating window 735. A metal of high atomic weight and high melting point, such as tungsten (W) or tantalum (Ta), is used in the target 736.

Figure 37:
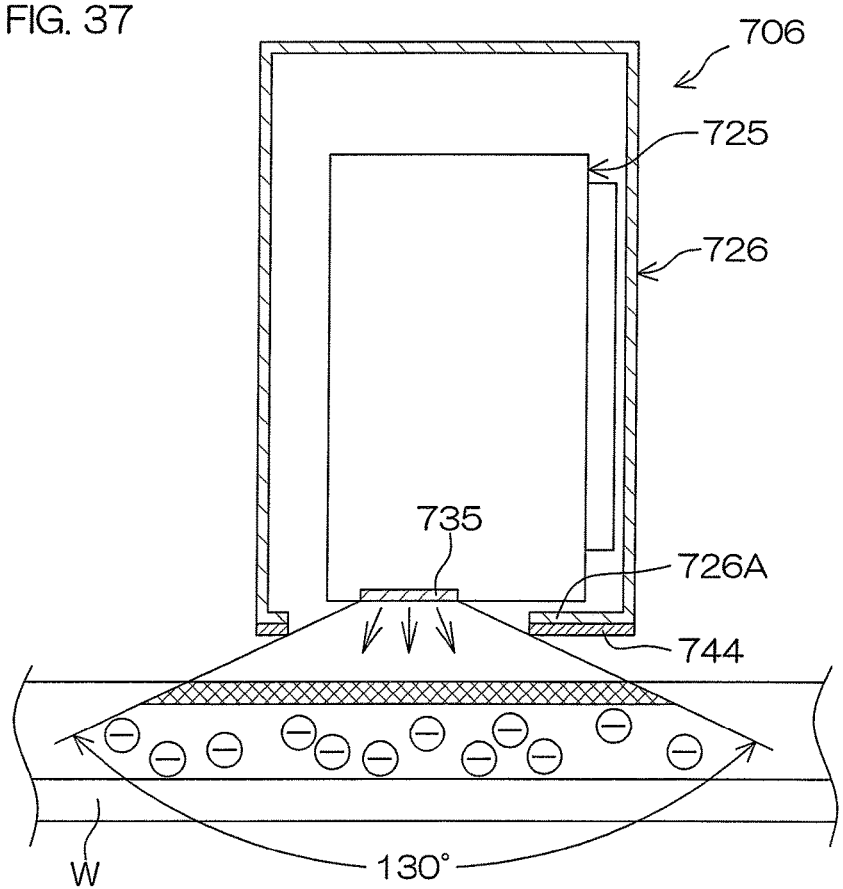
FIG. 37 is an illustrative diagram of a state of a vicinity of a front surface of a substrate in the rinsing processing.

By application of the driving voltage from the high voltage unit 731 to the filament 733 that is the cathode, electrons are emitted from the filament 733. The electrons emitted from the filament 733 are converged and made into an electron beam by the focusing electrode 734 and generate soft X-rays upon colliding against the target 736. The generated soft X-rays are emitted (radiated) downward from the irradiating window 735. The irradiation angle (irradiation range) of the soft X-rays from the irradiating window 735 is a wide angle (for example, 130°) as shown in FIG. 37. The soft X-rays irradiated out of the soft X-ray irradiating head 706 from the irradiating window 735 are, for example, 0.13 to 0.41 nm in wavelength.

The irradiating window 735 is the generation source that generates the soft X-rays. The irradiation of soft X-rays from the irradiating window 735 may thus be obstructed if the irradiating window 735 is fogged due to attachment of water droplets, etc., on an outer surface 735B thereof and this is not preferable.

The entirety of the outer surface 735B of the irradiating window 735 is covered by a polyimide resin coating film 738 having water repellency. The outer surface 735B of the irradiating window 735 is covered with the coating film 738 to protect the irradiating window 735, which is made of beryllium that is poor in acid resistance, from an acid contained in water or other processing liquid. The polyimide resin coating film 738 has a polyamic acid type polyimide resin. The film thickness of the polyimide resin coating film 738 is not more than 50 μm and is especially preferably approximately 10 μm. The coating film 738 has water repellency and moisture can thus be removed from the outer surface 735B of the irradiating window 735. Fogging of the irradiating window 735 can thus be suppressed or prevented. Also, the polyimide resin coating film 738 is high in chemical stability and the outer surface 735B of the irradiating window 735 can thus be protected continuously over a long period.

The periphery of the X-ray generator 725 is covered by the cover 726 to protect the X-ray generator 725 from moisture. As mentioned above, the X-ray generator 725 includes the high voltage unit 731 and therefore if the ambient atmosphere of the X-ray generator 725 contains a large amount of moisture, the high voltage may leak when the soft X-rays are generated. The periphery of the X-ray generator 725 is thus covered by the cover 726 to suppress the entry of moisture into the X-ray generator 725.

A discharge port of the gas nozzle 727 is opened in an upper wall of the cover 726. A gas from a gas supply source (not shown) is supplied to the gas nozzle 727 via a gas valve (gas supplying means) 737. Also, a gas of higher temperature (for example, 60° C.) than ordinary temperature (for example, 25° C.) is supplied to the gas nozzle 727 and therefore the gas nozzle 727 discharges the gas of high temperature (for example, 60° C.). As examples of the gas discharged by the gas nozzle 727, an inert gas such as CDA (clean dry air), nitrogen gas, can be cited. The gas discharged from the gas nozzle 727 is supplied to the interior of the cover 726.

As mentioned above, the opening 728 for allowing the transmission of the soft X-rays from the irradiating window 735 is formed in the lower wall 726A of the cover 726. Therefore, with the supplying of the gas into the interior of the cover 726, a gas flow directed toward the opening 728 is formed in, that is, in a space between the cover 726 and the outer wall of the X-ray generator 725. Entry of the atmosphere outside the cover 726 into the interior of the cover 726 via the opening 728 can thus be suppressed or prevented to further suppress the entry of moisture into the ambient atmosphere of the X-ray generator 725.

Also as mentioned above, the water repellent coating film 738 is formed on the outer surface 735B of the irradiating window 735. Moisture thus does not precipitate in the form of a film across the front surface of the irradiating window 735 but is formed into minute water droplets. The water droplets attached to the outer surface 735B of the irradiating window 735 are in contact with the outer surface 735B with a high contact angle and it may be said that the water droplets are in a state of being easily movable along the outer surface 735B. The gas supplied inside the cover 726 passes through a space 739 between the X-ray generator 725 and the cover 726 and reaches the outer surface of the irradiating window 735. The water droplets attached to the outer surface 735B of the irradiating window 735 move upon receiving the gas flow formed in the space 739. The water droplets can thus be removed satisfactorily from the outer surface 735B of the irradiating window 735 and fogging of the irradiating window 735 can be prevented reliably. Also, the gas supplied inside the cover 726 is of high temperature so that the water droplets attached to the outer surface 735B of the irradiating window 735 can be eliminated by evaporation, and fogging of the irradiating window 735 can thus be prevented even more reliably.

On the lower wall 726A of the cover 726, a sheet-shaped heater (heating member) 744 is disposed near a periphery of the opening 728. The heater 744 is formed by printing a resistor body onto a sheet. By supplying electricity to the heater 744, the heater 744 is made to rise in temperature so that members in its periphery are warmed and the irradiating window 735 is also warmed. The water droplets attached to the outer surface 735B of the irradiating window 735 can thus be eliminated by evaporation, and the fogging of the irradiating window 735 can thereby be prevented even more reliably.

Figure 33:
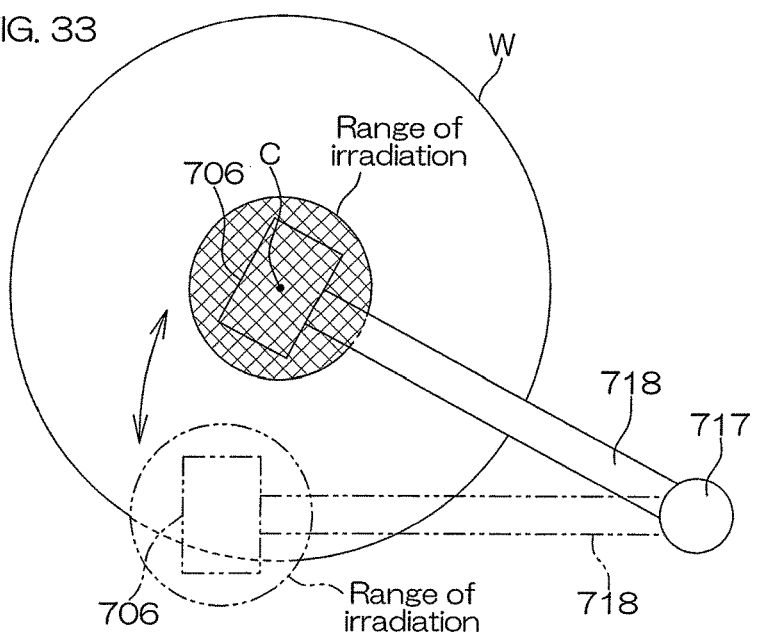
FIG. 33 is a plan view of the movement of the soft X-ray irradiating head shown in FIG. 31.

FIG. 33 is a plan view of placement positions of the soft X-ray irradiating head 706.

By control of the swinging drive mechanism 719, the soft X-ray irradiating head 706 can be moved along an arcuate locus intersecting the direction of rotation of the substrate W along the front surface of the substrate W held by the spin chuck 704. When the soft X-rays are to be irradiated onto the front surface of the substrate W by the soft X-ray irradiating head 706, the soft X-ray irradiating head 706 is positioned at the proximity position. It is kept positioned at the proximity position during the irradiation of soft X-rays. The placement position of the soft X-ray irradiating head 706 indicated by solid lines in FIG. 33 is a center proximity position, which is a proximity position at which the rotation center (along the rotation axis C) of the front surface of the substrate W is included in the range of irradiation from the irradiating window 735 of the soft X-ray irradiating head 706. The placement position of the soft X-ray irradiating head 706 indicated by alternate long and two short dashed lines in FIG. 33 is an edge proximity position, which is a proximity position at which a peripheral edge of the front surface of the substrate W is included in the range of irradiation from the irradiating window 735 of the soft X-ray irradiating head 706.

Figure 34:
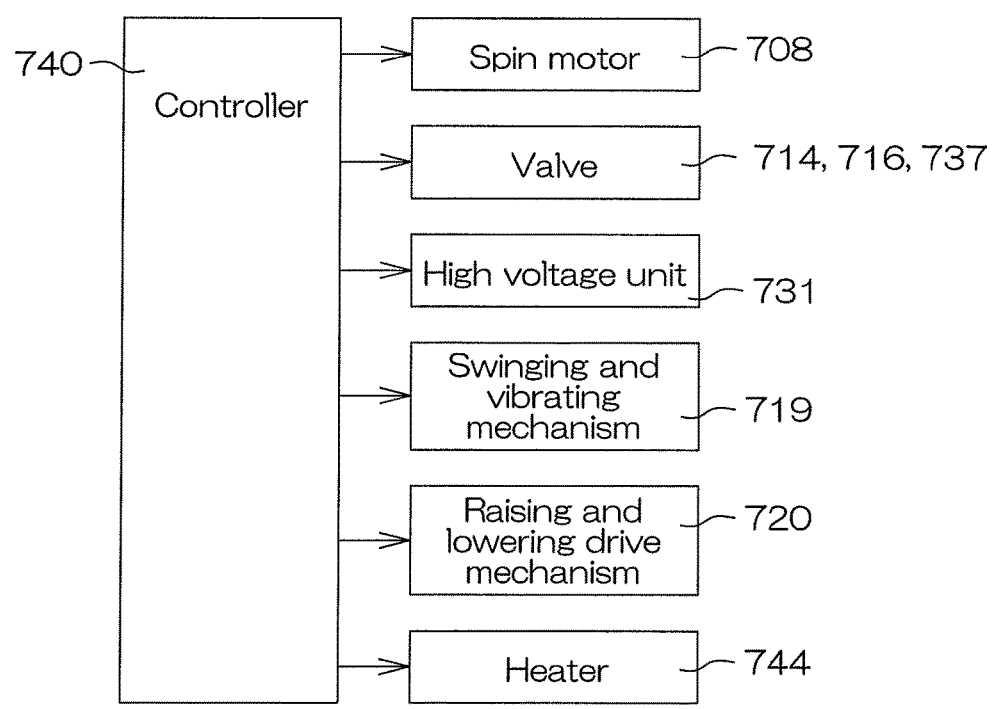
FIG. 34 is a block diagram of the electrical arrangement of the substrate processing apparatus shown in FIG. 31.

FIG. 34 is a block diagram of the electrical arrangement of the substrate processing apparatus 701. The substrate processing apparatus 701 further includes a controller (control means) 740 with an arrangement that includes a microcomputer. The spin motor 708, the high voltage unit 731, the swinging drive mechanism 719, the raising and lowering drive mechanism 720, the chemical solution valve 716, the water valve 714, the gas valve 737, the heater 744, etc., are connected as control objects to the controller 740.

To maintain the irradiating window 735 in an unfogged state, the gas valve 737 is constantly opened and the heater 744 is driven while the power of the substrate processing apparatus 701 is turned on. The heater 744 is heated and raised in temperature, for example, to approximately 100° C.

Figure 35:
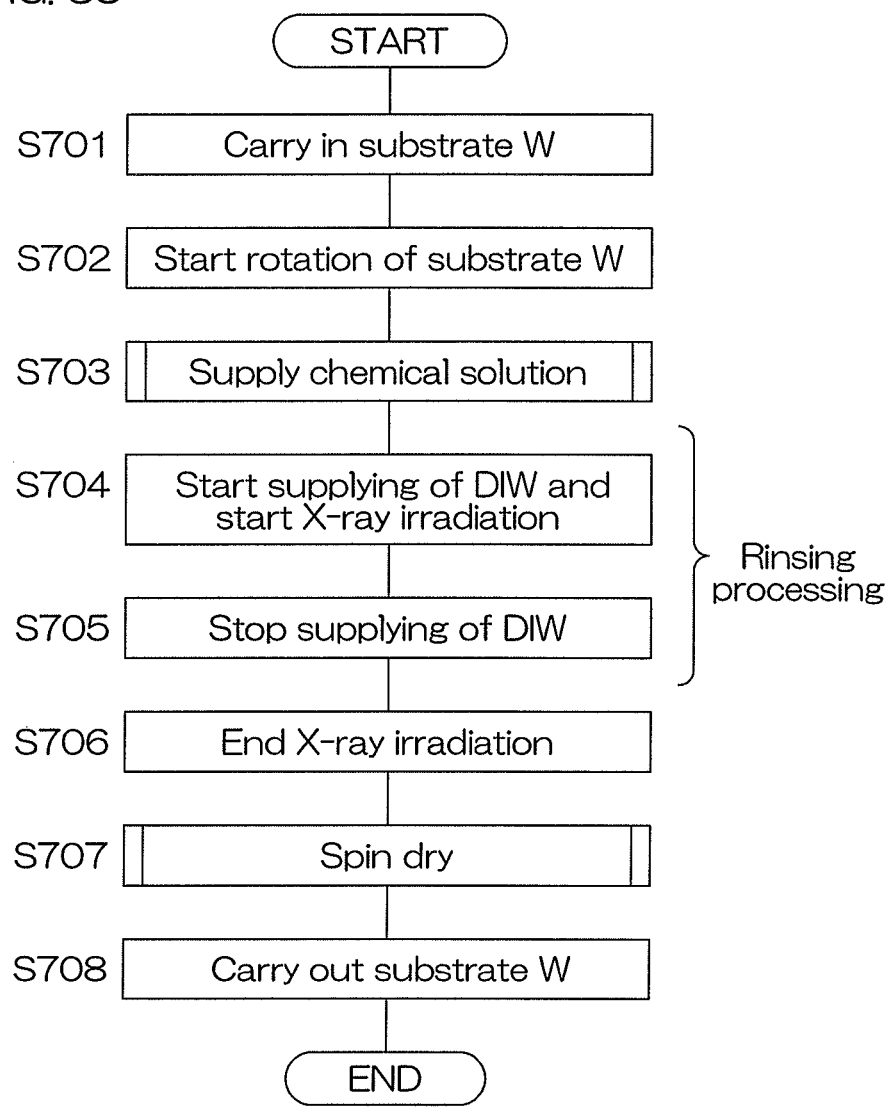
FIG. 35 is a process diagram of a processing example executed in the substrate processing apparatus shown in FIG. 31.

FIG. 35 is a process diagram of a processing example executed on the substrate W in the substrate processing apparatus 701. In this processing example, a rinsing processing is executed after execution of a chemical solution processing. In the rinsing processing, the soft X-rays are irradiated from the soft X-ray irradiating head 706 onto the front surface of the substrate W. The processing of the substrate W in the substrate processing apparatus 701 shall now be described with reference to FIG. 31, FIG. 33, FIG. 34, and FIG. 35.

In the processing of the substrate W, the shutter 722 is put in the open state from the closed state. The opening 721 is thereby opened. Thereafter, the unprocessed substrate W is carried inside the processing chamber 703 through the opening 721 by the transfer robot (not shown) (step S701) and is transferred with its front surface facing upward onto the spin chuck 704. During this time, the soft X-ray irradiating head 706 is positioned at the home position so as not to obstruct the carrying-in of the substrate W. After the hand of the transfer robot retracts to the exterior of the processing chamber 703, the shutter 722 is put in the closed state.

After the substrate W is held by the spin chuck 704, the controller 740 controls the spin motor 708 to start rotation of the substrate W by the spin chuck 704 (step S702). The rotation speed of the substrate W is increased to a predetermined liquid processing speed (for example, 500 rpm) and is thereafter maintained at the liquid processing speed.

When the rotation speed of the substrate W reaches the liquid processing speed, the controller 740 opens the chemical solution valve 716 to make the chemical solution be discharged from the chemical solution nozzle 707 toward the rotation center of the front surface of the substrate W (S703: chemical solution supplying). The chemical solution supplied to the front surface of the upper surface of the substrate W flows toward the peripheral edge of the substrate W upon receiving the centrifugal force due to the rotation of the substrate W (spreads across the entirety of the substrate W). Processing by the chemical solution is thereby applied to the entire front surface of the substrate W.

When a predetermined chemical solution processing time elapses from the start of supplying of the chemical solution, the controller 740 closes the chemical solution valve 716 to stop the supplying of the chemical solution from the chemical solution nozzle 707.

Also, the controller 740 opens the water valve 714 to make DIW be discharged from the water nozzle 705 toward the rotation center of the front surface of the substrate W in the rotating state (step S704). Also, the controller 740 controls the swinging drive mechanism 719 to move the soft X-ray irradiating head 706 from the home position set at the side of the spin chuck 704 to a position above the spin chuck 704 and thereafter controls the raising and lowering drive mechanism 720 to position the soft X-ray irradiating head 706 at the proximity position proximal to the front surface of the substrate W. The controller 740 then controls the high voltage unit 731 to make the X-ray generator 725 of the soft X-ray irradiating head 706 generate the soft X-rays so that the soft X-rays are irradiated downward from the irradiating window 735 (step S704).

The DIW supplied to the front surface of the substrate W receives the centrifugal force due to the rotation of the substrate W and flows toward the peripheral edge of the substrate W (spreads across the entirety of the substrate W). The chemical solution attached to the front surface of the substrate W is thereby rinsed off by the DIW (rinsing processing).

Figure 36:
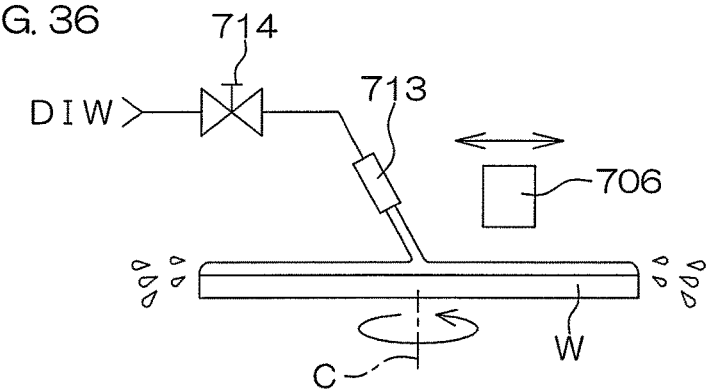
FIG. 36 is an illustrative diagram for describing a rinsing processing.

FIG. 36 is an illustrative diagram for describing the rinsing processing.

As shown in FIG. 35 and FIG. 36, the irradiation of the soft X-rays by the soft X-ray irradiating head 706 is executed continuously in parallel to the supplying of DIW to the substrate W. Also, the soft X-ray irradiating head 706 moved reciprocally between the center proximity position and the edge proximity position. In other words, the irradiation position of the front surface of the substrate W to which the soft X-rays from the soft X-ray irradiating head 706 are guided is moved reciprocally within a range from the rotation center of the substrate W to the peripheral edge portion of the substrate W and along the arcuate locus that intersects the rotation direction of the substrate W. The soft X-rays can thereby be irradiated on the entirety of the front surface of the substrate W.

FIG. 37 is an illustrative diagram of a state of a vicinity of the front surface of the substrate W in the rinsing processing.

During the rinsing processing, the soft X-rays are irradiated onto the front surface of the substrate W while DIW is supplied to the front surface of the substrate W. During this time, the soft X-rays are irradiated onto the DIW that flows along the front surface of the substrate W toward the peripheral edge. Specifically, a liquid film of DIW in liquid contact with the front surface of the substrate W is formed on the substrate W and on the front surface by the DIW flowing along the front surface, and the soft X-rays are irradiated onto the front surface portion (hatched portion in FIG. 37) of the liquid film. At the portion of the liquid film of DIW that is irradiated with the soft X-rays, electrons are emitted from water molecules due to excitation of the water molecules due to the irradiation of the soft X-rays and consequently, a plasma state is formed in which a large amount of electrons and a large amount of positive ions of the water molecules coexist. Thus even if positive charges are generated on the substrate W due to contact segregation with respect to DIW due to the supplying of DIW to the substrate W in the rotating state, the electrons generated in the DIW by the irradiation of the soft X-rays move by being drawn toward the negative charges generated on the substrate W and act to cancel out these charges. Charging of the substrate W can thereby be suppressed.

As shown in FIG. 31, FIG. 34, and FIG. 35, when a predetermined rinsing time elapses from the start of supplying of DIW, the controller 740 closes the water valve 714 to stop the supplying of DIW (step S705). The rinsing processing is thereby ended.

After a predetermined time elapses from the stopping of the supplying of DIW, the controller 740 controls the high voltage unit 731 to stop the irradiation of soft X-rays from the irradiating window 735 of the soft X-ray irradiating head 706 (step S706). Also, the controller 740 controls the swinging drive mechanism 719 and the raising and lowering drive mechanism 720 to return the soft X-ray irradiating head 706 to the home position. The irradiation of X-rays onto the front surface of the substrate W by the soft X-ray irradiating head 706 is executed until immediately before the start of the spin drying described below.

When a predetermined spin drying starting timing arrives, the controller 740 controls the spin motor 708 to raise the rotation speed of the substrate W to a spin drying rotation speed (for example of 2500 rpm). The DIW attached to the front surface of the substrate W after the rinsing processing is thereby spun off by the centrifugal force and drying is achieved (S707: spin drying).

After the spin drying has been performed for a predetermined drying time, the rotation of the spin chuck 704 is stopped. Thereafter, the shutter 722 is put in the open state from the closed state and the opening 721 is opened. The processed substrate W is then carried out through the opening 721 by the transfer robot (not shown) (step S708).

By the above arrangement, with the present preferred embodiment, the liquid film of DIW formed on the front surface of the substrate W is irradiated with the soft X-ray X-rays. At the portion of the liquid film of DIW that is irradiated with the soft X-rays, electrons are emitted from water molecules due to the excitation of the water molecules and consequently, the plasma state, in which a large amount of the electrons and a large amount of the positive ions of water molecules coexist, is formed. Thus even if positive charges are generated on the substrate W due to contact segregation with respect to DIW, the electrons generated in the DIW by the irradiation of the soft X-rays move via the liquid film of DIW by being drawn toward the negative charges generated on the substrate W and act to cancel out these charges. Charging of the substrate W can thereby be suppressed. Also, even if the substrate W is charged from before the rinsing processing, static elimination of the charged substrate W can be achieved by the liquid film of DIW in liquid contact with the front surface of the substrate W. Consequently, device breakdown due to charging of the substrate W can be prevented.

Next, the two tests of a static elimination test and an ionization test were performed to confirm that static elimination of a substrate, such as a silicon wafer, can be achieved by irradiating soft X-rays from an X-ray irradiating head. The contents and results of these tests shall now be described.

Figure 38:
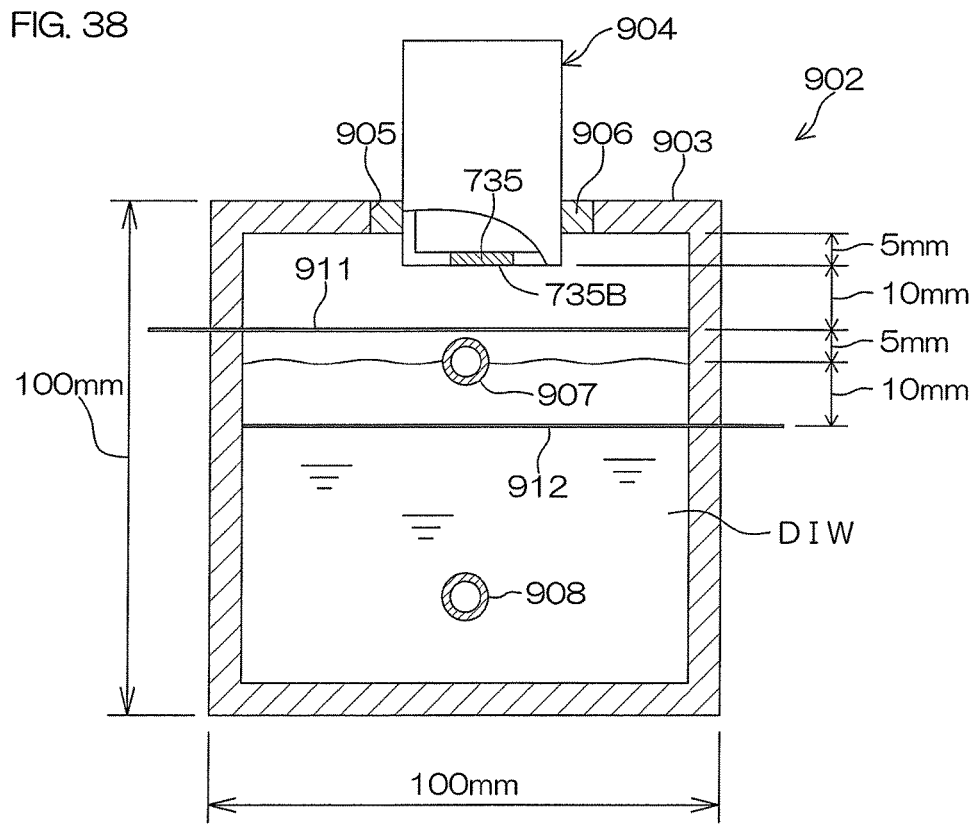
FIG. 38 is a diagram for describing a test apparatus used in tests.

FIG. 38 is a sectional view for describing a test apparatus 902 used in these tests.

The test apparatus 902 includes a water tank 903 of rectangular box shape arranged to store DIW and an X-ray irradiating head 904 mounted from above onto the water tank 903 and arranged to irradiate soft X-rays onto the DIW stored in the water tank 903.

The water tank 903 is formed to have a width of 100 mm, a length of 100 mm, and a height of 100 mm. A bottom wall, four side walls, and a top wall of the water tank 903 are respectively constituted of PVC plates of 5 mm thickness. The X-ray irradiating head 904 is a soft X-ray ionizer (manufactured by Hamamatsu Photonics K. K.) having an arrangement equivalent to the X-ray generator 725 shown in FIG. 32, etc., and is disposed with the irradiating window 735 faced downward. An opening 905 is formed in the upper wall of the water tank 903 and a lower end portion of the soft X-ray irradiating head 904, including the irradiating window 735, enters inside the water tank via the opening 905. In a state where the soft X-ray irradiating head 904 is installed on the water tank 903, the X-ray irradiating head 904 has a lower surface of the irradiating window positioned 5 mm lower than a lower surface of the upper wall of the water tank 903. A packing 906 made of silicon rubber is fitted onto a gap between a side edge of the opening 905 in the upper wall of the water tank 903 and a lower end portion of the soft X-ray irradiating head 904 and the soft X-ray irradiating head 904 is thereby fixed to the upper wall of the water tank 903.

In the present tests, square (80 cm×80 cm) meshes 911 and 912 (each having a grid form and being of a plate shape overall) made of stainless steel are used as measurement objects in place of substrates, such as silicon wafers, glass substrates. In the water tank 903, the two meshes 911 and 912 are respectively mounted in horizontal attitudes across a vertical interval. An interval between the upper mesh 911 and the outer surface 735B of the irradiating window 735 of the soft X-ray irradiating head 904 is, for example, 10 mm. An interval between the lower mesh 912 and the outer surface 735B of the irradiating window 735 of the soft X-ray irradiating head 904 is, for example, 25 mm.

A water drain nipple 907 and a water injection nipple 908 are mounted on a side wall of the water tank 903. The respective nipples 907 and 908 penetrate across the internal and external sides of the side wall of the water tank 903. The water drain nipple 907 is disposed at a position 20 mm from the lower surface of the upper wall of the water tank 903 (that is, a position 5 mm below the upper mesh 911 and 10 mm above the lower mesh 912). The water injection nipple 908 is disposed below the lower mesh 912 across a large interval. A water injection hose (not shown) is connected to the water injection nipple 908 and a water drain hose (not shown) is connected to the water drain nipple 907. Water is arranged to be supplied to the water tank 903 via the water injection hose and drained via the water drain nipple 907 and the water drain hose.

The lower mesh 912 is connected to a metal plate (not shown) of the charged plate monitor CPM (CPM 210, manufactured by Ion Systems Inc., USA) by a high voltage cable.

Water is supplied into the water tank 903 via the water injection hose. Here, even if the supply of water into the water tank 903 is continued, the water level of the DIW stored in the water tank 903 does not become higher than the height of the water drain nipple 907. In a state where DIW is stored in the water tank 903 up to the height of the water drain nipple 907, the lower mesh 912, disposed lower than the water drain nipple 907, is immersed in the DIW and, on the other hand, the upper mesh 911, disposed higher than the water drain nipple 907, is not immersed in the DIW.

(1) Static Elimination Test

In parallel to the supplying of water into the water tank 903, the lower mesh 912 in the liquid was charged to +/−1 kV or +/−5 kV by the charged plate monitor CPM. The soft X-ray irradiating head 904 was then turned on to irradiate soft X-rays onto the DIW stored in the water tank 903 and the time (static elimination time) required for the electric potential of the lower mesh 912 to become +/−100 kV from the start of irradiation was measured.

As results, the static elimination time in the case of charging to +/−1 kV was within 1 second and the static elimination time in the case of charging to +/−5 kV was approximately 2 seconds.

From the static elimination test, it can be understood that static elimination of a charged body (lower mesh 912) inside DIW can be achieved satisfactorily by irradiating the DIW with soft X-rays.

(2) Ionization Test

A high resistance meter (Model 4329A manufactured by Yokogawa Hewlett Packard, Ltd.) was connected between the upper and lower meshes 911 and 912 to measure the change of electrical resistance between the two meshes 911 and 912 according to whether or not soft X-rays are being irradiated.

First, DIW is stored in the water tank 903 up to the height of the water drain nipple 907. With the soft X-ray irradiating head 904 being off, a voltage of 10V was applied to the lower mesh 912 and the electrical resistance between the two meshes 911 and 912 was measured. Thereafter, with the voltage of 10V being applied to the lower mesh 912, the soft X-ray irradiating head 904 was turned on and the electrical resistance between the two meshes 911 and 912 was measured in the state of irradiating soft X-rays onto the DIW stored in the water tank 903.

As a result, the electrical resistance during soft X-ray irradiation decreased to $1 \times 10^9 (\Omega)$ from $1 \times 10^{11} (\Omega)$ before soft X-ray irradiation.

From the ionization test, it can be understood that DIW can be ionized by irradiation of soft X-rays onto the DIW.

From the above, it can be understood that DIW can be ionized by irradiation of soft X-rays onto the DIW and that satisfactory static elimination of a charged body in liquid contact with the DIW can be achieved by the ionization of DIW.

Figure 39:
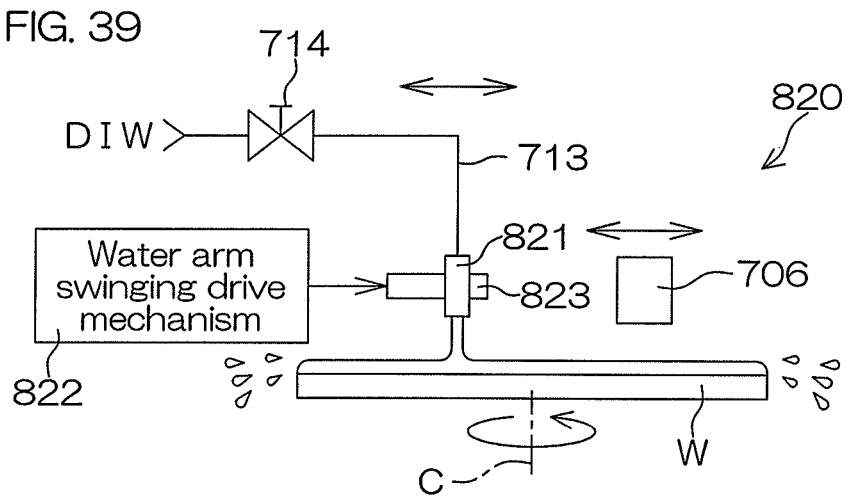
FIG. 39 is a schematic diagram of the arrangement of a substrate processing apparatus according to a sixteenth preferred embodiment of the present invention.

FIG. 39 is a schematic diagram of the arrangement of a substrate processing apparatus 820 according to a sixteenth preferred embodiment of the present invention. Portions of the substrate processing apparatus 820 that are in common to the substrate processing apparatus 701 according to the fifteenth preferred embodiment are provided with the same reference symbols as in FIG. 31 to FIG. 37 and description thereof shall be omitted. A main point of difference of the substrate processing apparatus 820 with respect to the substrate processing apparatus 701 is that a water nozzle (water supplying means) 821, adopting the form of a scan nozzle, is provided in place of the fixed water nozzle 705.

The water nozzle 821 is, for example, a straight nozzle that discharges DIW in a continuous flow state. The water nozzle 821 is mounted on a tip of a substantially horizontally extending water arm 823 in a state where its discharge port is directed downward. The water supplying pipe 713 is connected to the water nozzle 821. The water arm 823 is disposed to be rotatable around a predetermined swing axis extending in a vertical direction. A water arm swinging drive mechanism 822, arranged to swing the water arm 823 within a predetermined angular range, is coupled to the water arm 823. By the swinging of the water arm 823, the water nozzle 821 is moved between a position on the rotation axis C of the substrate W (a position facing the rotation center of the substrate W) and a home position set at a side of the spin chuck 704.

During the rinsing processing, the water arm swinging drive mechanism 822 is controlled so that the water nozzle 821 is moved reciprocally between the position above the rotation center and a position above a peripheral edge portion of the substrate W. The supplying position on the front surface of the substrate W to which the DIW from the water nozzle 821 is guided is thereby moved reciprocally within a range from the rotation center of the substrate W to the peripheral edge portion of the substrate W and along an arcuate locus that intersects the rotation direction of the substrate W. In this process, the swinging positions of the water nozzle 821 and the soft X-ray irradiating head 706 are respectively controlled so that the water nozzle 821 and the soft X-ray irradiating head 706 do not interfere.

Figure 40:
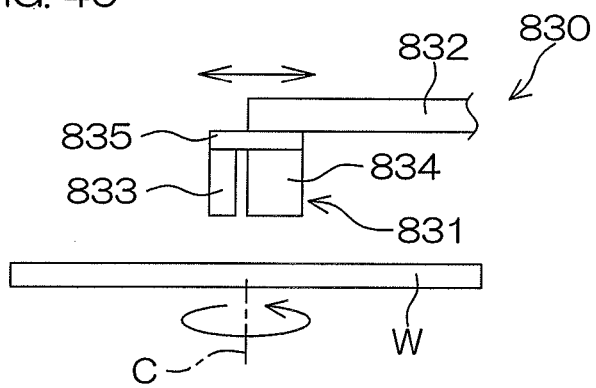
FIG. 40 is a schematic diagram of the arrangement of a substrate processing apparatus according to a seventeenth preferred embodiment of the present invention.

FIG. 40 is a schematic diagram of the arrangement of a substrate processing apparatus 830 according to a seventeenth preferred embodiment of the present invention. Portions of the substrate processing apparatus 830 that are in common to the substrate processing apparatus 701 according to the fifteenth preferred embodiment are provided with the same reference symbols as in FIG. 31 to FIG. 37 and description thereof shall be omitted. A main point of difference of the substrate processing apparatus 830 with respect to the substrate processing apparatus 701 is that it includes an integral head 831 integrally having a water nozzle and a soft X-ray irradiating head. The integral head 831 includes a water nozzle (water supplying means) 833 having an arrangement equivalent to the water nozzle 821 of the second preferred embodiment, a soft X-ray irradiating unit (X-ray irradiating means) 834 having an arrangement equivalent to the soft X-ray irradiating head 706 of the first preferred embodiment, and a holder 835 holding the water nozzle 833 and the soft X-ray irradiating unit 834. The integral head 831 is mounted on a tip of a substantially horizontally extending arm 832. The arm 832 is disposed to be rotatable around a predetermined swing axis extending in a vertical direction. By the swinging of the arm 832, the integral head 831 is moved between a position on the rotation axis C of the substrate W (a position facing the rotation center of the substrate W) and a home position set at a side of the spin chuck 704. During the rinsing processing, the integral head 831 is moved reciprocally between the position above the rotation center and a position above a peripheral edge portion of the substrate W. The supplying position on the front surface of the substrate W to which the DIW from the water nozzle 821 is guided and the irradiation position on the front surface of the substrate W to which the soft X-rays from the soft X-ray irradiating unit 834 is guided are thereby moved reciprocally within a range from the rotation center of the substrate W to the peripheral edge portion of the substrate W and along an arcuate locus that intersects the rotation direction of the substrate W.

Figure 41:
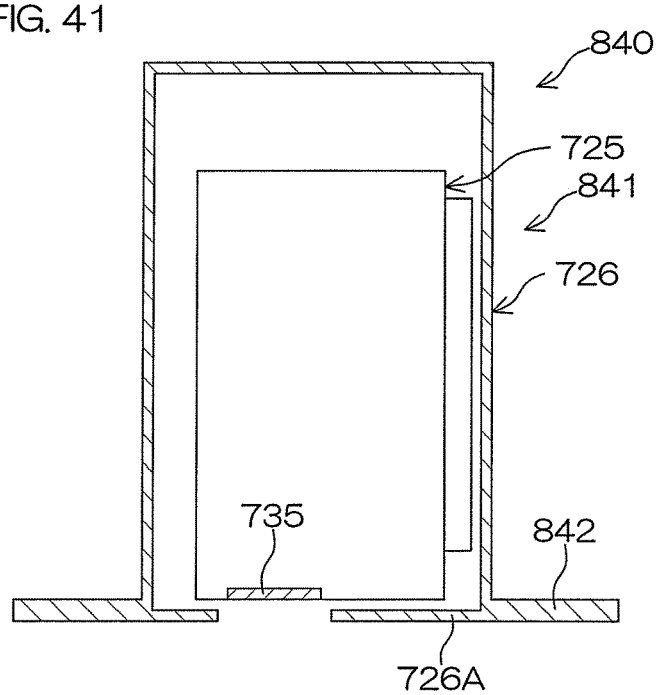
FIG. 41 is a schematic diagram of the arrangement of a substrate processing apparatus according to an eighteenth preferred embodiment of the present invention.

FIG. 41 is a schematic diagram of the arrangement of a substrate processing apparatus 840 according to an eighteenth preferred embodiment of the present invention. The substrate processing apparatus 840 includes a soft X-ray irradiating head (X-ray irradiating means) 841 in place of the soft X-ray irradiating head 706 of the first preferred embodiment. A main point of difference of the soft X-ray irradiating head 841 with respect to the soft X-ray irradiating head 706 is that it includes a shielding plate portion (shielding member) 842 projecting outward along a horizontal direction from a side wall lower edge of the cover 726 (projecting sideward from the cover 726). The shielding plate portion 842 has the shape of a square annular plate and its lower surface has a horizontal surface continuous to the lower wall 726A of the cover 726. During the rinsing processing, the shielding plate portion 842 is disposed to face the front surface of the substrate W held by the spin chuck 704. The soft X-rays irradiated from the irradiating window 735 are kept within a space between the substrate W and the shielding plate portion 842 by the shielding plate portion 842. Scattering of the soft X-rays, irradiated from the irradiating window 735, to the periphery of the substrate W can thus be suppressed or prevented. Safety of the substrate processing apparatus 840 can thereby be improved.

Figure 44:
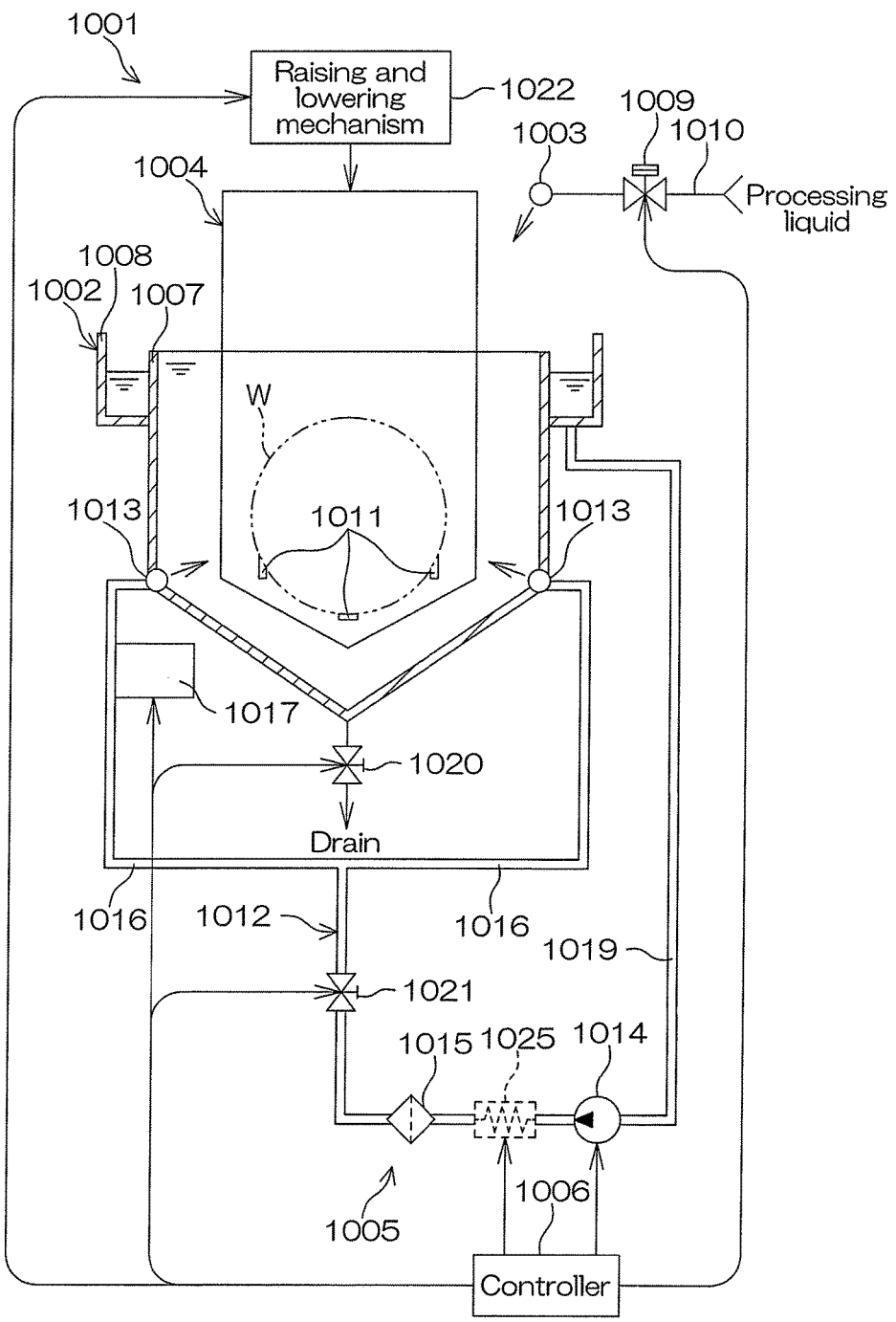
FIG. 44 is a diagram of the arrangement of a substrate processing apparatus to which a processing liquid processing apparatus according to a nineteenth preferred embodiment of the present invention is applied.

FIG. 44 is a diagram of the arrangement of a substrate processing apparatus 1001 to which a processing liquid processing apparatus according to a nineteenth preferred embodiment of the present invention is applied.

The substrate processing apparatus 1001 is a batch type substrate processing apparatus that applies a processing liquid processing (cleaning processing), for example, to a plurality of substrates W in a batch. The substrate processing apparatus 1001 includes a processing tank 1002 storing a processing liquid, a processing liquid nozzle 1003 supplying the processing liquid to the processing tank 1002, a lifter 1004 immersing the substrates W into the processing liquid stored in the processing tank 1002, a circulating mechanism 1005 circulating the processing liquid stored in the processing tank 1002, and a controller 1006 controlling the respective equipment and valves included in the substrate processing apparatus 1001.

The processing tank 1002 has a double tank structure including an inner tank 1007 having an upwardly open upper opening and an outer tank 1008. The inner tank 1007 is arranged to store the processing liquid and be capable of housing a plurality of substrates W. The outer tank 1008 is disposed at an outer surface of the upper opening of the inner tank 1007 and the height of an upper edge thereof is set higher than the height of an upper edge of the inner tank 1007.

A liquid drain valve 1020 is installed in a bottom wall of the inner tank 1007. The liquid drain valve 1020 is constituted of a so-called piston valve, with which a portion of the bottom wall of the inner tank 1007 is opened and closed by a piston (not shown) performing a reciprocating movement. By retreating of the piston (not shown) the portion of the bottom surface of the inner tank 1007 becomes detached to form a liquid drain port in the bottom surface of the inner tank 1007 and the processing liquid is thereby drained rapidly. That is, the processing tank 1002 has a QDR (quick dump rinse) function. The processing liquid drained from the bottom portion of the inner tank 1007 is arranged to be sent to and processed at a waste liquid apparatus.

The processing liquid nozzle 1003 is connected to a processing liquid piping 1010 in which a processing liquid valve 1009 is interposed. The processing liquid nozzle 1003 is constituted of a shower nozzle having numerous fine discharge ports (not shown) and discharging a liquid, for example, in the form of liquid droplets. When the controller 1006 opens the processing liquid valve 1009, the processing liquid discharged in shower form from the processing liquid nozzle 1003 is supplied into the inner tank 1007. When the processing liquid overflows from the upper edge of the inner tank 1007, the overflowing processing liquid is received and recovered by the outer tank 1008.

Water or a dilute chemical solution is adopted as the processing liquid. As water, any of DIW (deionized water), carbonated water, electrolytic ion water, hydrogen water, ozone water, or hydrochloric acid water of dilute concentration (for example, approximately 10 ppm to 100 ppm) may be adopted. As a dilute chemical solution, hydrofluoric acid diluted to a predetermined concentration, BHF (buffered HF), APM (ammonia-hydrogen peroxide mixture), TMAH (tetramethylammonium hydroxide aqueous solution), ammonia water, HPM (hydrochloric acid/hydrogen peroxide mixture), etc., may be used. This applies not only to the present preferred embodiment (nineteenth preferred embodiment) but the same applies to the nineteenth to twenty-seventh preferred embodiments.

The substrates W held by the lifter 1004 are immersed in the processing liquid stored in the inner tank 1007.

The lifter 1004 includes a plurality of horizontally extending holding rods 1011. The plurality of substrates W are held in a state where the plurality of substrates W are aligned in a direction extending from the front to inner side of the paper surface and held in an erect attitude (vertical attitude) with the lower edges of the respective substrates W being contacted by the plurality of holding rods 1011.

The lifter 1004 includes a raising and lowering mechanism 1022. the raising and lowering mechanism 1022 raises/lowers the lifter 1004 between a processing position (position shown in FIG. 44) at which the substrates W held by the lifter 1004 are positioned inside the inner tank 1007 and a retracted position (not shown) at which the substrates W held by the lifter 1004 are positioned above the inner tank 1007. The plurality of substrates W held by the lifter 1004 are thus immersed in the processing liquid by the lifter 1004 being moved to the processing position by the raising and lowering mechanism 1022. The processing using the processing liquid is thereby applied to the substrates W.

The circulating mechanism 1005 includes a circulation piping 1012 that guides processing liquid drained from the processing tank 1002 back to the processing tank 1002, a plurality of circulation nozzles 1013 respectively connected to a downstream side end portion of the circulation piping 1012, and a circulation pump 1014 feeding the processing liquid from the circulation piping 1012 to the circulation nozzles 1013. The circulation piping 1012 includes a feedback piping (overflow piping) 1019 having an upstream side end portion connected to a bottom portion of the outer tank 1008 and branch pipings (processing liquid supplying pipings) 1016 branching in plurality from a downstream side end portion of the feedback piping 1019. The circulation nozzles 1013 is mounted to tips of the respective branch pipings 1016. Each circulation nozzle 1013 has one or a plurality of discharge ports and discharges the processing liquid toward the interior of the inner tank 1007. The circulation pump 1014, a filter 1015, and a circulation valve 1021 are interposed in that order from the upstream side in the feedback piping 1019. The filter 1015 is a filter 1015 that filters the processing liquid flowing through the feedback piping 1012 and the feedback valve 1021 is a valve arranged to open and close the feedback piping 1019.

A soft X-ray irradiating unit (X-ray irradiating means) 1017 is mounted on at least one (in the present preferred embodiment, on one) of the plurality of branch pipings 1016. The soft X-ray irradiating unit 1017 is a unit arranged to irradiate soft X-rays onto the processing liquid present inside the branch piping 1016.

FIG. 45A is an illustrative sectional view of the respective arrangements of the branch piping 1016 and the soft X-ray irradiating unit 1017.

The branch piping 1016 is formed using, for example, a resin material, such as PVC (polyvinyl chloride), PTFE (polytetrafluoroethylene), and PFA (perfluoroalkylvinyl ether tetrafluoroethylene copolymer). A first opening 1052 of, for example, circular shape is formed in a pipe wall at an intermediate portion of the branch piping 1016. The soft X-ray irradiating unit 1017 is mounted onto the branch piping 1016 so as to close the first opening 1052.

The soft X-ray irradiating unit 1017 includes a soft X-ray generator (X-ray generator) 1025, a cover 1026 made, for example, of PVC (polyvinyl chloride) and surroundingly covering a periphery of the soft X-ray generator 1025, and a gas nozzle (gas supplying means) 1027, arranged to supply a gas into the interior of the cover 1026, and irradiates soft X-rays laterally. The cover 1026 has an oblong rectangular box shape that surrounds the periphery of the soft X-ray generator 1025 across an interval from the soft X-ray generator 1025 and has a second opening 1028, having, for example, a circular shape and the same diameter as the first opening 1052, formed in a portion of a vertical plate-shaped side wall 1026A facing an irradiating window 1035 to be described after the soft X-ray generator 1025. The soft X-ray irradiating unit 1017 is mounted onto the branch piping 1016 so that the second opening 1028 of the cover 1026 is matched with the first opening 1052 of the branch piping 1016 and the side wall 1026A is closely adhered to an outer periphery of the branch piping 1016.

The second opening 1028 is closed by a disk-shaped window member 1071. The window member 1071 closes the second opening 1028 from the inner side of the cover 1026. Not only the second opening 1028 but also the first opening 1052 is closed by the window member 1071. As the material of the window member 1071, a substance of low atomic weight is used so that the soft X-rays of weak penetrability can be transmitted readily and, for example, beryllium (Be), is adopted. The thickness of the window member 1071 is set, for example, to approximately 0.3 mm.

The soft X-ray generator 1025 emits (radiates) soft X-rays used to ionize the processing liquid flowing through the branch piping 1016. The soft X-ray generator 1025 includes a case body 1029, a soft X-ray tube 1030 that is long in the right/left direction and arranged to generate the soft X-rays, and a high voltage unit 1031 supplying a high voltage to the soft X-ray tube 1030. The case body 1029 has an oblong rectangular cylindrical shape, houses the soft X-ray tube 1030 and the high voltage unit 1031 in its interior, and is formed using a material having electrical conductivity and thermal conductivity (for example, a metal material, such as aluminum).

The high voltage unit 1031 inputs a driving voltage of high electrical potential, for example, of −9.5 kV into the soft X-ray tube 1030. The high voltage unit 1031 is supplied with a voltage from a power supply (not shown) via a feeder 1043 led outside the cover 1026 through a penetrating hole 1042 formed in the cover 1026.

The soft X-ray tube 1030 is constituted of a vacuum tube of circular cylindrical shape made of glass or metal and is disposed so that the tube direction is horizontal. A circular opening 1041 is defined by one end portion (opening end portion; left end portion shown in FIG. 45A) of the soft X-ray tube 1030. The other end portion (right end portion shown in FIG. 45A) of the soft X-ray tube 1030 is closed and constitutes a stem 1032. Inside the soft X-ray tube 1030, a filament 1033, which is a cathode, and a target 1036, which is an anode, are disposed so as to face each other. The soft X-ray tube 1030 houses the filament 1033 and a focusing electrode 1034. Specifically, the filament 1033 is disposed as the cathode at the stem 1032. The filament 1033 is electrically connected to the high voltage unit 1031. The filament 1033 is surrounded by the focusing electrode 1034 of circular cylindrical shape.

The opening end portion of the soft X-ray tube 1030 is closed by the plate-shaped irradiating window 1035 of vertical attitude. The irradiating window 1035 has, for example, a disk shape and is fixed to the wall surface at the opening end portion of the soft X-ray tube 1030 by silver alloy brazing. As the material of the irradiating window 1035, a substance of low atomic weight is used so that the soft X-rays of weak penetrability can be transmitted readily and, for example, beryllium (Be), is adopted. The thickness of the irradiating window 1035 is set, for example, to approximately 0.3 mm. The irradiating window 1035 is disposed to face an inner surface 1071A of the window member 1071 across a minute interval with respect to the window member 1071.

The target 1036 made of metal is formed by vapor deposition on an inner surface 1035A of the irradiating window 1035. A metal of high atomic weight and high melting point, such as tungsten (W) or tantalum (Ta), is used in the target 1036.

By application of the driving voltage from the high voltage unit 1031 to the filament 1033 that is the cathode, electrons are emitted from the filament 1033. The electrons emitted from the filament 1033 are converged and made into an electron beam by the focusing electrode 1034 and generate soft X-rays upon colliding against the target 1036. The generated soft X-rays are emitted (radiated) toward a lateral direction (left direction shown in FIG. 45A) from the irradiating window 1035 and irradiate the interior of the branch piping 1016 through the window member 1071 and the first opening 1052. The irradiation angle (irradiation range) of the soft X-rays from the irradiating window 1035 is a wide angle (for example, 130°) as shown in FIG. 46. The soft X-rays irradiated from the irradiating window 1035 onto the interior of the branch piping 1016 are, for example, 0.13 to 0.4 nm in wavelength.

The entirety of an outer surface (wall surface of the closed window at the side at which the processing liquid flows) 1071B of the window member 1071 is covered by a hydrophilic coating film (coating film) 1038. The hydrophilic coating film 1038 is, for example, a polyimide resin coating film. The outer surface 1071B of the window member 1071 is covered with the hydrophilic coating film 1038 to protect the window member 1071, which is made of beryllium that is poor in acid resistance, from an acid contained in water or other processing liquid. The film thickness of the hydrophilic coating film 1038 is not more than 50 μm and is especially preferably approximately 10 μm. The hydrophilic coating film 1038 has hydrophilicity and is thus capable of suppressing or preventing the mixing in of air bubbles between the coating film 1038 and the processing liquid. The soft X-rays from the irradiating window 1035 can thereby be irradiated satisfactorily onto the processing liquid flowing through the branch piping 1016.

A discharge port of the gas nozzle 1027 is opened in an upper wall of the cover 1026. A gas from a gas supply source (not shown) is supplied to the gas nozzle 1027 via a gas valve (gas supplying means) 1037. As examples of the gas discharged by the gas nozzle 1027, an inert gas such as CDA (clean dry air), nitrogen gas, can be cited. The gas discharged from the gas nozzle 1027 is supplied to the interior of the cover 1026. Although heat may be generated by the soft X-ray generator 1025 due to driving of the soft X-ray generator 1025, the soft X-ray generator 1025 can be cooled and temperature rise of the ambient atmosphere of the soft X-ray generator 1025 can be suppressed by supplying the gas into the interior of the cover 1026.

As shown in FIG. 44, the controller 1006 has an arrangement that includes a microcomputer and controls the operations of the raising and lowering mechanism 1022, the circulation pump 1014, etc., in accordance with a predetermined program. Further, the controller 1006 controls the opening and closing operations of the processing liquid valve 1009, the liquid drain valve 1020, etc.

Figure 45B:
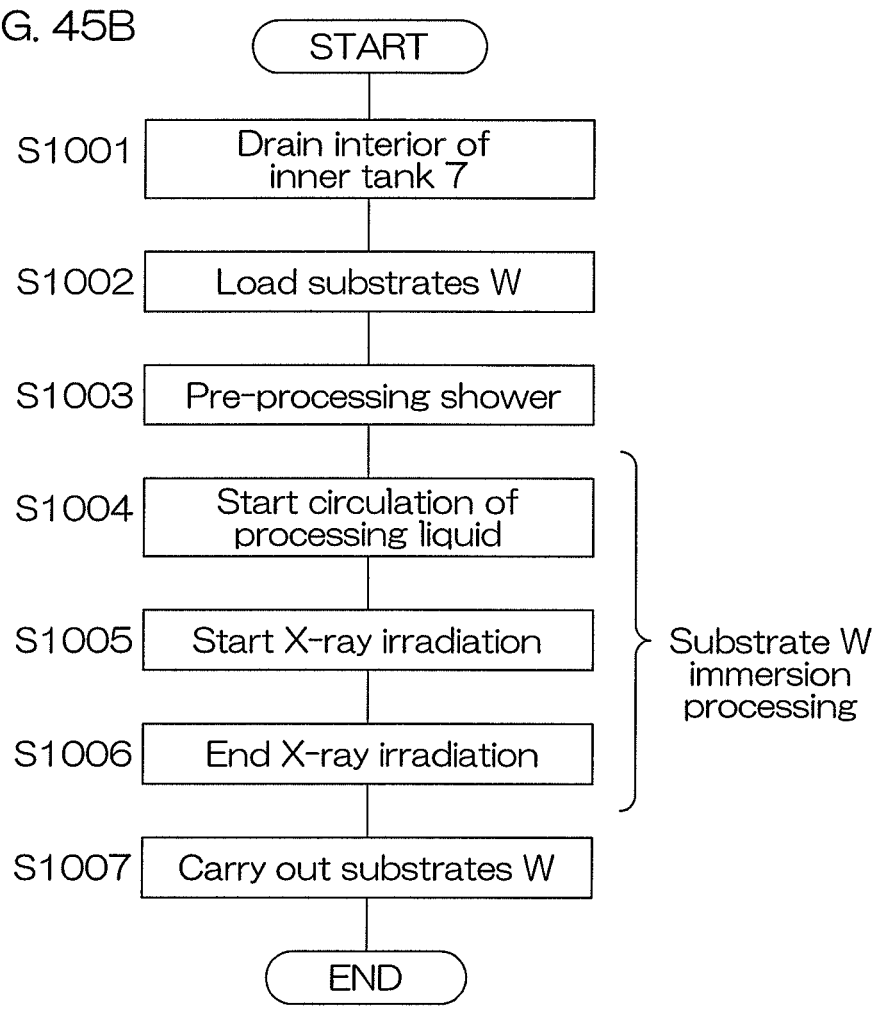
FIG. 45B is a process diagram of a processing example of substrate processing executed in the substrate processing apparatus shown in FIG. 44.
Figure 46:
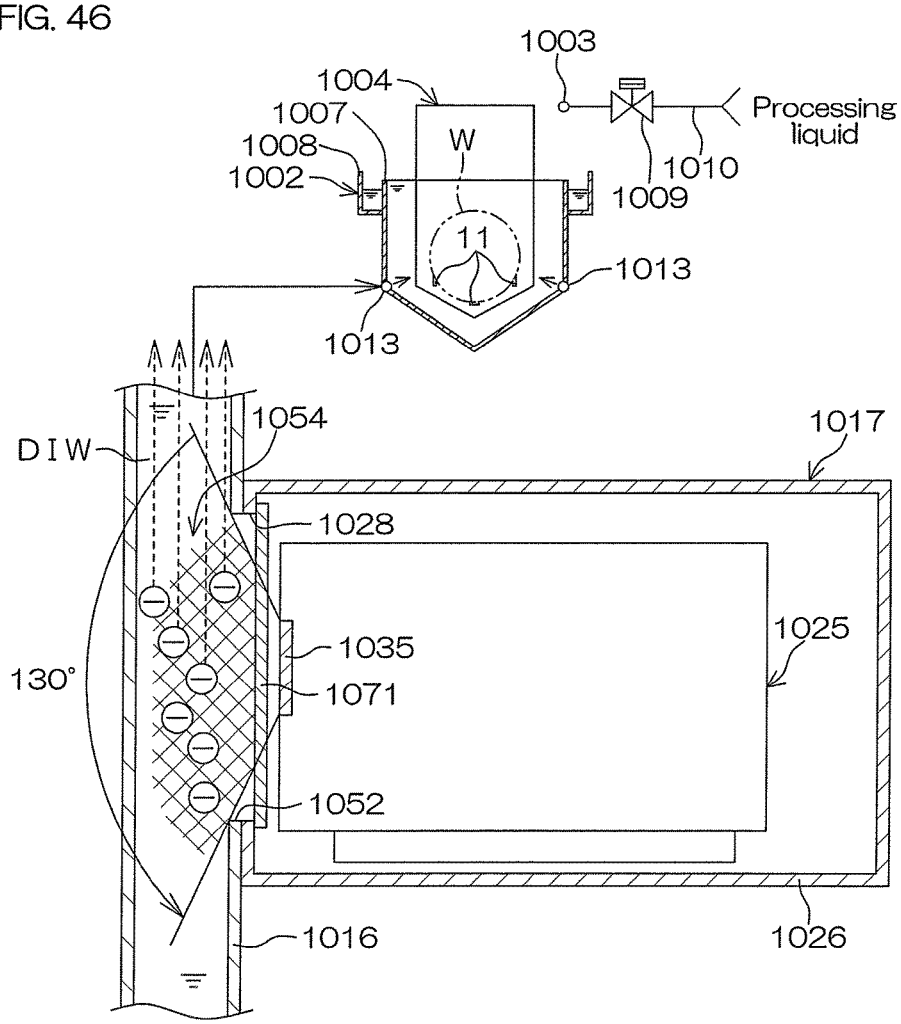
FIG. 46 is an illustrative diagram of a state of irradiation of soft X-rays onto the interior of the branch piping shown in FIG. 44.

FIG. 45B is a process diagram of a processing example of the substrate processing executed in the substrate processing apparatus 1001. The processing example of the substrate processing shall now be described with reference to FIG. 44, FIG. 45A, and FIG. 45B.

Even when the processing of the substrates W is not being performed in the processing tank 1002, the circulation of the processing liquid is performed continuously in the circulating mechanism 1005. That is, with the exception of specific situations, such as exchange of the processing liquid, apparatus maintenance, the processing liquid is constantly stored in the processing tank 1002 and the processing liquid is circulated through the circulation piping 1012 without being stagnant inside the processing tank 1002. During such circulation, the circulating valve 1021 is opened. Consequently, the processing liquid flowing out from the outer tank 1008 passes through the circulation piping 1012 and is supplied from the circulation nozzles 1013 into the interior of the inner tank 1007. The processing liquid is supplied further from the circulation nozzles 1013 in a state where the interior of the inner tank 1007 is filled with the processing liquid and therefore the excess processing liquid overflows from the upper end portion of the inner tank 1007 and flows into the outer tank 1008. The processing liquid flowing out from the outer tank 1008 then passes through the circulation piping 1012 and is supplied from the circulation nozzles 1013 into the interior of the inner tank 1007.

With the start of a substrate immersion processing, the circulation valve 1021 is closed, the driving of the circulation pump 1014 is stopped, and the liquid drain valve 1020 is opened so that the processing liquid stored in the inner tank 1007 is drained rapidly (step S1001).

After the processing liquid has been drained from the inner tank 1007 and the interior of the inner tank 1007 has become empty, the controller 1006 controls the lifter 1004 to lower the plurality of substrates W, which were received at a receiving/passing position, to the processing position in the interior of the inner tank 1007. The substrates W are thereby loaded into the processing tank 1002 (step S1002). The substrates W are held in the interior of the inner tank 1007 that is empty.

After the unprocessed substrates W have been loaded into the processing tank 1002 and held at the processing position, the controller 1006 opens the processing liquid valve 1009 to make the processing liquid be discharged in shower form from the processing liquid nozzle 1003 (step S1003). At this point, the liquid drain valve 1020 is kept open and the liquid drain port (not shown) is opened so that processing liquid that contains contaminants is not stored.

Thereafter, when a predetermined shower cleaning time elapses, the controller 1006 closes the liquid drain valve 1020. At this point, the discharge of processing liquid from the processing liquid nozzle 1003 is continued and therefore the processing liquid is stored in the inner tank 1007. The substrate immersion processing, with which the substrates W are immersed in the processing liquid, is thereby executed.

When the inner tank 1007 becomes full with the processing liquid, the controller 1006 closes the processing liquid valve 1009 to stop the discharge of the processing liquid from the processing liquid nozzle 1003. Also, the controller 1006 starts driving of the circulation pump 1014 and opens the circulation valve 1021. The processing liquid is thereby circulated through the circulation piping 1012 without being stagnant inside the processing tank 1002 (step S1004). Specifically, the processing liquid flowing out from the outer tank 1008 passes through the circulation piping 1012 and is supplied from the circulation nozzles 1013 into the interior of the inner tank 1007. The processing liquid is supplied further from the circulation nozzles 1013 in the state where the interior of the inner tank 1007 is filled with the processing liquid and therefore the excess processing liquid overflows from the upper end portion of the inner tank 1007 and flows into the outer tank 1008. The processing liquid flowing out from the outer tank 1008 then passes through the circulation piping 1012 and is supplied from the circulation nozzles 1013 into the interior of the inner tank 1007. Particles and other contaminants are eliminated when the circulating processing liquid passes through the filter 1015. Clean processing liquid, from which contaminants have been eliminated, is thus discharged from the circulation nozzles 1013 toward the interior of the inner tank 1007. In this state, the processing liquid is in a liquid-tight state inside the nozzle pipings of the circulation nozzles 1013 and inside the branch pipings 1016.

Also, the controller 1006 controls the high voltage unit 1031 (see FIG. 45A) to make the soft X-ray generator 1025 (see FIG. 45A) of the soft X-ray irradiating unit 1017 generate the soft X-rays so that the soft X-rays are irradiated from the irradiating window 1035 (see FIG. 45A) toward the interior of the branch piping 1016 via the window member 1071 (step S1005). The soft X-rays are thereby irradiated onto the processing liquid flowing through the interior of the branch piping 1016.

FIG. 46 is an illustrative view of a state of irradiation of the soft X-rays onto the interior of the branch piping 1016 shown in FIG. 44.

In parallel to the substrate immersion processing, the soft X-rays are irradiated onto the processing liquid flowing inside the branch piping 1016. At a portion of the processing liquid inside the branch piping 1016 irradiated with the soft X-rays (the portion inside the branch piping 1016 facing the first opening 1052; the hatched portion shown in FIG. 46; hereinafter referred to as the "irradiated portion 1054 of the processing liquid"), electrons are emitted from water molecules due to excitation of the water molecules. Consequently, a plasma state, in which a large amount of the electrons and a large amount of positive ions of water molecules coexist, is formed in the irradiated portion 1054 of the processing liquid.

In this case, the processing liquid is in the liquid-tight state inside the nozzle pipings of the circulation nozzles 1013 and inside the branch pipings 1016 as mentioned above and therefore the substrates W immersed in the processing liquid stored in the inner tank 1007 and the irradiated portion 1054 of the processing liquid are connected via the processing liquid stored in the inner tank 1007 and the processing liquid inside the branch pipings 1016. If at this point, the substrates W are positively charged, the potential difference between the irradiated portion 1054 of the processing liquid and the positively charged substrates W causes the electrons from the irradiated portion 1054 of the processing liquid to move toward the substrates W via the processing liquid stored in the inner tank 1007 and the processing liquid inside the branch pipings 1016. The substrates W are thereby supplied with a large amount of electrons and static elimination of the positively charged substrates W is thus achieved.

Also, even if the substrates W are positively charged from before being immersed in the processing liquid, static elimination of the substrates W via the processing liquid in the inner tank 1007 and the processing liquid inside the branch pipings 1016 can be achieved based on the same principles.

As shown in FIG. 45B, when a predetermined immersion processing time elapses from the start of the immersion processing, the controller 1006 stops the irradiation of soft X-rays from the soft X-ray irradiating unit 1017 (step S1006).

Thereafter, the processed substrates W are carried out of the inner tank 1007 (step S1007). The carrying-out of the substrates W is performed by the lifter 1004, which holds the plurality of substrates W in a batch, being raised from the processing position in the interior of the inner tank 1007 to the receiving/passing position thereabove. The lot constituted of the plurality of substrates W raised to the receiving/passing position is conveyed to a processing tank of a subsequent process.

If there are subsequent substrates W to be processed successively, step S1001 is returned to and the series of processing is executed repeatedly.

By the above arrangement, charging of the substrates W during the processing liquid immersion processing can be prevented with the nineteenth preferred embodiment. Also, even if the substrates W are charged from before the immersion processing, the charges carried by the substrates W can be eliminated (that is, static elimination can be achieved). Consequently, device breakdown due to charging of the substrates W can be prevented.

Figure 47:
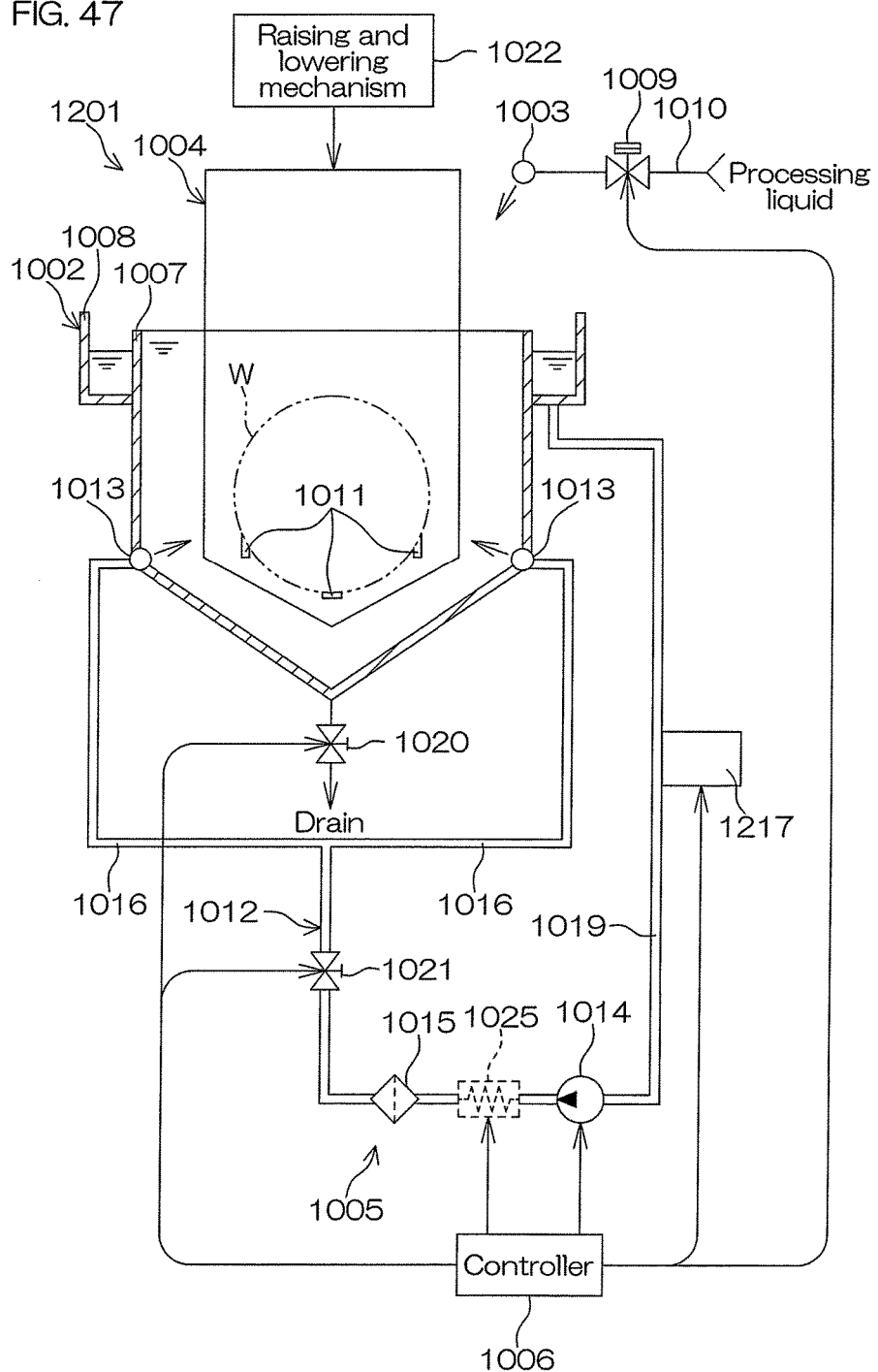
FIG. 47 is a diagram of the arrangement of a substrate processing apparatus to which a processing liquid processing apparatus according to a twentieth preferred embodiment of the present invention is applied.

FIG. 47 is a diagram of the arrangement of a substrate processing apparatus 1201 to which a processing liquid processing apparatus according to a twentieth preferred embodiment of the present invention is applied.

Portions of the twentieth preferred embodiment that are in common to the nineteenth preferred embodiment are provided with the same reference symbols as in FIG. 44 to FIG. 46 and description thereof shall be omitted. A point of difference of the substrate processing apparatus 1201 according to the twentieth preferred embodiment with respect to the substrate processing apparatus 1001 according to the nineteenth preferred embodiment is that a soft X-ray irradiating unit (X-ray irradiating means) 1217 is installed further upstream than the circulation pump 1014 in the feedback piping 1019. The soft X-ray irradiating unit 1217 is mounted on the feedback piping 1019.

The feedback piping 1019 has a round pipe shape (circular cylindrical shape) and is formed using a resin material, such as PVC (polyvinyl chloride), PTFE (polytetrafluoroethylene), and PFA (perfluoroalkylvinyl ether tetrafluoroethylene copolymer). An opening (not shown) is formed in a pipe wall at an intermediate portion of the feedback piping 1019 further upstream than the circulation pump 1014.

The soft X-ray irradiating unit 1217 adopts an arrangement equivalent to the soft X-ray irradiating unit 1017 (see FIG. 45A) according to the nineteenth preferred embodiment. The soft X-ray irradiating unit 1217 is mounted onto the feedback piping 1019 so as to close the opening in the feedback piping 1019. Specifically, an opening in the cover of the soft X-ray irradiating unit 1217 (an opening corresponding to the second opening 1028 (see FIG. 45A) in the cover 1026 of the soft X-ray irradiating unit 1017) is matched with the opening in the feedback piping 1019 and a wall surface of the cover of the soft X-ray irradiating unit 1217 (corresponding to the side wall 1026A (see FIG. 45A) of the cover 1026 of the soft X-ray irradiating unit 1017) is closely adhered to the outer periphery of the feedback piping 1019. A high voltage unit of the soft X-ray irradiating unit 1217 (corresponding to the high voltage unit 1031 (see FIG. 45A) of the soft X-ray irradiating unit 1017 according to the nineteenth preferred embodiment) is connected to the controller 1006.

With the substrate processing apparatus 1201, the same processing as that of the processing example shown in FIG. 45B is performed. In the substrate immersion processing (steps S1004 to S1006 of FIG. 45B), the processing liquid is circulated through the circulation piping 1012 without being stagnant inside the processing tank 1002. The processing liquid is supplied further from the circulation nozzles 1013 in the state where the interior of the inner tank 1007 is filled with the processing liquid and therefore the excess processing liquid overflows (spills) from the upper end portion of the inner tank 1007 and flows into the outer tank 1008.

Figure 48:
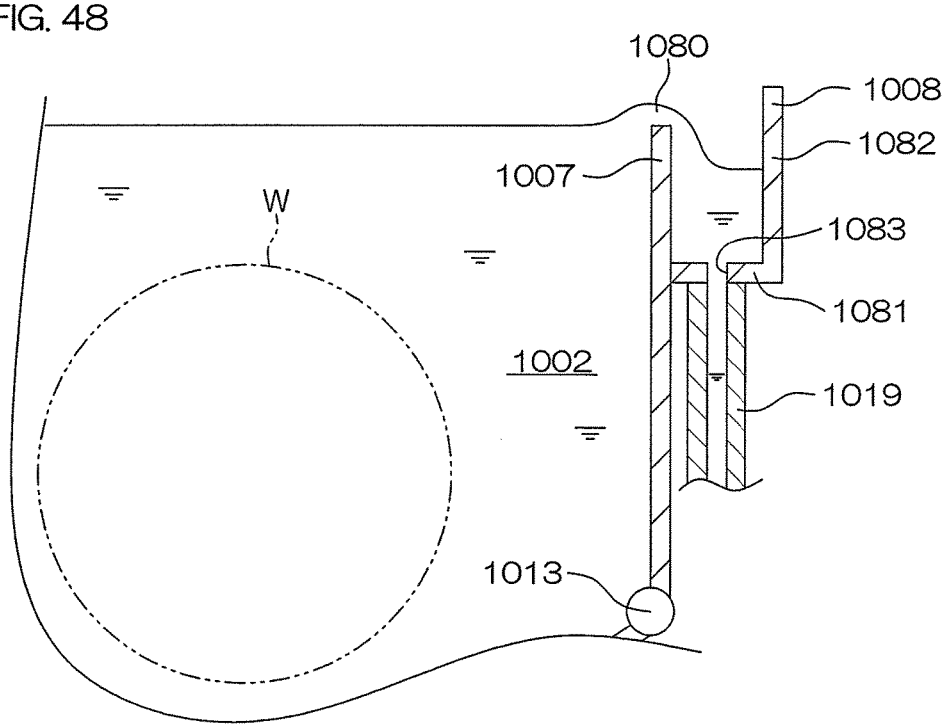
FIG. 48 is a schematic sectional view of a state where a processing liquid is overflowing from an upper end portion of an inner tank.

FIG. 48 is a schematic sectional view of a state where the processing liquid is overflowing from the upper end portion of the inner tank 1007.

The outer tank 1008 has a bottom wall 1081 of circular annular plate shape that surrounds an outer periphery of the inner tank 1007 and has a rising wall 1082 rising vertically upward from an outer peripheral edge of the bottom wall 1081. An overflow port 1083, constituted of a penetrating hole penetrating through the bottom wall 1081 in the thickness direction, is formed, for example, in one location in a circumferential direction of the bottom wall 1081. The upstream side end portion of the feedback piping 1019 is connected to the overflow port 1083.

In the substrate immersion processing (steps S1004 to S1006 of FIG. 45B), the supplying of the processing liquid from the circulation nozzles 1013 is continued intermittently and therefore the interior of the feedback piping 1019 is put in a state of being liquid-tight with the processing liquid. Also as shown in FIG. 48, a state where a liquid mass 1080 of the processing liquid overrides the upper end portion of the inner tank 1007 is sustained constantly and therefore the processing liquid stored in the inner tank 1007 and the processing liquid stored in the outer tank 1008 are constantly connected by such a liquid mass 1080 of the processing liquid.

In parallel to the substrate immersion processing, the soft X-rays are irradiated from the soft X-ray irradiating unit 1217 onto the processing liquid flowing inside the feedback piping 1019 (step S1005 of FIG. 45B).

At a portion of the processing liquid inside the feedback piping 1019 irradiated with the soft X-rays (the irradiated portion of the processing liquid; portion equivalent to the irradiated portion 1054 of the processing liquid according to the nineteenth preferred embodiment shown in FIG. 46), electrons are emitted from water molecules due to excitation of the water molecules. Consequently, a plasma state, in which a large amount of the electrons and a large amount of positive ions of water molecules coexist, is formed in the irradiated portion of the processing liquid.

In this case, the processing liquid is in the liquid-tight state inside the feedback piping 1019 and the processing liquid stored in the inner tank 1007 and the processing liquid stored in the outer tank 1008 are constantly connected by the liquid mass 1080 of the processing liquid as mentioned above and therefore the substrates W immersed in the processing liquid stored in the inner tank 1007 and the irradiated portion of the processing liquid are connected via the processing liquid stored in the inner tank 1007, the processing liquid stored in the outer tank 1008, and the processing liquid inside the feedback piping 1019. If at this point, the substrates W are positively charged, the potential difference between the irradiated portion of the processing liquid and the positively charged substrates W causes the electrons from the irradiated portion of the processing liquid to move toward the substrates W via the processing liquid stored in the inner tank 1007 and the processing liquid inside the feedback piping 1019. The substrates W are thereby supplied with a large amount of electrons and static elimination of the positively charged substrates W is thus achieved.

By the above, actions and effects equivalent to those described for the nineteenth preferred embodiment are also exhibited by the twentieth preferred embodiment.

Figure 49:
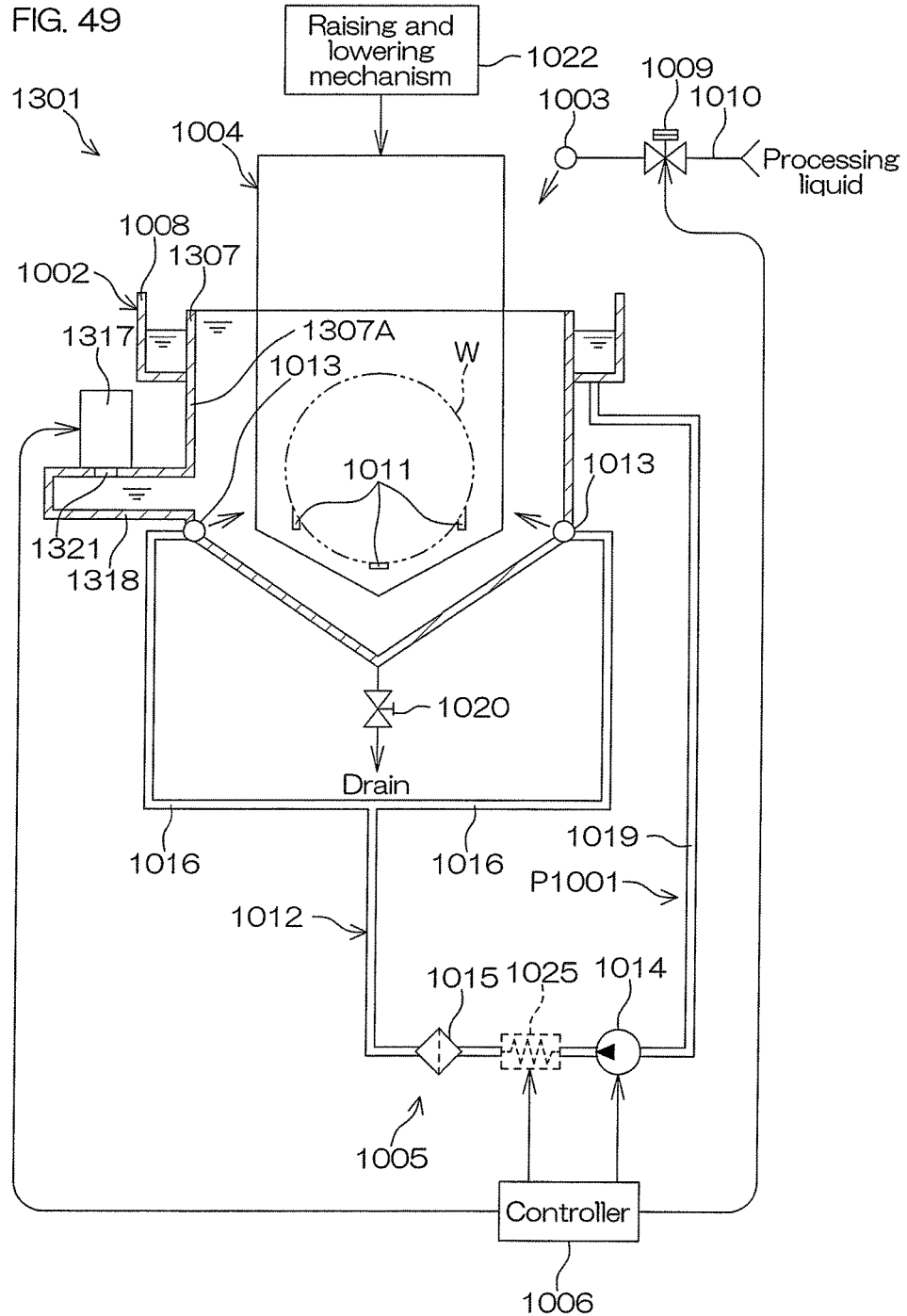
FIG. 49 is a diagram of the arrangement of a substrate processing apparatus to which a processing liquid processing apparatus according to a twenty-first preferred embodiment of the present invention is applied.

FIG. 49 is a diagram of the arrangement of a substrate processing apparatus 1301 to which a processing liquid processing apparatus according to a twenty-first preferred embodiment of the present invention is applied.

Portions of the twenty-first preferred embodiment that are in common to the nineteenth preferred embodiment are provided with the same reference symbols as in FIG. 44 to FIG. 46 and description thereof shall be omitted. Points of difference of the substrate processing apparatus 1301 according to the twenty-first preferred embodiment with respect to the substrate processing apparatus 1001 according to the nineteenth preferred embodiment are that it includes, in place of the inner tank 1007, an inner tank 1307 having a substantially box-shaped first bulging portion 1318 and that a soft X-ray irradiating unit (X-ray irradiating means) 1317 is installed on a wall of the first bulging portion 1318.

The first bulging portion 1318 bulges horizontally outward from a peripheral wall 1307A of circular cylindrical shape of the inner tank 1307 and is formed integral to the peripheral wall 1307A of the inner tank 1307. An opening 1321 is formed in an upper wall or a lower wall (upper surface in FIG. 49) of the first bulging portion 1318.

The soft X-ray irradiating unit 1317 adopts an arrangement equivalent to the soft X-ray irradiating unit 1017 (see FIG. 45A) according to the nineteenth preferred embodiment. The soft X-ray irradiating unit 1317 is mounted so as to close the opening 1321 in the first bulging portion 1318. Specifically, an opening in the cover of the soft X-ray irradiating unit 1317 (an opening corresponding to the second opening 1028 (see FIG. 45A) in the cover 1026 of the soft X-ray irradiating unit 1017) is matched with the opening 1321 in the first bulging portion 1318 and a wall surface of the cover of the soft X-ray irradiating unit 1317 (corresponding to the side wall 1026A (see FIG. 45A) of the cover 1026 of the soft X-ray irradiating unit 1017) is closely adhered to the upper wall of the first bulging portion 1318. A high voltage unit of the soft X-ray irradiating unit 1317 (corresponding to the high voltage unit 1031 (see FIG. 45A) of the soft X-ray irradiating unit 1017 according to the nineteenth preferred embodiment) is connected to the controller 1006.

With the substrate processing apparatus 1301, the same processing as that of the processing example shown in FIG. 45B is performed. In the substrate immersion processing (steps S1004 to S1006 of FIG. 45B), the processing liquid is stored inside the inner tank 1307 and the interior of the first bulging portion 1318 is thereby put in a liquid-tight state by the processing liquid.

In parallel to the substrate immersion processing, the soft X-rays are irradiated from the soft X-ray irradiating unit 1317 onto the processing liquid flowing inside the first bulging portion 1318 (step S1005 of FIG. 45B).

At a portion of the processing liquid inside the first bulging portion 1318 irradiated with the soft X-rays (the irradiated portion of the processing liquid; portion equivalent to the irradiated portion 1054 of the processing liquid according to the nineteenth preferred embodiment shown in FIG. 46), electrons are emitted from water molecules due to excitation of the water molecules. Consequently, a plasma state, in which a large amount of the electrons and a large amount of positive ions of water molecules coexist, is formed in the irradiated portion of the processing liquid.

In this case, the substrates W immersed in the processing liquid stored in the inner tank 1307 and the irradiated portion of the processing liquid are connected via the processing liquid stored in the inner tank 1307. If at this point, the substrates W are positively charged, the potential difference between the irradiated portion of the processing liquid and the positively charged substrates W causes the electrons from the irradiated portion of the processing liquid to move toward the substrates W via the processing liquid stored in the inner tank 1307. The substrates W are thereby supplied with a large amount of electrons and static elimination of the positively charged substrates W is thus achieved.

By the above, actions and effects equivalent to those described for the nineteenth preferred embodiment are also exhibited by the twenty-first preferred embodiment.

Figure 50:
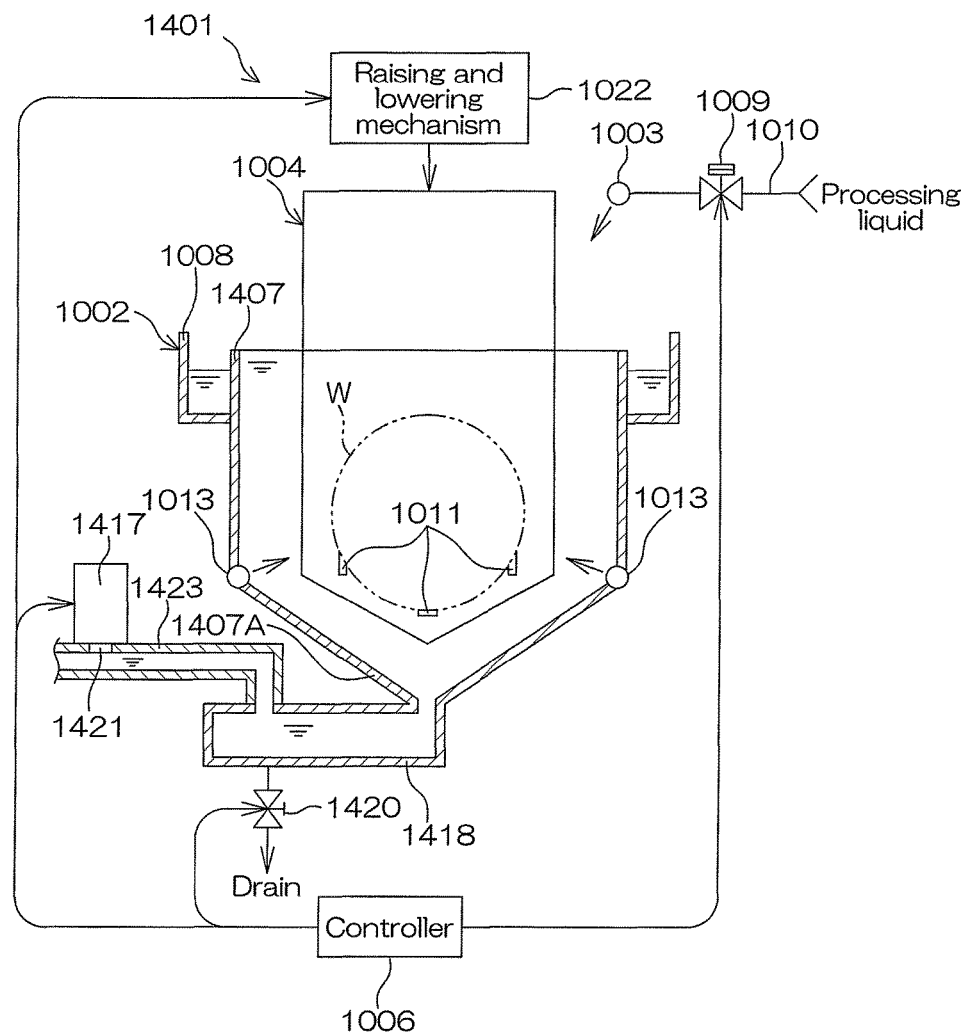
FIG. 50 is a diagram of the arrangement of a substrate processing apparatus to which a processing liquid processing apparatus according to a twenty-second preferred embodiment of the present invention is applied.

FIG. 50 is a diagram of the arrangement of a substrate processing apparatus 1401 to which a processing liquid processing apparatus according to a twenty-second preferred embodiment of the present invention is applied.

Portions of the twenty-second preferred embodiment that are in common to the nineteenth preferred embodiment are provided with the same reference symbols as in FIG. 44 to FIG. 46 and description thereof shall be omitted. Points of difference of the substrate processing apparatus 1401 according to the twenty-second preferred embodiment with respect to the substrate processing apparatus 1001 according to the nineteenth preferred embodiment are that it includes, in place of the inner tank 1007, an inner tank 1407 having a substantially box-shaped second bulging portion 1418 at a bottom portion and that a soft X-ray irradiating unit (X-ray irradiating means) 1417 is installed on a piping 1423 connected to the second bulging portion 1418.

Although the substrate processing apparatus 1401 includes a circulating mechanism of an arrangement equivalent to the circulating mechanism 1005 (see FIG. 44), illustration thereof is omitted from FIG. 50.

The second bulging portion 1418 bulges horizontally outward from a bottom wall 1407A of the inner tank 1407 and is formed integral to the bottom wall 1407A of the inner tank 1407. A liquid drain valve 1420 is installed at a predetermined position of a lower wall of the second bulging portion 1418. The liquid drain valve 1420 has an arrangement equivalent to the liquid drain valve 1020 (see FIG. 44).

The second bulging portion 1418 is thus a portion for installing a QDR (quick dump rinse) function. The processing liquid drained from the bottom portion of the inner tank 1407 is arranged to be sent to and processed at a waste liquid apparatus or a recovery apparatus.

One end of the piping 1423 is connected, for example, to an upper wall of the second bulging portion 1418. The interior of the piping 1423 is in communication with the interior of the second bulging portion 1418. Preferably, the position of connection of the piping 1423 at the second bulging portion 1418 is a position that differs in a plan view from the position of installation of the liquid drain valve 1420 at the second bulging portion 1418.

The piping 1423 has a round pipe shape (circular cylindrical shape) and is formed using a resin material, such as PVC (polyvinyl chloride), PTFE (polytetrafluoroethylene), and PFA (perfluoroalkylvinyl ether tetrafluoroethylene copolymer). An opening 1421 is formed at an intermediate portion of the piping 1423.

The soft X-ray irradiating unit 1417 adopts an arrangement equivalent to the soft X-ray irradiating unit 1017 (see FIG. 45A) according to the nineteenth preferred embodiment. The soft X-ray irradiating unit 1417 is mounted onto the piping 1423 so as to close the opening 1421 in the piping 1423. Specifically, an opening in the cover of the soft X-ray irradiating unit 1417 (an opening corresponding to the second opening 1028 (see FIG. 45A) in the cover 1026 of the soft X-ray irradiating unit 1017) is matched with the opening 1421 in the piping 1423 and a wall surface of the cover of the soft X-ray irradiating unit 1417 (corresponding to the side wall 1026A (see FIG. 45A) of the cover 1026 of the soft X-ray irradiating unit 1017) is closely adhered to the outer periphery of the piping 1423. A high voltage unit of the soft X-ray irradiating unit 1417 (corresponding to the high voltage unit 1031 (see FIG. 45A) of the soft X-ray irradiating unit 1017 according to the nineteenth preferred embodiment) is connected to the controller 1006.

With the substrate processing apparatus 1401, the same processing as that of the processing example shown in FIG. 45B is performed. In the substrate immersion processing (steps S1004 to S1006 of FIG. 45B), the processing liquid is stored inside the inner tank 1407 and the interior of the second bulging portion 1418 as well as the interior of the piping 1423 are thereby put in a liquid-tight state by the processing liquid.

In parallel to the substrate immersion processing, the soft X-rays are irradiated from the soft X-ray irradiating unit 1417 onto the processing liquid flowing inside the piping 1423 (step S1005 of FIG. 45B).

At a portion of the processing liquid inside the piping 1423 irradiated with the soft X-rays (the irradiated portion of the processing liquid; portion equivalent to the irradiated portion 1054 of the processing liquid according to the nineteenth preferred embodiment shown in FIG. 46), electrons are emitted from water molecules due to excitation of the water molecules. Consequently, a plasma state, in which a large amount of the electrons and a large amount of positive ions of water molecules coexist, is formed in the irradiated portion of the processing liquid.

In this case, as mentioned above, the processing liquid is in the liquid-tight state inside the piping 1423 and the interior of the second bulging portion 1418 is also put in a liquid-tight state by the processing liquid, and therefore the substrates W immersed in the processing liquid stored in the inner tank 1407 and the irradiated portion of the processing liquid are connected via the processing liquid stored in the inner tank 1407 (including the second bulging portion 1418) and the processing liquid in the piping 1423. If at this point, the substrates W are positively charged, the potential difference between the irradiated portion of the processing liquid and the positively charged substrates W causes the electrons from the irradiated portion of the processing liquid to move toward the substrates W via the processing liquid in the piping 1423 and the processing liquid stored in the inner tank 1407. The substrates W are thereby supplied with a large amount of electrons and static elimination of the positively charged substrates W is thus achieved.

By the above, actions and effects equivalent to those described for the nineteenth preferred embodiment are also exhibited by the twenty-second preferred embodiment.

Figure 51:
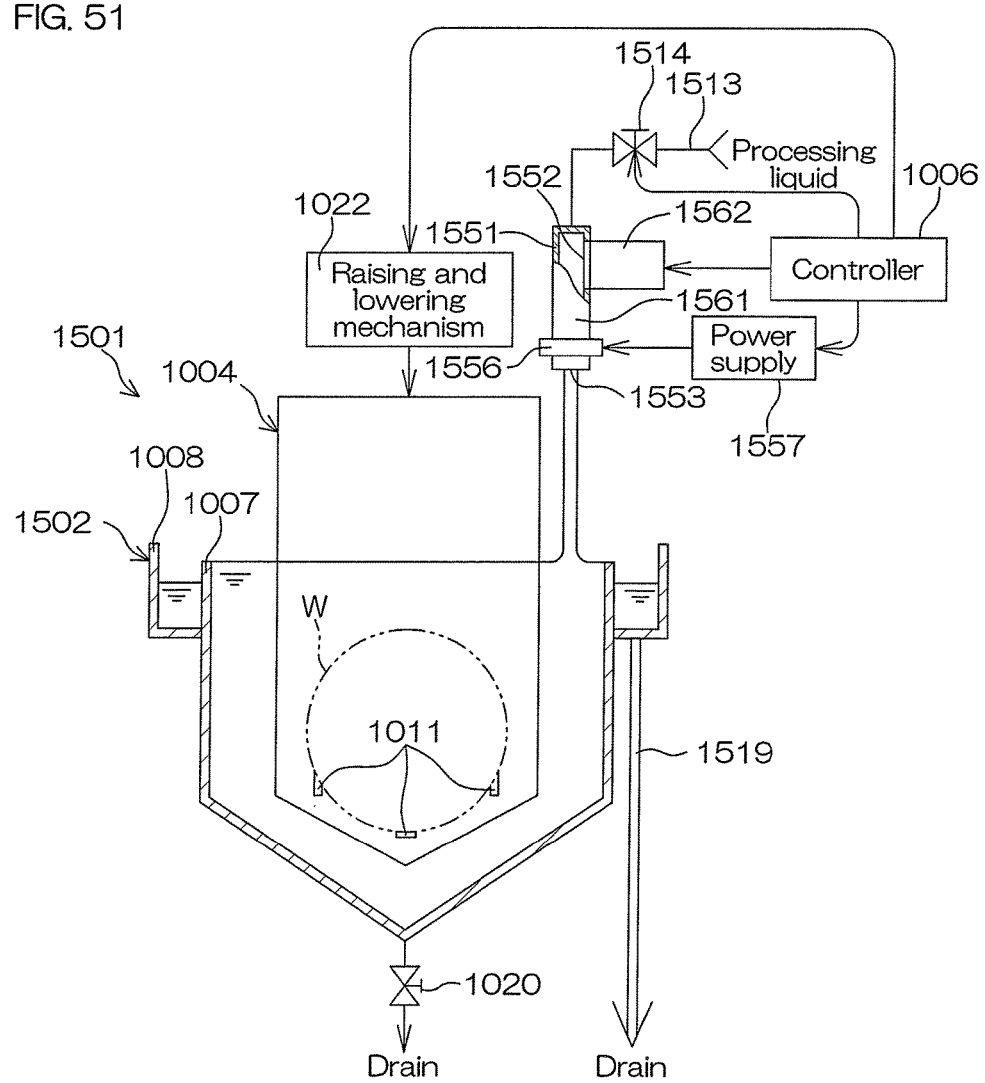
FIG. 51 is a diagram of the arrangement of a substrate processing apparatus to which a processing liquid processing apparatus according to a twenty-third preferred embodiment of the present invention is applied.

FIG. 51 is a diagram of the arrangement of a substrate processing apparatus 1501 to which a processing liquid processing apparatus according to a twenty-third preferred embodiment of the present invention is applied.

Portions of the twenty-third preferred embodiment that are in common to the nineteenth preferred embodiment are provided with the same reference symbols as in FIG. 44 to FIG. 46 and description thereof shall be omitted. Points of difference of the substrate processing apparatus 1501 according to the twenty-third preferred embodiment with respect to the substrate processing apparatus 1001 according to the nineteenth preferred embodiment are that the circulating mechanism 1005 (see FIG. 44) is not provided and the processing liquid flowing out from the outer tank 1008 is disposed or recovered, through a drain piping 1519 and that a processing liquid nozzle 1561 is provided in place of the processing liquid nozzle 1003 (see FIG. 44). A soft X-ray irradiating unit 1562 arranged to irradiate soft X-rays onto the processing liquid flowing through the interior of the processing liquid nozzle 1561 is mounted on the processing liquid nozzle 1561. The processing liquid nozzle 1561 is, for example, a straight nozzle that discharges the processing liquid in a continuous flow state and is disposed with its discharge port 1553 directed toward the interior of the inner tank 1007. The processing liquid nozzle 1561 is connected to a processing liquid piping 1513 to which the processing liquid is supplied from a processing liquid supply source. A processing liquid valve 1514 arranged to switch between supplying and stopping the supplying of the processing liquid from the processing liquid nozzle 1561 is interposed in an intermediate portion of the processing liquid piping 1513.

The processing liquid nozzle 1561 has a nozzle piping 1551 of round pipe shape (circular cylindrical shape) that extends in a vertical direction. The nozzle piping 1551 is formed using a resin material, such as PVC (polyvinyl chloride), PTFE (polytetrafluoroethylene), and PFA (perfluoroalkylvinyl ether tetrafluoroethylene copolymer). A round discharge port 1553 is opened in a tip portion (lower end portion) of the nozzle piping 1551. An opening 1552, for example of circular shape, is formed in a pipe wall of an intermediate portion of the nozzle piping 1551.

The soft X-ray irradiating unit 1562 adopts an arrangement equivalent to the soft X-ray irradiating unit 1017 (see FIG. 45A) according to the nineteenth preferred embodiment. The soft X-ray irradiating unit 1562 is mounted onto the nozzle piping 1551 so as to close the opening 1552 in the nozzle piping 1551. Specifically, an opening in the cover of the soft X-ray irradiating unit 1562 (an opening corresponding to the second opening 1028 (see FIG. 45A) in the cover 1026 of the soft X-ray irradiating unit 1017) is matched with the opening 1552 and a wall surface of the cover of the soft X-ray irradiating unit 1562 (corresponding to the side wall 1026A (see FIG. 45A) of the cover 1026 of the soft X-ray irradiating unit 1017) is closely adhered to the outer periphery of the nozzle piping 1551. A high voltage unit of the soft X-ray irradiating unit 1562 corresponding to the high voltage unit 1031 (see FIG. 45A) of the soft X-ray irradiating unit 1017 according to the nineteenth preferred embodiment) is connected to the controller 1006.

With the substrate processing apparatus 1501, after the processing liquid is stored in a processing tank 1502, the substrates W are loaded in a batch into the processing tank 1502 by the lifter 1004. Thereafter, the substrate immersion processing (steps S1004 to S1006 of FIG. 45B) is executed. However, the substrate processing apparatus 1501 is not provided with the circulating mechanism 1005 (see FIG. 44) and therefore in the substrate immersion processing, the processing liquid stored in the processing tank 1502 is not circulated. Instead, the supplying of the processing liquid from the processing liquid nozzle 1561 is continued intermittently during the substrate immersion processing. In the substrate immersion processing, the form of the processing liquid discharged from the discharge port 1553 of the processing liquid nozzle 1561 takes the form of a continuous flow connected to both the discharge port 1553 and the liquid surface of the processing liquid stored in the inner tank 1007. Also, the processing liquid is in a liquid-tight state inside the nozzle piping 1551 of the processing liquid nozzle 1561.

In parallel to the substrate immersion processing, the soft X-rays are irradiated from the soft X-ray irradiating unit 1562 onto the processing liquid flowing through the interior of the nozzle piping 1551 (step S1005 of FIG. 45B).

At a portion of the processing liquid inside the nozzle piping 1551 irradiated with the soft X-rays (the irradiated portion of the processing liquid; portion equivalent to the irradiated portion 1054 of the processing liquid according to the nineteenth preferred embodiment shown in FIG. 46), electrons are emitted from water molecules due to excitation of the water molecules. Consequently, a plasma state, in which a large amount of the electrons and a large amount of positive ions of water molecules coexist, is formed in the irradiated portion of the processing liquid.

In this case, as mentioned above, the processing liquid is in the liquid-tight state inside the nozzle piping 1551 and the form of the processing liquid discharged from the discharge port 1553 takes the form of a continuous flow connected to both the discharge port 1553 and the liquid surface of the processing liquid stored in the inner tank 1007, and therefore the substrates W immersed in the processing liquid stored in the inner tank 1007 and the irradiated portion of the processing liquid are connected via the processing liquid stored in the inner tank 1007, the processing liquid of continuous flow form, and the processing liquid in the nozzle piping 1551. If at this point, the substrates W are positively charged, the potential difference between the irradiated portion of the processing liquid and the positively charged substrates W causes the electrons from the irradiated portion of the processing liquid to move toward the substrates W via the processing liquid in the nozzle piping 1551, the processing liquid of continuous flow form, and the processing liquid stored in the inner tank 1007. The substrates W are thereby supplied with a large amount of electrons and static elimination of the positively charged substrates W is thus achieved.

By the above, actions and effects equivalent to those described for the nineteenth preferred embodiment are also exhibited by the twenty-third preferred embodiment.

Although with the twenty-third preferred embodiment, a case where the soft X-rays are irradiated from the soft X-ray irradiating unit 1562 onto the processing liquid flowing through the interior of the nozzle piping 1551 was described as an example, the soft X-ray irradiating unit 1562 may be provided on a piping, the interior of which is in communication with the nozzle piping 1551, and the soft X-rays from the soft X-ray irradiating unit 1562 may be irradiated onto the processing liquid flowing through the interior of this piping.

Figure 52:
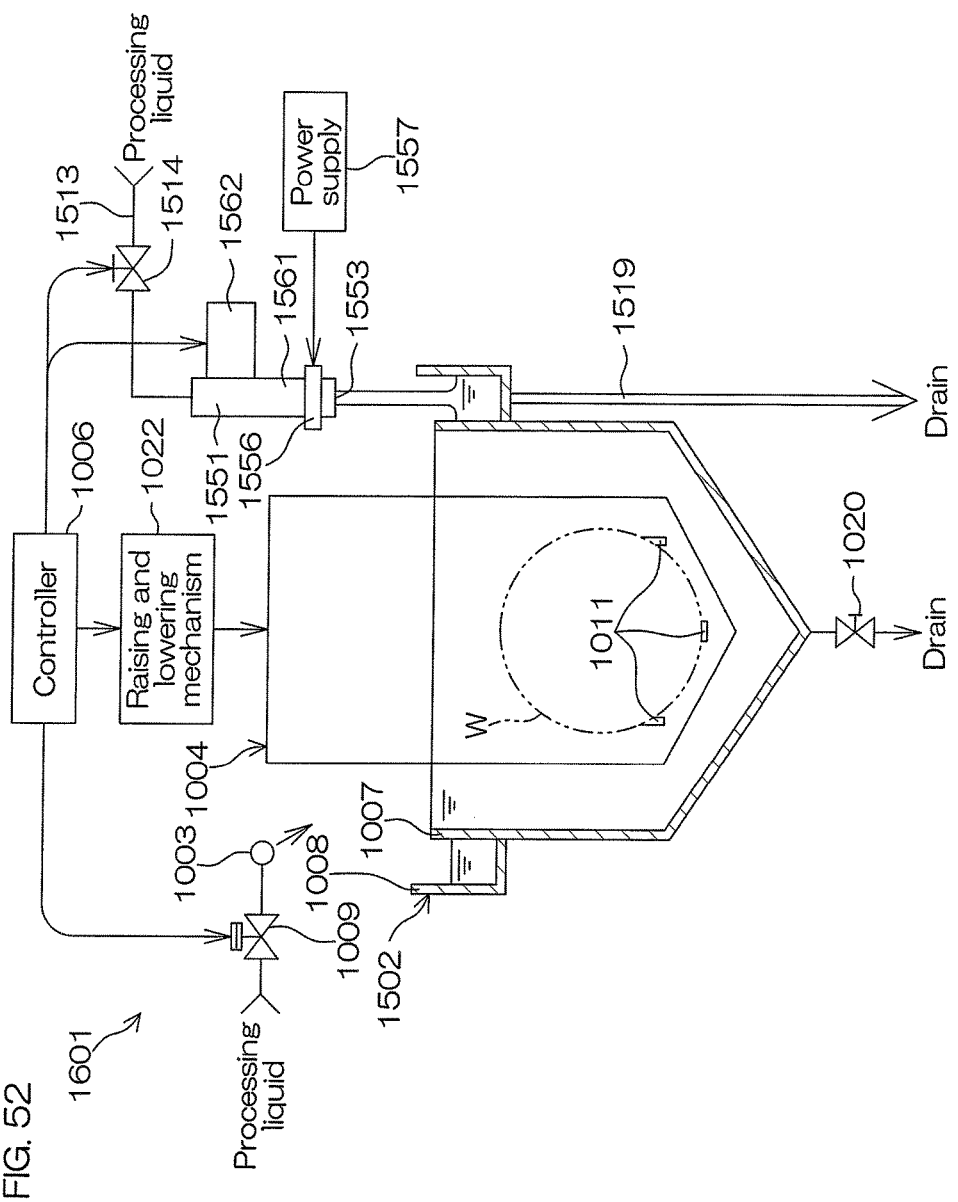
FIG. 52 is a diagram of the arrangement of a substrate processing apparatus to which a processing liquid processing apparatus according to a twenty-fourth preferred embodiment of the present invention is applied.

FIG. 52 is a diagram of the arrangement of a substrate processing apparatus 1601 to which a processing liquid processing apparatus according to a twenty-fourth preferred embodiment of the present invention is applied.

Portions of the twenty-fourth preferred embodiment that are in common to the nineteenth preferred embodiment are provided with the same reference symbols as in FIG. 44 to FIG. 46 and description thereof shall be omitted. Points of difference of the substrate processing apparatus 1601 according to the twenty-fourth preferred embodiment with respect to the substrate processing apparatus 1001 according to the nineteenth preferred embodiment are that the circulating mechanism 1005 (see FIG. 44) is not provided and the processing liquid flowing out from the outer tank 1008 is disposed or recovered through the drain piping 1519 and that the processing liquid nozzle 1561 discharging the processing liquid toward the outer tank 1008 is provided.

The processing liquid nozzle 1561 is, for example, a straight nozzle that discharges the processing liquid in a continuous flow state and is disposed with its discharge port 1553 directed toward the interior of the outer tank 1008. The soft X-ray irradiating unit 1562 arranged to irradiate soft X-rays onto the processing liquid flowing through the interior of the processing liquid nozzle 1561 is mounted on the processing liquid nozzle 1561. The series of arrangements related to the processing liquid nozzle 1561 and the soft X-ray irradiating unit 1562 is the same as that in the twenty-third preferred embodiment and therefore the same reference symbols as those of the twenty-third preferred embodiment are provided and description thereof shall be omitted.

With the substrate processing apparatus 1601, the same processing as that of the processing example shown in FIG. 45B is performed. However, the substrate processing apparatus 1601 is not provided with the circulating mechanism 1005 (see FIG. 44) and therefore in the substrate immersion processing (steps S1004 to S1006 of FIG. 45B), the processing liquid stored in the processing tank 1502 is not circulated. Instead, the supplying of the processing liquid from the processing liquid nozzle 1003 is continued intermittently during the substrate immersion processing. The processing liquid is supplied further from the processing liquid nozzle 1003 in the state where the interior of the inner tank 1007 is filled with the processing liquid and therefore the excess processing liquid overflows (spills) from the upper end portion of the inner tank 1007 and flows into the outer tank 1008. In the meantime, a state where a liquid mass of the processing liquid (the same liquid mass as the liquid mass 1080 of the processing liquid of FIG. 48) overrides the upper end portion of the inner tank 1007 is sustained constantly and therefore the processing liquid stored in the inner tank 1007 and the processing liquid stored in the outer tank 1008 are constantly connected by the liquid mass of the processing liquid.

In parallel to the substrate immersion processing, the processing liquid valve 1514 is opened and the processing liquid from the discharge port 1553 of the processing liquid nozzle 1561 is discharged toward the interior of the outer tank 1008. The form of the processing liquid discharged from the discharge port 1553 of the processing liquid nozzle 1561 takes the form of a continuous flow connected to both the discharge port 1553 and the liquid surface of the processing liquid stored in the outer tank 1008. In the meantime, the processing liquid is in a liquid-tight state inside the nozzle piping 1551 of the processing liquid nozzle 1561.

Also in parallel to the substrate immersion processing, the soft X-rays are irradiated from the soft X-ray irradiating unit 1562 onto the processing liquid flowing through the interior of the nozzle piping 1551 (step S1005 of FIG. 45B).

At the portion of the processing liquid inside the nozzle piping 1551 irradiated with the soft X-rays (the irradiated portion of the processing liquid; portion equivalent to the irradiated portion 1054 of the processing liquid according to the nineteenth preferred embodiment shown in FIG. 46), electrons are emitted from water molecules due to excitation of the water molecules. Consequently, the plasma state, in which a large amount of the electrons and a large amount of positive ions of water molecules coexist, is formed in the irradiated portion of the processing liquid.

In this case, the processing liquid is in the liquid-tight state inside the nozzle piping 1551, the form of the processing liquid discharged from the discharge port 1553 takes the form of a continuous flow connected to both the discharge port 1553 and the liquid surface of the processing liquid stored in the outer tank 1008, and the processing liquid stored in the inner tank 1007 and the processing liquid stored in the outer tank 1008 are constantly connected by the liquid mass of the processing liquid and therefore the substrates W immersed in the processing liquid stored in the inner tank 1007 and the irradiated portion of the processing liquid are connected via the processing liquid stored in the inner tank 1007, the processing liquid stored in the outer tank 1008, the processing liquid of continuous flow form, and the processing liquid in the nozzle piping 1551. If at this point, the substrates W are positively charged, the potential difference between the irradiated portion of the processing liquid and the positively charged substrates W causes the electrons from the irradiated portion of the processing liquid to move toward the substrates W via the processing liquid in the nozzle piping 1551, the processing liquid of continuous flow form, the processing liquid stored in the outer tank 1008, and the processing liquid stored in the inner tank 1007. The substrates W are thereby supplied with a large amount of electrons and static elimination of the positively charged substrates W is thus achieved.

By the above, actions and effects equivalent to those described for the nineteenth preferred embodiment are also exhibited by the twenty-fourth preferred embodiment.

Also, when a hydrophilic coating film (corresponding to the hydrophilic coating film 1038 (see FIG. 45)) peels off from an outer surface of a window member (corresponding to the outer surface 71B of the window member 1071 (see FIG. 45A)) of the soft X-ray irradiating unit 1562, the beryllium contained in the window member may become dissolved in the processing liquid. Even in such a case, the processing liquid containing beryllium is drained via the drain piping 1519 and the supplying of the processing liquid containing beryllium to the substrates W can thereby be avoided reliably.

Figure 53:
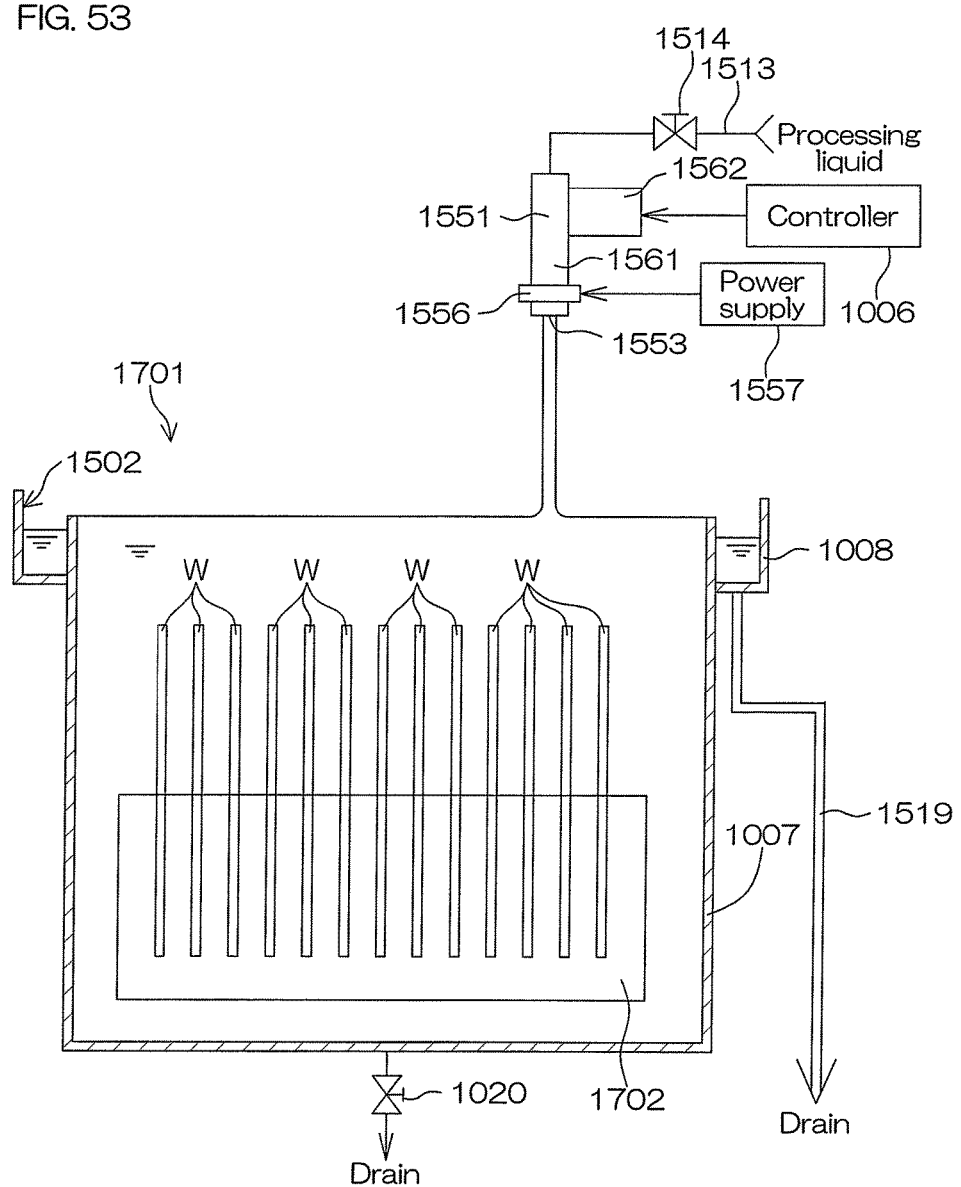
FIG. 53 is a diagram of the arrangement of a substrate processing apparatus to which a processing liquid processing apparatus according to a twenty-fifth preferred embodiment of the present invention is applied.

FIG. 53 is a diagram of the arrangement of a substrate processing apparatus 1701 to which a processing liquid processing apparatus according to a twenty-fifth preferred embodiment of the present invention is applied.

Portions of the twenty-fifth preferred embodiment that are in common to the twenty-third preferred embodiment are provided with the same reference symbols as in FIG. 51 and description thereof shall be omitted. A point of difference of the substrate processing apparatus 1701 according to the twenty-fifth preferred embodiment with respect to the substrate processing apparatus 1501 according to the twenty-third preferred embodiment is that a plurality of substrates W are immersed inside the processing tank 1502 together with a cassette 1702 that holds the plurality of substrates W in a batch. Although not illustrated in FIG. 53, the substrate processing apparatus 1701 is provided with the arrangements of the lifter 1004, the raising and lowering mechanism 1022, etc., of the twenty-third preferred embodiment. The cassette 1702 holding the plurality of substrates W in a batch is held and raised/lowered by the lifter 1004.

The cassette 1702 is formed using a resin material, such as PVC (polyvinyl chloride), PTFE (polytetrafluoroethylene), and PFA (perfluoroalkylvinyl ether tetrafluoroethylene copolymer).

With the substrate processing apparatus 1701, after the processing liquid is stored in a processing tank 1502, the plurality of substrates W and the cassette 1702 are loaded into the processing tank 1502. Thereafter, the substrate immersion processing (steps S1004 to S1006 of FIG. 45B) is executed.

As in the twenty-third preferred embodiment, the supplying of the processing liquid from the processing liquid nozzle 1561 is continued intermittently during the substrate immersion processing. In the substrate immersion processing, the form of the processing liquid discharged from the discharge port 1553 of the processing liquid nozzle 1561 takes the form of a continuous flow connected to both the discharge port 1553 and the liquid surface of the processing liquid stored in the inner tank 1007, and also, the processing liquid is in a liquid-tight state inside the nozzle piping 1551 of the processing liquid nozzle 1561.

Also in parallel to the substrate immersion processing, the soft X-rays are irradiated from the soft X-ray irradiating unit 1562 onto the processing liquid flowing through the interior of the nozzle piping 1551 (step S1005 of FIG. 45B). At the portion of the processing liquid inside the nozzle piping 1551 irradiated with the soft X-rays (the irradiated portion of the processing liquid; portion equivalent to the irradiated portion 1054 of the processing liquid according to the nineteenth preferred embodiment shown in FIG. 46), the plasma state described above is formed in the irradiated portion of the processing liquid.

In this case, as mentioned above, the processing liquid is in the liquid-tight state inside the nozzle piping 1551 and the form of the processing liquid discharged from the discharge port 1553 takes the form of a continuous flow connected to both the discharge port 1553 and the liquid surface of the processing liquid stored in the inner tank 1007, and therefore the substrates W and the cassette 1702 immersed in the processing liquid stored in the inner tank 1007 and the irradiated portion of the processing liquid are connected via the processing liquid stored in the inner tank 1007, the processing liquid of continuous flow form, and the processing liquid in the nozzle piping 1551. If at this point, the substrates W and the cassette 1702 are positively charged, the potential difference between the irradiated portion of the processing liquid and the positively charged substrates W and the cassette 1702 causes the electrons from the irradiated portion of the processing liquid to move toward the substrates W and the cassette 1702 via the processing liquid in the nozzle piping 1551, the processing liquid of continuous flow form, and the processing liquid stored in the inner tank 1007. The substrates W are thereby supplied with a large amount of electrons and static elimination of the positively charged substrates W is thus achieved.

Also although depending on the material of the cassette 1702, it may be considered that the cassette 1702 is negatively charged, in this case, the electrons from the cassette 1702 move toward the positive ions in the irradiated portion of the processing liquid via the processing liquid stored in the inner tank 1007, the processing liquid of continuous flow form, and the processing liquid in the nozzle piping 1551. The electrons are thereby eliminated from the cassette 1702 and static elimination of the negatively charged cassette 1702 is achieved.

By the above, actions and effects equivalent to those described for the nineteenth preferred embodiment are also exhibited by the twenty-fifth preferred embodiment.

The charging of the cassette 1702 during the immersion processing by the processing liquid can also be prevented. Also, even if the cassette 1702 is charged from before the immersion processing, the charges carried by the substrates W therein can be eliminated (that is, static elimination can be achieved).

Although with the nineteenth to twenty-fifth preferred embodiments, cases of applying present invention to the substrate processing apparatuses 1001, 1201, 1301, 1401, 1501, and 1601, with each of which the processing objects are the substrates W, were described, the present invention may also be applied to a processing liquid processing apparatus (article cleaning apparatus) with which a processing object besides a substrate W is processed.

Figure 54:
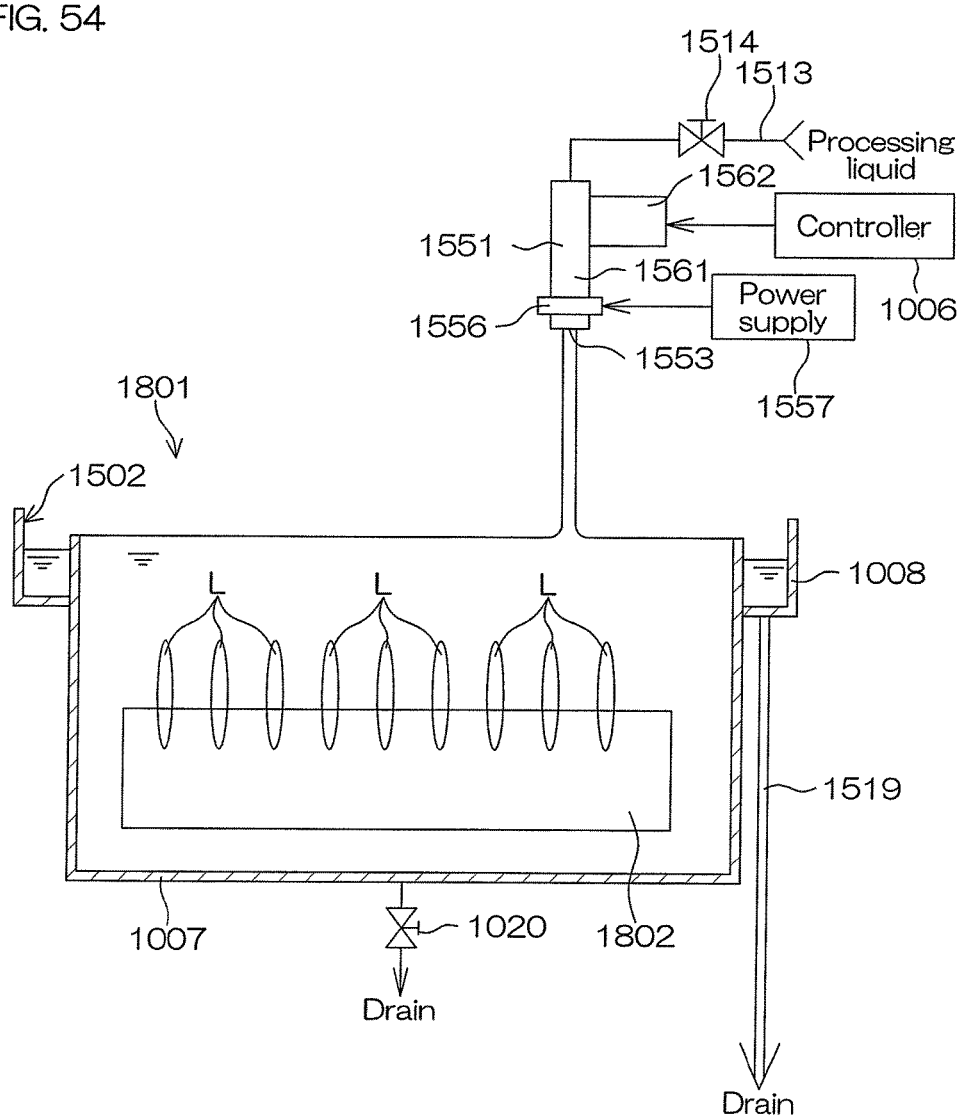
FIG. 54 is a diagram of the arrangement of an article cleaning apparatus to which a processing liquid processing apparatus according to a twenty-sixth preferred embodiment of the present invention is applied.

FIG. 54 is a diagram of the arrangement of an article cleaning apparatus 1801 to which a processing liquid processing apparatus according to a twenty-sixth preferred embodiment of the present invention is applied.

The article cleaning apparatus 1801 is an apparatus, with which the processing object is, for example, an optical part such as a lens L, and which is arranged to clean the optical part using a processing liquid (cleaning liquid). With the article cleaning apparatus 1801, lenses L are immersed in the processing tank 1502 to clean the lenses L. A plurality of the lenses L are immersed into the processing tank 1502 in a state of being housed in a batch in a cassette 1802. The article cleaning apparatus 1801 is provided with an ultrasonic generator (not shown) that generates ultrasonic vibrations in the processing liquid stored in the processing tank 1502.

With the exception of being provided with the ultrasonic generator (not shown), the general arrangement of the article cleaning apparatus 1801 is equivalent to the arrangement of the substrate processing apparatus 1701 according to the twenty-fifth preferred embodiment, and therefore portions of the twenty-sixth preferred embodiment that are in common to the twenty-fifth preferred embodiment are provided with the same reference symbols as in FIG. 53 and description thereof shall be omitted.

With the article cleaning apparatus 1801, after the lenses L and the cassette 1802 are loaded into the processing tank 1502, the processing liquid is stored in the processing tank 1502. The lenses L and the cassette 1802 are thereby immersed in the processing liquid and the lenses L are cleaned by such an immersion processing being continued for a predetermined period.

As in the twenty-third preferred embodiment, the supplying of the processing liquid from the processing liquid nozzle 1561 is continued intermittently during the immersion processing. In the immersion processing, the form of the processing liquid discharged from the discharge port 1553 of the processing liquid nozzle 1561 takes the form of a continuous flow connected to both the discharge port 1553 and the liquid surface of the processing liquid stored in the inner tank 1007, and also, the processing liquid is in a liquid-tight state inside the nozzle piping 1551 of the processing liquid nozzle 1561.

Also in parallel to the immersion processing, the soft X-rays are irradiated from the soft X-ray irradiating unit 1562 onto the processing liquid flowing through the interior of the nozzle piping 1551 (step S1005 of FIG. 45B). At the portion of the processing liquid inside the nozzle piping 1551 irradiated with the soft X-rays (the irradiated portion of the processing liquid; portion equivalent to the irradiated portion 1054 of the processing liquid according to the nineteenth preferred embodiment shown in FIG. 46), the plasma state described above is formed in the irradiated portion of the processing liquid.

In this case, as mentioned above, the processing liquid is in the liquid-tight state inside the nozzle piping 1551 and the form of the processing liquid discharged from the discharge port 1553 takes the form of a continuous flow connected to both the discharge port 1553 and the liquid surface of the processing liquid stored in the inner tank 1007, and therefore the lenses L and the cassette 1802 immersed in the processing liquid stored in the inner tank 1007 and the irradiated portion of the processing liquid are connected via the processing liquid stored in the inner tank 1007, the processing liquid of continuous flow form, and the processing liquid in the nozzle piping 1551. If at this point, the lenses L and the cassette 1802 are positively charged, the potential difference between the irradiated portion of the processing liquid and the positively charged lenses L and cassette 1802 causes the electrons from the irradiated portion of the processing liquid to move toward the lenses L and the cassette 1802 via the processing liquid in the nozzle piping 1551, the processing liquid of continuous flow form, and the processing liquid stored in the inner tank 1007. The substrates W are thereby supplied with a large amount of electrons and static elimination of the positively charged lenses L is thus achieved.

Also although depending on the material of the cassette 1802, it may be considered that the cassette 1802 is negatively charged, in this case, the electrons from the cassette 1802 move toward the positive ions in the irradiated portion of the processing liquid via the processing liquid stored in the inner tank 1007, the processing liquid of continuous flow form, and the processing liquid in the nozzle piping 1551. The electrons are thereby eliminated from the cassette 1802 and static elimination of the negatively charged cassette 1802 is achieved.

By the above, the charging of the lenses L during the immersion processing by the processing liquid can be prevented with the twenty-sixth preferred embodiment. Also, even if the lenses L are charged from before the immersion processing, the charges carried by the lenses L can be eliminated (that is, static elimination can be achieved).

Although in the above description, it was described that the plurality of lenses L are immersed in the processing liquid in a state of being housed in the cassette 1802, the lenses L may be immersed directly in the processing liquid (without being housed in the cassette 1802).

Also, although the description was provided with the lenses L (see FIG. 54) as an example of optical parts, the processing object may be a parts container housing an optical part, such as a mirror, diffraction grating. The cleaning object (processing object) may also be a part other than an optical part.

Also in the article cleaning apparatus 1801 according to the twenty-sixth preferred embodiment, the same arrangements as those of the nineteenth to twenty-second and twenty-fourth preferred embodiments may be adopted. In this case, the same processing as that described with the nineteenth to twenty-second and twenty-fourth preferred embodiments is applied. That is, the optical part (lens L) or other part is immersed in the processing liquid stored in the processing tank 1502 and in parallel thereto, the soft X-rays from the soft X-ray unit 1017, 1217, 1317, or 1417 are irradiated onto the processing liquid stored in the processing tank 1502 or the processing liquid present in the piping 1016, 1019, or 1423, the interior of which is in communication with the interior of the processing tank 1502.

Figure 55:
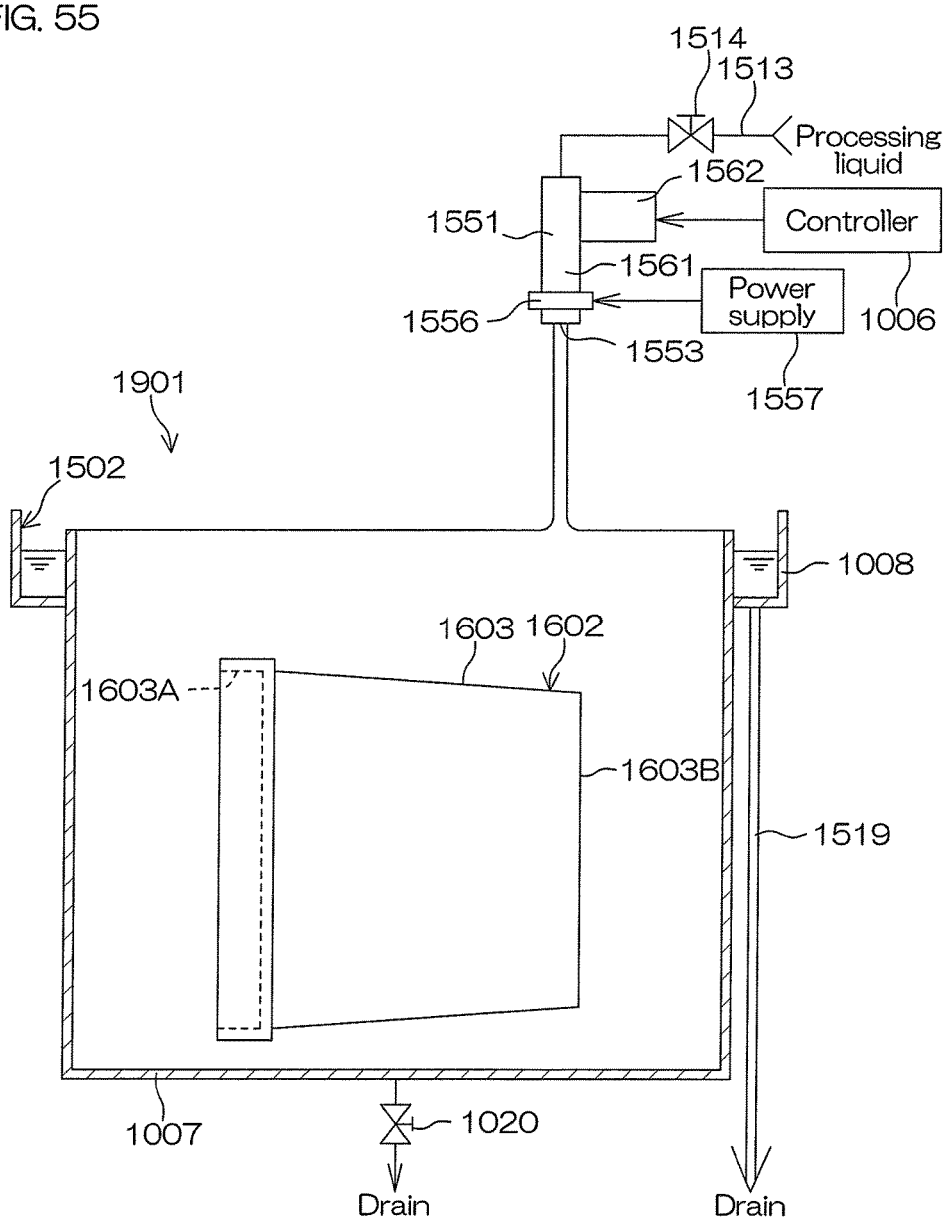
FIG. 55 is a diagram of the arrangement of an article cleaning apparatus to which a processing liquid processing apparatus according to a twenty-seventh preferred embodiment of the present invention is applied.

FIG. 55 is a diagram of the arrangement of an article cleaning apparatus 1901 to which a processing liquid processing apparatus according to a twenty-seventh preferred embodiment of the present invention is applied.

The article cleaning apparatus 1901 is an apparatus, with which the processing object is, for example, a substrate container (container) 1602, and which is arranged to clean the substrate container 1602 using a processing liquid (cleaning liquid). With the article cleaning apparatus 1901, the substrate container 1602 is immersed into the processing tank 1502 to clean the substrate container 1602.

Figure 56:
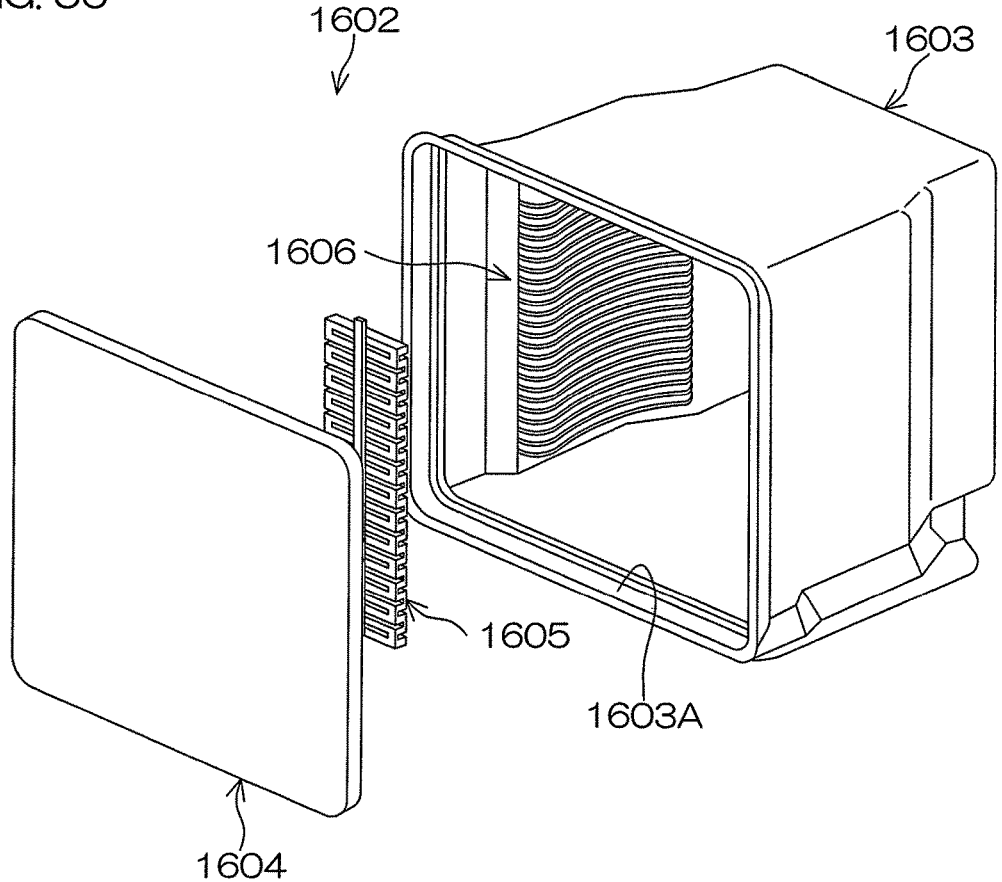
FIG. 56 is a perspective view of the arrangement of a substrate container shown in FIG. 55.

FIG. 56 is a perspective view of the arrangement of the substrate container 1602.

As shown in FIG. 56, the substrate container 1602 is a container that houses substrates W in a sealed state. An FOSB (front opening shipping box) can be cited as an example of the substrate container 1602. The FOSB is mainly used for delivery of substrates W from a semiconductor wafer manufacturer to a semiconductor device manufacturer. The FOSB houses a plurality of unprocessed substrates W and prevents damaging of the substrates W while maintaining the degree of cleanness of the substrates W.

The substrate container 1602 includes a container main body 1603 with the shape of a bottomed box and having an opening 1603A at a side, a lid 1604 arranged to open and close the opening 1603A of the container main body 1603, a multiple-stage container support rack 1606 mounted on an inner wall of the container main body 1603, and a multiple-stage lid support rack 1605 mounted on the lid 1604. The substrates W are taken into and out of the interior of the container main body 1603 via the opening 1603A. The container main body 1603 and the lid 1604 are respectively formed using, for example, a resin material, such as PVC (polyvinyl chloride).

As shown in FIG. 55, the general arrangement of the article cleaning apparatus 1901 is equivalent to the arrangement of the substrate processing apparatus 1701 according to the twenty-fifth preferred embodiment, and therefore portions of the twenty-seventh preferred embodiment that are in common to the twenty-fifth preferred embodiment are provided with the same reference symbols as in FIG. 53 and description thereof shall be omitted.

With the substrate processing apparatus 1901, after the substrate container 1602 (container main body 1603) is loaded into the processing tank 1502, the processing liquid is stored in the processing tank 1502. The substrate container 1602 is thereby immersed in the processing liquid and the substrate container 1602 is cleaned by such an immersion processing being continued for a predetermined period.

As in the twenty-fifth preferred embodiment, the supplying of the processing liquid from the processing liquid nozzle 1561 is continued intermittently during the immersion processing. In the immersion processing, the form of the processing liquid discharged from the discharge port 1553 of the processing liquid nozzle 1561 takes the form of a continuous flow connected to both the discharge port 1553 and the liquid surface of the processing liquid stored in the inner tank 1007, and also, the processing liquid is in a liquid-tight state inside the nozzle piping 1551 of the processing liquid nozzle 1561.

Also in parallel to the immersion processing, the soft X-rays are irradiated from the soft X-ray irradiating unit 1562 onto the processing liquid flowing through the interior of the nozzle piping 1551 (step S5 of FIG. 45B). At the portion of the processing liquid inside the nozzle piping 1551 irradiated with the soft X-rays (the irradiated portion of the processing liquid; portion equivalent to the irradiated portion 1054 of the processing liquid according to the nineteenth preferred embodiment shown in FIG. 46), the plasma state described above is formed in the irradiated portion of the processing liquid.

In this case, as mentioned above, the processing liquid is in the liquid-tight state inside the nozzle piping 1551 and the form of the processing liquid discharged from the discharge port 1553 takes the form of a continuous flow connected to both the discharge port 1553 and the liquid surface of the processing liquid stored in the inner tank 1007, and therefore the substrate container 1602 immersed in the processing liquid stored in the inner tank 1007 and the irradiated portion of the processing liquid are connected via the processing liquid stored in the inner tank 1007, the processing liquid of continuous flow form, and the processing liquid in the nozzle piping 1551. If at this point, the substrate container 1602 is positively charged, the potential difference between the irradiated portion of the processing liquid and the positively charged substrate container 1602 causes the electrons from the irradiated portion of the processing liquid to move toward the substrate container 1602 via the processing liquid in the nozzle piping 1551, the processing liquid of continuous flow form, and the processing liquid stored in the inner tank 1007. The substrates W are thereby supplied with a large amount of electrons and static elimination of the positively charged substrate container 1602 (container main body 1603) is thus achieved.

Also although depending on the material of the substrate container 1602, it may be considered that the substrate container 1602 is negatively charged, in this case, the electrons from the substrate container 1602 move toward the positive ions in the irradiated portion of the processing liquid via the processing liquid stored in the inner tank 1007, the processing liquid of continuous flow form, and the processing liquid in the nozzle piping 1551. The electrons are thereby eliminated from the substrate container 1602 and static elimination of the negatively charged substrate container 1602 is achieved.

By the above, the charging of the substrate container 1602 during the immersion processing by the processing liquid can be prevented with the twenty-seventh preferred embodiment. Also, even if substrate container 1602 is charged from before the immersion processing, the charges carried by the substrate container 1602 can be eliminated (that is, static elimination can be achieved).

Although in FIG. 55, an example of cleaning the container main body 1603 of the substrate container 1602 was described, the cleaning method may be adopted similarly to clean the lid 1604 or the support rack 1605 or 1606 to apply the cleaning processing to the lid 1604 or the support rack 1605 or 1606 while achieving static elimination of the lid 1604 or the support rack 1605 or 1606.

Also, although the FOSB was described as an example of the substrate container 1602, an FOUP (front opening unified pod), which houses substrates W in a sealed state and is mainly used for conveying substrates W within a plant of a semiconductor wafer manufacturer, can also be cited as an example. Besides this, an SMIF (standard mechanical interface) pod, OC (open cassette), and other forms of substrate containers can be cited as examples of the substrate container 1602.

Also, the container is not restricted to that which houses a substrate W, and the processing object may be a medium container housing a disk-shaped medium, such as a CD, DVD, blue disk, or a parts container housing an optical part, such as a lens L (see FIG. 54), mirror, diffraction grating.

Also in the article cleaning apparatus 1901 according to the twenty-seventh preferred embodiment, the same arrangements as those of the nineteenth to twenty-second and twenty-fourth preferred embodiments may be adopted. In this case, the same processing as that described with the nineteenth to twenty-second and twenty-fourth preferred embodiments is applied. That is, the substrate container 1602 or other container is immersed in the processing liquid stored in the processing tank 1002 and in parallel thereto, the soft X-rays from the soft X-ray irradiating unit 1017, 1217, 1317, or 1417 are irradiated onto the processing liquid stored in the processing tank 1002 or the processing liquid present in the piping 1016, 1019, or 1423, the interior of which is in communication with the interior of the processing tank 1002.

Although the preferred embodiments of the present invention were described above, the present invention may be implemented in other modes.

For example, although with the first to eighth, thirteenth, and fourteenth preferred embodiments, it was described that the electrode 56 (see FIG. 1, FIG. 8, FIG. 10A, FIG. 11, FIG. 12, FIG. 14, FIG. 15A, FIG. 16, FIG. 24, and FIG. 28) is provided at the respective tip portions of the nozzle pipings of the water nozzles 61, 202, 212, and 531, an arrangement where the electrode 56 is not provided at the nozzle piping is also possible. In this case, the power supply 57 (see FIG. 3) is also omitted.

Also oppositely, the electrode 56 may be provided at the tip portion of the water nozzle 409 of the twelfth preferred embodiment and the respective tip portions of the cup nozzles 224 and 313 of the sixth and eleventh preferred embodiments and a voltage with respect to an apparatus ground may be arranged to be applied to the electrode 56 by the power supply 57 (see FIG. 3).

Also as indicated by alternate long and two short dashed lines in FIG. 4, FIG. 18, FIG. 22, FIG. 24, FIG. 14, and FIG. 20, the liquid detection sensor (processing liquid detecting means) 101 may be disposed respectively at the water supplying pipings 204, 307, 410, and 533 of the fourth, tenth, twelfth, and thirteenth preferred embodiments and the branch pipings 222 and 312 of the sixth and eleventh preferred embodiments. The liquid detection sensor 101 is a sensor arranged to detect the presence or non-presence of DIW at the predetermined water detection position 102 in the water supplying piping 204, 307, 410, or 533 or the branch piping 222 or 312. In this case, the water detection position 102 is set at the same position as or a position close to the opening (opening at which the soft X-rays are irradiated) formed in the water supplying piping 204, 307, 410, or 533 or the branch piping 222 or 312. Also in this case, processing equivalent to the processing of FIG. 7 may be executed.

Also, the fibrous substance according to the third preferred embodiment may be provided respectively at the discharge ports 202A, 216, 409A, and 531A of the water nozzles 202, 212, 409, and 531 in the fourth, fifth, twelfth, and thirteenth preferred embodiments and at the discharge ports 224A and 313A of the cup nozzles 224 and 313 of the sixth and eleventh preferred embodiments.

Also, although with the sixth and eleventh preferred embodiments, static elimination of the cup 17 is achieved using the DIW from the nozzles 224 and 313 provided at the tips of the branch pipings 222 and 312, such DIW from the nozzles 224 and 313 may also be used to perform static elimination of the second nozzle piping 232 (see FIGS. 15A and 15B).

Also, although with the sixth and eleventh preferred embodiments, it was described that the soft X-ray irradiating units 223 and 319 are disposed at the branch pipings 222 and 312, the soft X-ray irradiating units 223 and 319 may instead be disposed respectively at the water supplying pipings 204 and 307.

Also, although it was described that the water supplying units 230, 250, and 600 according to the seventh, eighth, and fourteenth preferred embodiments adopt arrangements equivalent to the water supplying unit 100 according to the first preferred embodiment, these may instead adopt arrangements equivalent to the water supplying unit 200 (see FIG. 1) according to the fourth preferred embodiment or the water supplying unit 220 according to the fifth preferred embodiment.

Also, although with the tenth to twelfth preferred embodiments, it was described that water from the water nozzle 302 is supplied to the upper surface of the substrate W, the water supplying unit 100 (see FIG. 1) according to the first to third preferred embodiments, the water supplying unit 200 (see FIG. 11) according to the fourth preferred embodiment or the water supplying unit 220 according to the fifth preferred embodiment may be adopted in place of the water nozzle 302.

Also, although with the tenth to twelfth preferred embodiments, the case where rinsing is applied to both surfaces of the substrate W, the rinsing processing may be applied to just the lower surface of the substrate W in the tenth to twelfth preferred embodiments. In this case, arrangements with which the water nozzle 302, the water supplying piping 303, and the water valve 304 are omitted from the respective arrangements shown in FIG. 18, FIG. 20, and FIG. 22 may be adopted.

Also, the soft X-ray irradiating apparatus 314 according to the eleventh preferred embodiment may be disposed in the processing chamber 3 in each of the first to tenth and twelfth preferred embodiments. In this case, the soft X-rays from the soft X-ray irradiating apparatus 314 may be arranged to be irradiated onto the cup upper portion 19.

Also, although with each of the first to twelfth and fourteenth preferred embodiments, the case where DIW (example of water) is supplied to the processing object (the substrate W or the substrate container 602 or the second nozzle piping 232) from a single nozzle 61, 202, 212, 306, or 409 was described as an example, DIW may be supplied from a plurality of nozzles instead. In this case, it is preferable for upstream ends of a plurality of water supplying pipings arranged to supply DIW to nozzles 61, 202, 212, 306, or 409 to be connected to a collective water piping and the soft X-rays from a soft X-ray irradiating unit to be irradiated onto the DIW present in the collective water piping as in the water supplying unit 500 according to the thirteenth preferred embodiment.

Also with the first to fourteenth preferred embodiments, for example, a DLC (diamond-like carbon) coating film having hydrophilicity or a fluororesin coating film or hydrocarbon resin coating film, etc., having hydrophilicity may be used as the hydrophilic coating film 38 covering the outer surface 71B of the window member 71.

Also, the window member 71 may be formed using a polyimide resin. In this case, the window member 71 can be made to transmit the soft X-rays. Also, a polyimide resin is excellent in chemical stability and the window member 71 can thus be continued to be used over a long period. In this case, there is no need to cover the outer surface 71B with the hydrophilic coating film 38.

Also, although with the first to fourteenth preferred embodiments, DIW was cited as an example of water irradiated with soft X-rays and discharged from the discharge port, the water is not restricted to DIW and any of carbonated water, electrolytic ion water, hydrogen-dissolved water, ozone-dissolved water, or hydrochloric acid water of dilute concentration (for example, approximately 10 ppm to 100 ppm) may be adopted as the water.

Also, in the first to fourteenth preferred embodiments, a chemical solution (dilute chemical solution) may be adopted as the processing liquid irradiated with soft X-rays and discharged from the discharge port. In this case, hydrofluoric acid diluted to a predetermined concentration, BHF (buffered HF), APM (ammonia-hydrogen peroxide mixture), TMAH (tetramethylammonium hydroxide aqueous solution), ammonia water, HPM (hydrochloric acid/hydrogen peroxide mixture), etc., may be used as the chemical solution.

Further in the first to fourteenth preferred embodiments, in a processing of cleaning the front surface and the peripheral edge portion of the substrate W with a brush or scrubber while supplying the processing liquid, soft X-rays may be irradiated onto the processing liquid flowing through the interior of the first piping in parallel to the supplying of the processing liquid.

Also in the fifteenth to eighteenth preferred embodiments, another coating film may be used as the water repellent coating film formed on the outer surface 735B of the irradiating window 735 and covering the outer surface 735B.

Figure 42:
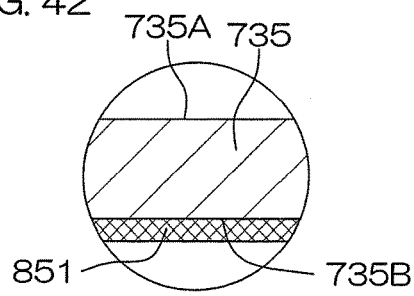
FIG. 42 is a diagram of a modification example (1) of the present invention.

As the water repellent film, a DLC (diamond-like carbon) coating film 851 (coating film of diamond-like carbon) having water repellency may be adopted as shown in FIG. 42. The DLC coating film 851 contains minute hydrogen atoms (in terms of the ratio of the number of atoms, C:H=99:1 to 96:4). The film thickness of the DLC coating film 851 is not more than 10 μm and is especially preferably approximately 1 to 2 μm.

In each of the fifteenth to eighteenth preferred embodiments, silicon (Si) ions are implanted by an ion implantation method, etc., in the outer surface 735B of the irradiating window 735 and then carbon (C) ions are implanted by a sputtering method, etc., in the outer surface 735B of the irradiating window 735. The outer surface 735B of the irradiating window 735 is thereby modified. A deposition film of DLC is then formed by a plasma CVD method, etc., on the outer surface 735B of the irradiating window 735 and the DLC coating film 851 is formed thereby. The implantation of silicon (Si) ions, the implantation of carbon (C) ions, and the deposition of DLC are performed under a low temperature environment of room temperature to 150° C.

The DLC coating film 851 formed by such a method (plasma ion assist method) has water repellency. When the water repellent DLC coating film 851 is formed on the outer surface 735B of the irradiating window 735, attachment of water droplets onto the outer surface 735B of the irradiating window 735 can be prevented. Consequently, fogging of the irradiating window 735 can be suppressed or prevented.

Also, the DLC coating film 851 has a highly adhesive property even under a high temperature environment. Contamination of the irradiating window 735 by peeled DLC can thus be prevented reliably.

Further, the deposition of DLC is performed under a low temperature environment and therefore the temperature drop after deposition is low and stress is unlikely to remain in the DLC coating film 851. A coating film that is unlikely to crack (is high in durability) can thereby be formed.

Figure 43:
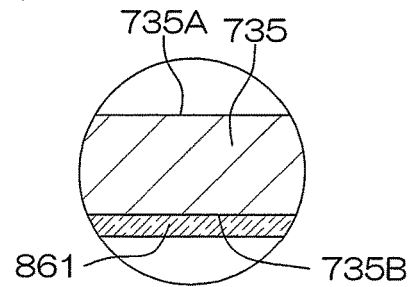
FIG. 43 is a diagram of a modification example (2) of the present invention.

Also in the fifteenth to eighteenth preferred embodiments, an amorphous fluororesin coating film 861 having water repellency may be adopted as the water repellent coating film as shown in FIG. 43. The amorphous fluororesin coating film 861 is formed of amorphous fluorine constituted, for example, of Cytop resin (trade name). The film thickness of the amorphous fluororesin coating film 861 is not more than 50 μm and is especially preferably approximately 5 to 10 μm. When the water repellent amorphous fluororesin coating film 861 is formed on the outer surface 735B of the irradiating window 735, attachment of water droplets onto the outer surface 735B of the irradiating window 735 can be prevented. Consequently, fogging of the irradiating window 735 can be suppressed or prevented.

Although the preferred embodiments of DLC and amorphous fluororesin as the coating film in the fifteenth to eighteenth preferred embodiment were described, another material may be applied as the coating film as long as the coating film is of a material that readily transmits soft X-rays, has a heat resistance of approximately hundred and several dozen ° C., is excellent in adhesion to beryllium, has water resistance, has corrosion resistance against chemicals and chemical vapors, is low in elution of ions into pure water, and is unlikely to peel or crack.

Also, although with the eighteenth preferred embodiment, the arrangement having the shielding member provided integral to the soft X-ray irradiating head 841 was described, the shielding member may be provided individually of the irradiating head 841. In this case, it may be mounted on an arm swingable within a horizontal plane above the spin chuck 704 and be provided to be movable above the spin chuck 704 by the swinging of the arm.

Also in the eighteenth preferred embodiment or in each of the preferred embodiments described above, the irradiation of X-rays from the soft X-ray irradiating head 706 or 841 or the X-ray irradiating unit 834 may be stopped when the shutter 721 is put in the open state.

Also, although with the fifteenth to eighteenth preferred embodiments, it was described that the gas nozzle 727 discharges a gas of higher temperature than ordinary temperature, a gas of ordinary temperature may be discharged from the gas nozzle 727.

Also, although in the fifteenth to eighteenth preferred embodiments, the arrangement in which the sheet-shaped heater 744 is disposed as the heating member was adopted, an arrangement in which another heat source is provided as the heating member is also possible. Also, the arrangement is not restricted to being provided at the periphery of the opening 728 such as that of the lower wall 726A of the cover 726 but may be provided at the irradiating window 735 instead. An arrangement provided at both the lower wall 726A of the cover 726 and the irradiating window 735 is also possible. An arrangement in which the heater 744 or other heating member is not provided at the periphery of the irradiating window 735 is also possible.

Also although with each of the fifteenth to eighteenth preferred embodiments, the arrangement in which the movable soft X-ray irradiating head 706 or 841 or the similarly movable X-ray irradiating unit 834 is provided as the X-ray irradiating means was described as an example, a fixed type X-ray irradiating means may be disposed facingly and fixedly above the substrate W held by the spin chuck 704. In this case, arrangements must be made so that the soft X-rays irradiated from the fixed type X-ray irradiating means is irradiated across the entirety of the substrate W.

Also, although with the fifteenth to eighteenth preferred embodiments, DIW was cited as an example of water irradiated with soft X-rays and, in parallel, supplied to the substrate W, the water is not restricted to DIW and any of carbonated water, electrolytic ion water, hydrogen-dissolved water, ozone-dissolved water, or hydrochloric acid water of dilute concentration (for example, approximately 10 ppm to 100 ppm) may be adopted as the water.

Also, although with each of the fifteenth to eighteenth preferred embodiments, the case where the soft X-rays are irradiated onto the front surface of the substrate W in parallel to supplying of water for the rinsing processing was described as an example, the irradiation of soft X-rays may also be performed in parallel to the supplying of a chemical solution (dilute chemical solution). In this case, hydrofluoric acid diluted to a predetermined concentration, BHF (buffered HF), APM (ammonia-hydrogen peroxide mixture), TMAH (tetramethylammonium hydroxide aqueous solution), ammonia water, HPM (hydrochloric acid/hydrogen peroxide mixture), etc., may be used as the chemical solution. Further in the first to fourteenth preferred embodiments, in a processing of cleaning the front surface and the peripheral edge portion of the substrate W with a brush or scrubber while supplying the processing liquid, soft X-rays may be irradiated onto the processing liquid flowing through the interior of the first piping in parallel to the supplying of the processing liquid.

Also in the fifteenth to eighteenth preferred embodiments, in a processing of cleaning the front surface and the peripheral edge portion of the substrate W with a brush or scrubber while supplying water, soft X-rays may be irradiated onto the front surface of the substrate W in parallel to the supplying of water.

Also, although with each of the fifteenth to eighteenth preferred embodiments, the case of performing processing on the substrate W having the oxide film formed on the front surface was described as an example, processing may be performed on a substrate W having a metal film (wiring film), such as a copper film or Ti (titanium) film, formed on the front surface.

With the nineteenth to twenty-fifth preferred embodiments, after the substrate immersion processing, all of the processing liquid inside the processing tank 1002 may be drained and a post-processing shower rinse may be performed on the substrates W from the processing liquid nozzle 1003. In this case, contaminants that remain attached to the substrates W even after the immersion processing can be rinsed off and prevented from reattaching to the substrates W.

Also with the nineteenth to twenty-third preferred embodiments, a heater 25, arranged to heat the processing liquid flowing through the circulation piping 1012, may be interposed at an intermediate portion of the circulation piping 1012 (feedback piping 1019) of the circulating mechanism 1005 as indicated by broken lines in FIG. 44, FIG. 47, and FIG. 49.

Also with the twentieth to twenty-third preferred embodiments, an arrangement where the circulating mechanism 1005 (see FIG. 44) is not provided is possible. In this case, the processing liquid stored in the processing tank 1002 or 1502 is not circulated and the processing liquid recovered in the outer tank 1008 is disposed or recovered.

Also with the twenty-fourth to twenty-seventh preferred embodiments, an arrangement provided with the circulating mechanism 1005 (see FIG. 44) is possible. In this case, the processing liquid stored in the processing tank 1502 is circulated and the processing liquid recovered in the outer tank 1008 is resupplied to the interior of the processing tank 1502.

Also with the twenty-six and twenty-seventh preferred embodiments, in parallel to the immersion processing, a processing of cleaning the processing object immersed in the processing liquid by rubbing with a brush may be executed in parallel.

In the nineteenth and twenty-first to twenty-seventh preferred embodiments, the outer tank 1008 is not essential. In particular, the arrangement of the outer tank 1008 may be omitted if the processing liquid stored in the processing tank 1002 or 1502 is not circulated.

Also with the nineteenth to twenty-seventh preferred embodiments, for example, a DLC (diamond-like carbon) coating film having hydrophilicity or a fluororesin coating film or hydrocarbon resin coating film, etc., having hydrophilicity may be used as the hydrophilic coating film 1038 covering the outer surface 71B of the window member 1071.

Also, the window member 1071 may be formed using a polyimide resin. In this case, the window member 1071 can be made to transmit the soft X-rays. Also, a polyimide resin is excellent in chemical stability and the window member 1071 can thus be continued to be used over a long period. In this case, there is no need to cover the outer surface 71B with the hydrophilic coating film 1038.

Also with the twenty-third to twenty-seventh preferred embodiments, a voltage from a power supply 1557 may be applied to an electrode 1556 in accordance with the irradiation of soft X-rays by the soft X-ray irradiating unit 1562. In this case, the electrode 1556 is preferably charged with positive charges. In this case, the electrons generated in the irradiated portion of the processing liquid by the irradiation of the soft X-rays are drawn toward the electrode 1556 by the positive charges at the electrode 1556 and move to the tip portion of the nozzle piping 1551 at which the electrode 1556 is disposed. That is, a large amount of electrons can be drawn toward the discharge port 1553 of the processing liquid nozzle 1561. Movement of electrons toward the substrates W can thereby be promoted.

Also, although with the first to twenty-seventh preferred embodiments, the means irradiating "soft X-rays," which are comparatively long in wavelength among X-rays, was used as the X-ray irradiating means, the X-rays are not restricted thereto and "hard X-rays" of comparatively short wavelength (0.001 nm to 0.1 nm) may also be used. In this case, it is preferable for the safety of a human body, such as that of an operator of the apparatus, to provide a shielding structure that shields the leakage of X-rays to the exterior of the apparatus, for example, by covering an operator side surface of the apparatus with a lead plate of suitable thickness, etc., or to take measures, such as prohibiting the entry of an operator to a periphery of the apparatus during X-ray irradiation. By use of the means that irradiates soft X-rays as in the respective preferred embodiments, the apparatus can be made compact and inexpensive and shielding with respect to a human body, etc., can be achieved comparatively easily in comparison to a means that irradiates hard X-rays.

Also, although as the substrate W, a semiconductor wafer or a glass substrate for liquid crystal display was cited as an example in the description, besides these, examples of the substrate W include such substrates as substrates for plasma displays, substrates for FEDs (field emission displays), substrates for OLEDs (organic electroluminescence displays), substrates for optical disks, substrates for magnetic disks, substrates for magneto-optical disks, substrates for photomasks, ceramic substrates, substrates for solar cells. Also, SiC, quartz, sapphire, plastic, ceramic, etc., can be cited as examples of the material of the substrate besides silicon and glass.

While preferred embodiments of the present invention have been described in detail above, these are merely specific examples used to clarify the technical contents of the present invention, and the present invention should not be interpreted as being limited to these specific examples, and the scope of the present invention shall be limited only by the appended claims.

The present application corresponds to Japanese Patent Application No. 2012-215293 filed on Sep. 27, 2012 in the Japan Patent Office, Japanese Patent Application No. 2012-215294 filed on Sep. 27, 2012 in the Japan Patent Office, Japanese Patent Application No. 2013-194293 filed on Sep. 19, 2013 in the Japan Patent Office, and Japanese Patent Application No. 2013-194294 filed on Sep. 19, 2013 in the Japan Patent Office, and the entire disclosures of these applications are incorporated herein by reference.

REFERENCE SIGNS LIST 1 substrate processing apparatus
4 spin chuck (substrate holding and rotating means)
6 integral head
6A integral head
6B integral head
17 cup (liquid receiver member)
25 soft X-ray generator (X-ray generator)
26 cover
27 gas nozzle (gas supplying means)
35 irradiating window
37 gas valve (gas supplying means)
38 hydrophilic film (coating film)
40 controller (X-ray irradiation control means)
51 first nozzle piping (processing liquid piping)
51A first nozzle piping (processing liquid piping)
52 first opening (opening, X-ray irradiation position)
52A third opening (opening, X-ray irradiation position)
53 discharge port
56 electrode
57 power supply
61 water nozzle (processing liquid nozzle)
62 soft X-ray irradiating unit (X-ray irradiating means)
65 fiber bundle (fibrous substance)
71 window member
71B outer wall (wall surface of the closed window at the side at which the processing liquid flows)
100 water supplying unit (processing liquid supplying apparatus)
101 liquid detection sensor (processing liquid detecting means)
200 water supplying unit (processing liquid supplying apparatus)
201 substrate processing apparatus
202A discharge port
203 soft X-ray irradiating unit (X-ray irradiating means)
204 water supplying piping (processing liquid piping)
211 substrate processing apparatus
216 discharge port
220 water supplying unit (processing liquid supplying apparatus)
221 substrate processing apparatus
222 first branch piping (branch piping)
224A discharge port (liquid receiver discharge port)
230 water supplying unit (processing liquid supplying apparatus)
231 substrate processing apparatus
232 second nozzle piping (second piping)
250 water supplying unit (processing liquid supplying apparatus)
251 substrate processing apparatus
260 water supplying unit (processing liquid supplying apparatus)
261 substrate processing apparatus
262 second nozzle piping (second piping)
276 discharge port
300 water supplying unit (processing liquid supplying apparatus)
301 substrate processing apparatus
306A discharge port
307 water supplying piping (processing liquid piping)
309 soft X-ray irradiating unit (X-ray irradiating means)
310 water supplying unit (processing liquid supplying apparatus)
311 substrate processing apparatus
312 second branch piping (branch piping)
313A discharge port (liquid receiver discharge port)
400 water supplying unit (processing liquid supplying apparatus)
401 substrate processing apparatus
402 spin chuck (substrate holding and rotating means)
404 spin shaft (supporting member)
405 spin base (supporting member)
409A discharge port
410 water supplying piping (processing liquid piping)
412 soft X-ray irradiating unit (X-ray irradiating means)
500 water supplying unit (processing liquid supplying apparatus)
501 substrate processing apparatus
504 roller conveying unit (substrate holding and conveying means)
531A discharge port
533 water supplying piping (processing liquid piping)
534 soft X-ray irradiating unit (X-ray irradiating means)
600 water supplying unit (processing liquid supplying apparatus)
602 substrate container (container)
701 substrate processing apparatus
704 spin chuck (substrate holding means)
705 water nozzle (water supplying means)
706 soft X-ray irradiating head (X-ray irradiating means)
714 water valve (water supplying means)
719 swinging drive mechanism (moving means)
720 raising and lowering drive mechanism (moving means)
725 X-ray generator
726 cover
727 gas nozzle (gas supplying means)

728 opening
735 irradiating window
737 gas valve (gas supplying means)
738 polyimide resin coating film
740 controller (control means)
744 heater (heating member)
820 substrate processing apparatus
821 water nozzle (water supplying means)
830 substrate processing apparatus
833 water nozzle (water supplying means)
834 soft X-ray irradiating unit (X-ray irradiating means)
840 substrate processing apparatus
841 soft X-ray irradiating head (X-ray irradiating means)
842 shielding member (shielding plate portion)
851 DLC coating film (coating film of diamond-like carbon)
861 amorphous fluororesin coating film
1001 substrate processing apparatus (processing liquid processing apparatus)
1002 processing tank
1007 inner tank
1008 outer tank
1016 branch piping (processing liquid supplying piping)
1017 soft X-ray irradiating unit (X-ray irradiating means)
1019 feedback piping (overflow piping)
1025 soft X-ray generator (X-ray generator)
1026 cover
1027 gas nozzle (gas supplying means)
1035 irradiating window
1037 gas valve (gas supplying means)
1038 hydrophilic coating film (coating film)
1052 opening
1071 window member
1071B outer surface (wall surface)
1201 substrate processing apparatus (processing liquid processing apparatus)
1217 soft X-ray irradiating unit (X-ray irradiating means)
1301 substrate processing apparatus (processing liquid processing apparatus)
1307 inner tank
1317 soft X-ray irradiating unit (X-ray irradiating means)
1321 opening
1401 substrate processing apparatus (processing liquid processing apparatus)
1407 inner tank
1417 soft X-ray irradiating unit (X-ray irradiating means)
1421 opening
1423 piping
1602 substrate container (processing object)
C rotation axis
L lens
W substrate (processing object)

The invention claimed is:

1. A processing liquid supplying apparatus arranged to discharge a processing liquid from a discharge port to supply the processing liquid to a processing object, the processing liquid supplying apparatus comprising:
a first piping, having an interior for carrying flowing processing liquid, the interior of the first piping being in communication with the discharge port; and
an X-ray irradiating unit irradiating X-rays onto the processing liquid present inside the first piping and thereby ionizing the processing liquid present inside the first piping.

2. The processing liquid supplying apparatus according to claim 1, wherein the first piping has an opening in its pipe wall,
the opening is closed by a window member formed using a material which transmits X-rays, and
the X-ray irradiating unit irradiates X-rays onto the processing liquid present inside the first piping via the window member.

3. The processing liquid supplying apparatus according to claim 2, wherein the window member is formed using beryllium or a polyimide resin.

4. The processing liquid supplying apparatus according to claim 2, wherein the wall surface of the window member at the side at which the processing liquid is present is coated with a coating film.

5. The processing liquid supplying apparatus according to claim 4, wherein the coating film includes one or more materials among a polyimide resin, diamond-like carbon, fluororesin, and hydrocarbon resin.

6. The processing liquid supplying apparatus according to claim 2, wherein the X-ray irradiating unit includes an X-ray generator that has an irradiating window disposed to face the window member, generates X-rays and irradiates the generated X-rays from the irradiating window.

7. The processing liquid supplying apparatus according to claim 6, wherein
the X-ray irradiating unit further includes
a cover surrounding a periphery of the X-ray generator across an interval from the X-ray generator and
a gas supplying unit supplying a gas to the interior of the cover.

8. The processing liquid supplying apparatus according to claim 1, wherein the first piping includes a processing liquid piping, through the interior of which the processing liquid flows toward the discharge port, and
the X-ray irradiating unit irradiates the X-rays onto the processing liquid flowing through the interior of the first piping.

9. The processing liquid supplying apparatus according to claim 1, wherein the processing liquid supplying apparatus further comprises: a processing liquid piping, through the interior of which the processing liquid flows toward the discharge port; and
the first piping includes a branch piping branching from the processing liquid piping.

10. The processing liquid supplying apparatus according to claim 1, further comprising: a fibrous substance, disposed at the discharge port and along which the processing liquid, discharged from the discharge port, flows.

11. The processing liquid supplying apparatus according to claim 1, further comprising: an electrode disposed further downstream in the processing liquid flowing direction than the X-ray irradiation position in the first piping; and
a power supply applying a voltage to the electrode.

12. The processing liquid supplying apparatus according to claim 11, wherein the electrode is disposed at a tip portion of the first piping.

13. The processing liquid supplying apparatus according to claim 1, further comprising: a processing liquid detecting unit arranged to detect the presence or non-presence of the processing liquid at the irradiation position of the X-rays in the first piping; and
an X-ray irradiation control unit that executes the irradiation of the X-rays by the X-ray irradiating unit when the processing liquid is present at the irradiation position and does not perform the irradiation of X-rays by the X-ray irradiating unit when the processing liquid is not present at the irradiation position.

14. A substrate processing apparatus comprising:
a substrate holding unit holding a substrate; and the processing liquid supplying apparatus according to claim 1; and supplying a processing liquid, discharged from the discharge port, to a major surface of the substrate.

15. The substrate processing apparatus according to claim 14, wherein the substrate holding unit includes a substrate holding and rotating unit that rotates the substrate around a predetermined vertical rotation axis while holding it in a horizontal attitude, the substrate processing apparatus further comprises a cylindrical liquid receiver member surrounding a periphery of the substrate holding and rotating unit, the processing liquid supplying apparatus further includes a processing liquid piping, through the interior of which the processing liquid flows toward the discharge port, the first piping of the processing liquid supplying apparatus includes a branch piping branching from the processing liquid piping, and the branch piping has a liquid receiver discharge port for discharging the processing liquid toward the liquid receiver member.

16. The substrate processing apparatus according to claim 14, wherein the substrate holding unit includes a substrate holding and rotating unit that rotates the substrate around a predetermined vertical rotation axis while holding it in a horizontal attitude, the substrate holding and rotating unit has a supporting member contacting at least a portion of a lower surface of the substrate to support the substrate in the horizontal attitude, the supporting member is formed using a porous material, and the processing liquid discharged from the discharge port is supplied to the supporting member.

17. The substrate processing apparatus according to claim 14, wherein the substrate holding unit includes a substrate holding and conveying unit that conveys the substrate toward a predetermined conveying direction while holding the substrate.

18. The substrate processing apparatus according to claim 17, wherein the substrate holding and conveying unit conveys the substrate while holding it in an attitude along the conveying direction and inclined with respect to a horizontal plane.

19. A processing liquid supplying method for making a processing liquid be discharged from a discharge port of a processing liquid supplying apparatus to supply the processing liquid to a processing object, the processing liquid supplying method comprising:

a facing positioning step of positioning the discharge port to face the processing object;

a first X-ray irradiating step of irradiating X-rays onto the processing liquid present in the interior of a first piping in communication with the discharge port and thereby ionizing the processing liquid present inside the first piping; and a processing liquid discharging step of making the processing liquid be discharged from the discharge port in parallel to the first X-ray irradiating step, and wherein in the processing liquid discharging step, the processing liquid is connected in liquid form between the discharge port and the processing object.

20. The processing liquid supplying method according to claim 19, wherein, in the processing liquid discharging step, the processing liquid discharged from the discharge port takes on a continuous flow form connected to both the discharge port and the processing object.

21. The processing liquid supplying method according to claim 19, wherein the processing object is a second piping, through the interior of which a liquid flows.

22. The processing liquid supplying method according to claim 19, wherein the processing object is a container arranged to contain an article.

23. A substrate processing method for processing a substrate using a processing liquid discharged from a discharge port of a processing liquid supplying apparatus, the substrate processing method comprising:

a facing positioning step of positioning the discharge port to face a major surface of the substrate that is held by a substrate holding unit;

a first X-ray irradiating step of irradiating X-rays onto the processing liquid present in the interior of a first piping in communication with the discharge port and thereby ionizing the processing liquid present inside the first piping; and a processing liquid discharging step of making the processing liquid be discharged from the discharge port in parallel to the first X-ray irradiating step; and wherein in the processing liquid discharging step, the processing liquid is connected in liquid form between the discharge port and the major surface of the substrate.

24. The substrate processing method according to claim 23, wherein, in the processing liquid discharging step, the processing liquid discharged from the discharge port takes on a continuous flow form connected to both the discharge port and the major surface of the substrate.

25. The substrate processing method according to claim 23, wherein the substrate is held in a horizontal attitude by the substrate holding unit and the facing positioning step includes a step of positioning the discharge port to face an upper surface of the substrate held by the substrate holding unit.

26. The substrate processing method according to claim 23, wherein the substrate is held in a horizontal attitude by the substrate holding unit, the facing positioning step includes a step of positioning the discharge port to face a lower surface of the substrate held by the substrate holding unit, and the substrate processing method further comprises:

a substrate rotating step, which is executed in parallel to the processing liquid discharging step and by which the substrate is rotated around a predetermined vertical rotation axis; and an upper surface processing liquid supplying step of supplying the processing liquid to the upper surface of the substrate in parallel to the processing liquid discharging step and the substrate rotating step.

27. The substrate processing method according to claim 23, further comprising: a second X-ray irradiating step, which is executed in parallel to a liquid removing processing or a drying processing executed after the end of the processing liquid discharging step and by which X-rays are irradiated onto the major surface of the substrate.

28. A substrate processing apparatus comprising:

a substrate holding unit holding a substrate;

a processing liquid supplying unit supplying a processing liquid onto the front surface of the substrate held by the substrate holding unit;

an X-ray irradiating unit for irradiating X-rays onto a front surface of the substrate held by the substrate holding unit and thereby for ionizing the processing liquid on the front surface of the substrate held by the substrate holding unit; and a control unit controlling the X-ray irradiating unit and the processing liquid supplying unit so that the supplying of the processing liquid and the irradiation of X-rays onto the front surface of the substrate are performed in parallel.

29. The substrate processing apparatus according to claim 28, wherein the X-ray irradiating unit includes an X-ray generator that has an irradiating window, generates X-rays, and irradiates the generated X-rays from the irradiating window.

30. The substrate processing apparatus according to claim 29, further comprising: a cover surrounding a periphery of the X-ray generator across an interval; and wherein an opening is formed in a portion of the cover facing the irradiating window.

31. The substrate processing apparatus according to claim 30, further comprising: a gas supplying unit supplying a gas into the interior of the cover.

32. The substrate processing apparatus according to claim 31, wherein the gas supplying unit supplies a gas of higher temperature than ordinary temperature.

33. The substrate processing apparatus according to of claim 30, wherein a heating member is disposed at least at one of either a periphery of the opening in the cover or the irradiating window.

34. The substrate processing apparatus according to claim 29, wherein an outer surface of the irradiating window is coated with a coating film.

35. The substrate processing apparatus according to claim 34, wherein the coating film is a coating film of a polyimide resin.

36. The substrate processing apparatus according to claim 34, wherein the coating film is a coating film of diamond-like carbon.

37. The substrate processing apparatus according to claim 34, wherein the coating film is a coating film of an amorphous fluororesin.

38. The substrate processing apparatus according to claim 29, further comprising: a shielding member disposed to face the front surface of the substrate held by the substrate holding unit and arranged to shield a space above the front surface of the substrate from a periphery thereof;

wherein the shielding member is arranged to keep the X-rays, irradiated from the irradiating window, within the space above the front surface of the substrate.

39. The substrate processing apparatus according to claim 38, wherein the shielding member is provided to be integrally movable with the cover.

40. The substrate processing apparatus according to claim 28, further comprising: a moving unit moving the X-ray irradiating unit along the front surface of the substrate held by the substrate holding unit.

41. The substrate processing apparatus according to claim 28, wherein the processing liquid is water.

42. A substrate processing method comprising:

a processing liquid supplying step of supplying a processing liquid onto a front surface of a substrate held by a substrate holding unit; and an X-ray irradiating step of irradiating X-rays onto the front surface of the substrate held by the substrate holding unit and thereby ionizing the processing liquid on the front surface of the substrate held by the substrate holding unit, in parallel to the processing liquid supplying step.

* * * * *